US010622369B2

(12) United States Patent
Zhou et al.

(10) Patent No.: US 10,622,369 B2
(45) Date of Patent: Apr. 14, 2020

(54) THREE-DIMENSIONAL MEMORY DEVICE INCLUDING CONTACT VIA STRUCTURES THAT EXTEND THROUGH WORD LINES AND METHOD OF MAKING THE SAME

(71) Applicant: SANDISK TECHNOLOGIES LLC, Plano, TX (US)

(72) Inventors: Fei Zhou, Milpitas, CA (US); Raghuveer S. Makala, Campbell, CA (US); Hiroyuki Kinoshita, San Jose, CA (US); Yanli Zhang, San Jose, CA (US); James Kai, Santa Clara, CA (US); Johann Alsmeier, San Jose, CA (US); Stephen Ross, Milpitas, CA (US); Senaka Kanakamedala, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 69 days.

(21) Appl. No.: 15/877,219

(22) Filed: Jan. 22, 2018

(65) Prior Publication Data

US 2019/0229125 A1 Jul. 25, 2019

(51) Int. Cl.
*H01L 27/11556* (2017.01)
*H01L 27/11526* (2017.01)
(Continued)

(52) U.S. Cl.
CPC .. *H01L 27/11556* (2013.01); *H01L 21/76816* (2013.01); *H01L 21/76877* (2013.01);
(Continued)

(58) Field of Classification Search
CPC ......... H01L 27/11556; H01L 27/11575; H01L 21/76816; H01L 23/5226; H01L 27/11582;
(Continued)

(56) References Cited

U.S. PATENT DOCUMENTS 5,915,167 A 6/1999 Leedy
8,884,357 B2 11/2014 Wang et al.
(Continued)

OTHER PUBLICATIONS

U.S. Appl. No. 15/251,374, filed Aug. 30, 2016, SanDisk Technologies Inc.
(Continued)

*Primary Examiner* — Thanh T Nguyen
(74) *Attorney, Agent, or Firm* — The Marbury Law Group, PLLC

(57) ABSTRACT

A three-dimensional memory device includes semiconductor devices located on a semiconductor substrate, lower interconnect level dielectric layers embedding lower interconnect structures, an alternating stack of insulating layers and electrically conductive layers overlying the lower interconnect level dielectric layers and including stepped surfaces, memory stack structures vertically extending through the alternating stack, and contact via structures extending downward from the stepped surfaces through underlying portions of the alternating stack to the lower interconnect structures. Each of the contact via structures laterally contacts an electrically conductive layer located at the stepped surfaces, and provides electrical interconnection to an underlying semiconductor device. A top portion of each contact via structures contacts an electrically conductive layer, and is electrically isolated from other underlying electrically conductive layers.

10 Claims, 87 Drawing Sheets

(51) Int. Cl.

| | |
|---|---|
| ***H01L 27/11548*** | (2017.01) |
| ***H01L 27/11573*** | (2017.01) |
| ***H01L 21/768*** | (2006.01) |
| ***H01L 27/11582*** | (2017.01) |
| ***H01L 23/522*** | (2006.01) |
| ***H01L 27/11575*** | (2017.01) |

(52) U.S. Cl.

CPC .... *H01L 23/5226* (2013.01); *H01L 27/11526* (2013.01); *H01L 27/11548* (2013.01); *H01L 27/11573* (2013.01); *H01L 27/11575* (2013.01); *H01L 27/11582* (2013.01)

(58) Field of Classification Search

CPC ......... H01L 27/11573; H01L 27/11548; H01L 27/11526; H01L 21/76877; H01L 21/768; H01L 23/522

See application file for complete search history.

(56) References Cited

U.S. PATENT DOCUMENTS 8,946,023 B2 2/2015 Makala et al.
9,230,987 B2 1/2016 Pachamuthu et al.
9,236,392 B1 1/2016 Izumi et al.
9,356,034 B1 5/2016 Yada et al.
9,401,309 B2 7/2016 Izumi et al.
9,449,982 B2 9/2016 Lu et al.
9,502,429 B2 11/2016 Hironaga
9,502,471 B1 11/2016 Lu et al.
9,530,790 B1 12/2016 Lu et al.
9,570,463 B1 2/2017 Zhang et al.
9,576,967 B1 2/2017 Kimura et al.
9,589,981 B2 3/2017 Nishikawa et al.
9,595,535 B1 3/2017 Ogawa et al.
9,601,502 B2 3/2017 Sano et al.
9,627,403 B2 4/2017 Liu et al.
9,691,778 B2 6/2017 Izumi et al.
9,728,551 B1 8/2017 Lu et al.
9,754,963 B1 9/2017 Kawamura et al.
9,786,681 B1 10/2017 Ariyoshi
9,806,093 B2 10/2017 Toyama et al.
9,818,693 B2 11/2017 Toyama et al.
9,818,759 B2 11/2017 Toyama et al.
2015/0036407 A1 2/2015 Nakajima et al.
2016/0148835 A1 5/2016 Shimabukuro et al.
2016/0204117 A1 7/2016 Liu et al.
2016/0365351 A1 12/2016 Nishikawa et al.
2017/0062454 A1 3/2017 Lu et al.
2017/0179153 A1 6/2017 Ogawa et al.
2017/0179154 A1* 6/2017 Furihata ............ H01L 27/11524
2017/0236746 A1 8/2017 Yu et al.
2017/0352678 A1 12/2017 Lu et al.
2017/0358594 A1 12/2017 Lu et al.

OTHER PUBLICATIONS

U.S. Appl. No. 15/367,791, filed Dec. 2, 2016, SanDisk Technologies Inc.
U.S. Appl. No. 15/451,773, filed Mar. 7, 2017, SanDisk Technologies LLC.
U.S. Appl. No. 15/488,924, filed Apr. 17, 2017, SanDisk Technologies LLC.
U.S. Appl. No. 15/489,050, filed Apr. 17, 2017, SanDisk Technologies LLC.
U.S. Appl. No. 15/610,918, filed Jun. 1, 2017, SanDisk Technologies LLC.
U.S. Appl. No. 15/638,672, filed Jun. 30, 2017, SanDisk Technologies LLC.
U.S. Appl. No. 15/717,102, filed Sep. 27, 2017, SanDisk Technologies LLC.

* cited by examiner

THREE-DIMENSIONAL MEMORY DEVICE INCLUDING CONTACT VIA STRUCTURES THAT EXTEND THROUGH WORD LINES AND METHOD OF MAKING THE SAME

FIELD

The present disclosure relates generally to the field of semiconductor devices and specifically to a three-dimensional memory device employing CMOS under array architecture with a hydrogen diffusion barrier layer, and methods of making the same.

BACKGROUND

Recently, ultra high density storage devices employing three-dimensional (3D) memory stack structures have been proposed. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

SUMMARY

According to an aspect of the present disclosure, a three-dimensional memory device is provided, which comprises: semiconductor devices located on a semiconductor substrate; lower interconnect level dielectric layers located over the semiconductor devices and embedding lower interconnect structures that are electrically connected to respective semiconductor devices; an alternating stack of insulating layers and electrically conductive layers located over the lower interconnect level dielectric layers, wherein stepped surfaces of layers of the alternating stack are provided in a terrace region; memory stack structures vertically extending through the alternating stack, wherein each of the memory stack structures comprises a memory film and a vertical semiconductor channel laterally surrounded by the memory film; and contact via structures located in the terrace region, wherein each of the contact via structures laterally contacts a respective one of the electrically conductive layers, vertically extends through a respective opening in at least a bottommost electrically conductive layer of the alternating stack, and contacts a respective one of the lower interconnect structures that underlie the alternating stack.

According to another aspect of the present disclosure, a method of forming a three-dimensional memory device is provided, which comprises: forming semiconductor devices on a top surface of a semiconductor substrate; forming lower interconnect level dielectric layers embedding lower interconnect structures over the semiconductor devices, wherein the lower interconnect structures are electrically connected to a respective one of the semiconductor devices; forming an alternating stack of insulating layers and sacrificial material layers over the lower interconnect level dielectric layers; forming stepped surfaces on the alternating stack in a word line contact region by patterning the alternating stack; forming contact via structures in the word line contact region, wherein each of the contact via structures laterally contacts a respective one of the sacrificial material layers, vertically extends through a respective opening in at least a bottommost sacrificial material layer of the alternating stack, and contacts a respective one of the lower interconnect structures that underlie the alternating stack; forming memory stack structures through the alternating stack, wherein each of the memory stack structures comprises a memory film and a vertical semiconductor channel laterally surrounded by the memory film; and replacing the sacrificial materials with electrically conductive layers.

DETAILED DESCRIPTION

Figure 1:
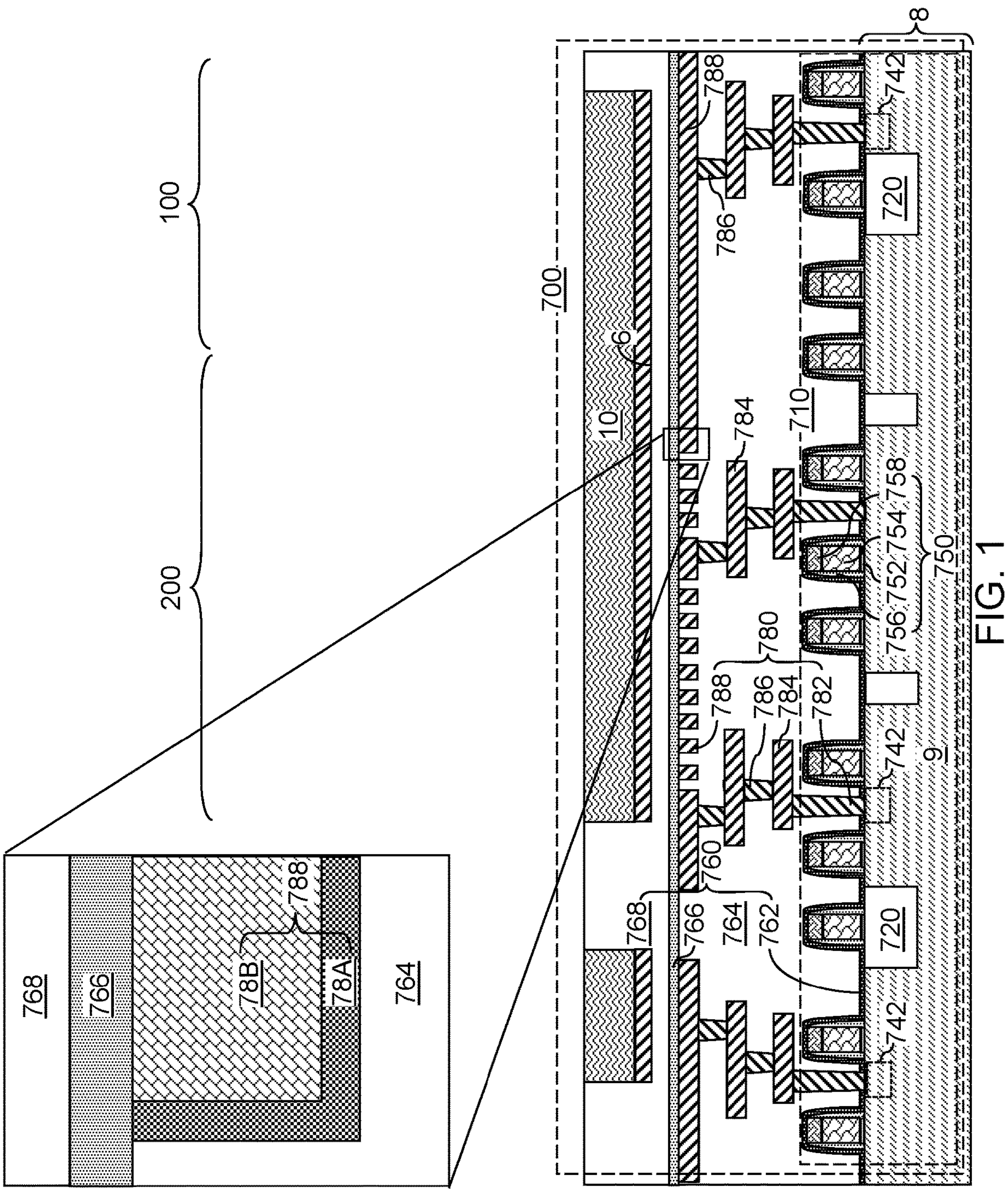
FIG. 1 is a vertical cross-sectional view of a first exemplary structure after formation of semiconductor devices, lower level dielectric layers including a silicon nitride layer, lower metal interconnect structures, and a planar semiconductor material layer on a semiconductor substrate according to a first embodiment of the present disclosure.

As three-dimensional memory devices scale to smaller device dimensions, the device area for peripheral devices can take up a significant portion of the total chip area. CMOS under array architecture has been proposed to stack a three-dimensional array of memory devices over underlying peripheral devices on a substrate. However, electrical connections between the word lines and the underlying peripheral devices include a substantial number of interconnect via structures and interconnect line structures, which are typically located in a dedicated interconnect region, which decreases the overall device density.

The embodiments of the present disclosure provide contact via structures which extend through the stepped surfaces in a contact region to interconnect the underlying peripheral devices and the word lines in the stepped region. The embodiments of the present disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Referring to FIG. 1, a first exemplary structure according to an embodiment of the present disclosure is illustrated. The first exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as lower level dielectric layers 760. The lower level dielectric layers 760 constitute a dielectric layer stack in which each lower level dielectric layer 760 overlies or underlies other lower level dielectric layers 760. The lower level dielectric layers 760 can include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer (e.g., hydrogen diffusion barrier) 766 that overlies the dielectric material layer 764, and at least one second dielectric layer 768.

The dielectric layer stack including the lower level dielectric layers 760 functions as a matrix for lower metal interconnect structures 780 that provide electrical wiring among the various nodes of the semiconductor devices and landing pads for through-stack contact via structures to be subsequently formed. The lower metal interconnect structures 780 are embedded within the dielectric layer stack of the lower level dielectric layers 760, and comprise a lower metal line structure located under and optionally contacting a bottom surface of the silicon nitride layer 766.

For example, the lower metal interconnect structures 780 can be embedded within the at least one first dielectric material layer 764. The at least one first dielectric material layer 764 may be a plurality of dielectric material layers in which various elements of the lower metal interconnect structures 780 are sequentially embedded. Each dielectric material layer among the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9.

The lower metal interconnect structures 780 can include various device contact via structures 782 (e.g., source and drain electrodes which contact the respective source and drain nodes of the device or gate electrode contacts), intermediate lower metal line structures 784, lower metal via structures 786, and topmost lower metal line structures 788 that are configured to function as landing pads for through-stack contact via structures to be subsequently formed. In this case, the at least one first dielectric material layer 764 may be a plurality of dielectric material layers that are formed level by level while incorporating components of the lower metal interconnect structures 780 within each respective level. For example, single damascene processes may be employed to form the lower metal interconnect structures 780, and each level of the lower metal via structures 786 may be embedded within a respective via level dielectric material layer and each level of the lower level metal line structures (784, 788) may be embedded within a respective line level dielectric material layer. Alternatively, a dual damascene process may be employed to form integrated line and via structures, each of which includes a lower metal line structure and at least one lower metal via structure.

The topmost lower metal line structures 788 can be formed within a topmost dielectric material layer of the at least one first dielectric material layer 764 (which can be a plurality of dielectric material layers). Each of the lower metal interconnect structures 780 can include a metallic nitride liner 78A and a metal fill portion 78B. Each metallic nitride liner 78A can include a conductive metallic nitride material such as TiN, TaN, and/or WN. Each metal fill portion 78B can include an elemental metal (such as Cu, W, Al, Co, Ru) or an intermetallic alloy of at least two metals. Top surfaces of the topmost lower metal line structures 788 and the topmost surface of the at least one first dielectric material layer 764 may be planarized by a planarization process, such as chemical mechanical planarization. In this case, the top surfaces of the topmost lower metal line structures 788 and the topmost surface of the at least one first dielectric material layer 764 may be within a horizontal plane that is parallel to the top surface of the substrate 8.

The silicon nitride layer 766 can be formed directly on the top surfaces of the topmost lower metal line structures 788 and the topmost surface of the at least one first dielectric material layer 764. Alternatively, a portion of the first dielectric material layer 764 can be located on the top surfaces of the topmost lower metal line structures 788 below the silicon nitride layer 766. In one embodiment, the silicon nitride layer 766 is a substantially stoichiometric silicon nitride layer which has a composition of $Si_3N_4$. A silicon nitride material formed by thermal decomposition of a silicon nitride precursor is preferred for the purpose of blocking hydrogen diffusion. In one embodiment, the silicon nitride layer 766 can be deposited by a low pressure chemical vapor deposition (LPCVD) employing dichlorosilane ($SiH_2Cl_2$) and ammonia ($NH_3$) as precursor gases. The temperature of the LPCVD process may be in a range from 750 degrees Celsius to 825 degrees Celsius, although lesser and greater deposition temperatures can also be employed. The sum of the partial pressures of dichlorosilane and ammonia may be in a range from 50 mTorr to 500 mTorr, although lesser and greater pressures can also be employed. The thickness of the silicon nitride layer 766 is selected such that the silicon nitride layer 766 functions as a sufficiently robust hydrogen diffusion barrier for subsequent thermal processes. For example, the thickness of the silicon nitride layer 766 can be in a range from 6 nm to 100 nm, although lesser and greater thicknesses may also be employed.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional planar conductive material layer 6 and a planar semiconductor material layer 10. The optional planar conductive material layer 6, if present, provides a high conductivity conduction path for electrical current that flows into, or out of, the planar semiconductor material layer 10. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can include horizontal semiconductor channels and/or source regions for a three-dimensional array of memory devices to be subsequently formed. The optional planar conductive material layer 6 can include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses can also be employed. The planar semiconductor material layer 10 includes a polycrystalline semiconductor material such as polysilicon or a polycrystalline silicon-germanium alloy. The thickness of the planar semiconductor material layer 10 may be in a range from 30 nm to 300 nm, although lesser and greater thicknesses can also be employed.

The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

The optional planar conductive material layer 6 and the planar semiconductor material layer 10 may be patterned to provide openings in areas in which through-stack contact via structures and through-dielectric contact via structures are to be subsequently formed. In one embodiment, the openings in the optional planar conductive material layer 6 and the planar semiconductor material layer 10 can be formed within the area of a memory array region 100, in which a three-dimensional memory array including memory stack structures is to be subsequently formed. Further, additional openings in the optional planar conductive material layer 6 and the planar semiconductor material layer 10 can be formed within the area of a word line contact region 200 in which contact via structures contacting word line electrically conductive layers are to be subsequently formed.

The region of the semiconductor devices 710 and the combination of the lower level dielectric layers 760 and the lower metal interconnect structures 780 is herein referred to an underlying peripheral device region 700, which is located underneath a memory-level assembly to be subsequently formed and includes peripheral devices for the memory-level assembly. The lower metal interconnect structures 780 are embedded in the lower level dielectric layers 760.

The lower metal interconnect structures 780 can be electrically shorted to active nodes (e.g., transistor active regions 742 or gate electrodes 750) of the semiconductor devices 710 (e.g., CMOS devices), and are located at the level of the lower level dielectric layers 760. Only a subset of the active nodes is illustrated in FIG. 1 for clarity. Through-stack contact via structures (not shown in FIG. 1) can be subsequently formed directly on the lower metal interconnect structures 780 to provide electrical connection to memory devices to be subsequently formed. In one embodiment, the pattern of the lower metal interconnect structures 780 can be selected such that the topmost lower metal line structures 788 (which are a subset of the lower metal interconnect structures 780 located at the topmost portion of the lower metal interconnect structures 780) can provide landing pad structures for the through-stack contact via structures to be subsequently formed.

Figure 2:
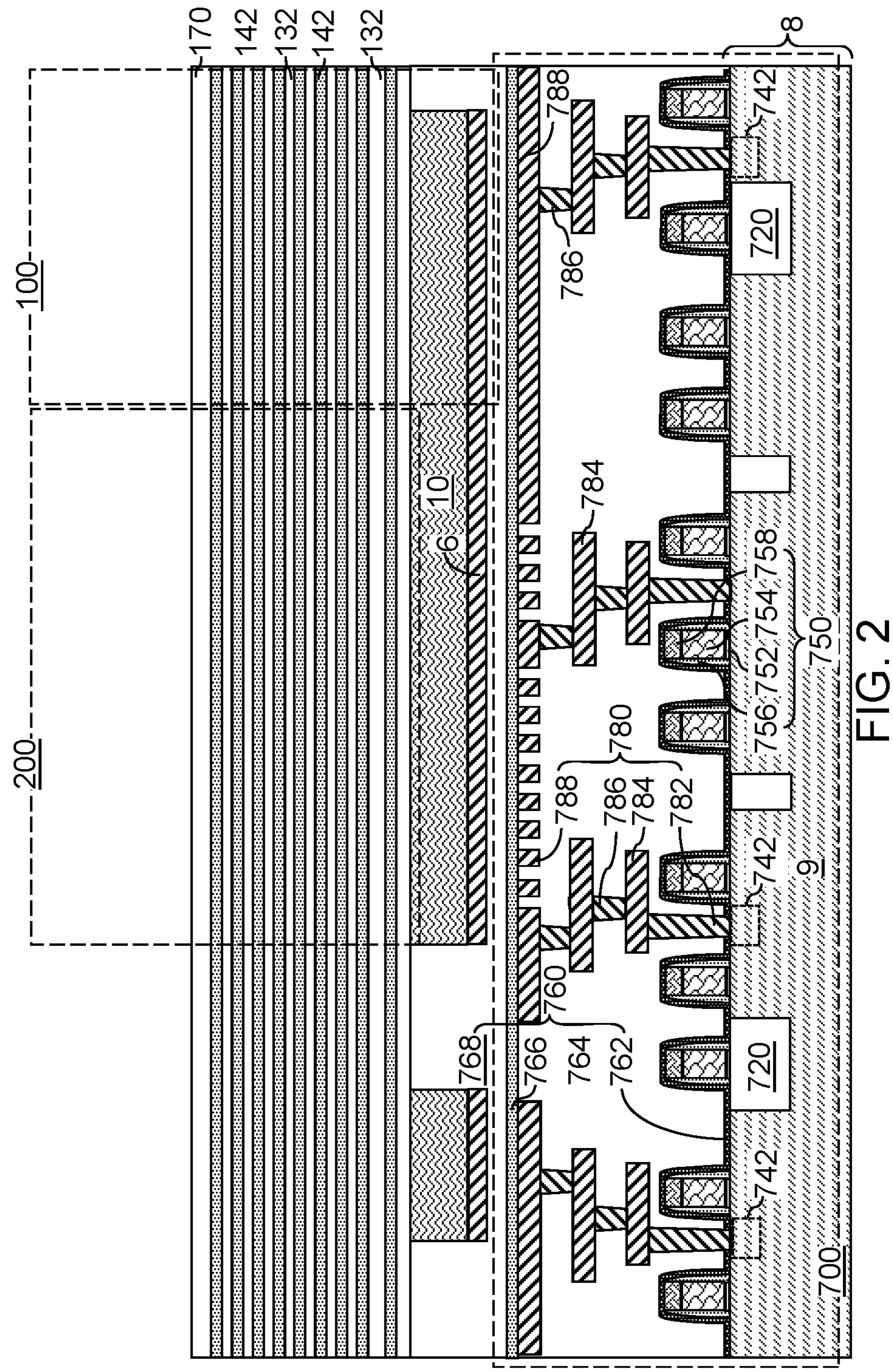
FIG. 2 is a vertical cross-sectional view of the first exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3:
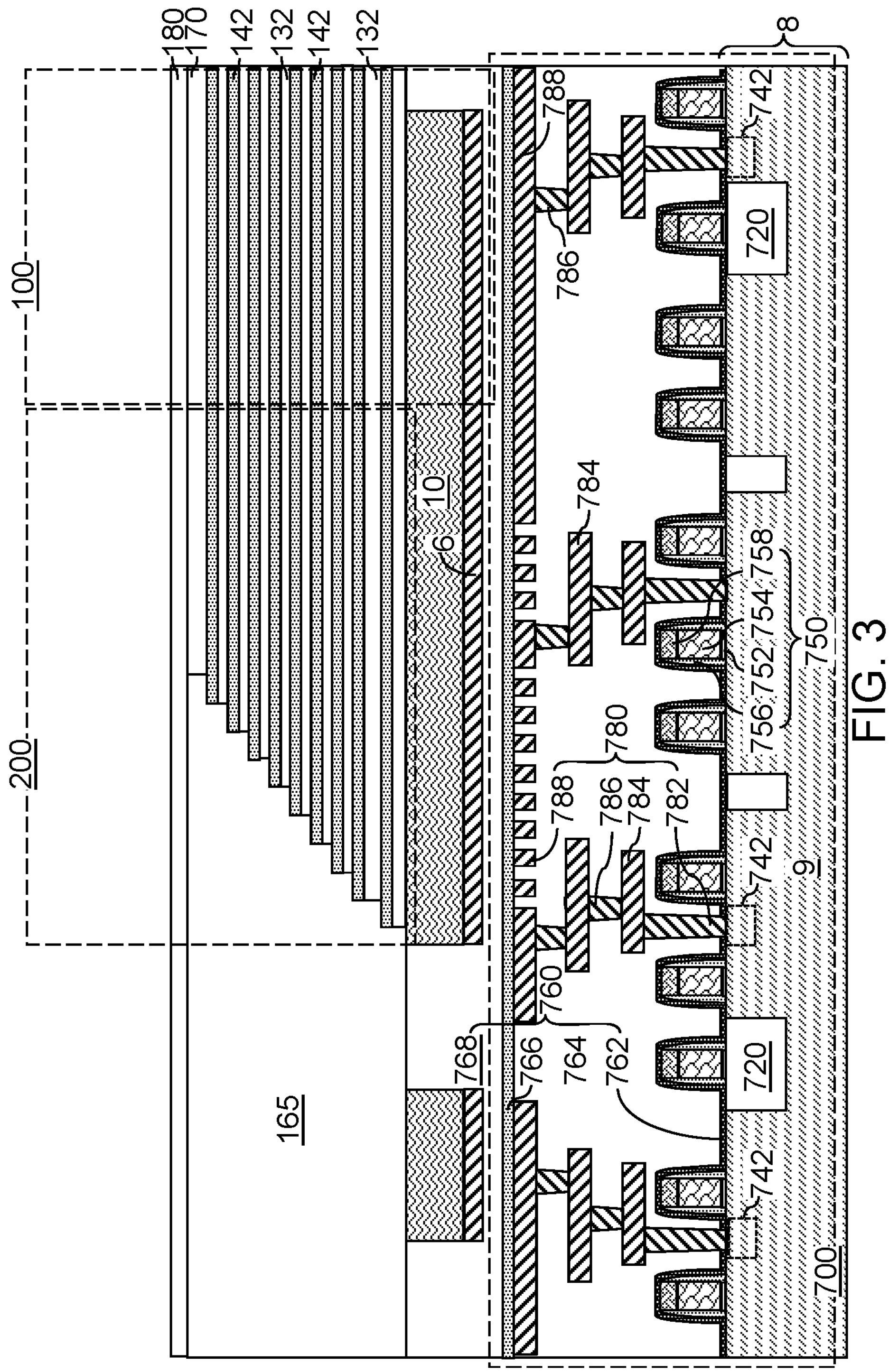
FIG. 3 is a vertical cross-sectional view of the first exemplary structure after patterning first-tier staircase regions on the first-tier alternating stack and forming a first-tier retro-stepped dielectric material portion according to an embodiment of the present disclosure.

Referring to FIG. 3, the first insulating cap layer 170 and the first-tier alternating stack (132, 142) can be patterned to form first stepped surfaces in the word line contact region 200. The word line contact region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first-tier structure, which is an in-process structure that is subsequently modified.

Figure 4A:
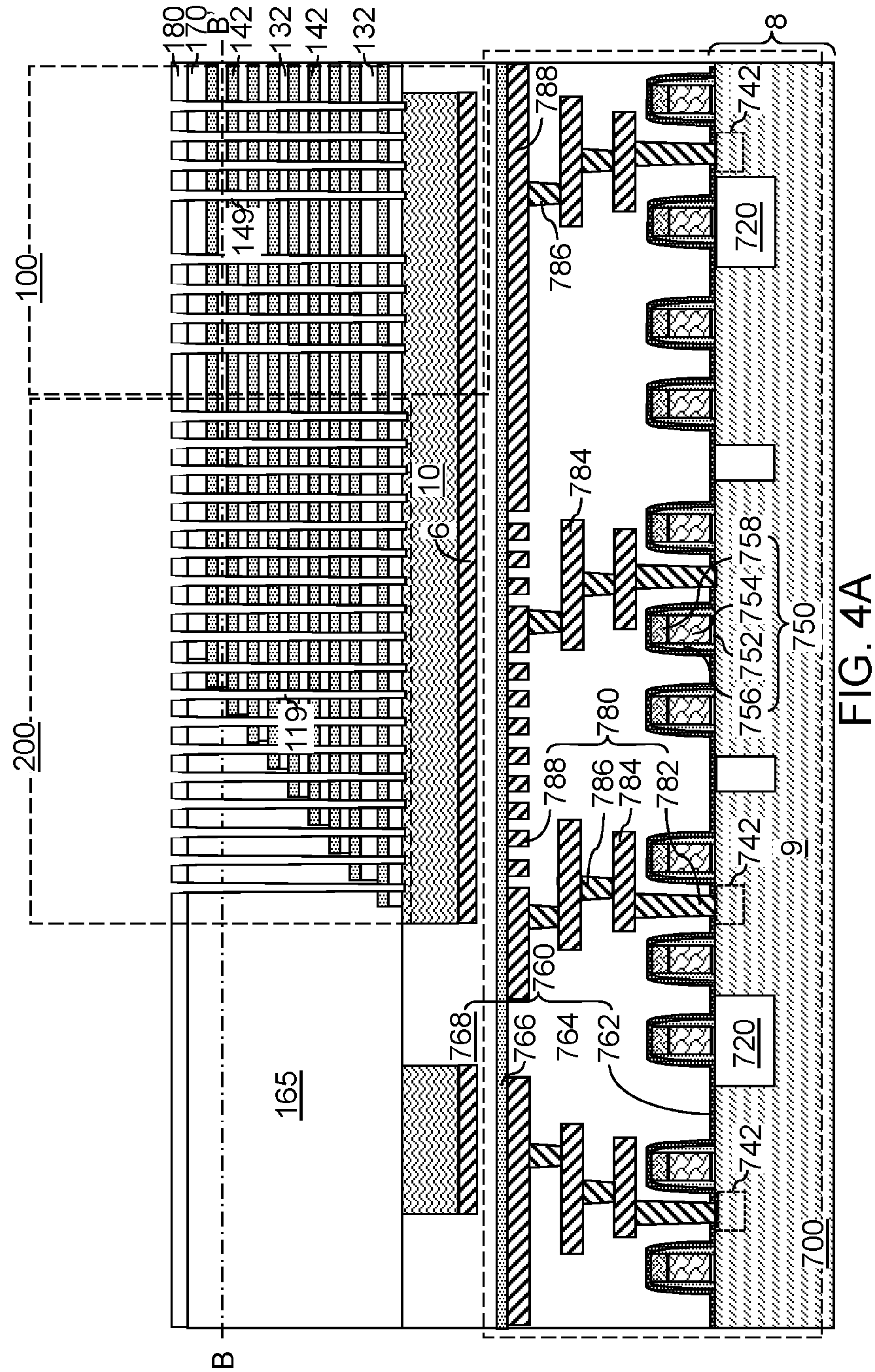
FIG. 4A is a vertical cross-sectional view of the first exemplary structure after formation of first-tier memory openings and first-tier support openings according to an embodiment of the present disclosure.
Figure 4B:
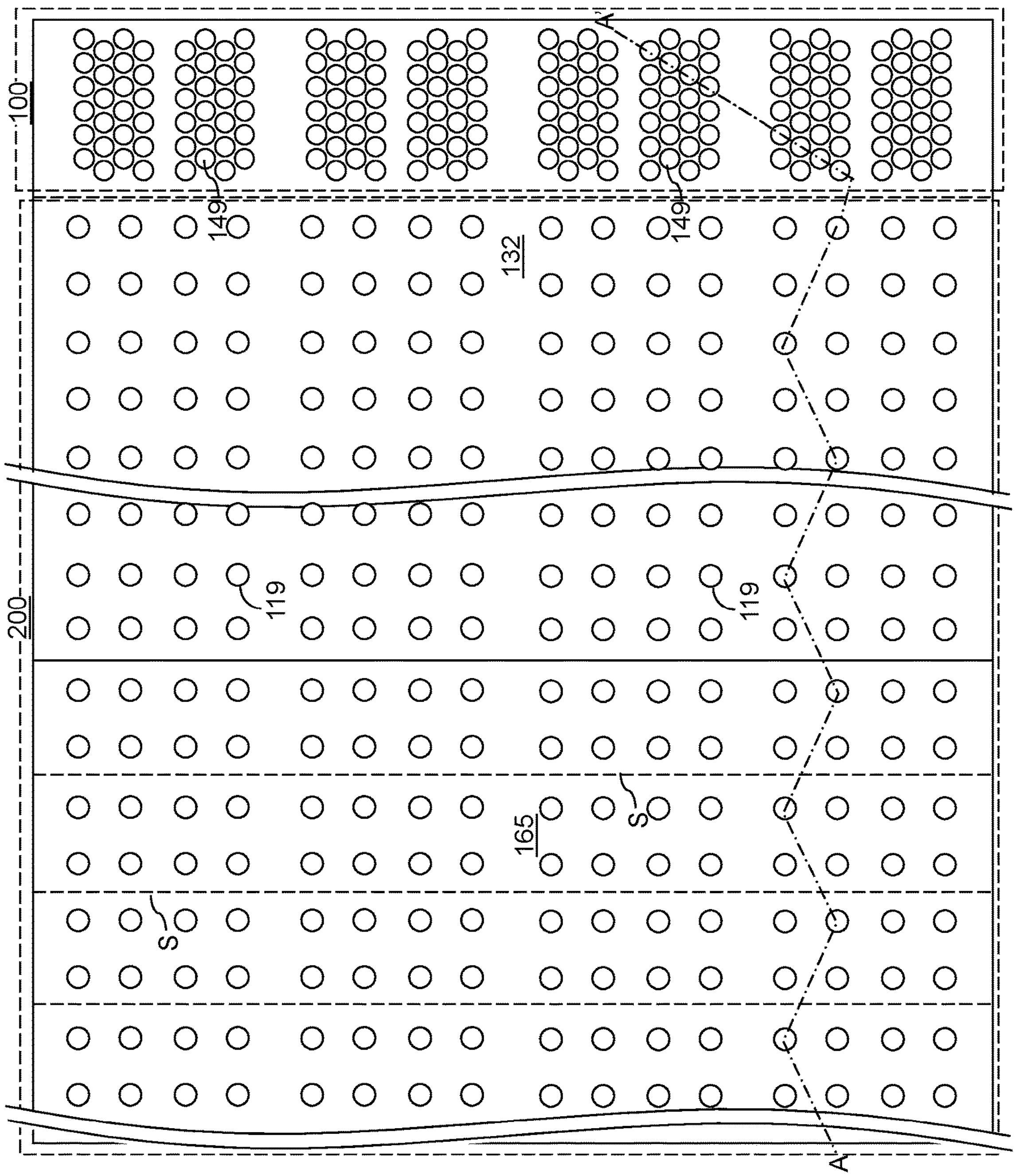
FIG. 4B is a horizontal cross-sectional view of the first exemplary structure along the horizontal plane B-B' in FIG. 4A. The zig-zag vertical plane A-A' corresponds to the plane of the vertical cross-sectional view of FIG. 4A.

Referring to FIGS. 4A and 4B, an inter-tier dielectric layer 180 may be optionally deposited over the first-tier structure (132, 142, 165, 170). The inter-tier dielectric layer 180 includes a dielectric material such as silicon oxide. The thickness of the inter-tier dielectric layer 180 can be in a range from 30 nm to 300 nm, although lesser and greater thicknesses can also be employed. Locations of steps S in the first-tier alternating stack (132, 142) are illustrated as dotted lines.

First-tier memory openings 149 and first-tier support openings 119 can be formed. The first-tier memory openings 149 and the first-tier support openings 119 extend through the first-tier alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line contact region 200. For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first-tier alternating stack (132, 142) by at least one anisotropic etch that employs the patterned lithographic material stack as an etch mask. Portions of the first insulating cap layer 170 (and the optional inter-tier dielectric layer 180), and the first-tier alternating stack (132, 142) underlying the openings in the patterned lithographic material stack are etched to form the first-tier memory openings 149 and the first-tier support openings 119. In other words, the transfer of the pattern in the patterned lithographic material stack through the first insulating cap layer 170 and the first-tier alternating stack (132, 142) forms the first-tier memory openings 149 and the first-tier support openings 119.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 and the support openings 119 can be substantially vertical, or can be tapered. Subsequently, the patterned lithographic material stack can be subsequently removed, for example, by ashing.

Optionally, the portions of the first-tier memory openings 149 and the first-tier support openings 119 at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. The portions of the first-tier memory openings 149 (and the first-tier support openings 119) located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
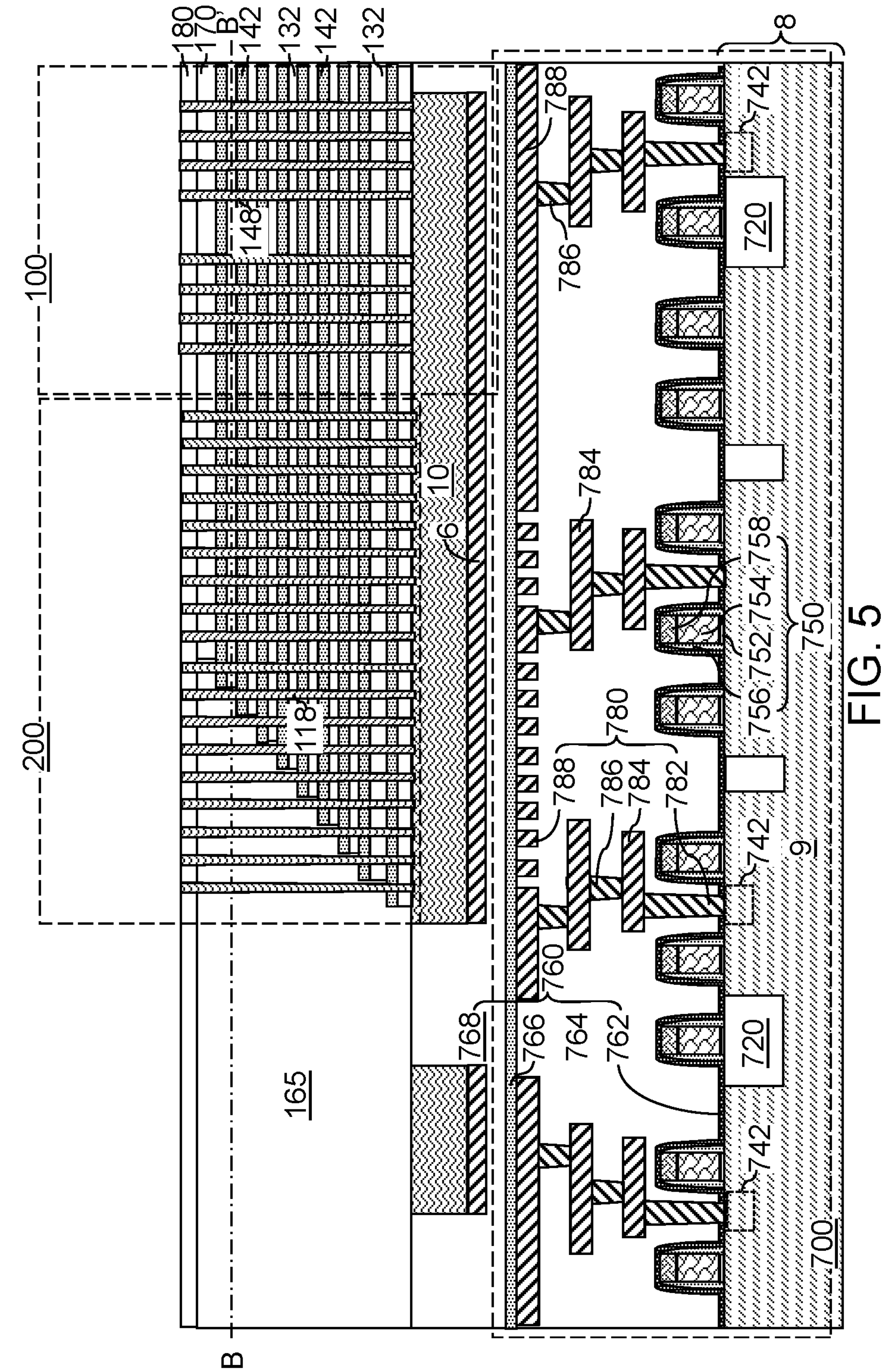
FIG. 5 is a vertical cross-sectional view of the first exemplary structure after formation of sacrificial memory opening fill portions and sacrificial support opening fill portions according to an embodiment of the present disclosure.

Referring to FIG. 5, sacrificial memory opening fill portions 148 can be formed in the first-tier memory openings 149, and sacrificial support opening fill portions 118 can be formed in the first-tier support openings 119. For example, a sacrificial fill material layer is deposited in the first-tier memory openings 149 and the first-tier support openings 119. The sacrificial fill material layer includes a sacrificial material which can be subsequently removed selective to the materials of the first insulator layers 132 and the first sacrificial material layers 142. In one embodiment, the sacrificial fill material layer can include germanium, a silicon-germanium alloy, carbon, borosilicate glass (which provides higher etch rate relative to undoped silicate glass), porous or non-porous organosilicate glass, organic polymer, or inorganic polymer. Optionally, a thin etch stop layer (such as a silicon oxide layer having a thickness in a range from 1 nm to 3 nm) may be employed prior to depositing the sacrificial fill material layer. If an etch stop layer is employed, semiconductor materials such as amorphous silicon may be employed as the sacrificial fill material. The sacrificial fill material layer may be formed by a non-conformal deposition or a conformal deposition method.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating layer 170 (and optionally layer 180 if present) can be employed as an etch stop layer or a planarization stop layer. Each remaining portion of the sacrificial material in a first-tier memory opening 149 constitutes a sacrificial memory opening fill portion 148. Each remaining portion of the sacrificial material in a first-tier support opening 119 constitutes a sacrificial support opening fill portion 118. The top surfaces of the sacrificial memory opening fill portions 148 and the sacrificial support opening fill portions 118 can be coplanar with the top surface of the inter-tier dielectric layer 180 (or the first insulating cap layer 170 if the inter-tier dielectric layer 180 is not present). The sacrificial memory opening fill portion 148 and the sacrificial support opening fill portions 118 may, or may not, include cavities therein.

Figure 6:
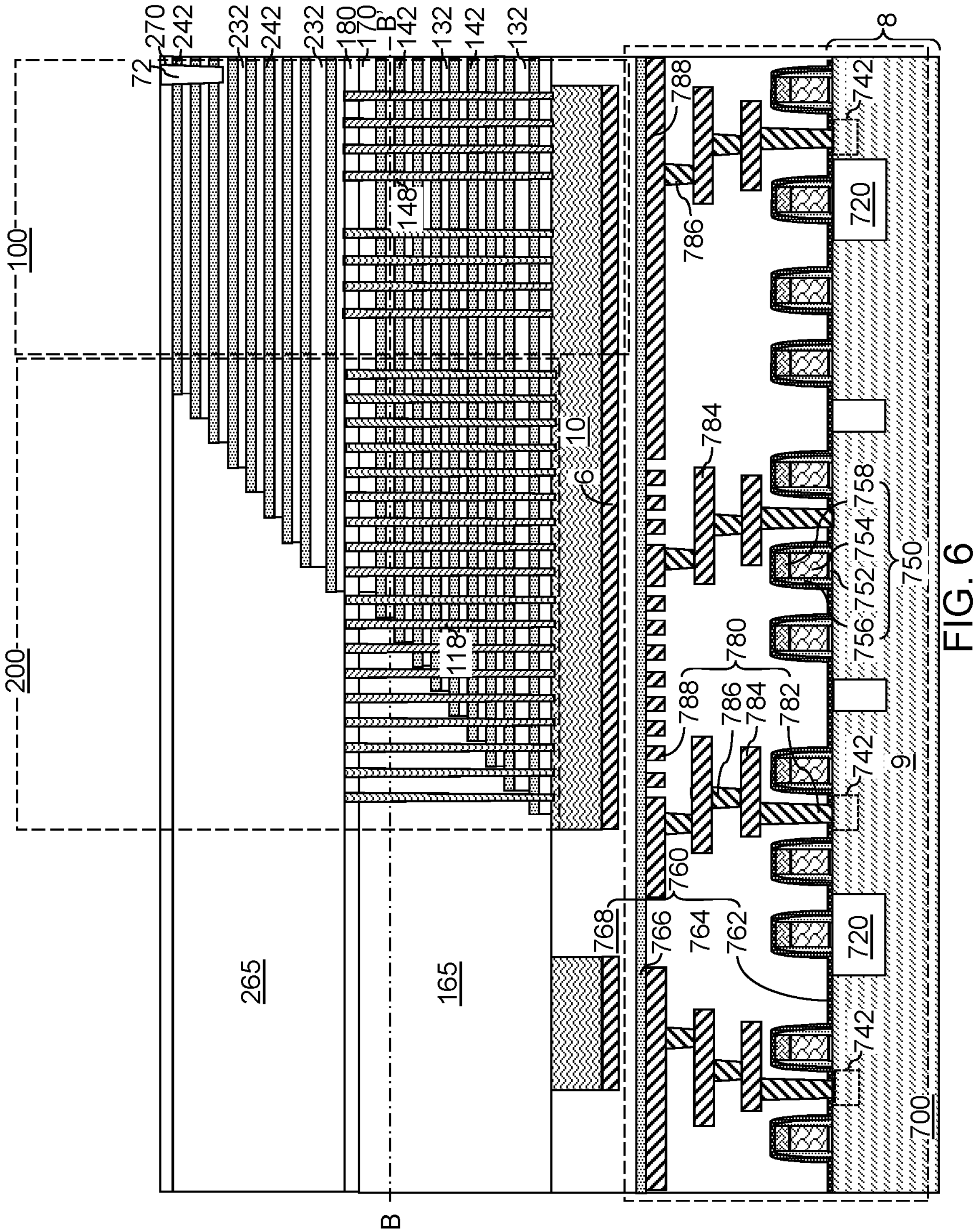
FIG. 6 is a vertical cross-sectional view of the first exemplary structure after formation of a second-tier alternating stack of second insulating layers and second spacer material layers, a second-tier retro-stepped dielectric material portion, and a second insulating cap layer according to an embodiment of the present disclosure.

Referring to FIG. 6, a second-tier structure can be formed over the first-tier structure (132, 142, 170, 148, 118). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the word line contact region 200 employing a same set of processing steps as the processing steps employed to form the first stepped surfaces in the first stepped area with suitable adjustment to the pattern of at least one masking layer. A second-tier retro-stepped dielectric material portion 265 can be formed over the second stepped surfaces in the word line contact region 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level shallow trench isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Figure 7A:
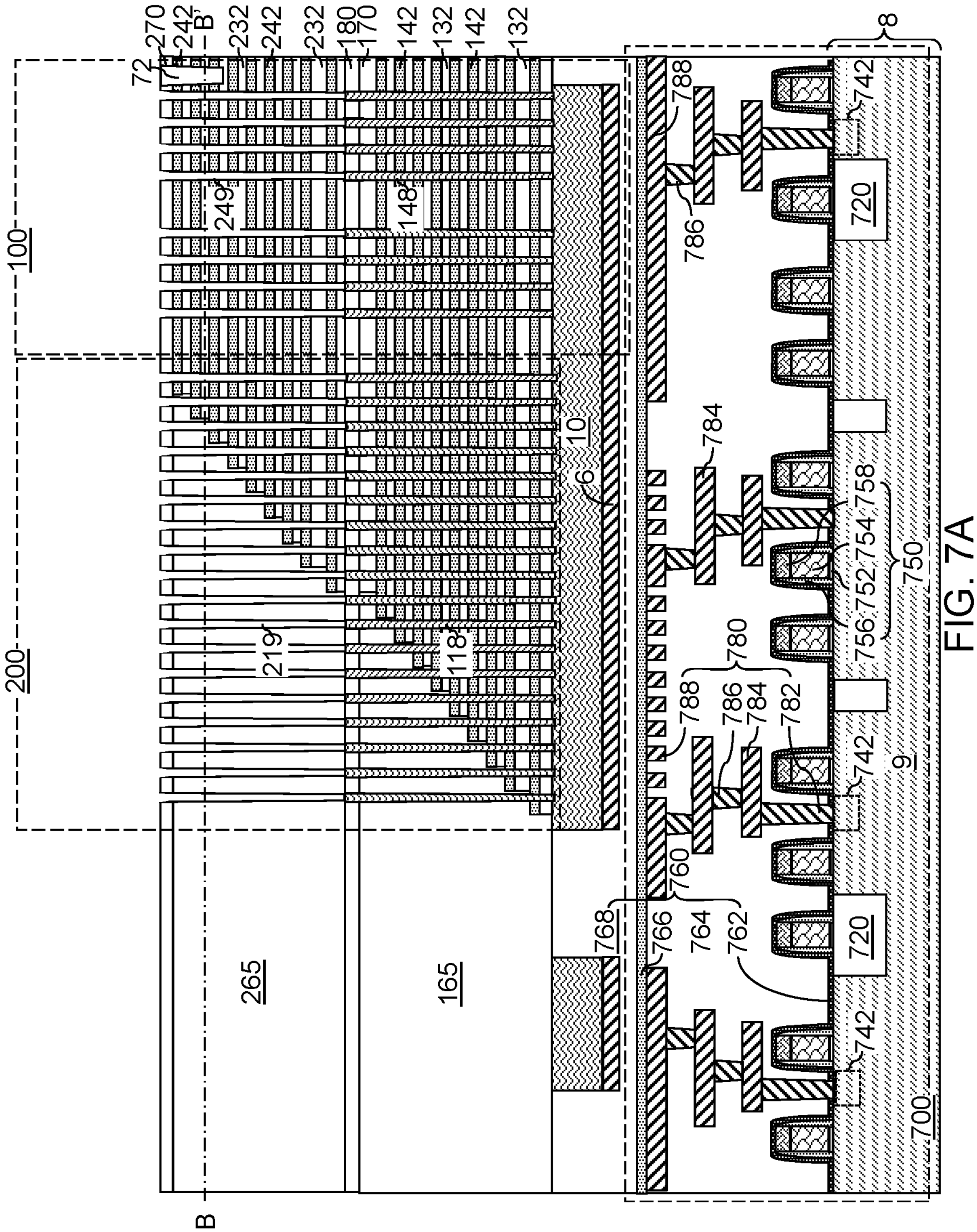
FIG. 7A is a vertical cross-sectional view of the first exemplary structure after formation of inter-tier memory openings and inter-tier support openings according to an embodiment of the present disclosure.
Figure 7B:
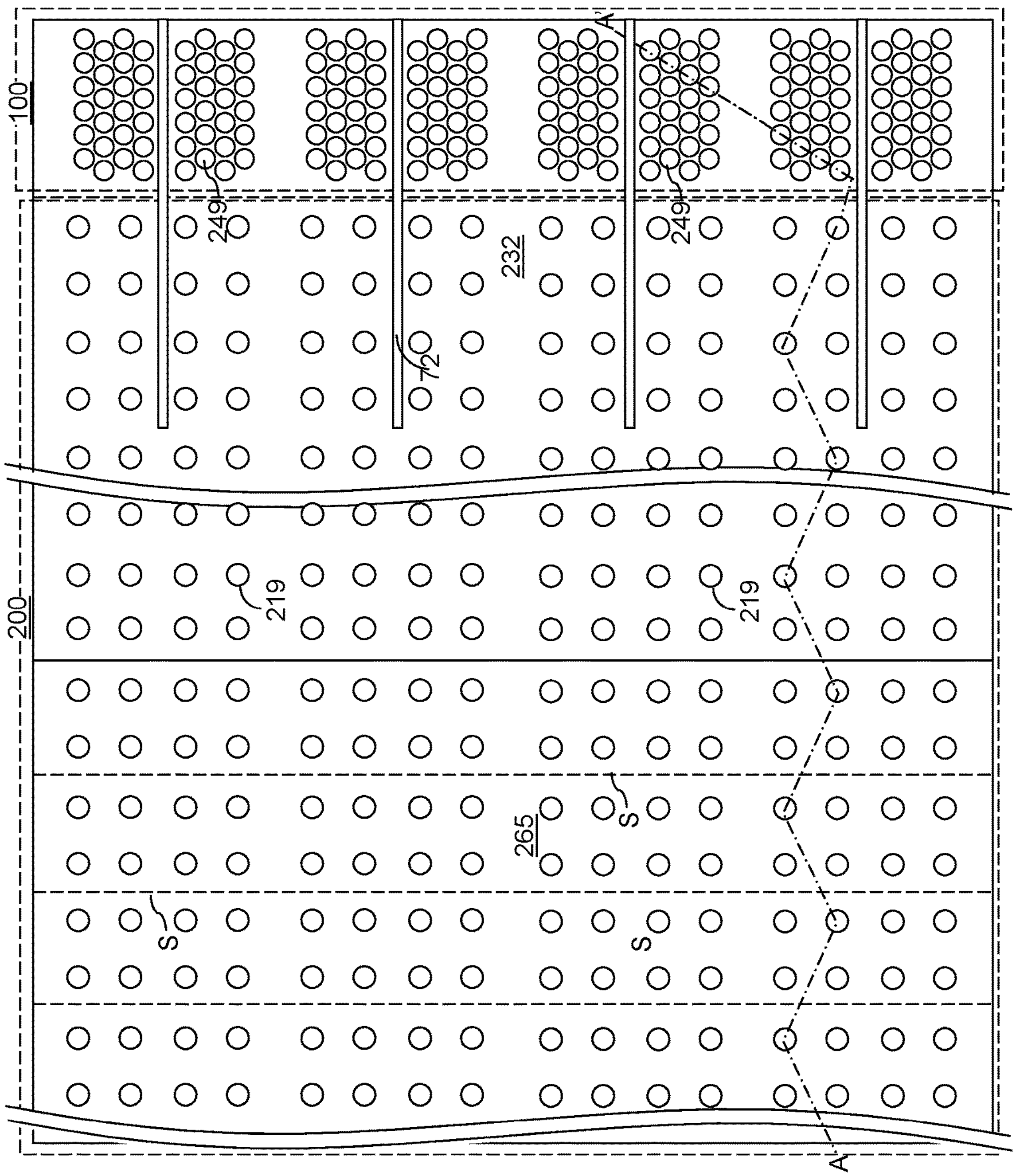
FIG. 7B is a horizontal cross-sectional view of the first exemplary structure along the horizontal plane B-B' in FIG. 7A. The zig-zag vertical plane A-A' corresponds to the plane of the vertical cross-sectional view of FIG. 7A.

Referring to FIGS. 7A and 7B, second-tier memory openings 249 and second-tier support openings 219 extending through the second-tier structure (232, 242, 270, 265) are formed in areas overlying the sacrificial memory opening fill portions 148. A photoresist layer can be applied over the second-tier structure (232, 242, 270, 265), and can be lithographically patterned to form a same pattern as the pattern of the sacrificial memory opening fill portions 148 and the sacrificial support opening fill portions 118, i.e., the pattern of the first-tier memory openings 149 and the first-tier support openings 119. Thus, the lithographic mask employed to pattern the first-tier memory openings 149 and the first-tier support openings 119 can be employed to pattern the second-tier memory openings 249 and the second-tier support openings 219. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying sacrificial support opening fill portion 118 can be physically exposed at the bottom of each second-tier support opening 219. After the top surfaces of the sacrificial memory opening fill portions 148 and the sacrificial support opening fill portions 118 are physically exposed, an etch process can be performed, which removes the sacrificial material of the sacrificial memory opening fill portions 148 and the sacrificial support opening fill portions 118 selective to the materials of the second-tier alternating stack (232, 242) and the first-tier alternating stack (132, 142) (e.g., $C_4F_8/O_2/Ar$ etch).

Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). Likewise, upon removal of the sacrificial support opening fill portions 118, each vertically adjoining pair of a second-tier support opening 219 and a first-tier support opening 119 forms a continuous cavity that extends through the first-tier alternating stack (132, 142) and the second-tier alternating stack (232, 242). The continuous cavities are herein referred to as memory openings (or inter-tier memory openings) and support openings (or inter-tier support openings), respectively. A top surface of the planar semiconductor material layer 10 can be physically exposed at the bottom of each memory opening and at the bottom of each support openings. Locations of steps S in the first-tier alternating stack (132, 142) and the second-tier alternating stack (232, 242) are illustrated as dotted lines.

Figure 8:
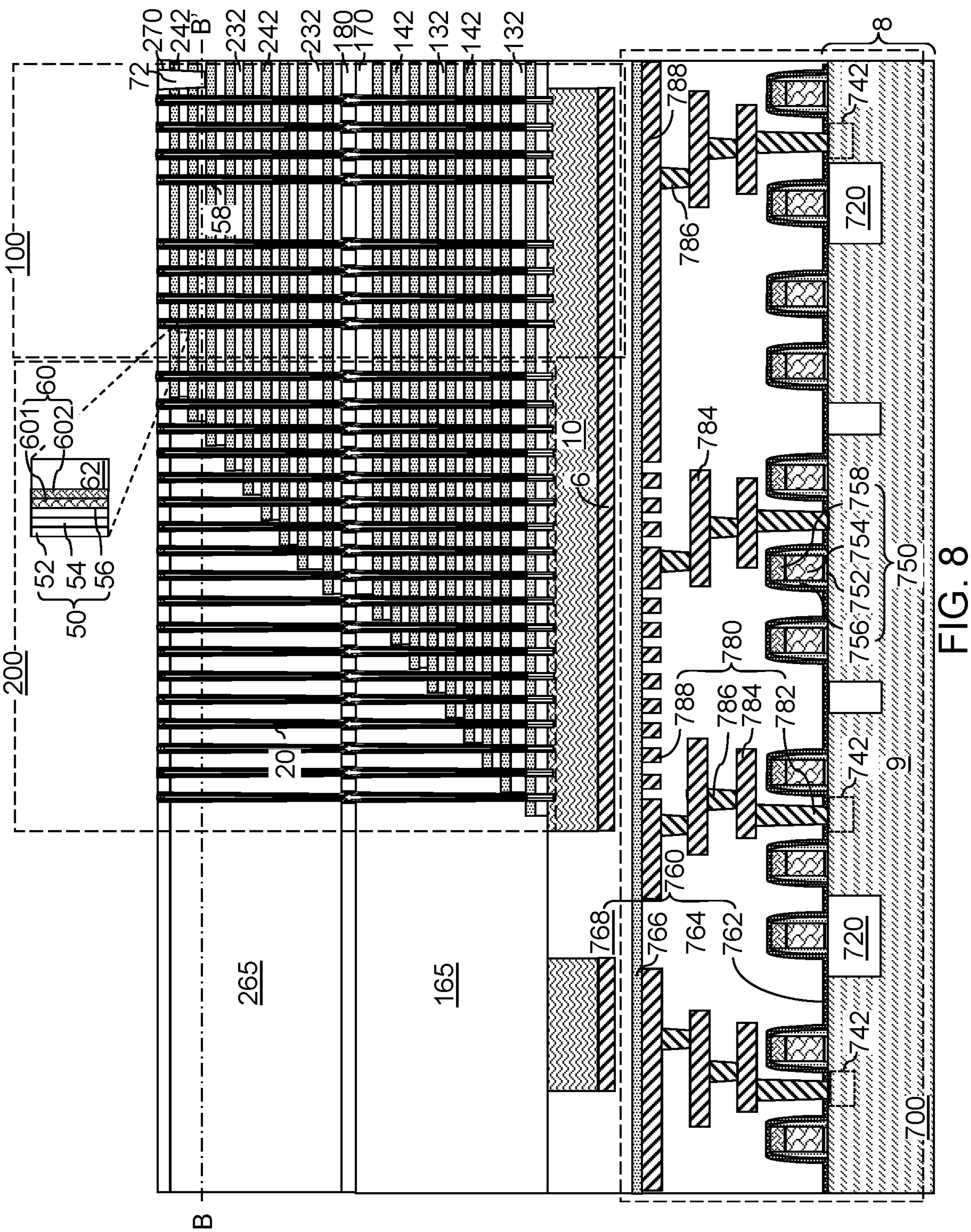
FIG. 8 is a vertical cross-sectional view of the first exemplary structure after formation of memory stack structures according to an embodiment of the present disclosure.

Referring to FIG. 8, memory opening fill structures 58 are formed within each memory opening, and support pillar structures 20 are formed within each support opening. The memory opening fill structures 58 and the support pillar structures 20 can include a same set of components, and can be formed simultaneously.

FIGS. 9A-9H provide sequential cross-sectional views of a memory opening 49 or a support opening (119, 219) during formation of a memory opening fill structure 58 or a support pillar structure 20. While a structural change in a memory opening 49 is illustrated in FIGS. 9A-9H, it is understood that the same structural change occurs in each memory openings 49 and in each of the support openings (119, 219) during the same set of processing steps.

Figure 9B:
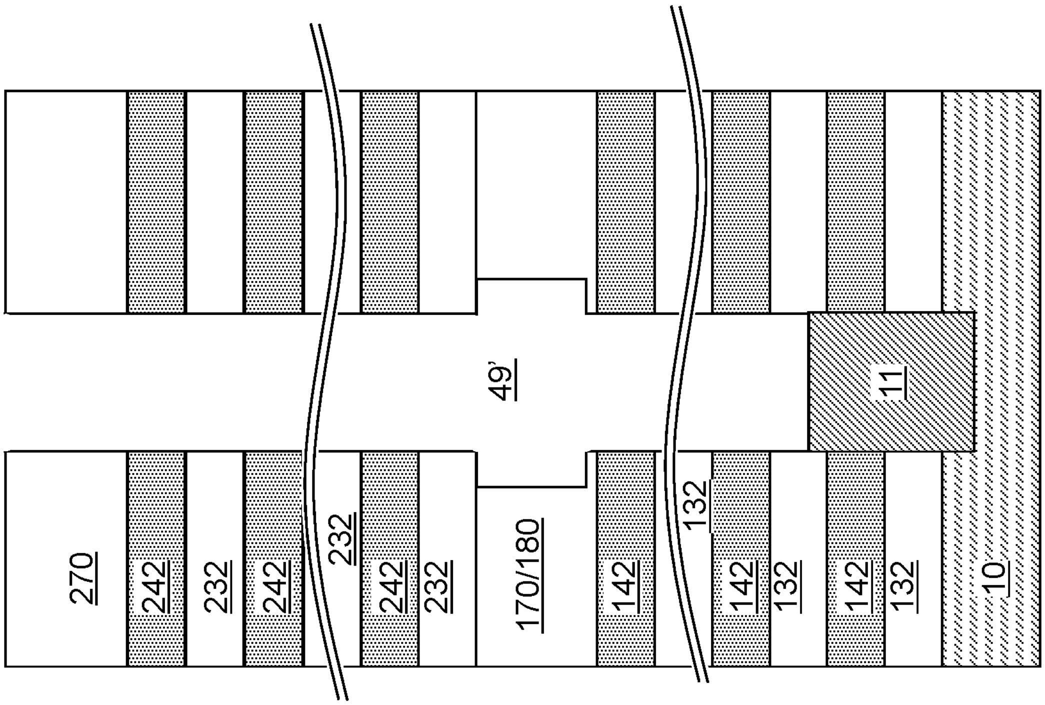
FIGS. 9A-9H are sequential vertical cross-sectional views of an inter-tier memory opening during formation of a pillar channel portion, a memory stack structure, a dielectric core, and a drain region according to an embodiment of the present disclosure.
Figure 9A:
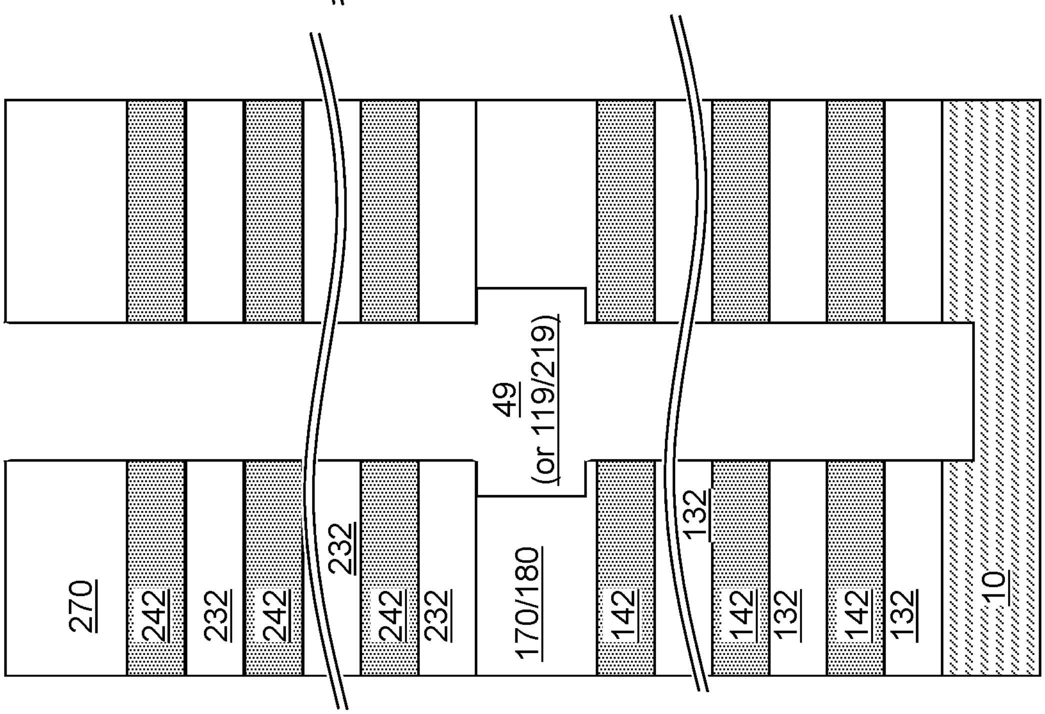
Figure 14:
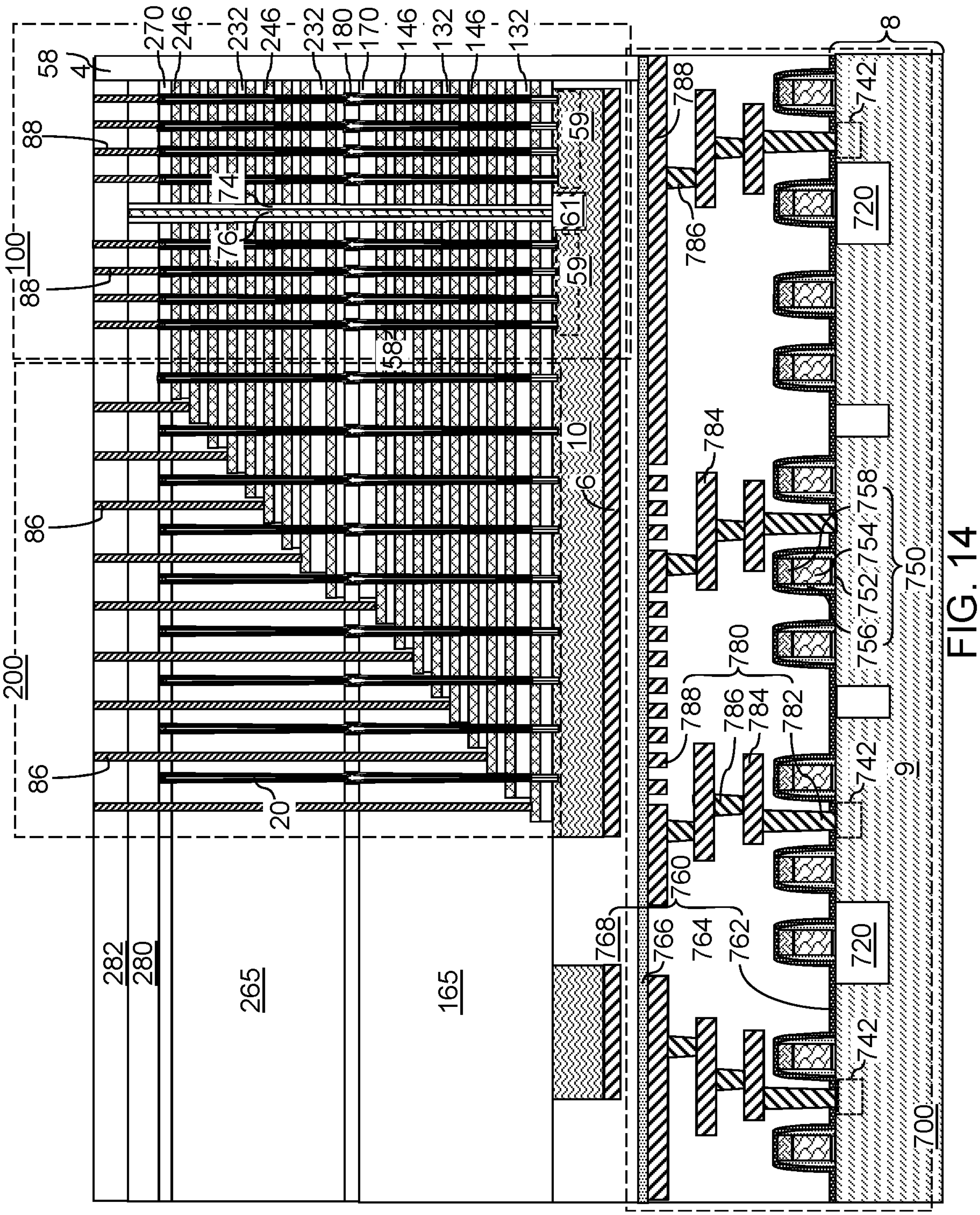
FIG. 14 is a vertical cross-sectional view of the first exemplary structure after formation of drain contact via structures and word line contact via structures according to an embodiment of the present disclosure.

Referring to FIG. 9A, a memory opening 49 in the exemplary device structure of FIG. 14 is illustrated. The memory opening 49 extends through the first-tier structure and the second-tier structure. Likewise, each support opening (119, 219) extends through the first-tier structure and the second-tier structure.

Referring to FIG. 9B, an optional pedestal channel portion (e.g., an epitaxial pedestal) 11 can be formed at the bottom portion of each memory opening 49 and each support openings (119, 219), for example, by a selective semiconductor deposition process. In one embodiment, the pedestal channel portion 11 can be doped with electrical dopants of the same conductivity type as the planar semiconductor material layer 10. In one embodiment, at least one source select gate electrode can be subsequently formed by replacing each sacrificial material layer 42 located below the horizontal plane including the top surfaces of the pedestal channel portions 11 with a respective conductive material layer. A cavity 49' is present in the unfilled portion of the memory opening 49 (or of the support opening) above the pedestal channel portion 11. In one embodiment, the pedestal channel portion 11 can comprise single crystalline silicon. In one embodiment, the pedestal channel portion 11 can have a doping of the same as the conductivity type of the planar semiconductor material layer 10.

Figure 9D:
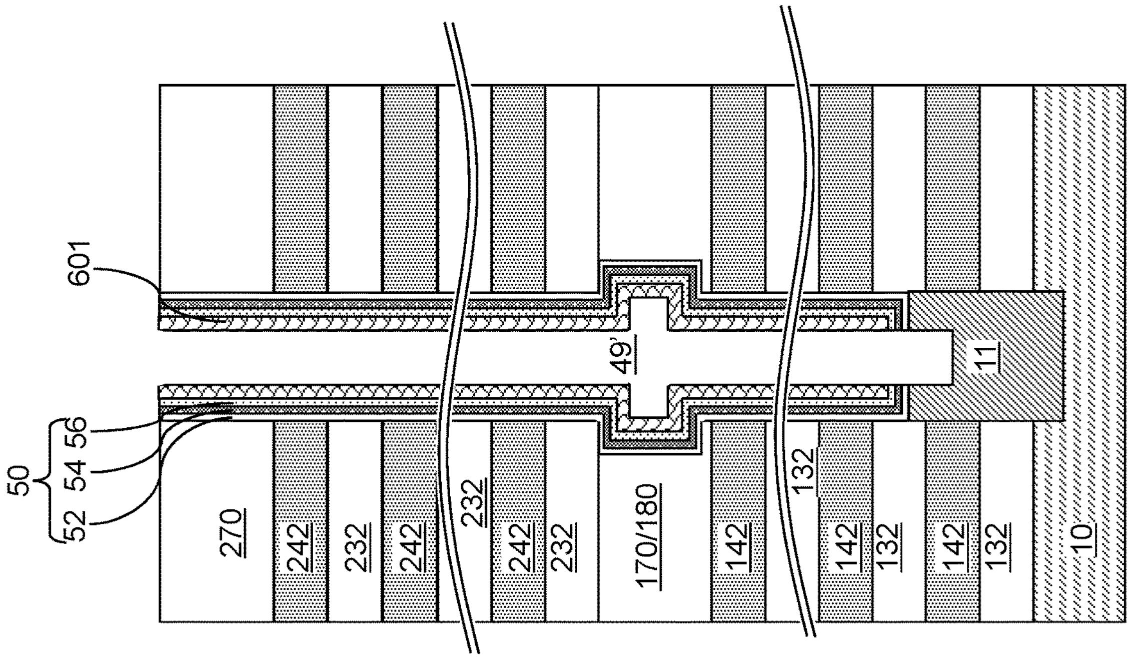
Figure 9C:
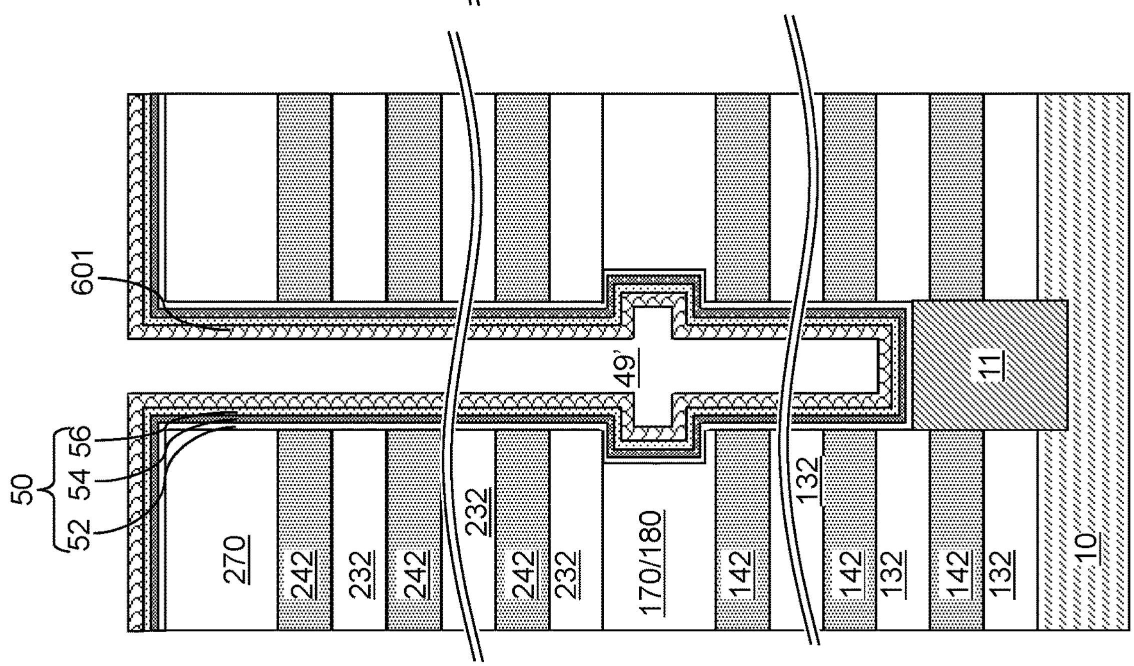

Referring to FIG. 9C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 9D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the planar semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 9F:
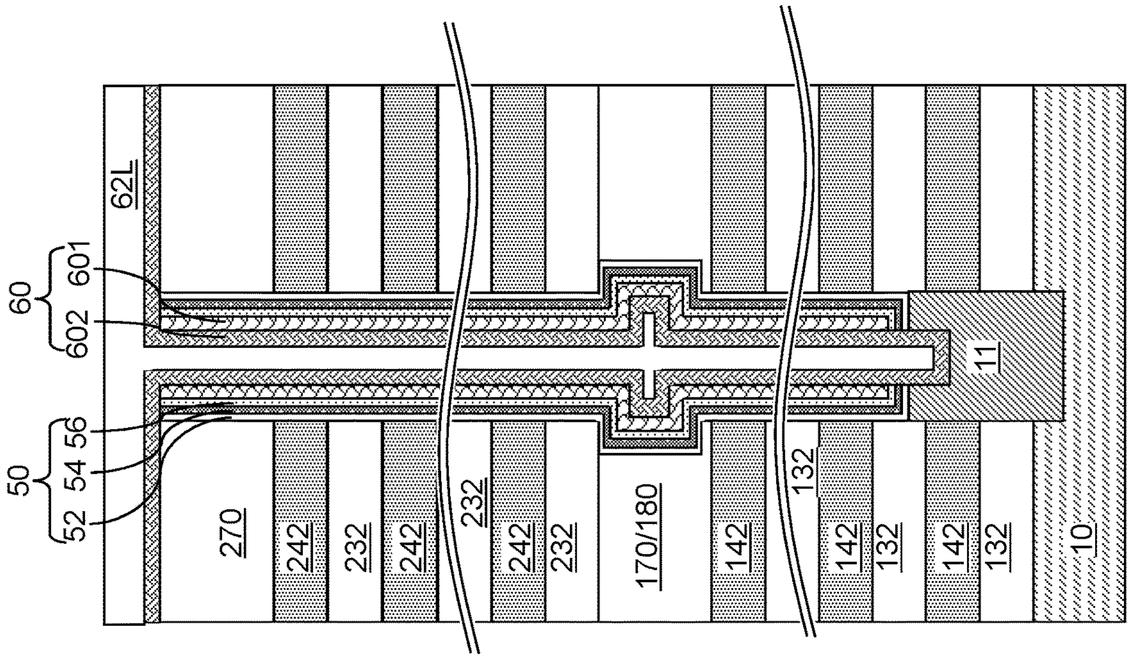
Figure 9E:
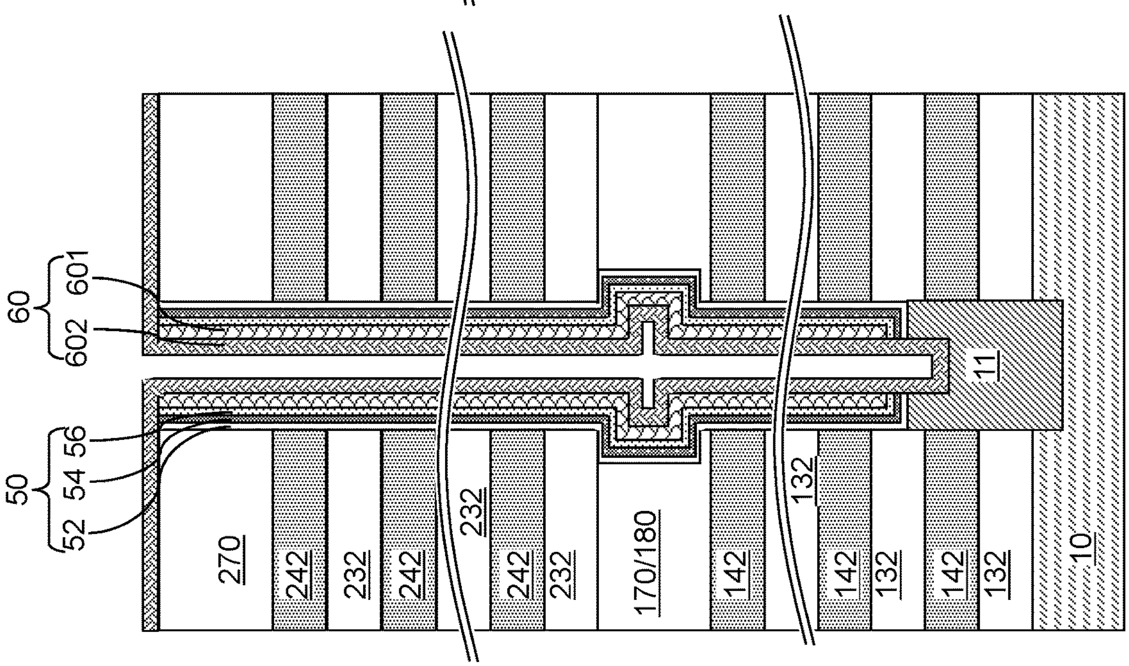

Referring to FIG. 9E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 9F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 9H:
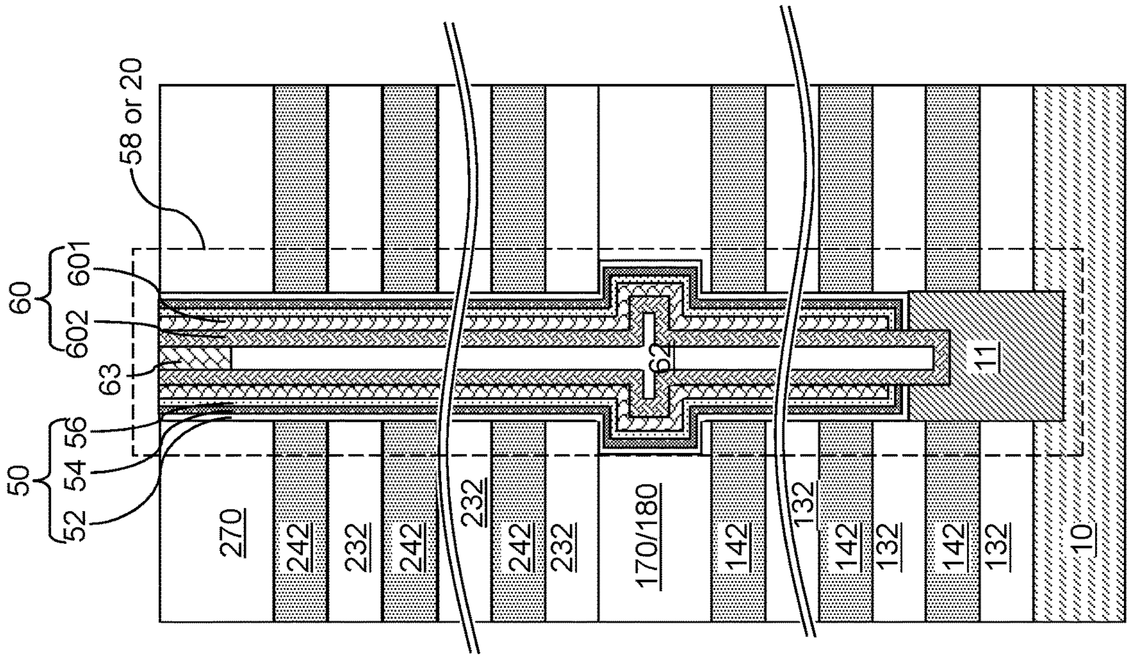
Figure 9G:
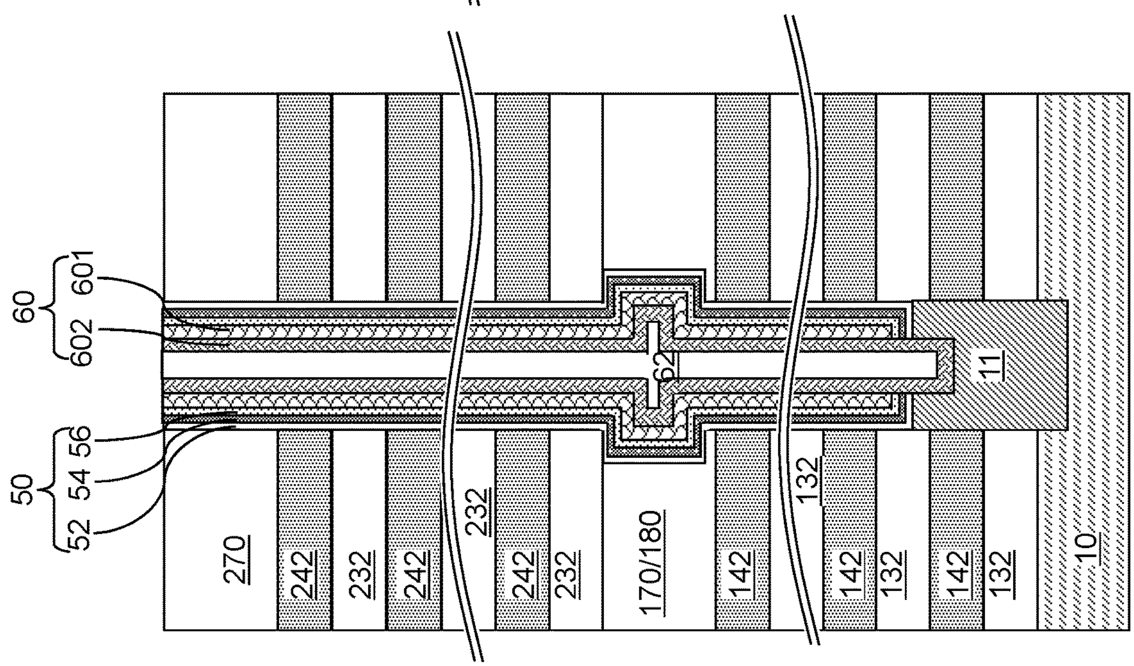

Referring to FIG. 9G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can employ a recess etch or chemical mechanical planarization (CMP). Each remaining portion of the second semiconductor channel layer 602 can be located entirety within a memory opening 49 or entirely within a support opening (119, 219).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 9H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening (119, 219) fills the respective support openings (119, 219), and constitutes a support pillar structure 20.

The first-tier structure (132, 142, 170, 165), the second-tier structure (232, 242, 270, 265), the inter-tier dielectric layer 180, the memory opening fill structures 58, and the support pillar structures 20 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Figure 10A:
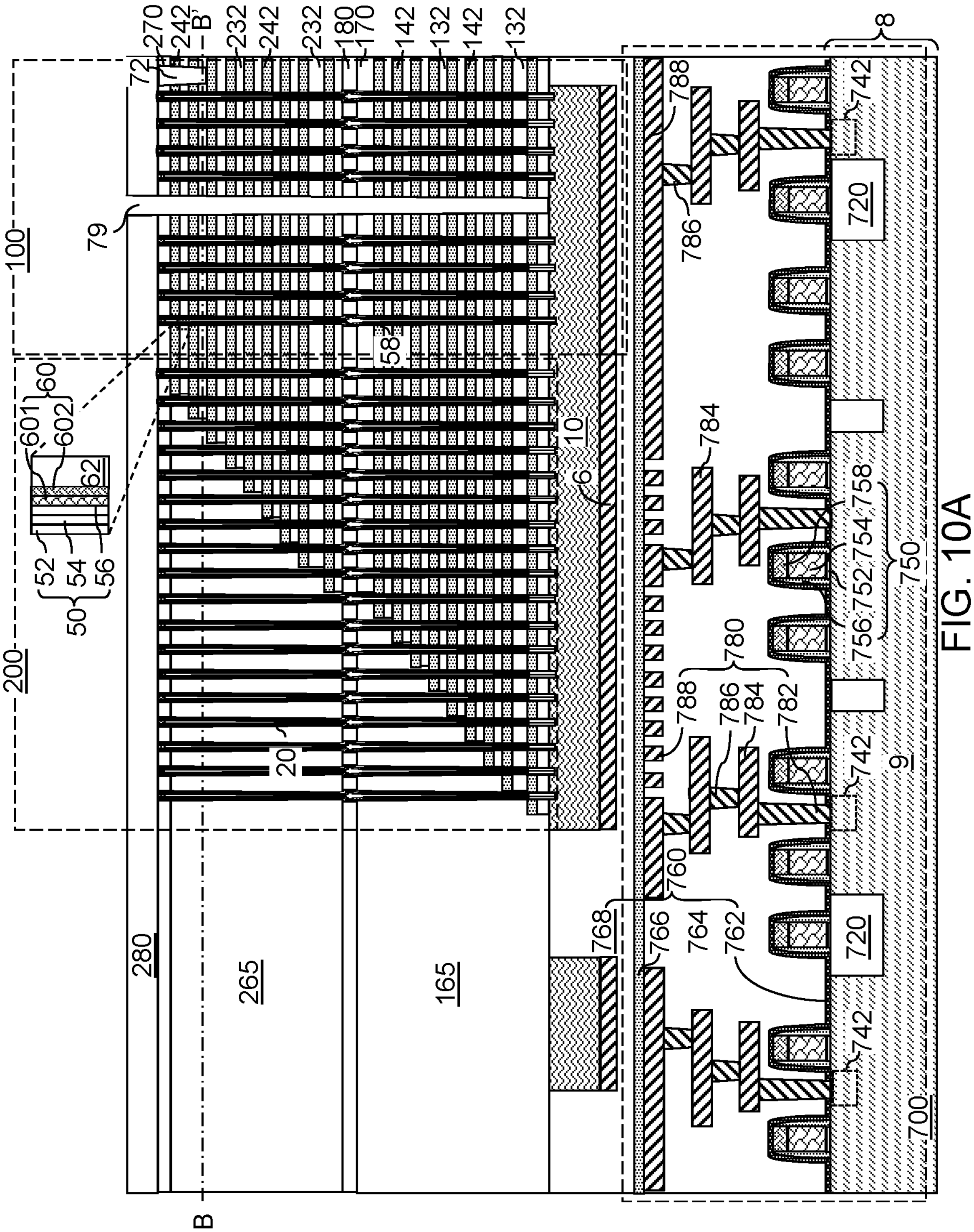
FIG. 10A is a vertical cross-sectional view of the first exemplary structure after formation of first through-stack via cavities according to an embodiment of the present disclosure.
Figure 10B:
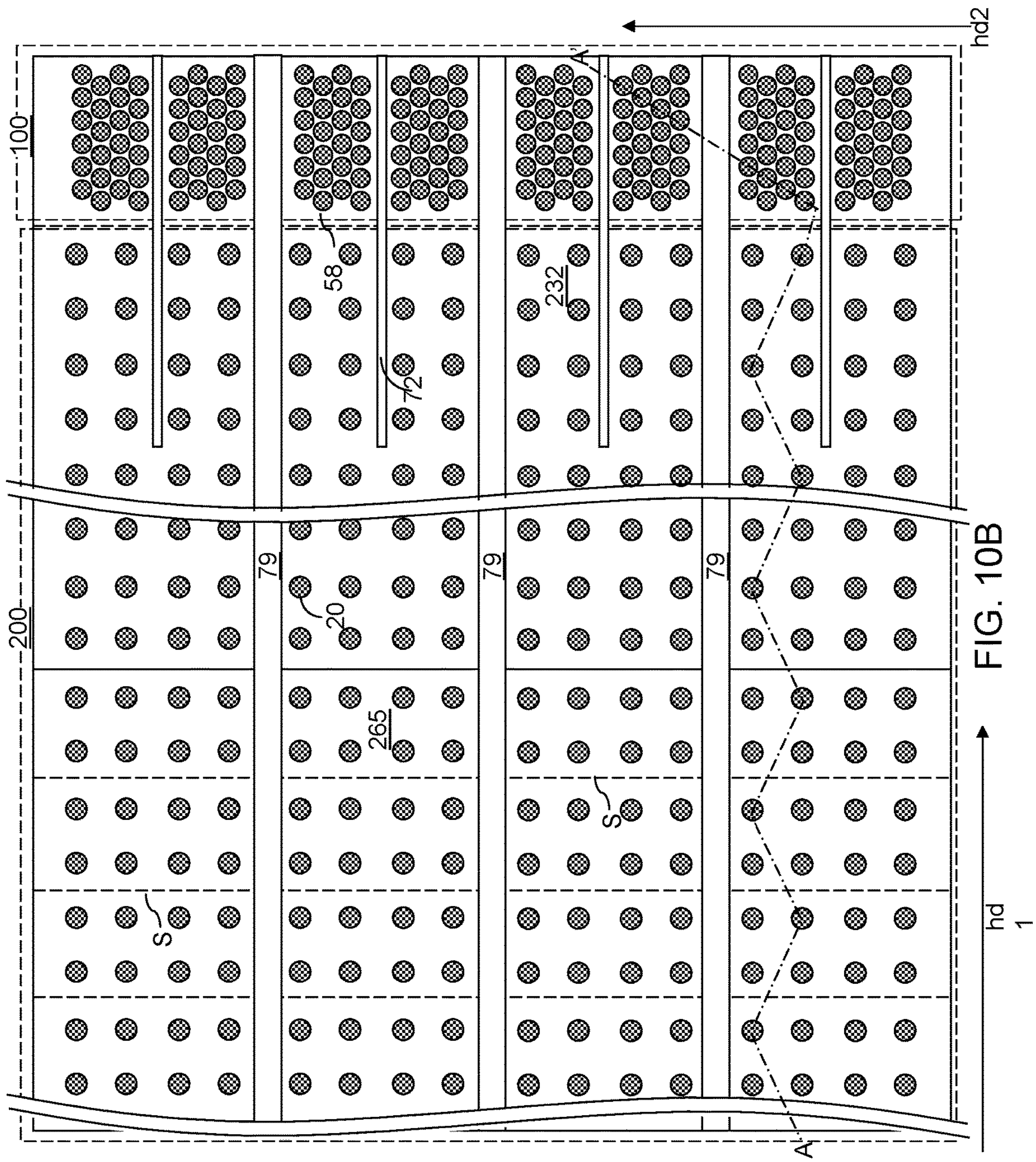
FIG. 10B is a horizontal cross-sectional view of the first exemplary structure along the horizontal plane B-B' in FIG. 10A. The zig-zag vertical plane A-A' corresponds to the plane of the vertical cross-sectional view of FIG. 10A.

Referring to FIGS. 10A and 10B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Figure 13A:
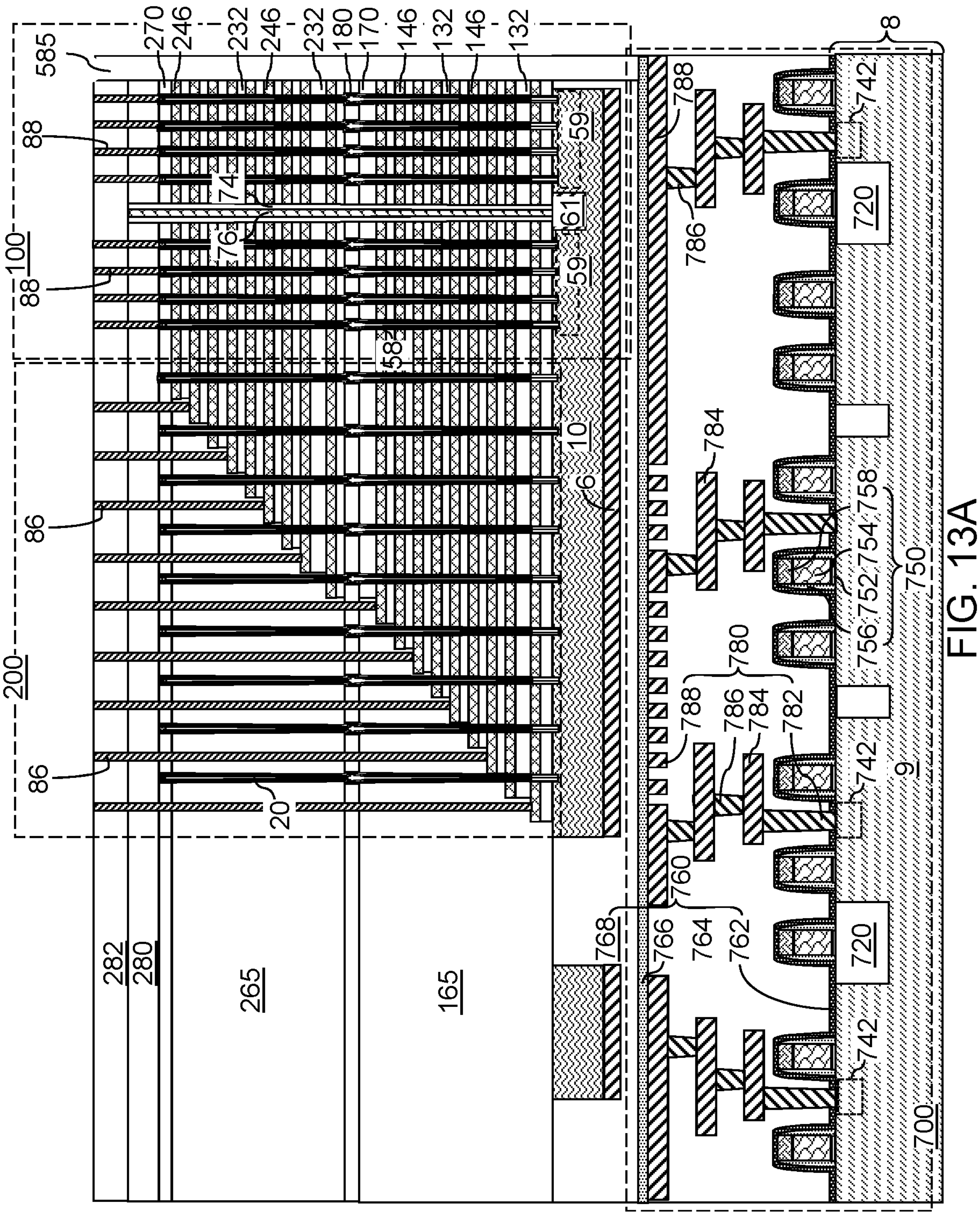
FIG. 13A is a vertical cross-sectional view of the first exemplary structure after replacement of sacrificial material layers with electrically conductive layers and formation of insulating spacers and backside contact via structures according to an embodiment of the present disclosure.
Figure 13B:
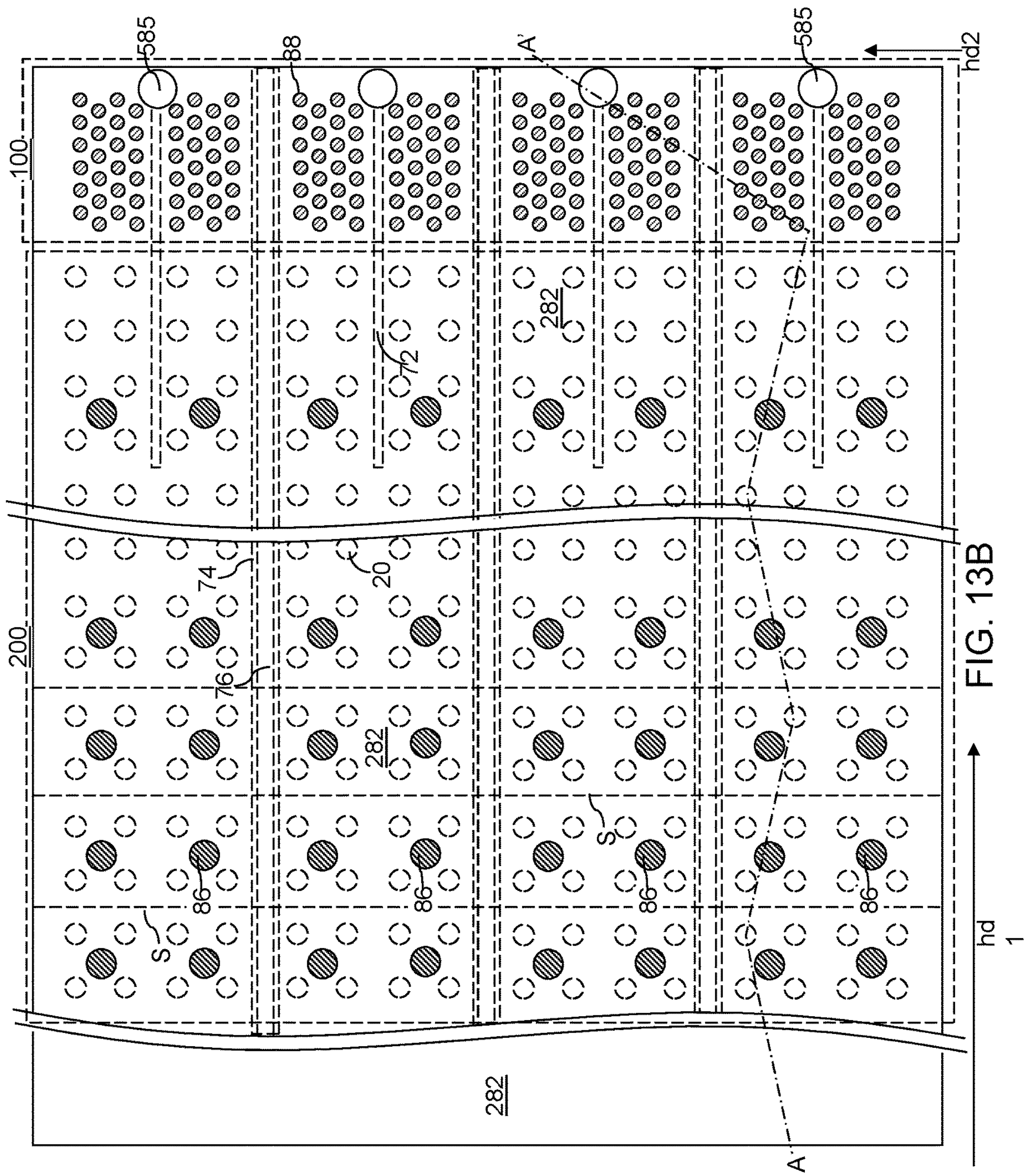
FIG. 13B is a horizontal cross-sectional view of the first exemplary structure along the horizontal plane B-B' in FIG. 13A. The zig-zag vertical plane A-A' corresponds to the plane of the vertical cross-sectional view of FIG. 13A.

Referring to FIGS. 13A and 13B, first through-stack via cavities 585 can be formed with the memory array region 100, for example, by applying and patterning of a photoresist layer to form openings therein, and by anisotropically etching the portions of the first contact level dielectric layer 280, the alternating stacks (132, 146, 232, 246), and the at least one second dielectric material layer 768 that underlie the openings in the photoresist layer. In one embodiment, each of the first through-stack via cavities 585 can be formed within a respective three-dimensional memory array so that each first through-stack via cavities 585 is laterally surrounded by memory opening fill structures 58. In one embodiment, one or more of the first through-stack via cavities 585 can be formed through the drain-select-level shallow trench isolation structures 72, as shown in FIG. 10B. However, other locations may also be selected. In one embodiment, the first-through-stack via cavities 585 can be formed within areas of openings in the planar semiconductor material layer 10 and the optional planar conductive material layer 6. The bottom surface of each first through-stack via cavity 585 can be formed at, or above, the silicon nitride layer 766. In one embodiment, the silicon nitride layer 766 can be employed as an etch stop layer during the anisotropic etch process that forms the first through-stack via cavities. In this case, the bottom surface of each first through-stack via cavity 585 can be formed at the silicon nitride layer 766, and the silicon nitride layer 766 can be physically exposed at the bottom of each first through-stack via cavity 585. In an alternative embodiment described below with respect to FIG. 21, the bottom surface of each first through-stack via cavity 585 can be located above the silicon nitride layer 766 and the silicon nitride layer 766 is not exposed in the cavity 585. Sidewalls of all layers within the alternating stacks (132, 146, 232, 246) can be physically exposed inside each first through-stack via cavity 585. The photoresist layer can be subsequently removed, for example, by ashing.

Referring to FIG. 11, a dielectric material is deposited in the first through-stack via cavities 585. The dielectric material can include a silicon-oxide based material such as undoped silicate glass, doped silicate glass, or a flowable oxide material. The dielectric material can be deposited by a conformal deposition method such as chemical vapor deposition or spin coating. A void may be formed within an unfilled portion of each first through-stack via cavity 585. Excess portion of the deposited dielectric material may be removed from above a horizontal plane including the top surface of the first contact level dielectric layer 280, for example, by chemical mechanical planarization or a recess etch. Each remaining dielectric material portion filling a respective one of the first through-stack via cavity 585 constitutes a through-stack insulating material portion 584. The through-stack insulating material portions 584 contact sidewalls of the alternating stacks (132, 146, 232, 246), and may contact the silicon nitride layer 766.

Figure 12A:
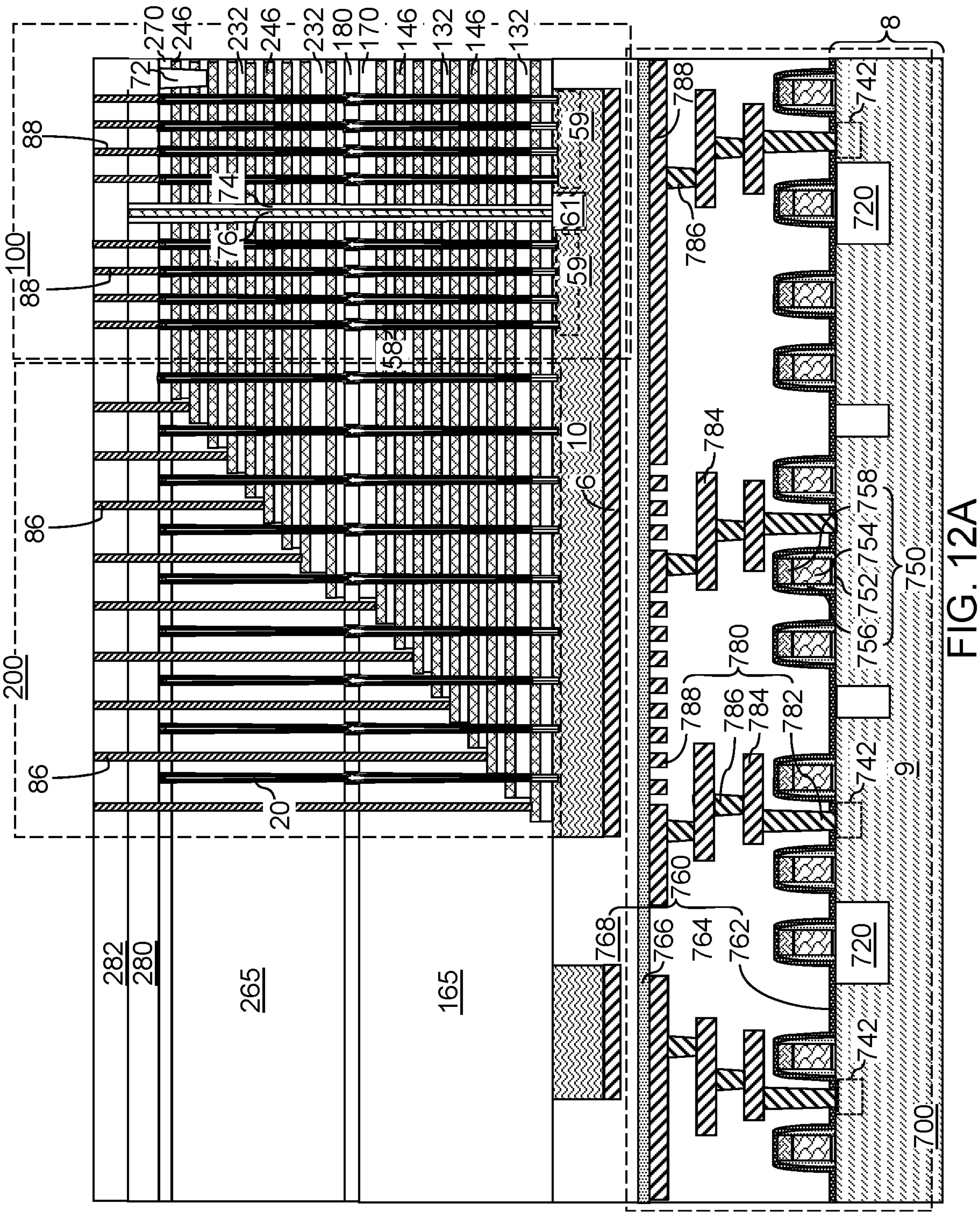
FIG. 12A is a vertical cross-sectional view of the first exemplary structure after formation of backside contact trenches according to an embodiment of the present disclosure.
Figure 12B:
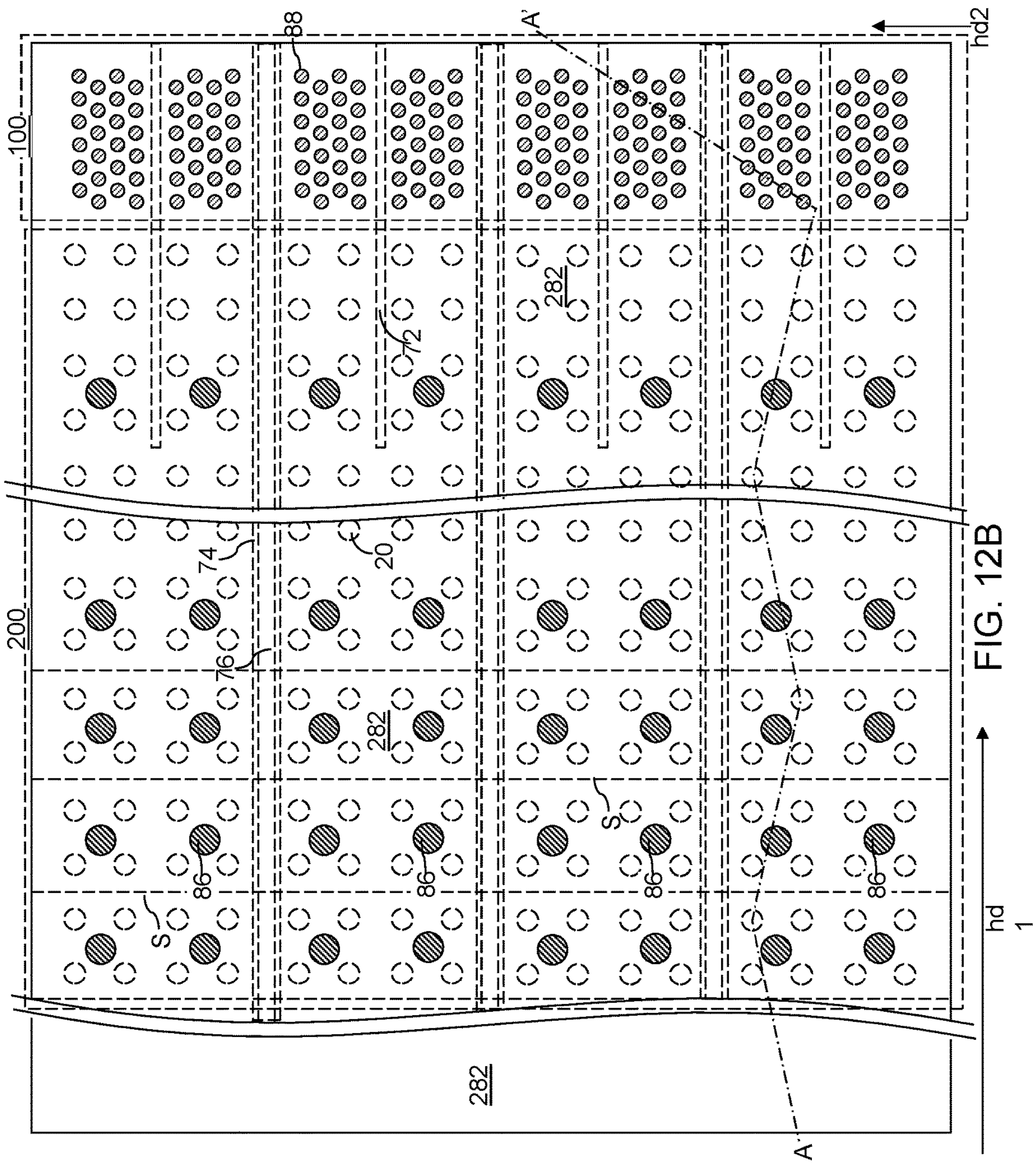
FIG. 12B is a horizontal cross-sectional view of the first exemplary structure along the horizontal plane B-B' in FIG. 12A. The zig-zag vertical plane A-A' corresponds to the plane of the vertical cross-sectional view of FIG. 12A.

Referring to FIGS. 12A and 12B, backside contact trenches 79 are subsequently formed through the first contact level dielectric layer 280 and the memory-level assembly. For example, a photoresist layer can be applied and lithographically patterned over the first contact level dielectric layer 280 to form elongated openings that extend along a first horizontal direction hd1. An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 can be laterally spaced among one another along a second horizontal direction hd2, which can be perpendicular to the first horizontal direction hd1. The backside contact trenches 79 can extend through the memory array region (e.g., a memory plane) 100 and the word line contact region 200. The fist subset of the backside contact trenches 79 laterally divides the memory-level assembly (e.g., into memory blocks).

Referring to FIGS. 13A and 13B, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, employing an isotropic etch process. First backside recesses are formed in volumes from which the first sacrificial material layers 142 are removed. Second backside recesses are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside contact trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HC1) may be employed.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate 9. A backside recess can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second sacrificial material layers (142, 242). Further, a top surface of the planar semiconductor material layer 10 can be physically exposed at the bottom of each backside contact trench 79. An annular dielectric spacer (not shown) can be formed around each pedestal channel portion 11 by oxidation of a physically exposed peripheral portion of the pedestal channel portions 11. Further, a semiconductor oxide potion (not shown) can be formed from each physically exposed surface portion of the planar semiconductor material layer 10 concurrently with formation of the annular dielectric spacers.

A backside blocking dielectric layer (not shown) can be optionally deposited in the backside recesses and the backside contact trenches 79 and over the first contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside contact trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside contact trench 79 and over the first contact level dielectric layer 280. Thus, the first and second sacrificial material layers (142, 242) can be replaced with the first and second conductive material layers (146, 246), respectively.

Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of the first electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the planar semiconductor material layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The first contact level dielectric layer 280 may be thinned due to a collateral etch during the anisotropic etch that removes the vertical portions of horizontal portions of the deposited conformal insulating material.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the first contact level dielectric layer 280 by a planarization process such as chemical mechanical planarization or a recess etch. The backside contact via structures are electrically insulated in all lateral directions, and is laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the first contact level dielectric layer 280. The first contact level dielectric layer 280 can be thinned and removed during a latter part of the planarization process, which may employ chemical mechanical planarization (CMP), a recess etch, or a combination thereof. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

Referring to FIGS. 14A and 14B, a second contact level dielectric layer 282 can be optionally formed over the first contact level dielectric layer 280. The second contact level dielectric layer 282 includes a dielectric material such as silicon oxide or silicon nitride. The thickness of the second contact level dielectric layer 282 can be in a range from 30 nm to 300 nm, although lesser and greater thicknesses can also be employed.

Drain contact via structures 88 contacting the drain regions 63 can extend through the contact level dielectric layers (280, 282) and the second insulating cap layer 270 in the memory array region 100. A source connection via structure 91 can extend through the contact level dielectric layers (280, 282) to provide electrical connection to the laterally-elongated contact via structures 76.

Various contact via structures can be formed through the contact level dielectric layers (280, 282) and the retro-stepped dielectric material portions (165, 265). For example, word line contact via structures 86 can be formed in the word line contact region 200. A subset of the word line contact via structures 86 contacting the second electrically conductive layers 246 extends through the second-tier retro-stepped dielectric material portion 265 in the word line contact region 200, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165 in the word line contact region 200.

Figure 15:
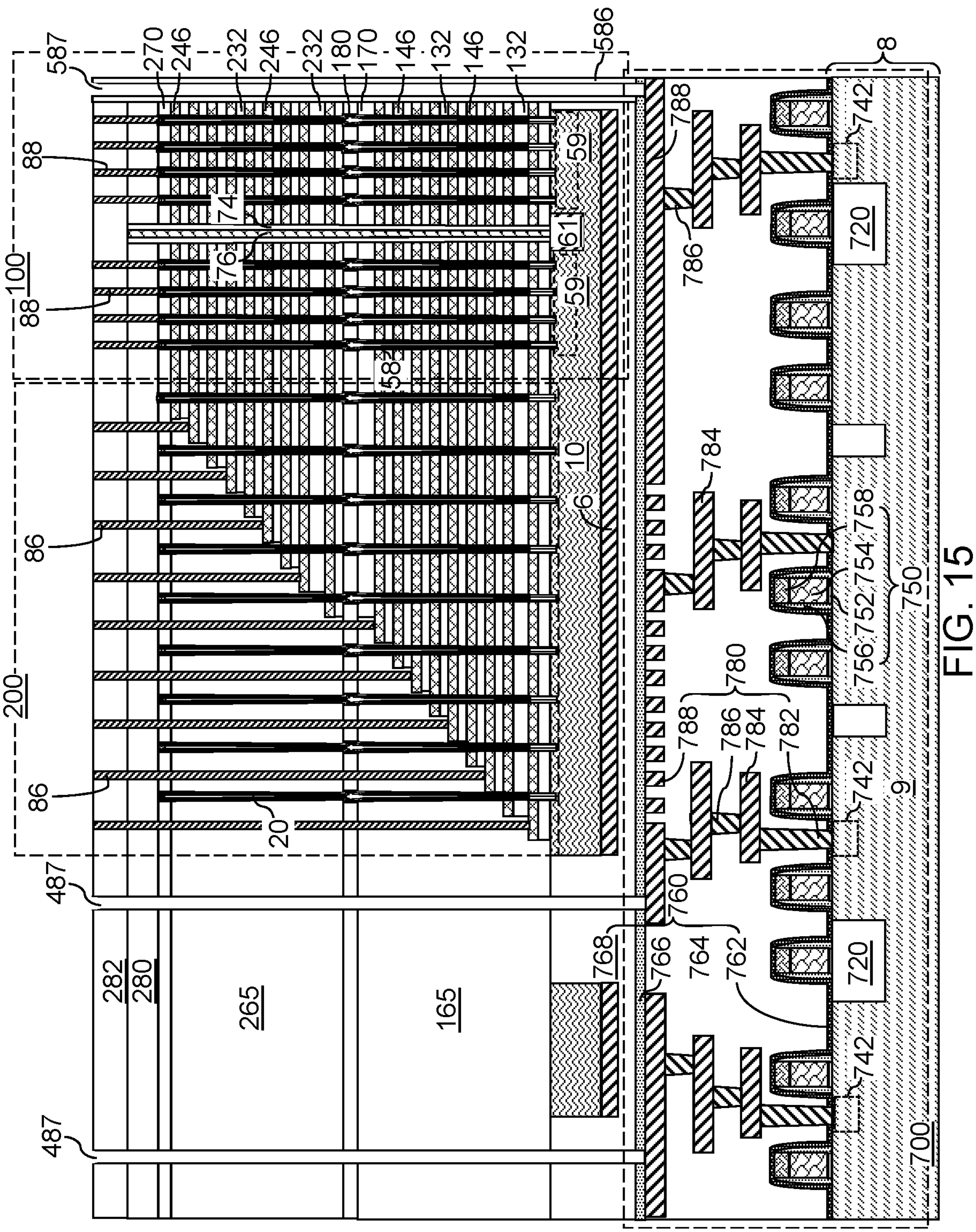
FIG. 15 is a vertical cross-sectional view of the first exemplary structure after formation of second through-track via cavities and through-dielectric via cavities according to an embodiment of the present disclosure.

Referring to FIG. 15, a photoresist layer is applied over the second contact level dielectric layer 282, and is lithographically patterned to form openings that overlie the through-stack insulating material portions 584 in the memory array region 100, and additional memory openings in which layers of the alternating stacks (132, 146, 232, 246) are absent, i.e., in a peripheral region 400 located outside the memory array region 100 and the word line contact region 200. For example, the peripheral region may surround memory array region 100 and/or the word line contact region 200 and/or may be located on one or more sides of the memory array region 100 and/or the word line contact region 200. In one embodiment, the areas of the openings in the memory array region 100 may be entirely within the areas of the through-stack insulating material portions 584. In one embodiment, the areas of the openings outside the areas of the memory array region 100 and the word line contact region 200 (e.g., the areas of the openings in the peripheral region 400) may be within areas of openings in the planar semiconductor material layer 10 and the optional planar conductive material layer 6.

Via cavities (487, 587) are formed by an anisotropic etch process that transfers the pattern of the openings in the photoresist layer to the top surfaces of the topmost lower metal line structures 788. Specifically, second through-stack via cavities 587 are formed through the through-stack insulating material portions 584 such that a remaining portion of each through-stack insulating material portion 584 after formation of the second through-stack via cavities 587 constitutes a through-stack insulating spacer 586. In one embodiment, the second through-stack via cavities 587 can be formed employing an anisotropic etch process that includes a first etch step that etches the dielectric material of the through-stack insulating material portions 584 selective to silicon nitride, and a second etch step that etches a physically exposed portion of the silicon nitride layer 766. The first etch step employs the silicon nitride layer 766 as an etch stop layer. Thus, the via cavities 587 are etched through the insulating material (e.g., silicon oxide) of the through-stack insulating material portions 584, rather than through the electrically conductive layers (e.g., tungsten and/or titanium nitride layers) (146, 246). Etching silicon oxide of portions 584 is easier than etching refractory metal and/or refractory metal nitride layers (146, 246). Furthermore, etching the opening 585 through the alternating stack of insulating layers (132, 232) such as silicon oxide, and sacrificial material layers (142, 242) such as silicon nitride before forming the electrically conductive layers (146, 246)

easier than etching the opening through the electrically conductive layers (146, 246). Thus, by forming and filling the openings 585 with an insulating material (e.g., with portions 584) before replacing the sacrificial material layers with the electrically conductive layers makes it easier to subsequently form the second through-stack via cavities 587 through the insulating material after replacing the sacrificial material layers with the electrically conductive layers, instead of etching the cavities 587 through the electrically conductive layers.

Each through-stack insulating spacer 586 can have a substantially cylindrical shape. Depending on the lithographic alignment of the pattern of the openings in the photoresist layer and the through-stack insulating material portions 584, the second through-stack via cavities 587 may, or may not, have a lateral offset from the geometrical center of a respective one of the through-stack insulating material portion 584. Thus, the through-stack insulating spacers 586 may, or may not, have a uniform thickness around the vertical axis passing through the geometrical center thereof as a function of an azimuthal angle. In other words, the through-stack insulating spacers 586 may have the same thickness irrespective of the azimuthal angle in the case of perfect lithographic alignment, or may have an azimuthally-varying thickness that is measured between the inner sidewall and the outer sidewall of a respective through-stack insulating spacer 586. The second through-stack via cavities 587 are formed through the silicon nitride layer 766. A top surface of a lower metal line structure (such as a topmost lower metal liner structure 788) can be physically exposed at the bottom of each second through-stack via cavity 587.

Further, through-dielectric via cavities 487 can be formed in the peripheral region through the contact level dielectric layers (280, 282), the retro-stepped dielectric material portions (165, 265), the at least one second dielectric material layer 768, and the silicon nitride layer 766 to a top surface of a respective one of the topmost lower metal liner structures 788. The through-dielectric via cavities 487 can be formed concurrently with formation of the second through-stack via cavities 587 employing a same photolithography and anisotropic etch processes. In one embodiment, the through-dielectric via cavities 487 can pass through openings in the planar semiconductor material layer 10 and the optional planar conductive material layer 6. The photoresist layer can be removed, for example, by ashing.

Figure 16A:
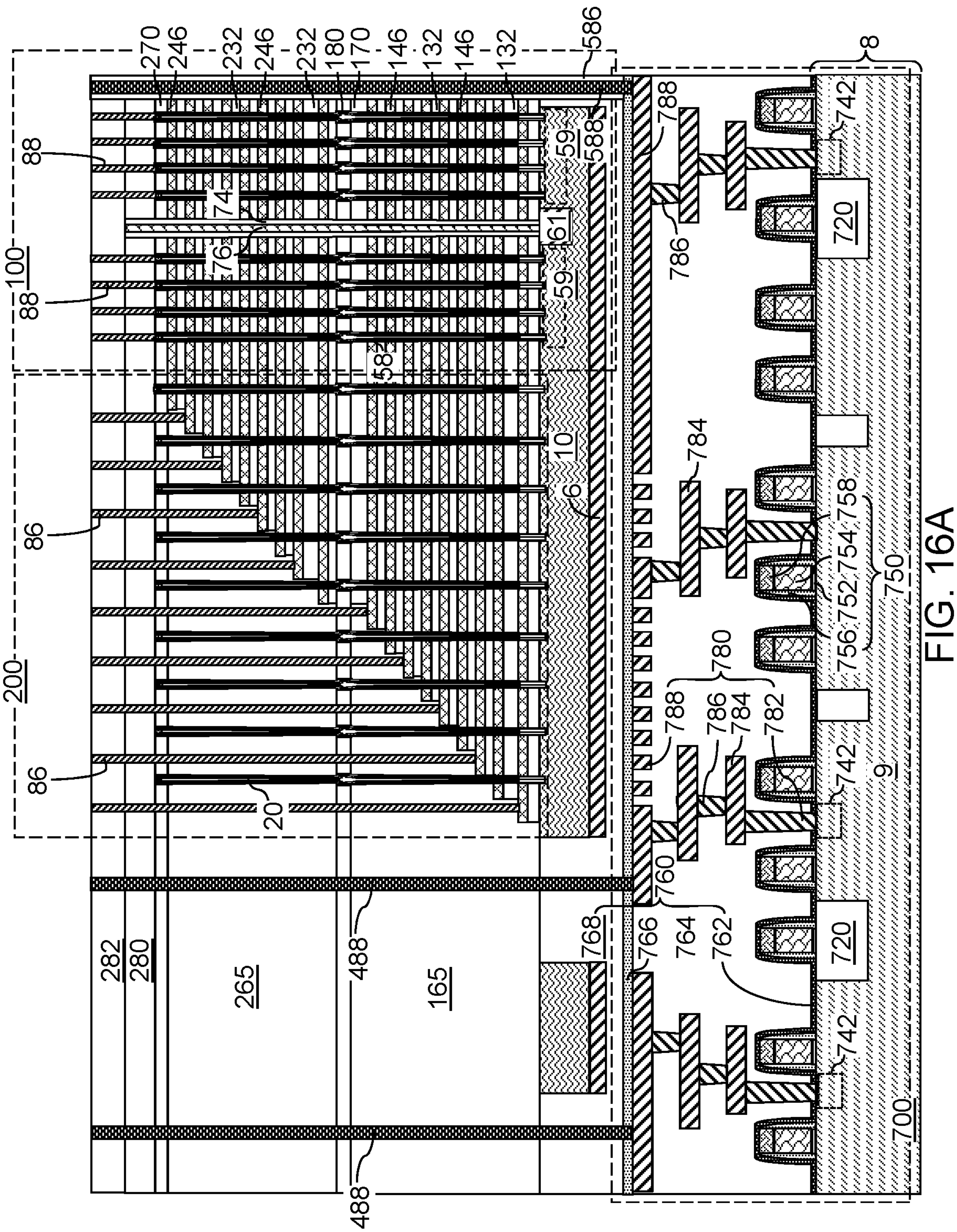
FIG. 16A is a vertical cross-sectional view of the first exemplary structure after formation of through-stack contact via structures and through-dielectric contact via structures according to an embodiment of the present disclosure.
Figure 16B:
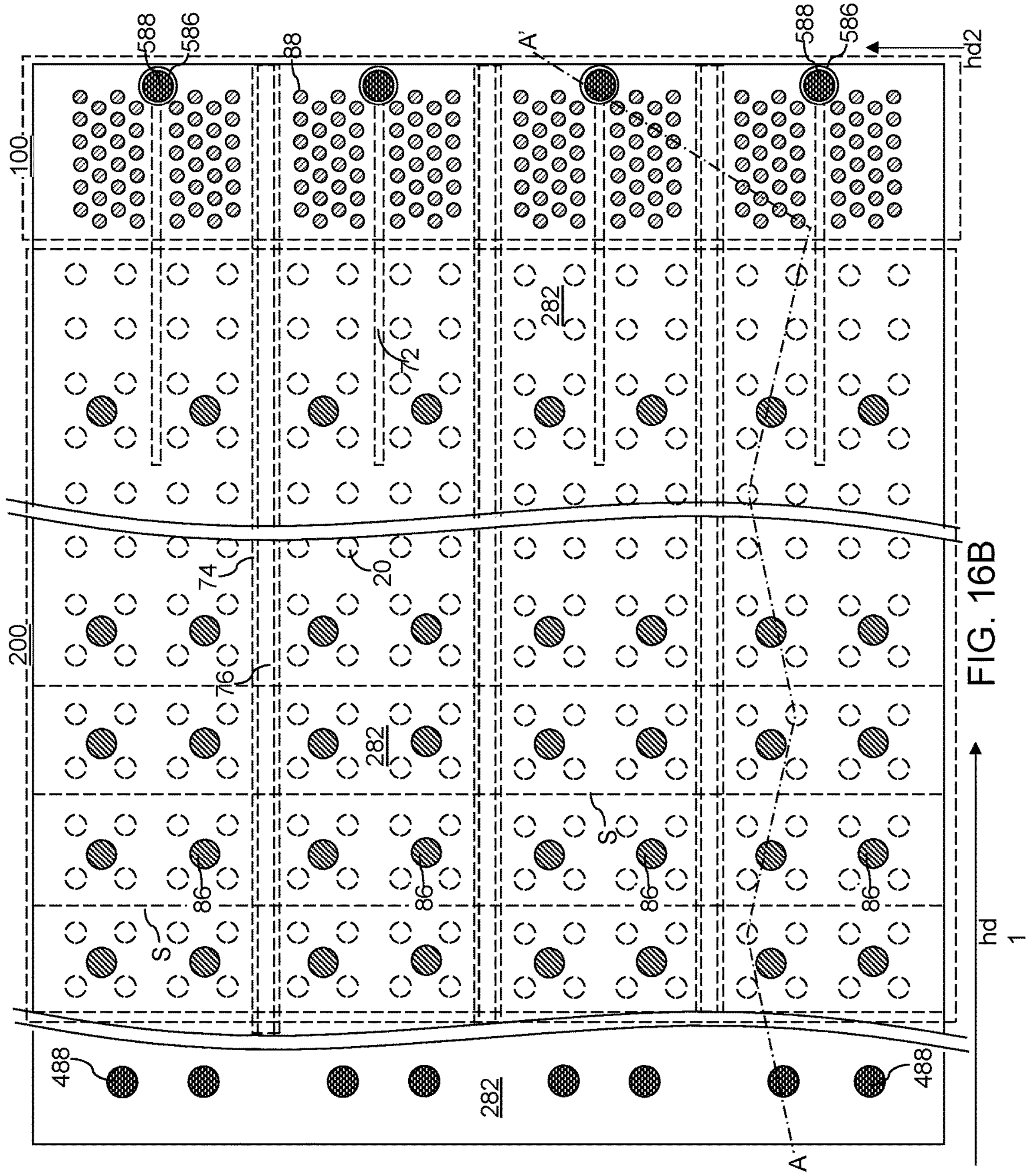
FIG. 16B is a horizontal cross-sectional view of the first exemplary structure along the horizontal plane B-B' in FIG. 16A. The zig-zag vertical plane A-A' corresponds to the plane of the vertical cross-sectional view of FIG. 16A.

Referring to FIGS. 16A and 16B, at least one conductive material can be simultaneously deposited in the second through-stack via cavities 587 and the through-dielectric via cavities 487. The at least one conductive material can include, for example, a metallic nitride liner (such as a TiN liner) and a metal fill material (such as W, Cu, Al, Ru, or Co). Excess portions of the at least one conductive material can be removed from outside the second through-stack via cavities 587 and the through-dielectric via cavities 487. For example, excess portions of the at least one conductive material can be removed from above the top surface of the second contact level dielectric layer 282 by a planarization process such as chemical mechanical planarization and/or a recess etch. Each remaining portion of the at least one conductive material in the second through-stack via cavities 587 constitutes a through-stack contact via structure 588 that contacts a top surface of a respective one of the topmost lower metal line structure 788. Each remaining portion of the at least one conductive material in the through-dielectric via cavities 487 that contacts a top surface of a respective one of the topmost lower metal line structure 788 constitutes a through-dielectric contact via structure 488. Each through-stack contact via structure 588 can be formed within a respective second through-stack via cavity 587 and inside a respective through-stack insulating spacer 586. Thus, through-stack contact via structures 588 are formed through the alternating stacks (132, 146, 232, 246), the at least one second dielectric material layer 768, and the silicon nitride layer 766, and directly on a top surface of a lower metal line structure (such as a topmost lower metal line structure 788). In this embodiment, each through-stack contact via structure 588 extends through the second contact level dielectric layer 282 and the silicon nitride layer (i.e., the hydrogen barrier layer) 766, while the respective through-stack insulating spacer 586 does not extend through the second contact level dielectric layer 282 and the silicon nitride layer (i.e., the hydrogen barrier layer) 766.

Figure 17:
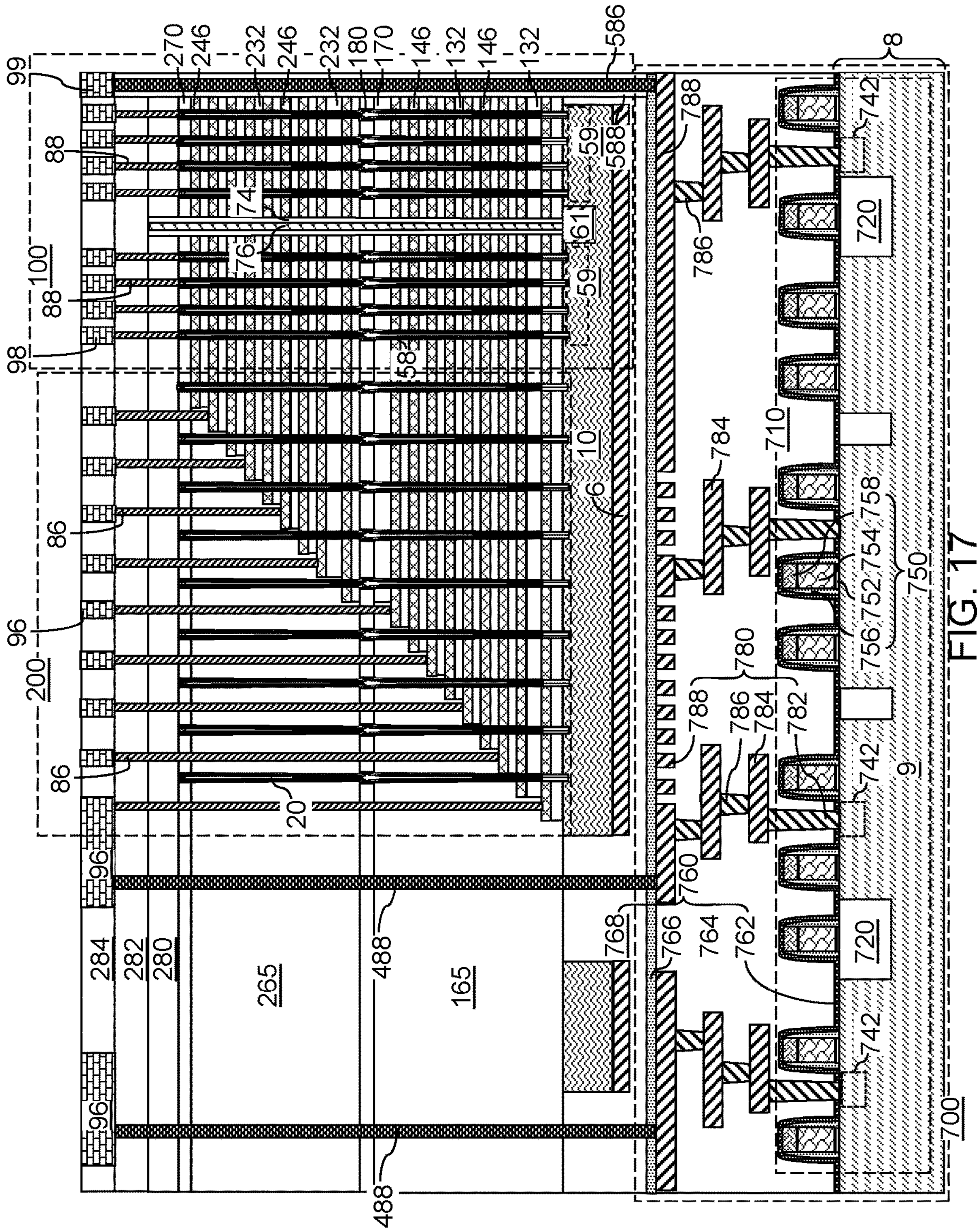
FIG. 17 is a vertical cross-sectional view of the first exemplary structure after formation of upper metal line structures according to an embodiment of the present disclosure.

Referring to FIG. 17, at least one upper interconnect level dielectric layer 284 can be formed over the contact level dielectric layers (280, 282). Various upper interconnect level metal structures can be formed in the at least one upper interconnect level dielectric layer 284. For example, the various upper interconnect level metal structures can include line level metal interconnect structures (96, 98, 99). The line level metal interconnect structures (96, 98, 99) can include first upper metal line structures 99 that contact a top surfaces of a respective one of the through-stack contact via structures 588, second upper metal line structures 96 that contact a top surface of a respective one of the through-dielectric contact via structures 488, and bit lines 98 that contact a respective one of the drain contact via structures 88 and extend along the second horizontal direction (e.g., bit line direction) hd2 and perpendicular to the first horizontal direction (e.g., word line direction) hd1. In one embodiment, a subset of the first upper metal line structures 99 may be employed to provide electrical connections through the source connection via structures 91 described above to the laterally-elongated contact via structures 76 and to the source regions 61. In one embodiment, a subset of the second upper metal line structures 96 may contact, or are electrically coupled to, a respective pair of a word line contact via structure 86 and a through-dielectric contact via structure 488.

At least a subset of the upper metal interconnect structures (which include the line level metal interconnect structures (96, 98, 99)) is formed over the three-dimensional memory array. The upper metal interconnect structures comprise an upper metal line structure (such as a first upper metal line structure 99) that is formed directly on a through-stack contact via structure 588. A set of conductive structures including the through-stack contact via structure 588 and a lower metal line structure (such as a topmost lower metal line structure 788) provides an electrically conductive path between the at least one semiconductor device 710 on the substrate semiconductor layer and the upper metal line structure. A through-dielectric contact via structure 488 can be provided through the retro-stepped dielectric material portions (165, 265), the at least one second dielectric material layer 768, and the silicon nitride layer 766 and directly on a top surface of another lower metal line structure (e.g., another topmost lower metal line structure 788) of the lower metal interconnect structures 780.

Figure 18A:
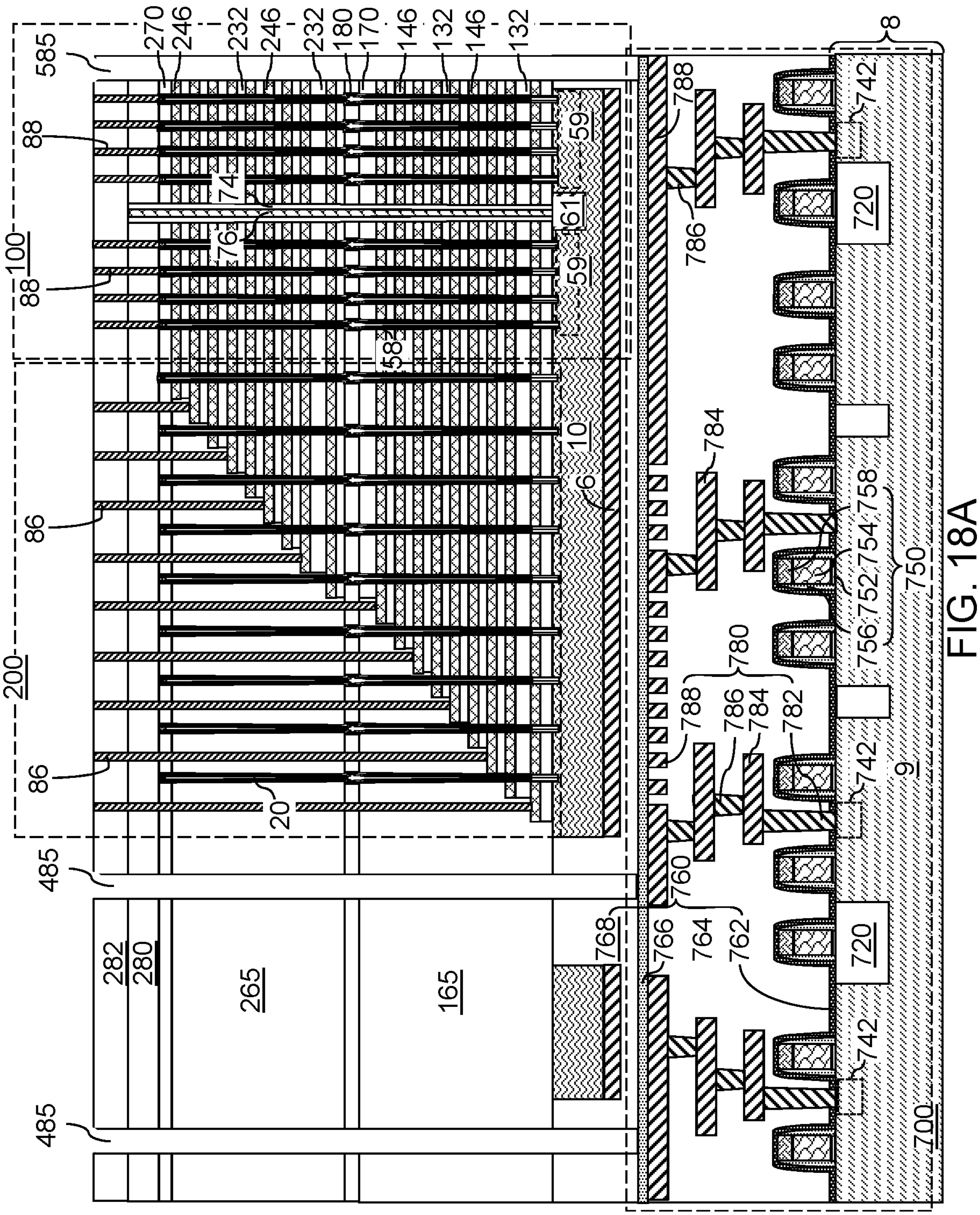
FIG. 18A is a vertical cross-sectional view of a first alternative configuration of the first exemplary structure after formation of first through-stack via cavities and first through-dielectric via cavities according to an embodiment of the present disclosure.
Figure 18B:
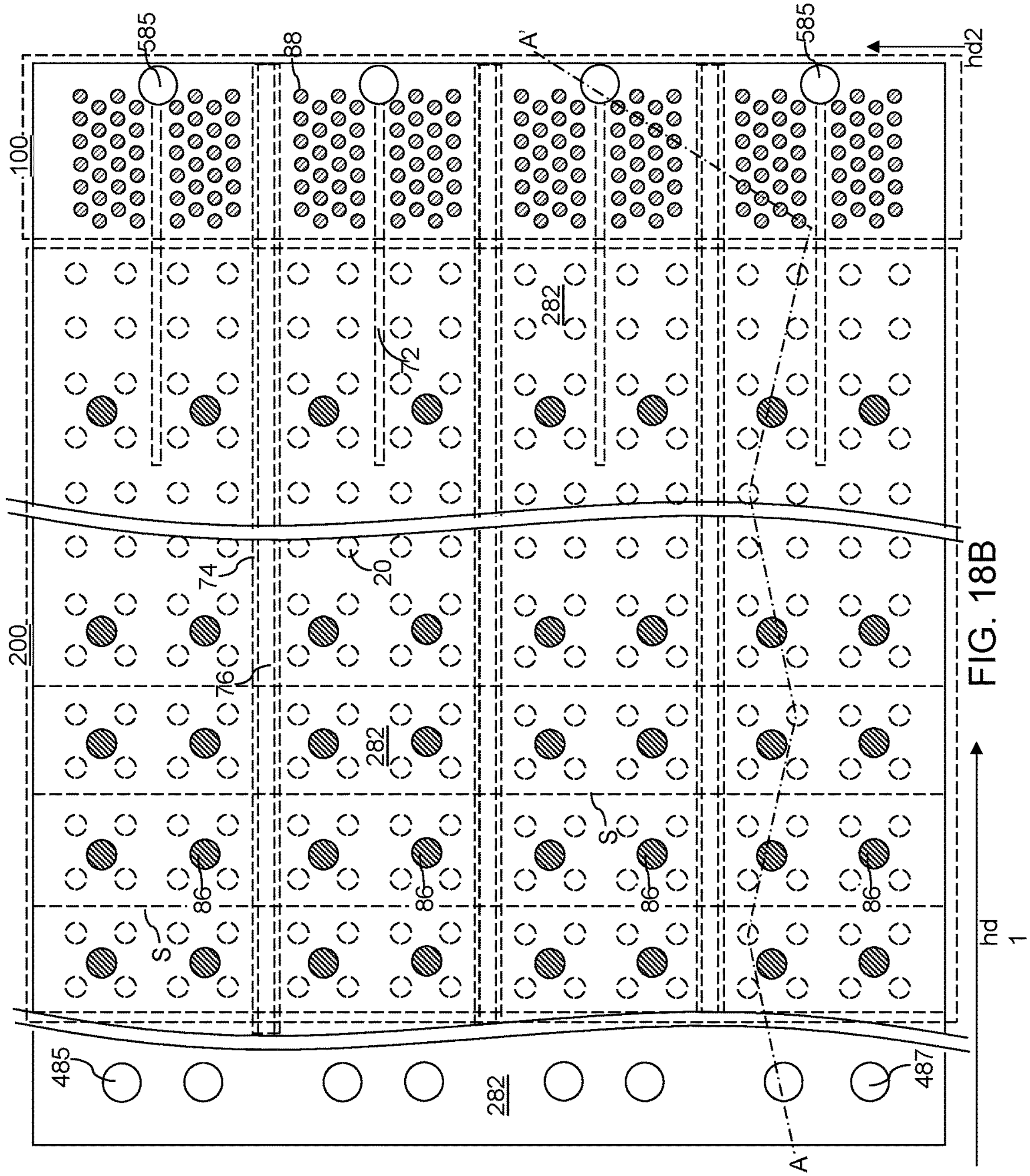
FIG. 18B is a horizontal cross-sectional view of first alternative configuration of the first exemplary structure along the horizontal plane B-B' in FIG. 18A. The zig-zag vertical plane A-A' corresponds to the plane of the vertical cross-sectional view of FIG. 18A.

Referring to FIGS. 18A and 18B, a first alternative configuration of the first exemplary structure can be derived from the first exemplary structure of FIGS. 14A and 14B by forming first through-dielectric via cavities 485 concurrently with formation of the first through-stack via cavities 585. In this embodiment, the first through-stack via cavities 585 are formed through the electrically conductive layers (146, 246)

in the alternating stack (132, 232, 146, 246) after the sacrificial material layers are replaced with the electrically conductive layers.

The first through-dielectric via cavities 485 and the first through-stack via cavities 585 can be concurrently formed by a same anisotropic etch process, similar to the step shown in FIG. 15. Optionally, the silicon nitride layer 766 may be employed as an etch stop layer for the anisotropic etch process.

Figure 19A:
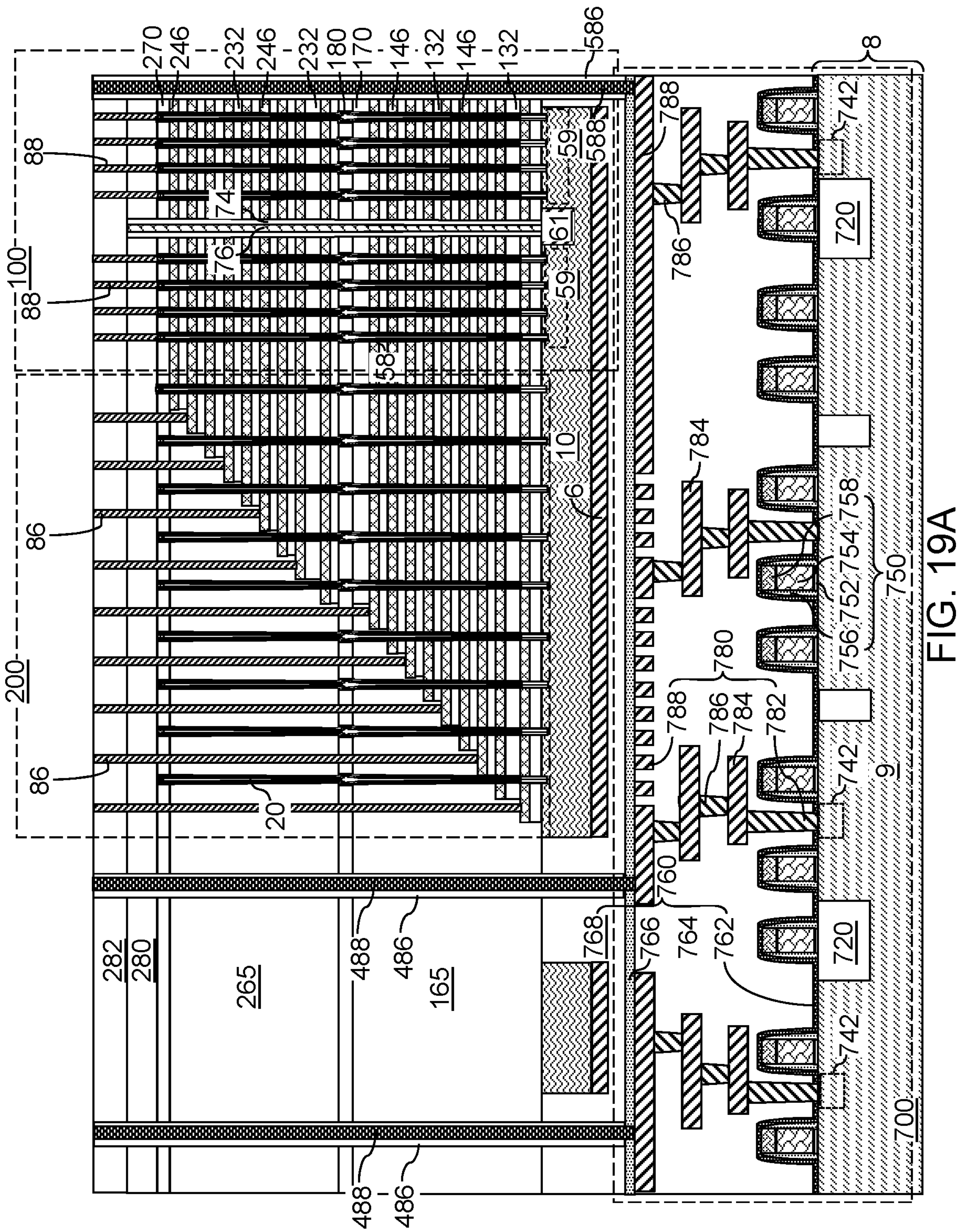
FIG. 19A is a vertical cross-sectional view of the first alternative configuration of the first exemplary structure after formation of through-stack contact via structures and through-dielectric contact via structures according to an embodiment of the present disclosure.
Figure 19B:
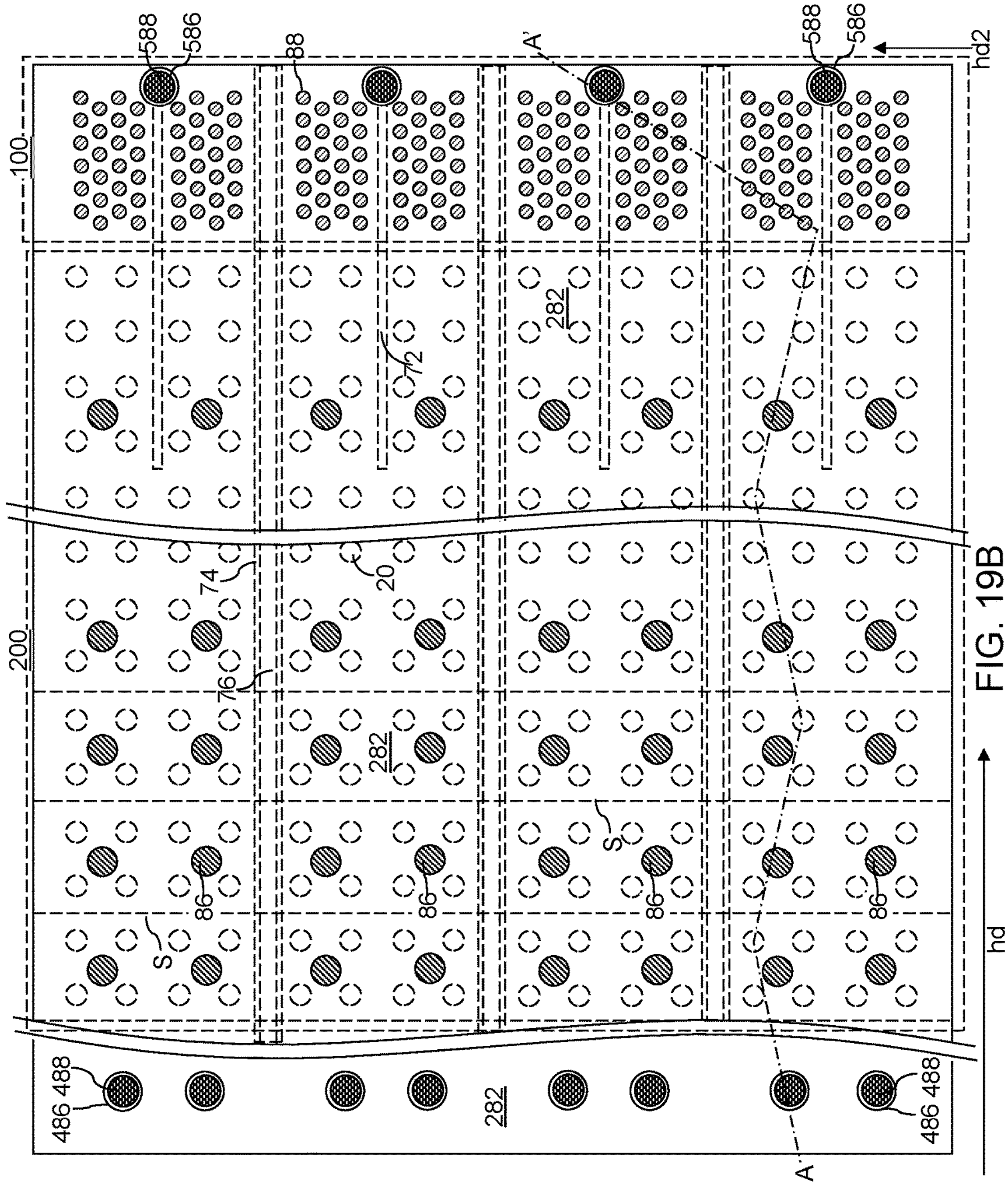
FIG. 19B is a horizontal cross-sectional view of the first exemplary structure along the horizontal plane B-B' in FIG. 19A. The zig-zag vertical plane A-A' corresponds to the plane of the vertical cross-sectional view of FIG. 19A.

Referring to FIGS. 19A and 19B, the processing steps of FIG. 11 can be performed to fill each of the first through-stack via cavities 585 and the first through-dielectric via cavities 485 with insulating material. Through-stack insulating material portions 584 are formed in the first through-stack via cavities 585, and through-dielectric insulating material portions are formed in the first through-dielectric via cavities 485.

The processing steps of FIG. 15 can be performed to form second through-stack via cavities 587 through the through-stack insulating material portions 584, and to form second through-dielectric via cavities 487. A through-stack insulating spacer 586 is formed around each second through-stack via cavity 587, and a through-dielectric insulating spacer 486 is formed around each second through-dielectric via cavity.

The processing steps of FIGS. 16A and 16B can be performed to form a through-stack contact via structure 588 within each second through-stack via cavity 587, and to form a through-dielectric contact via structure 488 within each second through-dielectric via cavity.

Figure 20:
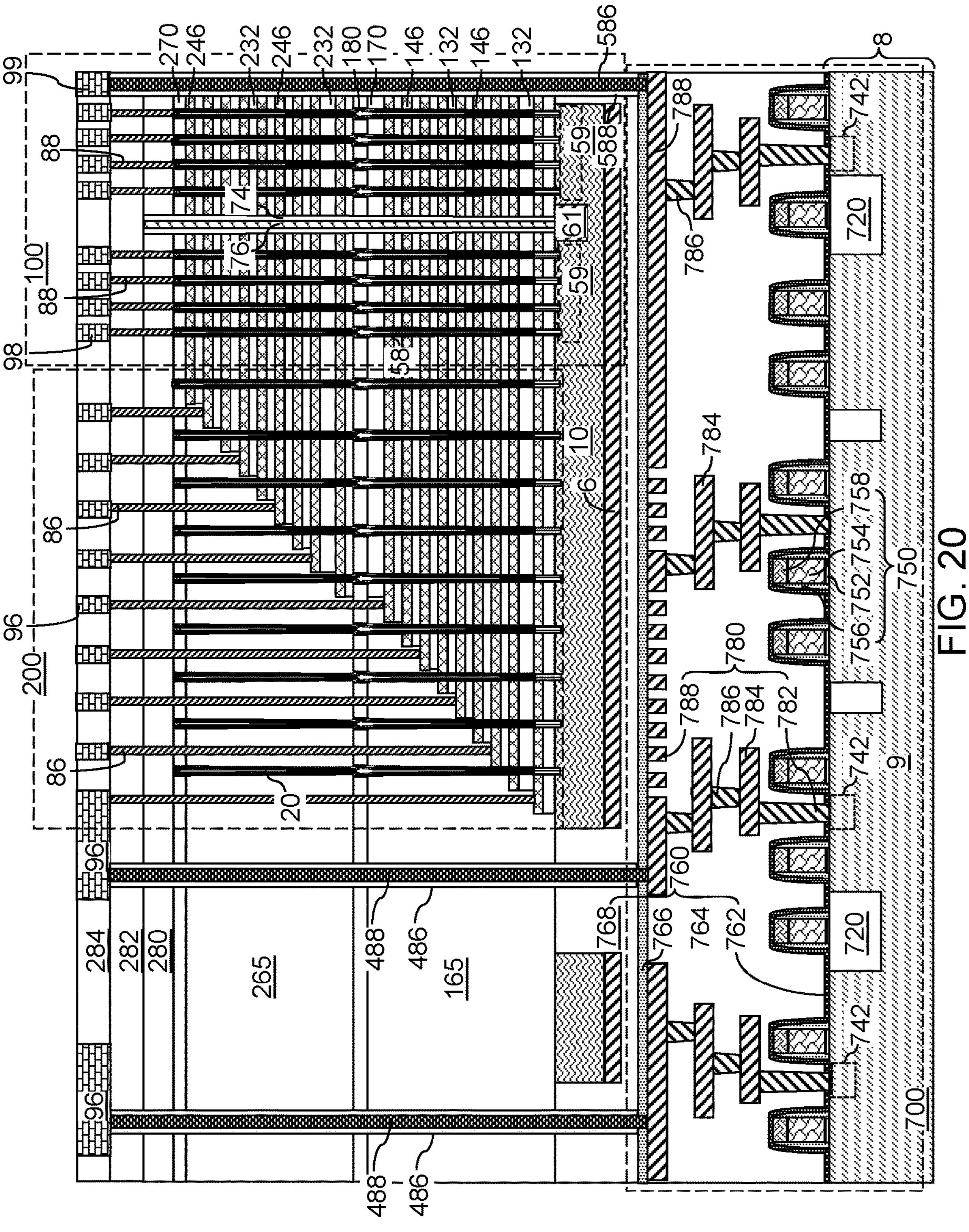
FIG. 20 is a vertical cross-sectional view of the first alternative configuration of the first exemplary structure after formation of upper metal line structures according to an embodiment of the present disclosure.

Referring to FIG. 20, the processing steps of FIG. 17 can be performed to form at least one upper interconnect level dielectric layer 284 and various upper interconnect level metal structures.

Figure 21:
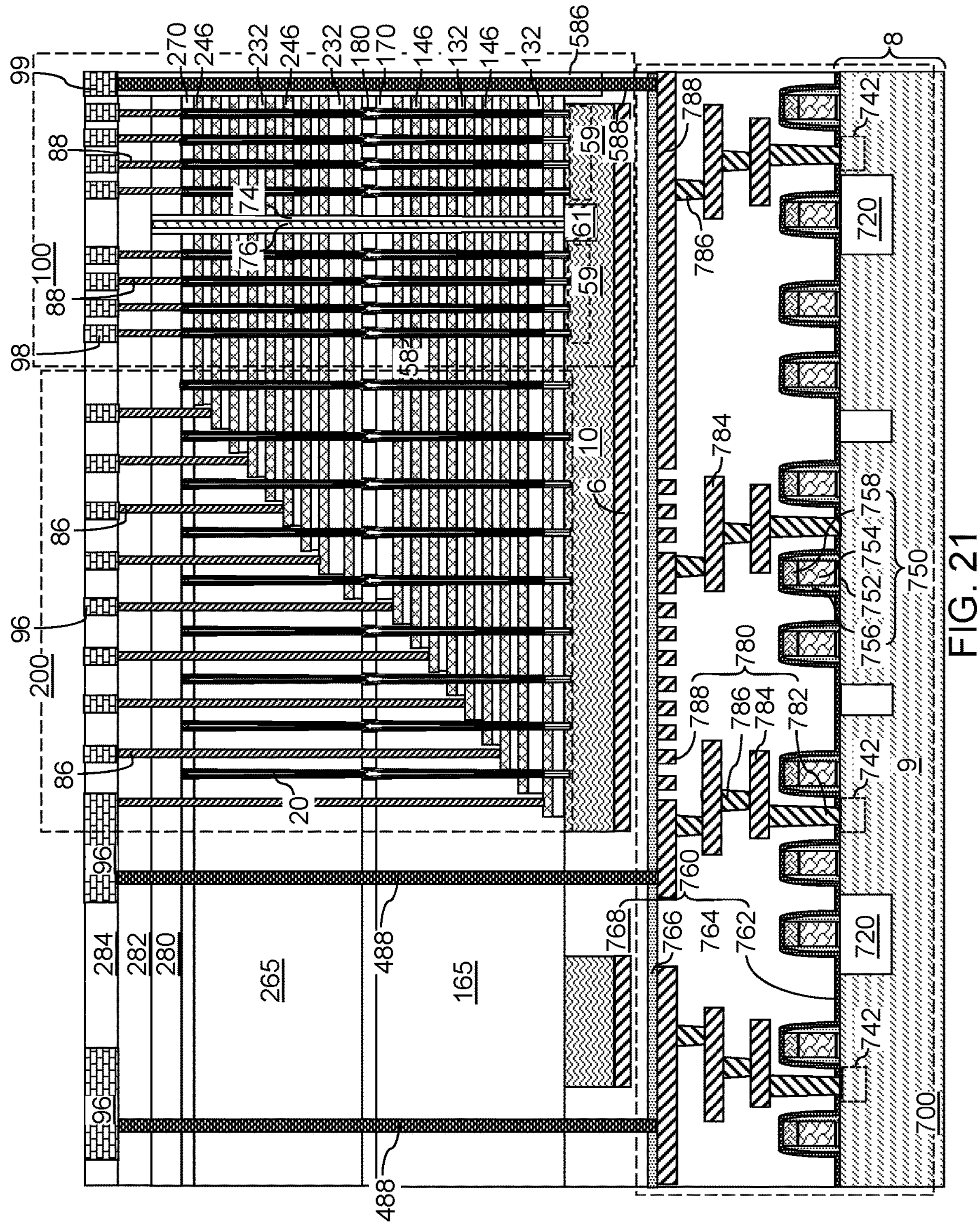
FIG. 21 is a vertical cross-sectional view of a second alternative configuration of the first exemplary structure according to an embodiment of the present disclosure.

FIG. 21 illustrates a second alternative configuration of the first exemplary structure in which the anisotropic etch process that forms the first through-stack via cavities do not employ the silicon nitride layer 766 as an etch stop layer. In this case, the through-stack insulating spacers 586 may not physically contact the silicon nitride layer 766.

The first exemplary structures and alternative embodiments of the present disclosure include a semiconductor structure. The semiconductor structure includes a semiconductor device 710, a hydrogen diffusion barrier layer 766, a lower metal line structure 788 located below the hydrogen diffusion barrier layer 766, an alternating stack of insulating layers (132, 232) and electrically conductive layers (146, 246), memory stack structures 55 vertically extending through the alternating stack in a memory array region 100, a through-stack contact via structure 588 extending through the alternating stack and through the hydrogen diffusion barrier layer 766 in the memory array region 100 and contacting the lower metal line structure 788, and a through-stack insulating spacer laterally 586 surrounding the through-stack contact via structure 588 and extending through the alternating stack but not extending through the hydrogen diffusion barrier layer 766. In one embodiment, the hydrogen diffusion barrier layer 766 can be a silicon nitride layer.

In another embodiment, the semiconductor structure can include: at least one semiconductor device 710; a dielectric layer stack 760 of at least one first dielectric material layer 764, a silicon nitride layer comprising a hydrogen diffusion barrier 766, and at least one second dielectric material layer 768 overlying the at least one semiconductor device 710; lower metal interconnect structures 780 embedded within the dielectric layer stack 760, the lower metal interconnect structures 780 comprising a lower metal line structure 788 located below a bottom surface of the silicon nitride layer 766; a three-dimensional memory array overlying the dielectric layer stack 760 and including an alternating stack of insulating layers (132, 232) and electrically conductive layers (146, 246); and memory stack structures 55 vertically extending through the alternating stack (132, 232, 146, 246) in a memory array region. A through-stack contact via structure 588 extends through the alternating stack (132, 232, 146, 246) in the memory array region, through the at least one second dielectric material layer 768, and through the silicon nitride layer 766, and contacting the lower metal line structure 788. A through-stack insulating spacer 586 laterally surrounds the through-stack contact via structure 588 and extends through the alternating stack (132, 232, 146, 246) and through the at least one second dielectric material layer 768, but not extending through the silicon nitride layer 566.

Upper metal interconnect structures including an upper metal line structure (96, 98, 99) are located over the three-dimensional memory array. The through-stack contact via structure 588 contacts a top surface of the lower metal line structure 788 and a bottom surface of the upper metal line structure 99. A set of conductive structures (782, 784, 786, 788, 588) including the through-stack contact via structure 588 and the lower metal line structure 788 provides an electrically conductive path between the at least one semiconductor device 710 and the upper metal line structure 99.

In one embodiment, the at least one semiconductor device 710 comprises a CMOS driver circuit device located on a top surface of a substrate semiconductor layer 9 of a substrate 8, or on a top surface of the substrate 8 if layer 9 is omitted; In one embodiment, an inner sidewall of the through-stack insulating spacer 586 contacts a sidewall of the through-stack contact via structure 588, and an outer sidewall of the through-stack insulating spacer 586 contacts sidewalls of each layer within the alternating stack (132, 232, 146, 246).

In one embodiment, the semiconductor structure further comprises a planar semiconductor material layer 10 located between the at least one second dielectric material layer 768 and the alternating stack (132, 232, 146, 246), wherein the through-stack insulating spacer 586 vertically extends through an opening in the planar semiconductor material layer 10 and through at least an upper portion of the at least one second dielectric material layer 768. In one embodiment, each of the memory stack structures 55 includes a memory film 50 and a vertical semiconductor channel 60 that extend through the alternating stack (132, 232, 146, 246), and the planar semiconductor material layer 10 includes a horizontal semiconductor channel 59 that is electrically connected to the vertical semiconductor channels 60 of the memory stack structures 55. In one embodiment, the through-stack insulating spacer 586 is laterally spaced from a sidewall of the opening of the planar semiconductor material layer 10 by a portion of the at least one second dielectric material layer 768.

In one embodiment, the through-stack insulating spacer 586 directly contacts the silicon nitride layer 766, and the through-stack contact via structure 588 is laterally spaced from the at least one second dielectric material layer 768 by the through-stack insulating spacer 586. In one embodiment, the through-stack insulating spacer 586 does not directly contact the silicon nitride layer 766, and the through-stack contact via structure 588 directly contacts the at least one second dielectric material layer 768 as illustrated in FIG. 21.

In one embodiment, the semiconductor structure further comprises: a terrace region including stepped surfaces of layers of the alternating stack (132, 232, 146, 246); a retro-stepped dielectric material portion (165 or 265) overlying the stepped surfaces and located at levels of the alternating stack (132, 232, 146, 246) and above the at least one second dielectric material layer 768; and a through-dielectric contact via structure 488 vertically extending through the retro-stepped dielectric material portion (165 or 265), the at least one second dielectric material layer 768, and the silicon nitride layer 766 and contacting a top surface of another lower metal line structure 788 of the lower metal interconnect structures 780. In one embodiment, the through-stack contact via structure 488 is laterally spaced from each layer within the alternating stack (132, 232, 146, 246) by a through-stack insulating spacer 486 (as illustrated in FIG. 20). Alternatively, the through-dielectric contact via structure 488 directly contacts the retro-stepped dielectric material portion (165 or 265) and the at least one second dielectric material layer 768 (as illustrated in FIGS. 17 and 21).

In one embodiment, the memory stack structures 55 can comprise memory elements of a vertical NAND device. The electrically conductive layers (146, 246) can comprise, or can be electrically connected to, a respective word line of the vertical NAND device. The substrate 8 can comprises a silicon substrate. The vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising the word line driver circuit and a bit line driver circuit for monolithic three-dimensional NAND memory device. The array of monolithic three-dimensional NAND strings can comprise a plurality of semiconductor channels, wherein at least one end portion (such as a vertical semiconductor channel 60) of each of the plurality of semiconductor channels (59, 11, 60) extends substantially perpendicular to a top surface of the semiconductor substrate 8, a plurality of charge storage elements (as embodied as portions of the memory material layer 54 located at each word line level), each charge storage element located adjacent to a respective one of the plurality of semiconductor channels (59, 11, 60), and a plurality of control gate electrodes (as embodied as a subset of the electrically conductive layers (146, 246) having a strip shape extending substantially parallel to the top surface of the substrate 8 (e.g., along the first horizontal direction hd1), the plurality of control gate electrodes comprise at least a first control gate electrode located in the first device level and a second control gate electrode located in the second device level.

Various electrical dopants in the source region 61 and the drain regions 63 are activated by an activation anneal, which is typically conducted at a temperature greater than 950 degrees Celsius. Hydrogen diffusion from the various materials at the level of the three-dimensional memory device (such as from the alternating stack (132, 142) and/or from a TEOS oxide in the retro-stepped dielectric material portions (165, 265)) to the semiconductor devices 710 may adversely impact the performance of the semiconductor devices. The silicon nitride layer 766 blocks diffusion of hydrogen to reduce or prevent degradation of performance of the various semiconductor devices 710 on the substrate 8 during high temperature anneal processes, thereby providing superior performance for the three-dimensional memory device. In one embodiment, the silicon nitride layer 766 is continuous and not etched until after the source and drain regions are annealed and the sacrificial material layers are replaced with electrically conductive layers. This continuity improves its hydrogen blocking properties during the high temperature annealing and replacement steps during which hydrogen diffusion may be generated. Furthermore, in one embodiment, the second through-stack via cavities 587 can be formed through insulating and sacrificial layers (132, 232, 142, 242) rather than through electrically conductive layers (146, 246) to make the etching of the cavities easier. The cavities 587 are then filled with insulating spacers 586 to prevent short circuiting the electrically conductive layers (146, 246) of the stack before forming the through-stack contact via structure 588 over the spacers 586. Both sets of cavities 487 and 587 may be filled with the electrically conductive material (e.g., tungsten) of respective structures 488 and 588 during the same deposition step, which reduces process cost and complexity by eliminating a separate conductive material deposition step for structures 588.

Figure 22:
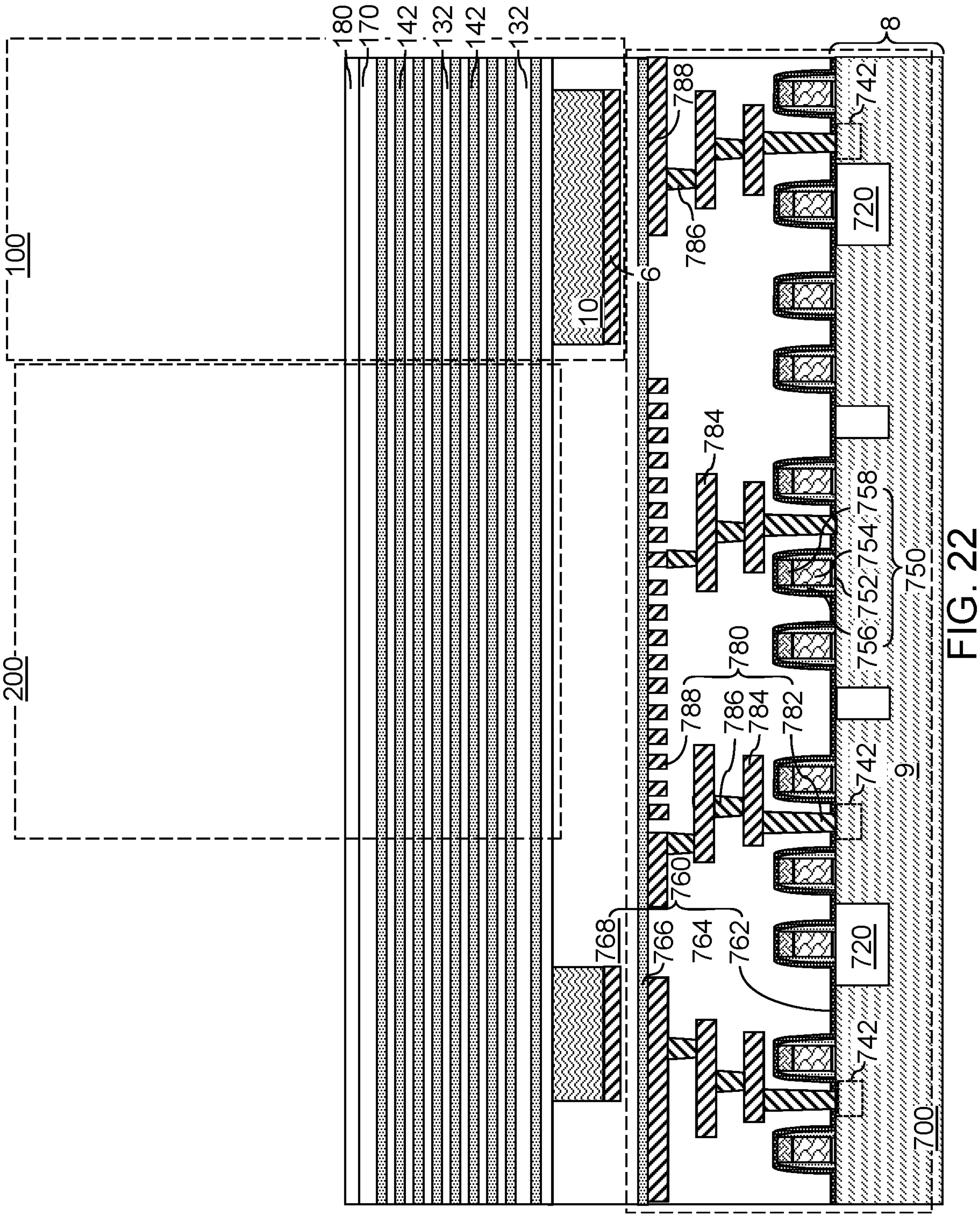
FIG. 22 is a vertical cross-sectional view of a second exemplary structure after the processing steps of FIG. 2 with appropriate changes to the pattern of the optional planar conductive material layer and the planar semiconductor material layer according to an embodiment of the present disclosure.

Referring to FIG. 22, a second exemplary structure according to a second embodiment of the present disclosure can be derived from the first exemplary structure after the processing steps of FIG. 2. Appropriate changes to the pattern of the optional planar conductive material layer 6 and the planar semiconductor material layer 10 may be made. In one embodiment, the optional planar conductive material layer 6 and the planar semiconductor material layer 10 can be removed from the word line contact region 200. Thus, the at least one second dielectric material layer 768 extends into the word line contact region 200. The pattern of the topmost lower metal liner structures 788 can be modified so that the topmost lower metal liner structures 788 extend into the word line contact region 200, and are located in areas in which word line contact via structures are to be subsequently formed.

Figure 23A:
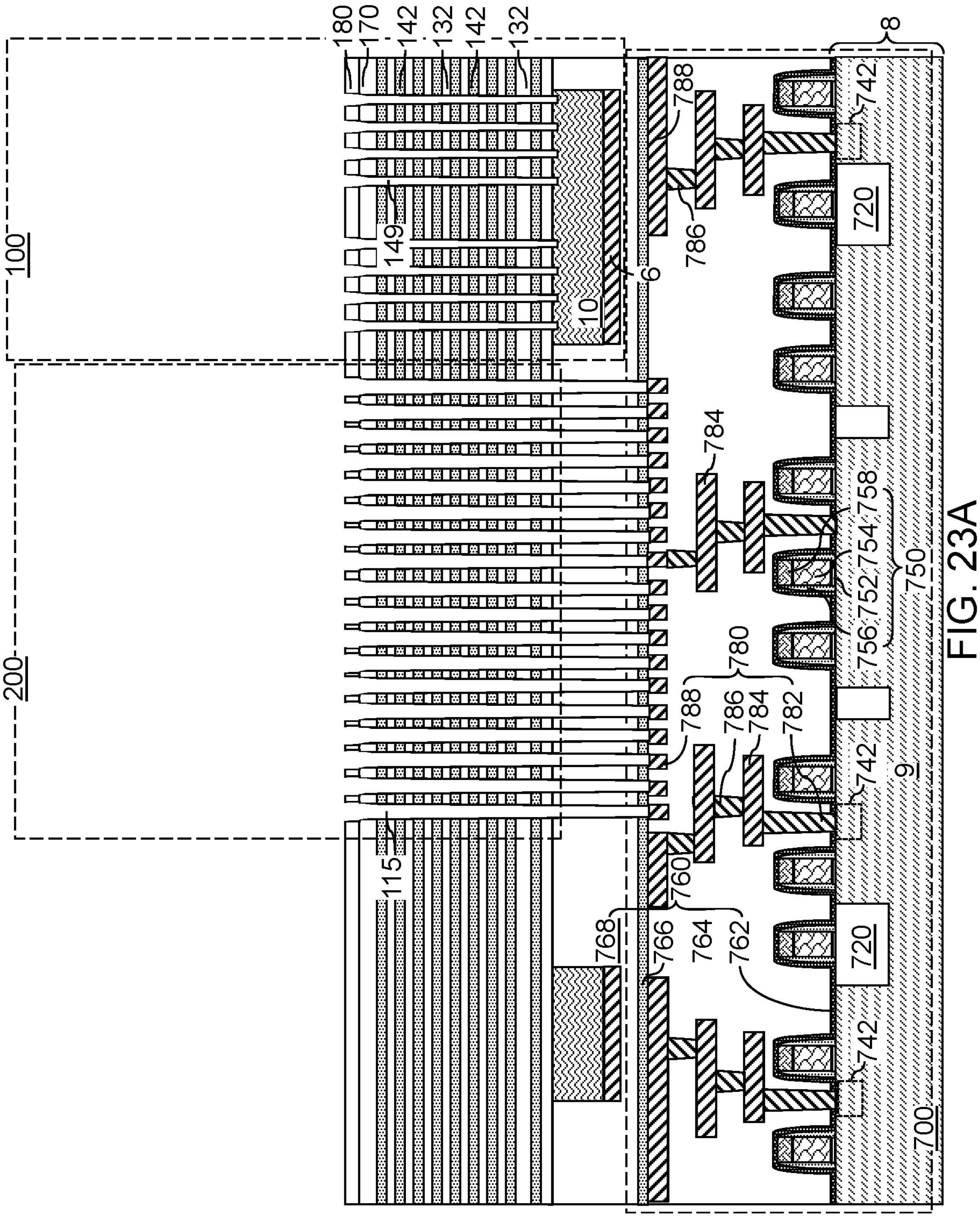
FIG. 23A is a vertical cross-sectional view of the second exemplary structure after formation of first-tier memory openings and first-tier contact openings according to an embodiment of the present disclosure.
Figure 23B:
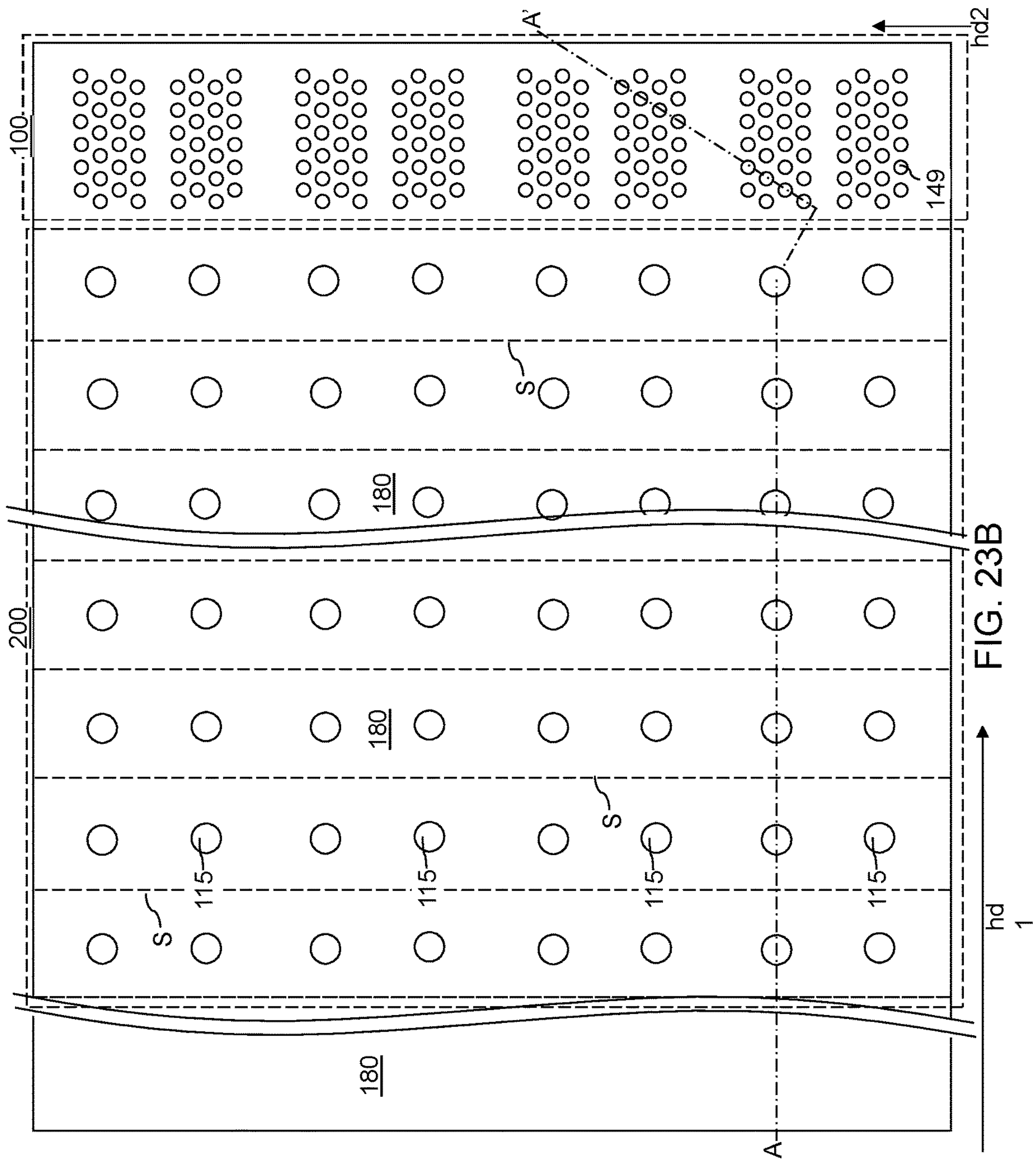
FIG. 23B is a top-down view of the second exemplary structure of FIG. 23A.

Referring to FIG. 23A and 23B, first-tier memory openings 149 and first-tier contact openings 115 can be formed. The first-tier memory openings 149 can be formed in the memory array region 100 at locations at which memory stack structures including vertical stacks of memory elements are to be subsequently formed. The first-tier memory openings 149 extend through the first-tier alternating stack (132, 142) at least to a top surface of the planar semiconductor material layer 10. The first-tier contact openings 115 can be formed in the word line contact region 200. The first-tier contact openings 115 extend through the first-tier alternating stack (132, 142), and the at least one second dielectric material layer 768, and the silicon nitride layer 766, and to a top surface of a respective one of the topmost lower metal liner structures 788.

For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first-tier alternating stack (132, 142) by at least one anisotropic etch that employs the patterned lithographic material stack as an etch mask. Portions of the first insulating cap layer 170 (and the optional inter-tier dielectric layer 180), the first-tier alternating stack (132, 142), the at least one second dielectric material layer 768, and the silicon nitride layer 766 underlying the openings in the patterned lithographic material stack can be etched in a same anisotropic etch process to form the first-tier memory openings 149 and the first-tier contact openings 115. In other words, the transfer of the pattern in the patterned lithographic material stack through the first insulating cap layer 170 and the first-tier alternating stack (132, 142) forms the first-tier memory openings 149 and the first-tier contact openings 115.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 and the first-tier contact openings 115 can be substantially vertical, or can be tapered. The planar semiconductor material layer 10 and the topmost lower metal liner structures 788 can be employed as etch stop structures. Subsequently, the patterned lithographic material stack can be subsequently removed, for example, by ashing. The locations of the steps to be subsequently formed as shown by dashed lines "S".

Optionally, the portions of the first-tier memory openings 149 and the first-tier contact openings 115 at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. The portions of the first-tier memory openings 149 (and the first-tier contact openings 115) located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 24A:
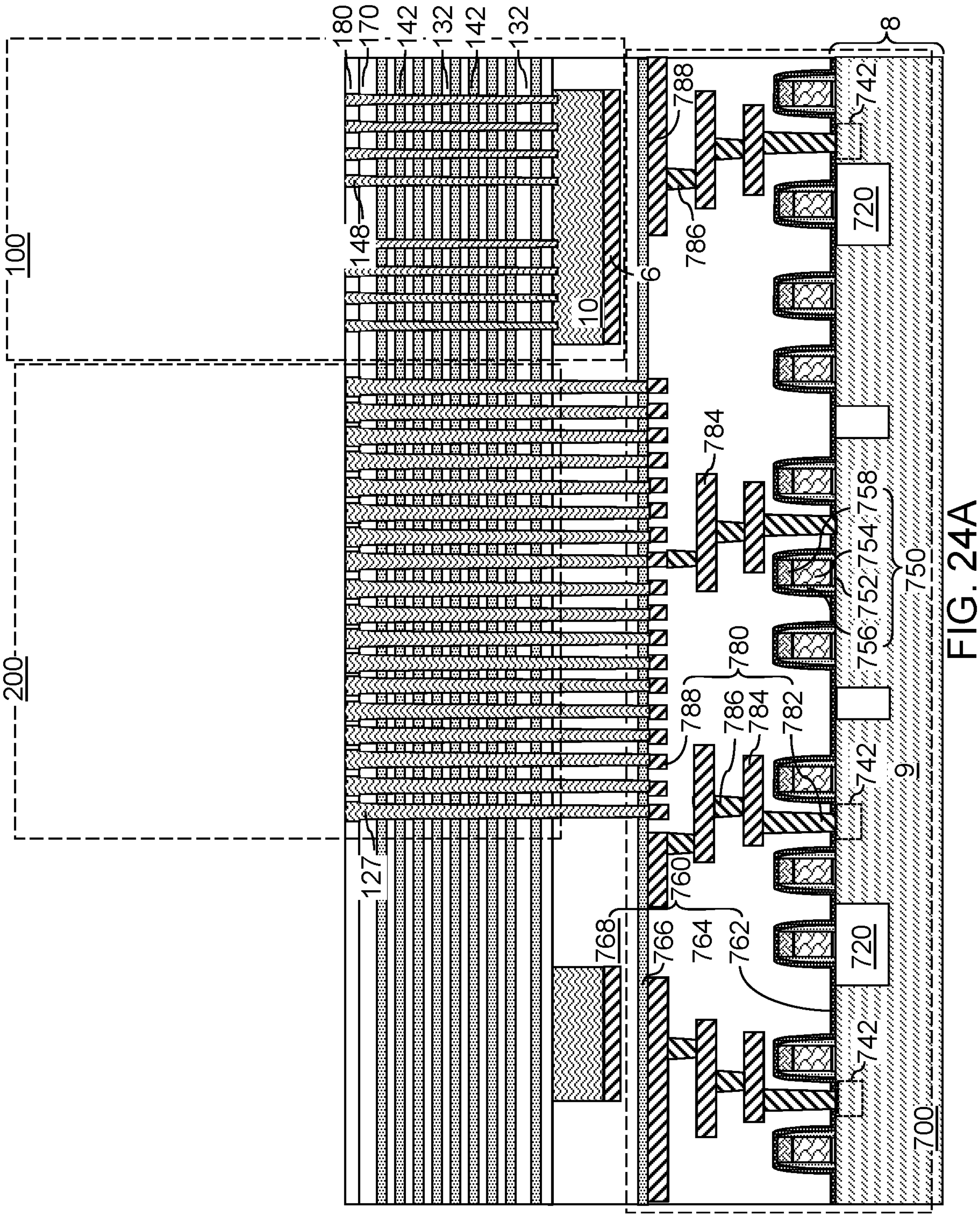
FIG. 24A is a vertical cross-sectional view of the second exemplary structure after formation of sacrificial memory opening fill portions and sacrificial contact opening fill portions according to an embodiment of the present disclosure.
Figure 24B:
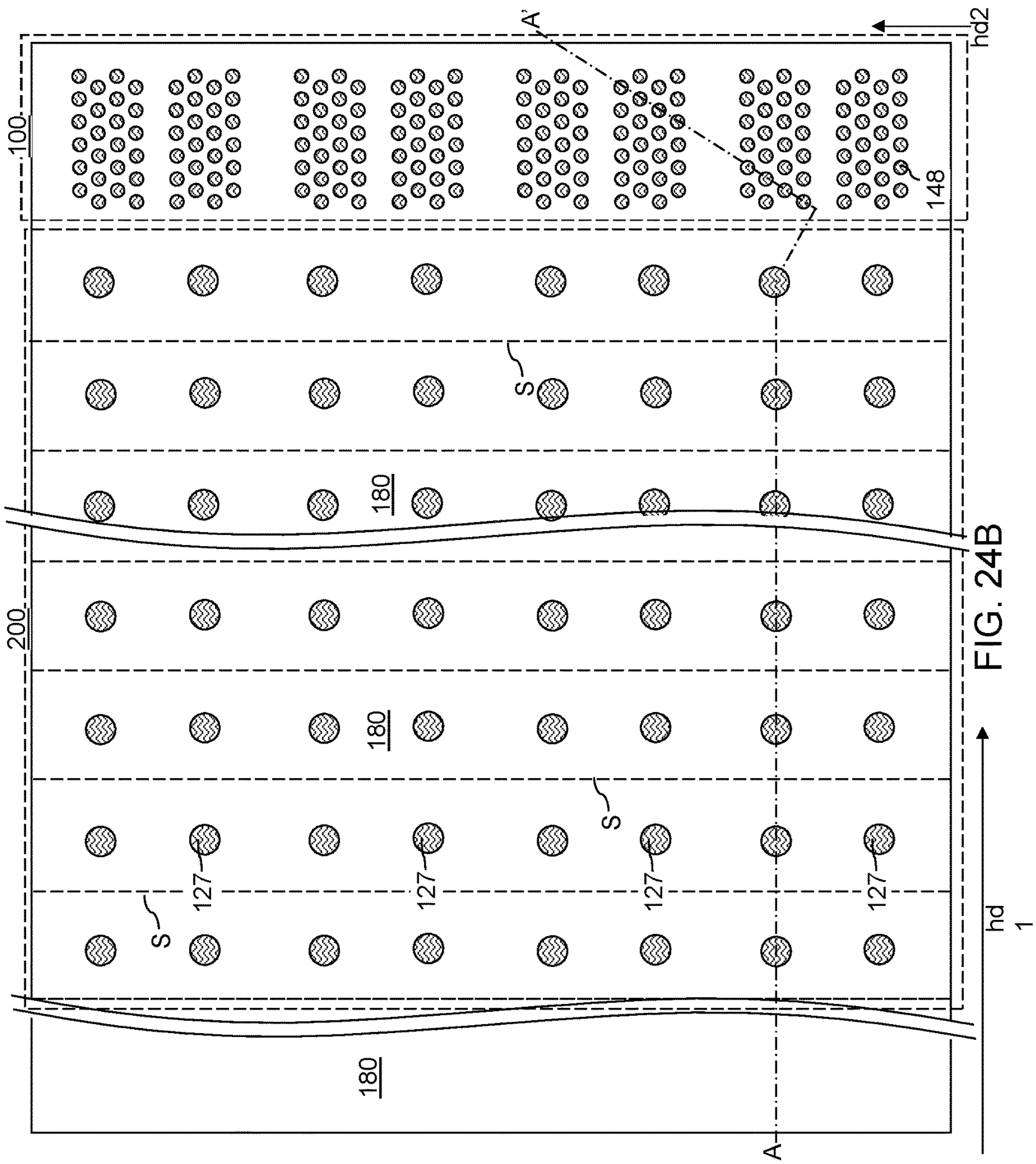
FIG. 24B is a top-down view of the second exemplary structure of FIG. 24A.

Referring to FIGS. 24A and 24B, sacrificial memory opening fill portions 148 can be formed in the first-tier memory openings 149, and sacrificial contact opening fill portions 127 can be formed in the first-tier contact openings 115. For example, a sacrificial fill material layer is deposited in the first-tier memory openings 149 and the first-tier contact openings 115. The sacrificial fill material layer includes a sacrificial material which can be subsequently removed selective to the materials of the first insulator layers 132 and the first sacrificial material layers 142. In one embodiment, the sacrificial fill material layer can include germanium, a silicon-germanium alloy, carbon, borosilicate glass (which provides higher etch rate relative to undoped silicate glass), porous or non-porous organosilicate glass, organic polymer, or inorganic polymer.

Optionally, a thin etch stop layer (such as a silicon oxide layer having a thickness in a range from 1 nm to 3 nm) may be employed prior to depositing the sacrificial fill material layer. If an etch stop layer is employed, semiconductor materials such as amorphous silicon may be employed as the sacrificial fill material. The sacrificial fill material layer may be formed by a non-conformal deposition or a conformal deposition method.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating layer 170 (and optionally layer 180 if present) can be employed as an etch stop layer or a planarization stop layer. Each remaining portion of the sacrificial material in a first-tier memory opening 149 constitutes a sacrificial memory opening fill portion 148. Each remaining portion of the sacrificial material in a first-tier contact opening 115 constitutes a sacrificial contact opening fill portion 127. The top surfaces of the sacrificial memory opening fill portions 148 and the sacrificial contact opening fill portions 127 can be coplanar with the top surface of the inter-tier dielectric layer 180 (or the first insulating cap layer 170 if the inter-tier dielectric layer 180 is not present). The sacrificial memory opening fill portion 148 and the sacrificial contact opening fill portions 127 may, or may not, include cavities therein.

Figure 25A:
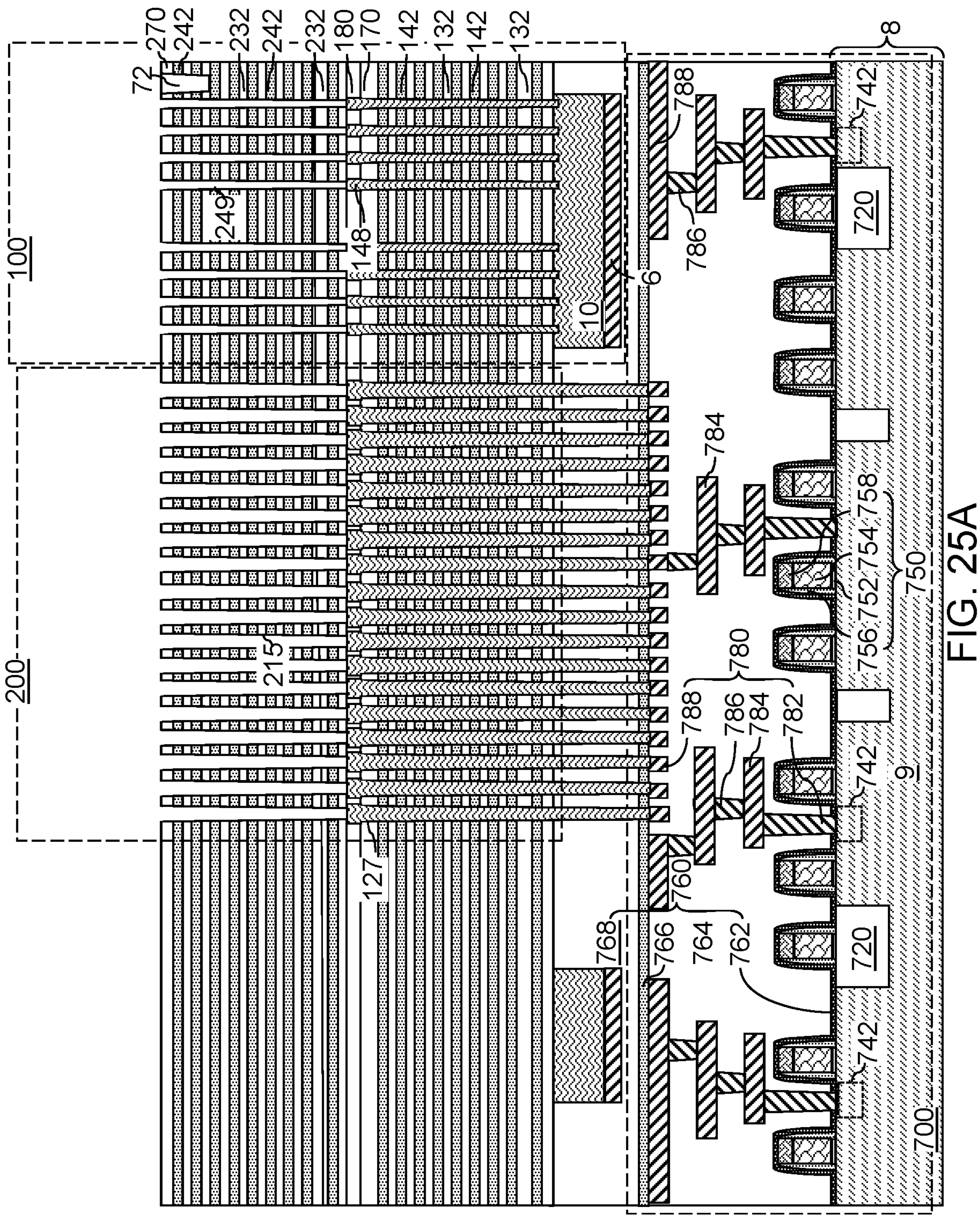
FIG. 25A is a vertical cross-sectional view of the second exemplary structure after formation of a second-tier alternating stack of second insulating layers and second spacer material layers, second-tier memory openings and second-tier contact openings according to an embodiment of the present disclosure.
Figure 25B:
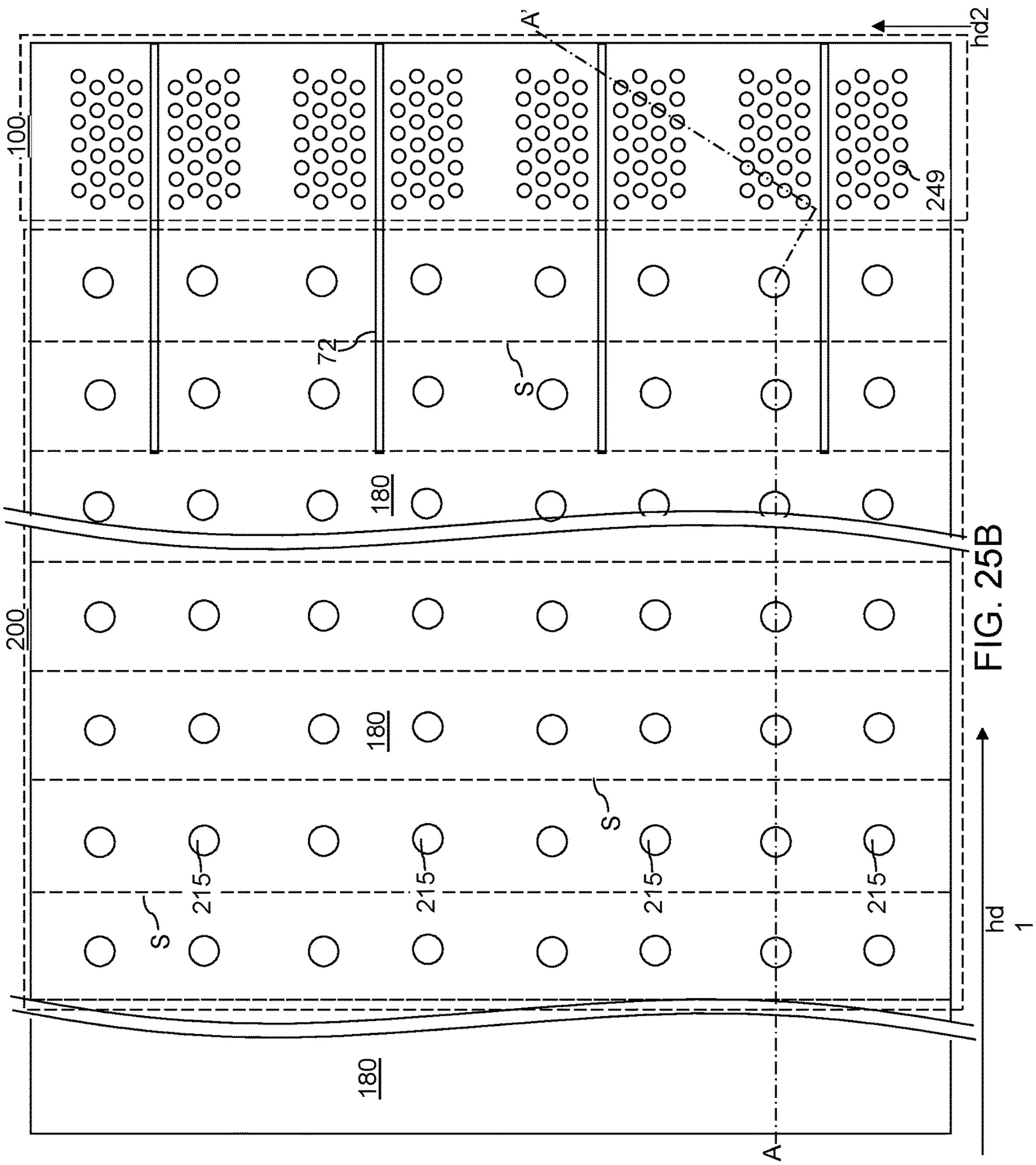
FIG. 25B is a top-down view of the second exemplary structure of FIG. 25A.

Referring to FIGS. 25A and 25B, a second-tier structure can be formed over the first-tier structure (132, 142, 170, 148, 117). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Optionally, drain-select-level shallow trench isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Second-tier memory openings 249 and second-tier contact openings 215 can be formed. The second-tier memory openings 249 can be formed in the areas of the sacrificial memory opening fill portions 148. The second-tier memory openings 249 extend through the second-tier alternating stack (232, 242) to a top surface of a respective one of the sacrificial memory opening fill portions 148. The second-tier contact openings 215 can be formed in the areas of the sacrificial contact opening fill portions 127. The second-tier contact openings 215 extend through the second-tier alternating stack (232, 242) to a top surface of a respective one of the sacrificial contact opening fill portions 127.

For example, a lithographic material stack (not shown) including at least a photoresist layer can be formed over the second insulating cap layer 270, and can be lithographically patterned to form openings within the lithographic material stack. The lithographic mask stack can be patterned with the same lithographic mask that is employed to pattern the first-tier memory openings 149 and the first-tier contact openings 115. The pattern in the lithographic material stack can be transferred through the second insulating cap layer 270, and through the entirety of the second-tier alternating stack (232, 242) by at least one anisotropic etch that employs the patterned lithographic material stack as an etch mask. Portions of the second insulating cap layer 270 and the second-tier alternating stack (132, 142) underlying the openings in the patterned lithographic material stack can be etched in a same anisotropic etch process to form the second-tier memory openings 249 and the second-tier contact openings 215. In other words, the transfer of the pattern in the patterned lithographic material stack through the second insulating cap layer 270 and the second-tier alternating stack (232, 242) forms the second-tier memory openings 249 and the second-tier contact openings 215.

In one embodiment, the chemistry of the anisotropic etch process employed to etch through the materials of the second-tier alternating stack (232, 242) can alternate to optimize etching of the second and second materials in the second-tier alternating stack (232, 242). The sidewalls of the second-tier memory openings 249 and the second-tier contact openings 215 can be substantially vertical, or can be tapered. Subsequently, the patterned lithographic material stack can be subsequently removed, for example, by ashing.

Figure 26:
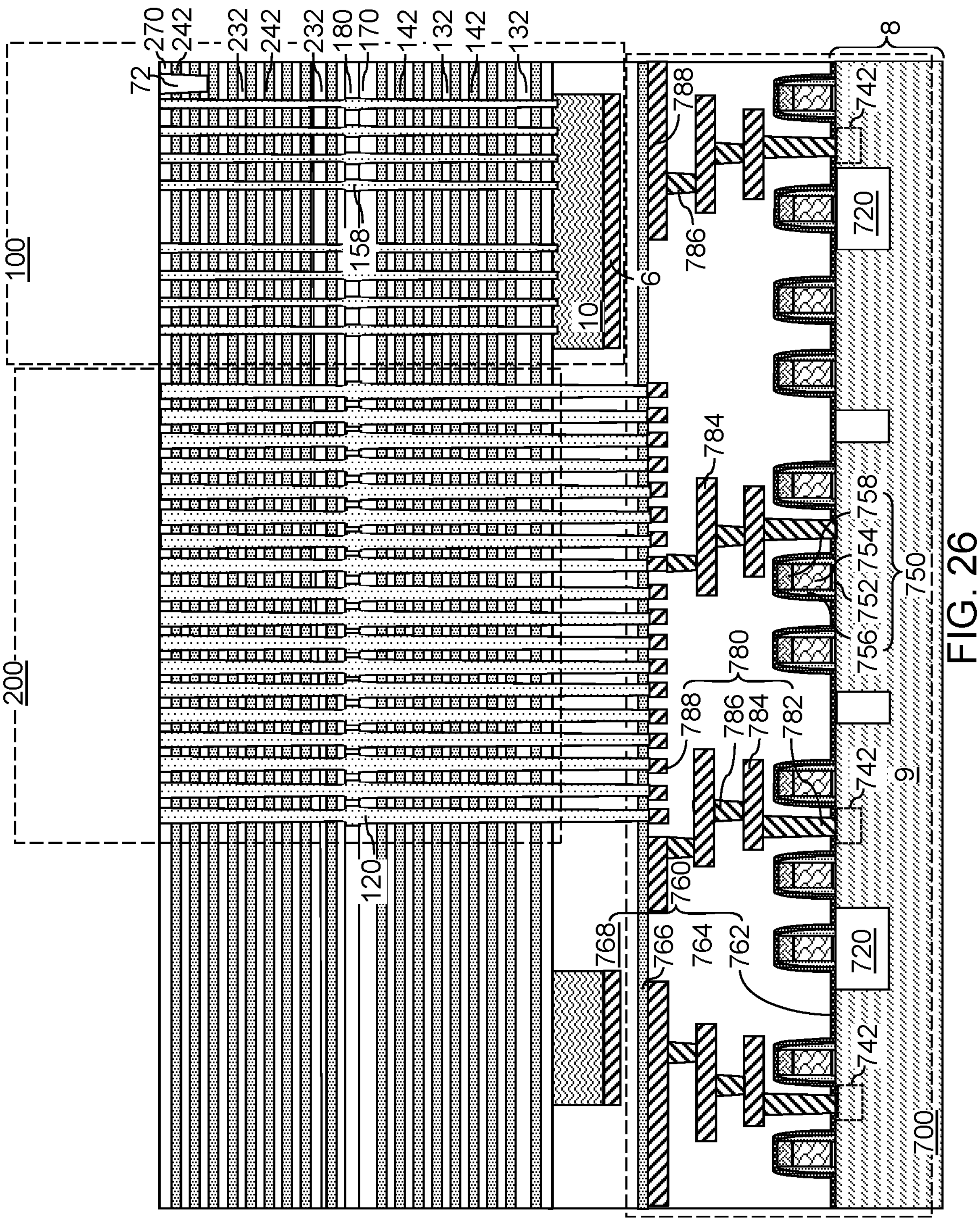
FIG. 26 is a vertical cross-sectional view of the second exemplary structure after formation of inter-tier memory openings and inter-tier contact openings, and formation of sacrificial memory opening pillars and sacrificial contact opening pillars according to an embodiment of the present disclosure.

Referring to FIG. 26, the sacrificial materials of the sacrificial memory opening fill portions 148 and the sacrificial contact opening fill portions 127 can be removed selective to the materials of the second alternating stack (232, 242), the first alternating stack (132, 142), the first and second insulating cap layers (170, 270), the inter-tier dielectric layer 180 (if present), the semiconductor material layer 10, and the topmost lower metal line structures 788. If an etch stop layer is present, the etch stop layer can be removed by an isotropic etch process such as a wet etch process. A memory opening is provided by each continuous volume including a volume of a second-tier memory opening 249 and a volume of a first-tier memory opening 149 from which a sacrificial memory opening fill portion 148 is removed. A contact opening is provided by each continuous volume including a volume of a second-tier contact opening 215 and a volume of a first-tier contact opening 115 from which a sacrificial contact opening fill portion 127 is removed.

Another sacrificial material is deposited in the memory openings and in the contact openings by a conformal deposition process. The deposited sacrificial material can include germanium, a silicon-germanium alloy, carbon, borosilicate glass (which provides higher etch rate relative to undoped silicate glass), porous or non-porous organosilicate glass, organic polymer, or inorganic polymer. Optionally, a thin etch stop layer (such as a silicon oxide layer having a thickness in a range from 1 nm to 3 nm) may be employed prior to depositing the sacrificial fill material. If an etch stop layer is employed, semiconductor materials such as amorphous silicon may be employed as the sacrificial fill material. The sacrificial fill material layer may be formed by a non-conformal deposition or a conformal deposition method. Excess portions of the sacrificial fill material can be removed from above the horizontal plane including the top surface of the second insulating cap layer 270 by a planarization process. The planarization process can include a recess etch process or a chemical mechanical planarization process. Each remaining portion of the deposited sacrificial material in the memory openings constitutes a sacrificial memory opening pillar 158. Each remaining portion of the deposited sacrificial material in the contact openings constitutes a sacrificial contact opening pillar 120. The sacrificial memory opening pillars 158 and the sacrificial contact opening pillars 120 include the same sacrificial fill material.

In an alternative embodiment, the sacrificial memory opening pillars 158 and the sacrificial contact opening pillars 120 can be formed by filling the volumes of the second-tier memory openings 249 and the second-tier contact opening 215 without removing the sacrificial memory opening fill portions 148 or the sacrificial contact opening fill portions 127. In this case, each sacrificial memory opening pillar 158 can include a sacrificial memory opening fill portion 148 and an overlying portion of a newly deposited sacrificial fill material that fills a respective second-tier memory opening 249. Each sacrificial contact opening pillar 120 can include a sacrificial contact opening fill portion 127 and an overlying portion of the newly deposited sacrificial fill material that fills a respective second-tier contact opening 215. Excess portions of the deposited sacrificial material can be removed from above the horizontal plane including the top surface of the second insulating cap layer 270.

Figure 27:
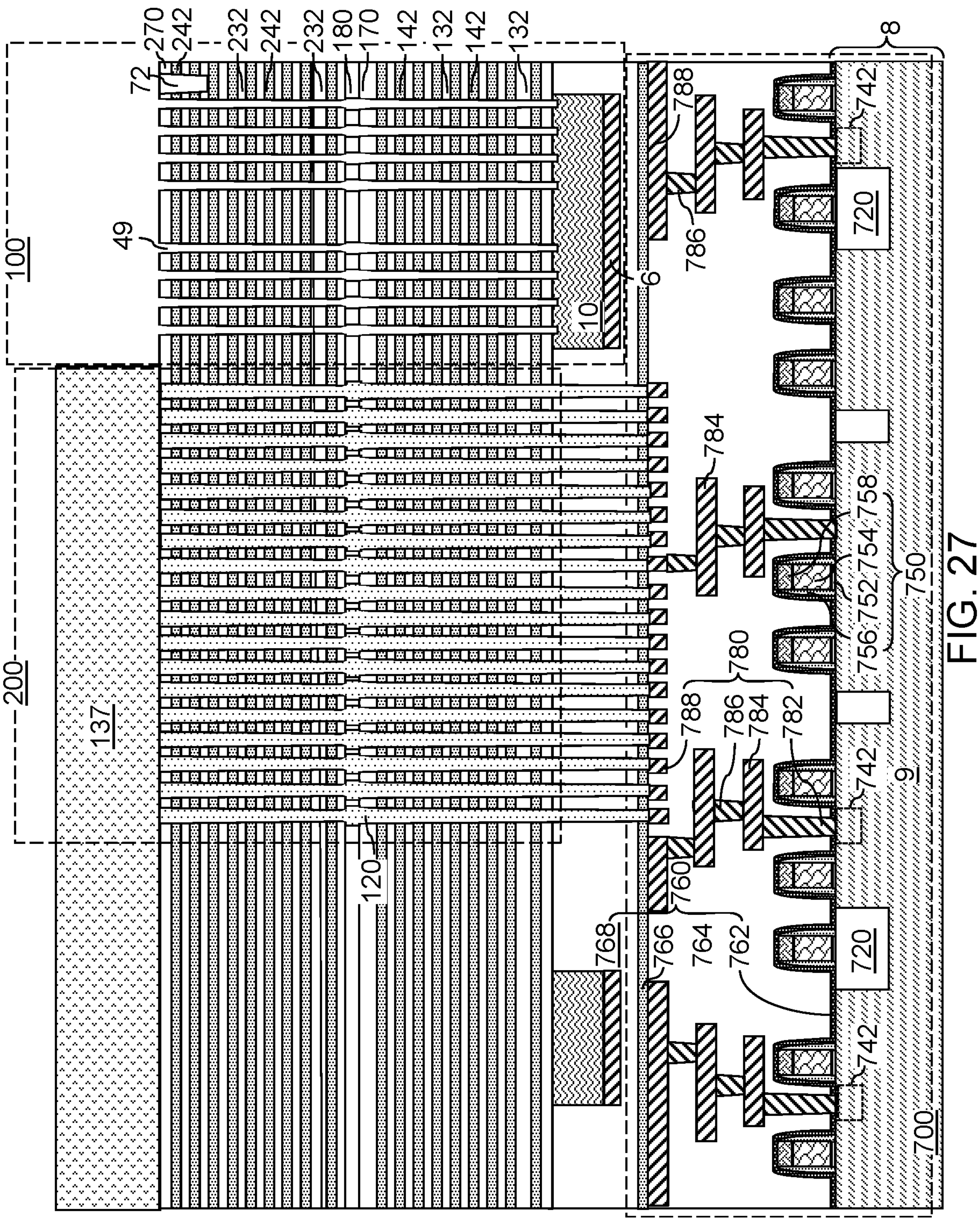
FIG. 27 is a vertical cross-sectional view of the second exemplary structure after removal of the sacrificial memory opening pillars from the inter-tier memory openings according to an embodiment of the present disclosure.

Referring to FIG. 27, an etch mask layer 137 can be applied over the second exemplary structure, and can be patterned to cover the word line contact region 200 without covering the memory array region 100. The etch mask layer 137 can be a patterned photoresist layer or a patterned hard mask layer. The sacrificial memory opening pillars 158 can be removed selective to the materials of the second alternating stack (232, 242), the first alternating stack (132, 142), the first and second insulating cap layers (170, 270), the inter-tier dielectric layer 180 (if present), and the semiconductor material layer 10. For example, if the sacrificial memory opening pillars 158 include borosilicate glass, a wet etch employing hydrofluoric acid or a vapor phase clean using HF vapor can be employed to remove the sacrificial memory opening pillars 158.

An inter-tier memory opening 49 can be formed in each volume from which the sacrificial memory opening pillars 158 are removed. Each inter-tier memory opening 49 includes a continuous volume that includes the volume of a first-tier memory opening 149 and the volume of a second-tier memory opening 249. The etch mask layer 137 is subsequently removed.

Figure 28:
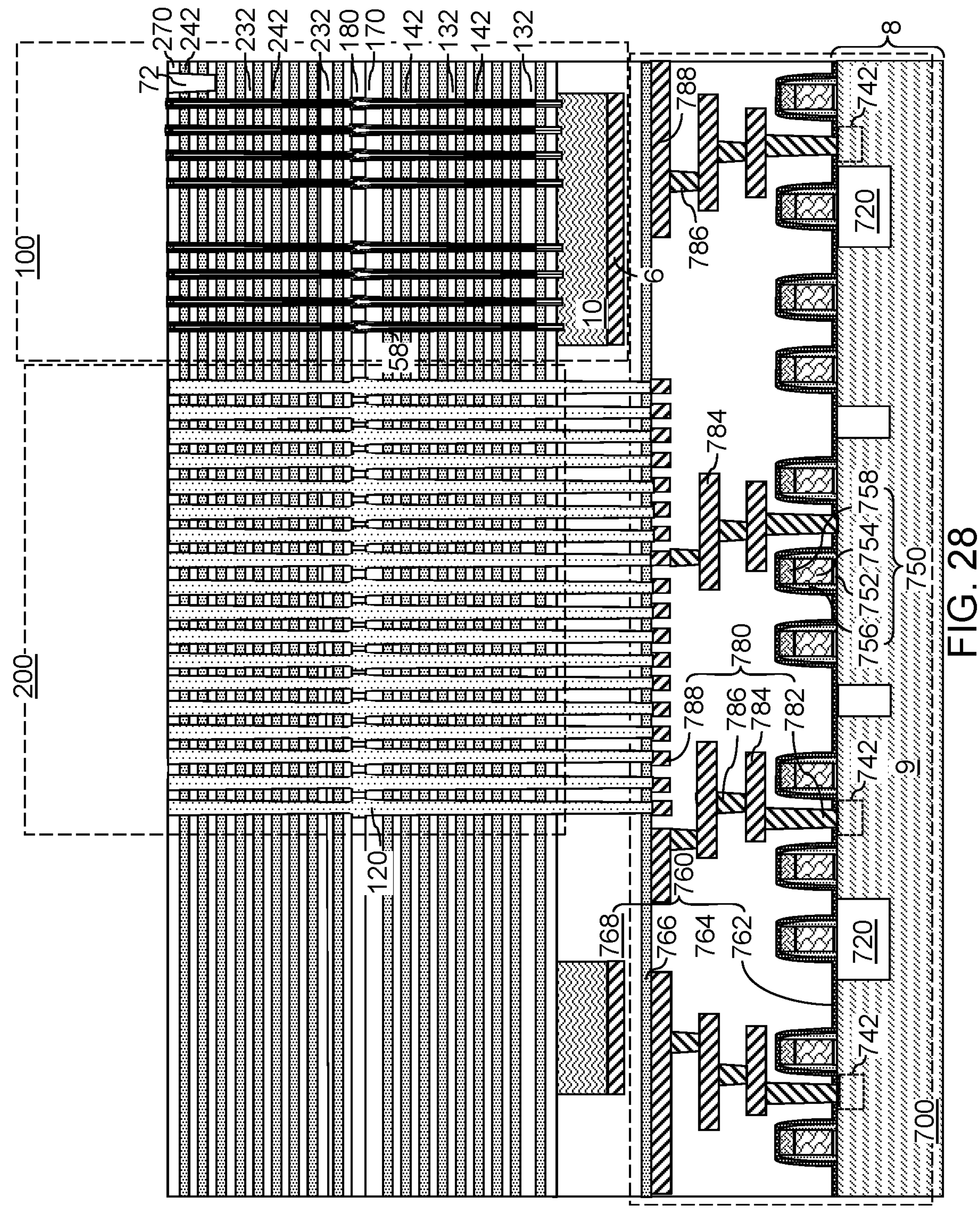
FIG. 28 is a vertical cross-sectional view of the second exemplary structure after formation of memory stack structures in the inter-tier memory openings according to an embodiment of the present disclosure.

Referring to FIG. 28, memory opening fill structures 58 are formed in each of the inter-tier memory openings 49. For example, the processing steps of FIGS. 9A-9H can be performed to form the memory opening fill structures 58, each of which includes a respective memory stack structure 55. Each memory stack structure vertically extends through the first alternating stack (132, 142) and the second alternating stack (232, 242). Each memory stack structure 55 comprises a memory film 50 and a vertical semiconductor channel 60 laterally surrounded by the memory film 50.

Subsequently, stepped surfaces are formed in the word line contact region 200. The stepped surfaces can be formed, for example, by forming a trimmable mask layer 117 that covers the memory array region 100 and a predominant portion of the word line contact region 200 that excludes a distal peripheral region of the word line contact region 200, etching unmasked areas of the word line contact region 200 to vertically recess a layer or a pair of layers in the unmasked areas, and iteratively trimming the trimmable mask layer 117 and vertically recessing unmasked areas of the word line contact region 200 by a pair of layers that includes a sacrificial material layer (242, 142) and an insulating layer (232, 132).

Figure 29:
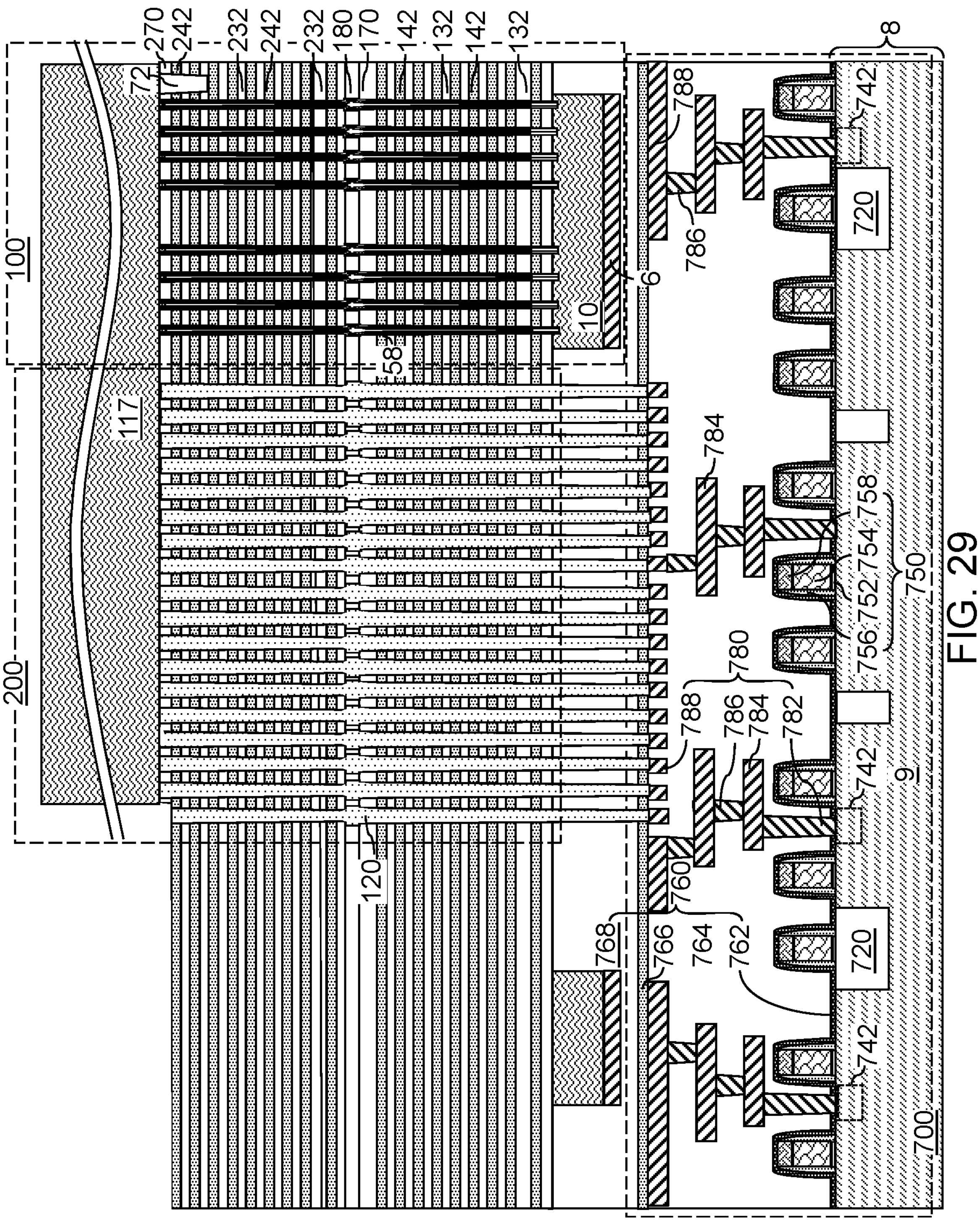
FIG. 29 is a vertical cross-sectional view of the second exemplary structure after application and patterning of a trimmable mask layer and an anisotropic etch process that removes a physically exposed portion of a second insulating cap layer according to an embodiment of the present disclosure.

Referring to FIG. 29, the second exemplary structure is illustrated during formation of the stepped surfaces. Specifically, the trimmable mask layer 117 is applied and patterned to cover the memory array region 100 and the predominant portion of the word line contact region 200 that excludes the distal peripheral region of the word line contact region 200. An anisotropic etch process is performed to etch a physically exposed portion of the second insulating cap layer 270.

Figure 30:
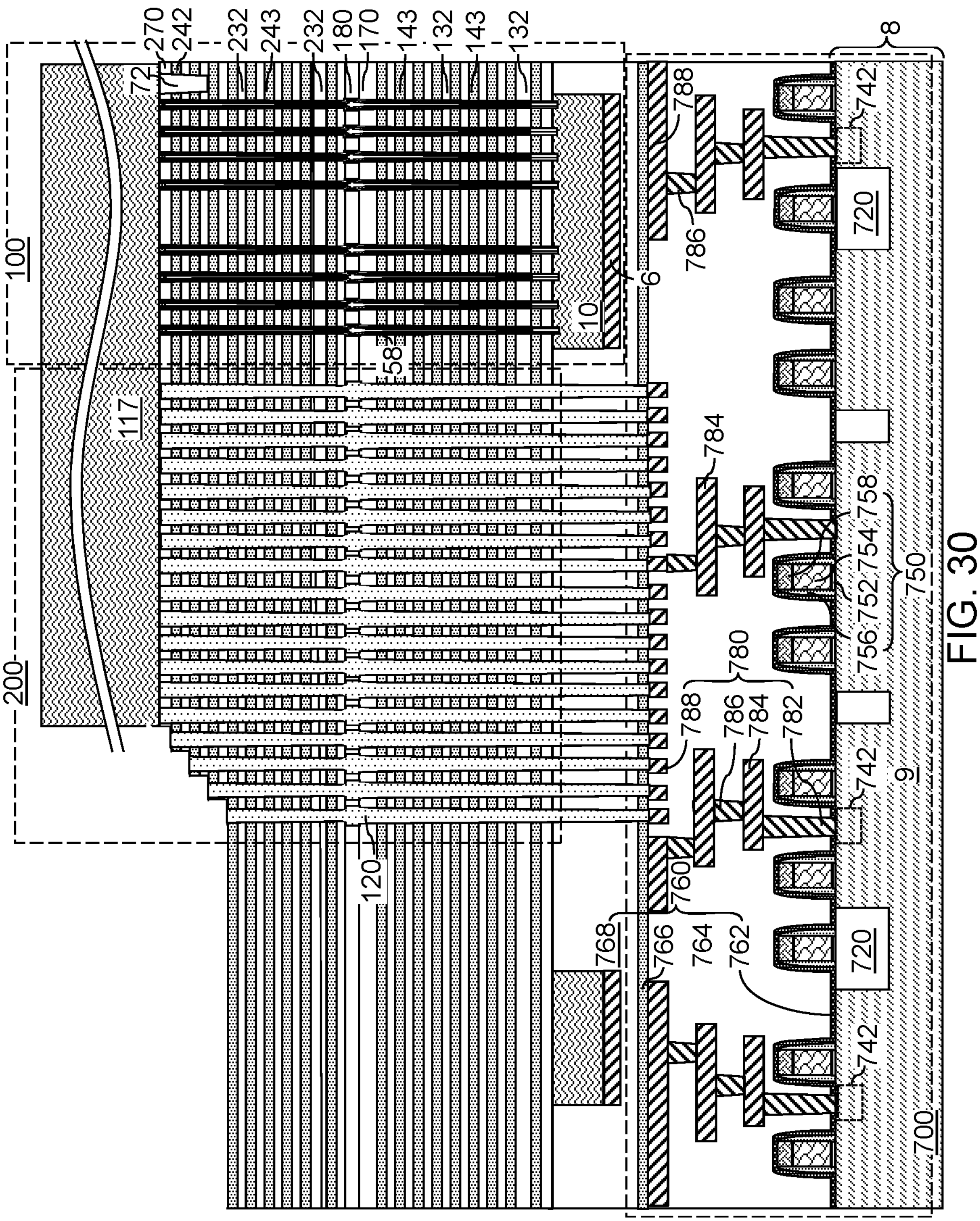
FIG. 30 is a vertical cross-sectional view of the second exemplary structure during formation of stepped surfaces in a word line contact region by repetition of an anisotropic etch process and trimming of the trimmable mask layer according to an embodiment of the present disclosure.

Referring to FIG. 30, a set of processing steps can be repeated multiple times to shift existing stepped surfaces downward and to form additional stepped surfaces. During the set of processing steps, upper portions of the sacrificial contact opening pillars 120 can be removed at approximately the same etch rate as the unmasked portions of the alternating stack (132, 142, 232, 242) so that the sacrificial contact opening pillars 120 do not protrude above the stepped surfaces.

Each set of processing steps includes a first step of removing an uppermost pair of layers that includes one of the insulating layers (232, 132) and one of the sacrificial material layers (242, 142) within each area that is not covered by the trimmable mask layer 117, and removing each portion of the sacrificial contact opening pillars 120 from above a physically exposed horizontal surface within each area that is not covered by the trimmable material layer 117. In one embodiment, the insulating layers (232, 132) can include, and/or can consist essentially of, undoped silicate glass, the sacrificial material layers (242, 142) can include, and/or can consist essentially of, silicon nitride, and the sacrificial contact opening pillars 120 can include, and/or can consist essentially of, borosilicate glass or a porous organosilicate glass. The first step can be effected by an anisotropic etch process. The etch chemistry of the anisotropic etch process can be selected to remove the materials of the insulating layers (232, 132), the sacrificial material layers (242, 142), and the sacrificial contact opening pillars 120 at approximately the same removal rate.

Each set of processing steps include a second step of trimming the trimmable mask layer 117 to provide an additional area that is not covered by the trimmable mask layer 117. Each additional area can include the area of a sacrificial contact opening pillar 120 that is more proximal to the memory array region 100 than previously exposed sacrificial contact opening pillars 120. Thus, each second step can physically expose an additional sacrificial contact opening pillar 120 among each row of sacrificial contact opening pillars 120 that are arranged along the first horizontal direction hd1.

Figure 31:
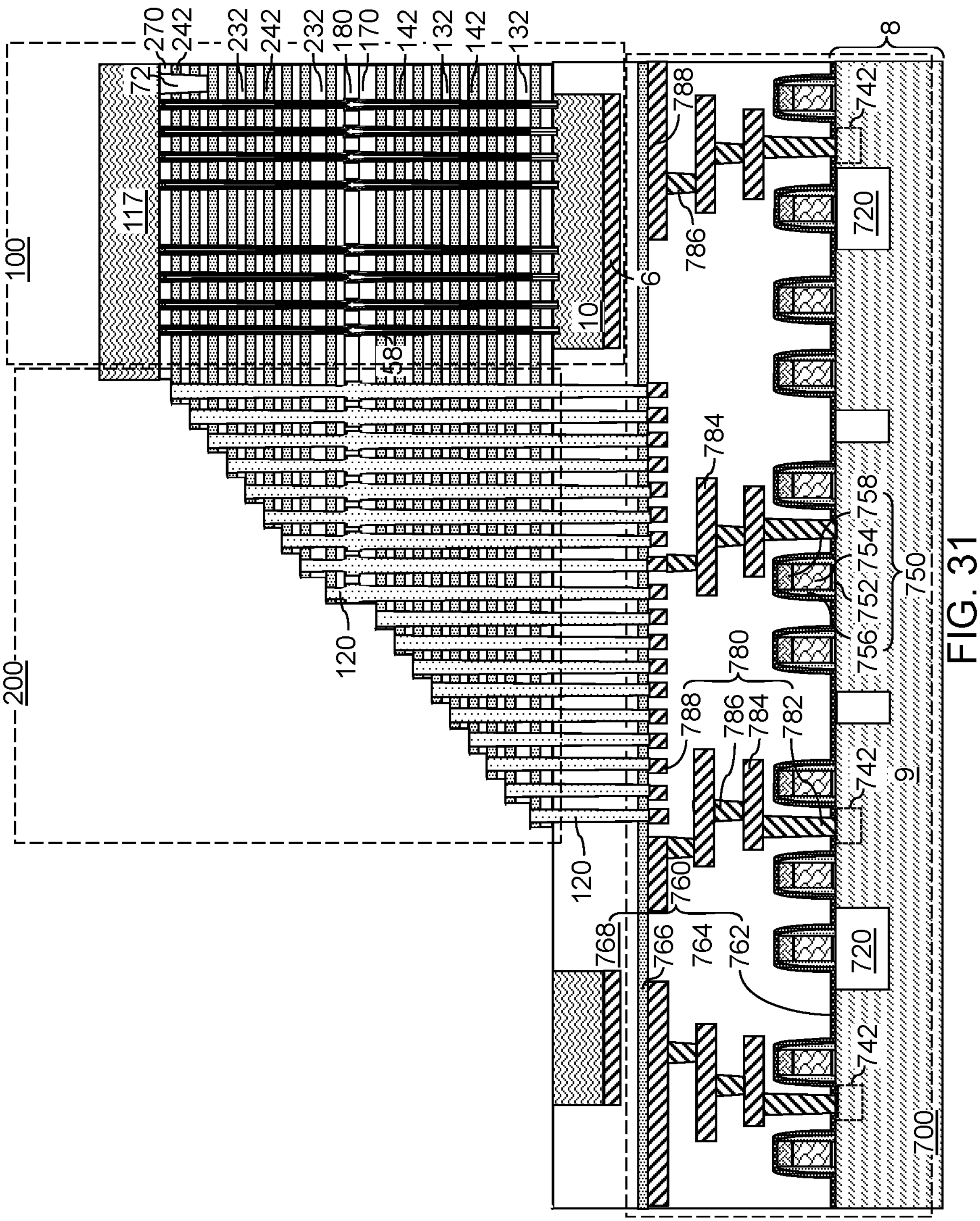
FIG. 31 is a vertical cross-sectional view of the second exemplary structure after formation of stepped surfaces in a word line contact region by repetition of an anisotropic etch process and trimming of the trimmable mask layer according to an embodiment of the present disclosure.

Referring to FIG. 31, the set of processing steps is repeated until the at least one second dielectric material layer 768 is physically exposed and the stepped surfaces continuously extend from the bottommost layer of the alternating stacks (132, 142, 232, 242) to the topmost layer of the alternating stacks (132, 142, 232, 242). Generally, an anisotropic etch process and trimming of the trimmable mask layer 117 can be repeated to pattern the alternating stacks (132, 142, 232, 242), thereby forming the stepped surfaces in the word line contact region 200. The stepped surfaces can include stepped terraces that laterally extend along the second horizontal direction hd2. Upper portions of the sacrificial contact opening pillars 120 can be removed concurrently with formation of the stepped surfaces.

Mismatch between the etch rate of the material of the sacrificial contact opening pillars 120 and the materials of the alternating stacks (132, 142, 232, 242) may cause remaining portions of the sacrificial contact opening pillars 120 to protrude above the stepped surfaces of the alternating stacks (132, 142, 232, 242) or to be recessed below the stepped surfaces of the alternating stacks (132, 142, 232, 242). Such protrusions or recesses are acceptable because the sacrificial contact opening pillars 120 are subsequently removed selective to the alternating stacks (132, 142, 232, 242). The trimmable mask layer 117 can be subsequently removed, for example, by ashing or by dissolving in a solvent.

Figure 32:
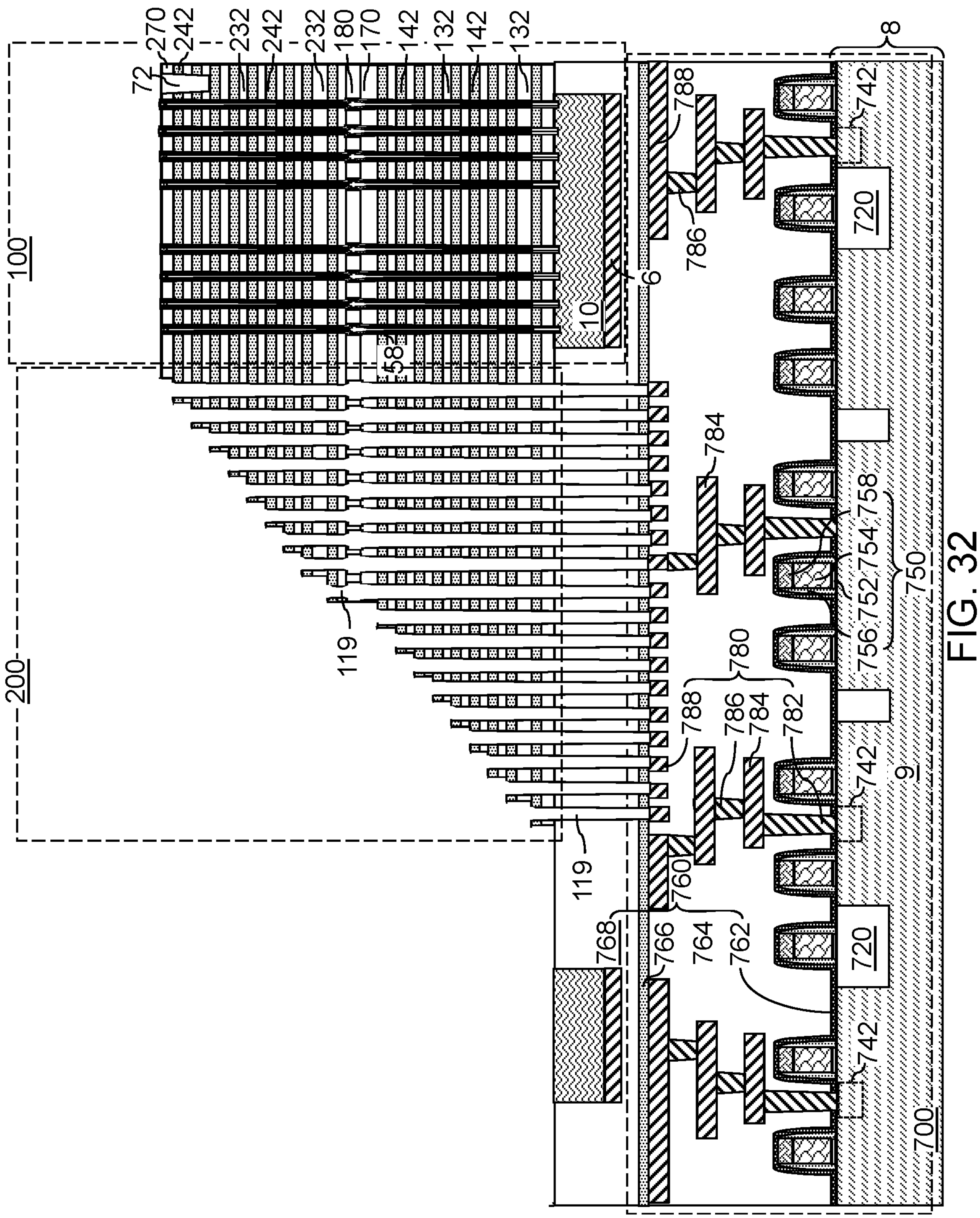
FIG. 32 is a vertical cross-sectional view of the second exemplary structure after selective removal of remaining portions of the sacrificial contact opening pillars to form contact via cavities according to an embodiment of the present disclosure.

Referring to FIG. 32, remaining portions of the sacrificial contact opening pillars 120 can be removed selective to the materials of the alternating stacks (132, 142, 232, 242), the at least one second dielectric material layer 768, the first and second insulating cap layers (170, 270), the inter-tier dielectric layer 180 (if present), and the semiconductor material layer 10. For example, if the sacrificial contact opening pillars 120 include borosilicate glass, a wet etch employing hydrofluoric acid or a vapor phase clean using HF vapor can be employed to remove the remaining portions of the sacrificial contact opening pillars 120. Contact via cavities 119 can be formed in each volume from which the sacrificial contact opening pillars 120 are removed. A top surface of a respective one of the topmost lower metal line structures 788 can be physically exposed at the bottom of each contact via cavity 119. The bottom surfaces of the contact via cavities 119 can be within a same horizontal plane such as the horizontal plane including the top surfaces of the topmost lower metal line structures 788. Each of the contact via cavities 119 has a top periphery that is adjoined to a respective horizontal surface of the stepped surfaces.

Subsequently, a continuous insulating liner layer is formed by a conformal deposition process. The continuous insulating liner layer includes an insulating material that is different from the material of the sacrificial material layers (142, 242). In one embodiment, the continuous insulating liner layer can include a dielectric metal oxide (such as aluminum oxide) or silicon oxide. The continuous insulating liner layer can be deposited within each contact via cavity 119 and over the stepped surfaces of the alternating stacks (132, 142, 232, 242). The thickness of the continuous insulating liner layer may be in a range from 2 nm to 40 nm, such as from 4 nm to 20 nm, although lesser and greater thicknesses can also be employed. The continuous insulating liner layer continuously covers the exposed underlying area prior to the subsequent etching step.

An anisotropic etch process is performed on the continuous insulating liner layer to remove horizontal portions of the continuous insulating liner layer. Each remaining vertical portion of the continuous insulating liner layer within the contact via cavities 119 constitutes an insulating tubular liner 66, having the configuration shown in FIG. 33. Each insulating tubular liner 66 has a general configuration of a tube, and extends from a bottom surface of a respective contact via cavity 119 to a topmost region of the contact via cavity 119. A top surface of a respective one of the topmost lower metal line structures 788 is physically exposed within a bottom region of each insulating tubular liner 66.

At least one continuous conductive material layer 67L is deposited in unfilled volumes of the contact via cavities 119 and over the stepped surfaces of the alternating stacks (132, 142, 232, 242). The at least one continuous conductive material layer 67L can include a stack of multiple conductive layers. For example, the at least one continuous conductive material layer 67L can include a continuous metallic nitride liner layer 67A and a continuous metal fill layer 67B. The continuous metallic nitride liner layer 67A can be deposited on physically exposed top surfaces of the lower interconnect structures 780 and on inner sidewalls of the insulating tubular liners 66. The continuous metallic nitride liner 67A can include a conductive metallic nitride material such as TiN, TaN, and/or WN, and can have a thickness in a range from 2 nm to 40 nm, such as from 4 nm to 20 nm, although lesser and greater thicknesses can also be employed. The continuous metal fill layer 67B can be deposited on the continuous metallic nitride liner layer 67A. The continuous metal fill layer 67B includes a metal such as tungsten, copper, aluminum, ruthenium, cobalt, molybdenum, or any other metal that can be employed for metal interconnect structures. The continuous metal fill layer 67B can fill remaining volumes of the contact via cavities 119.

Figure 34:
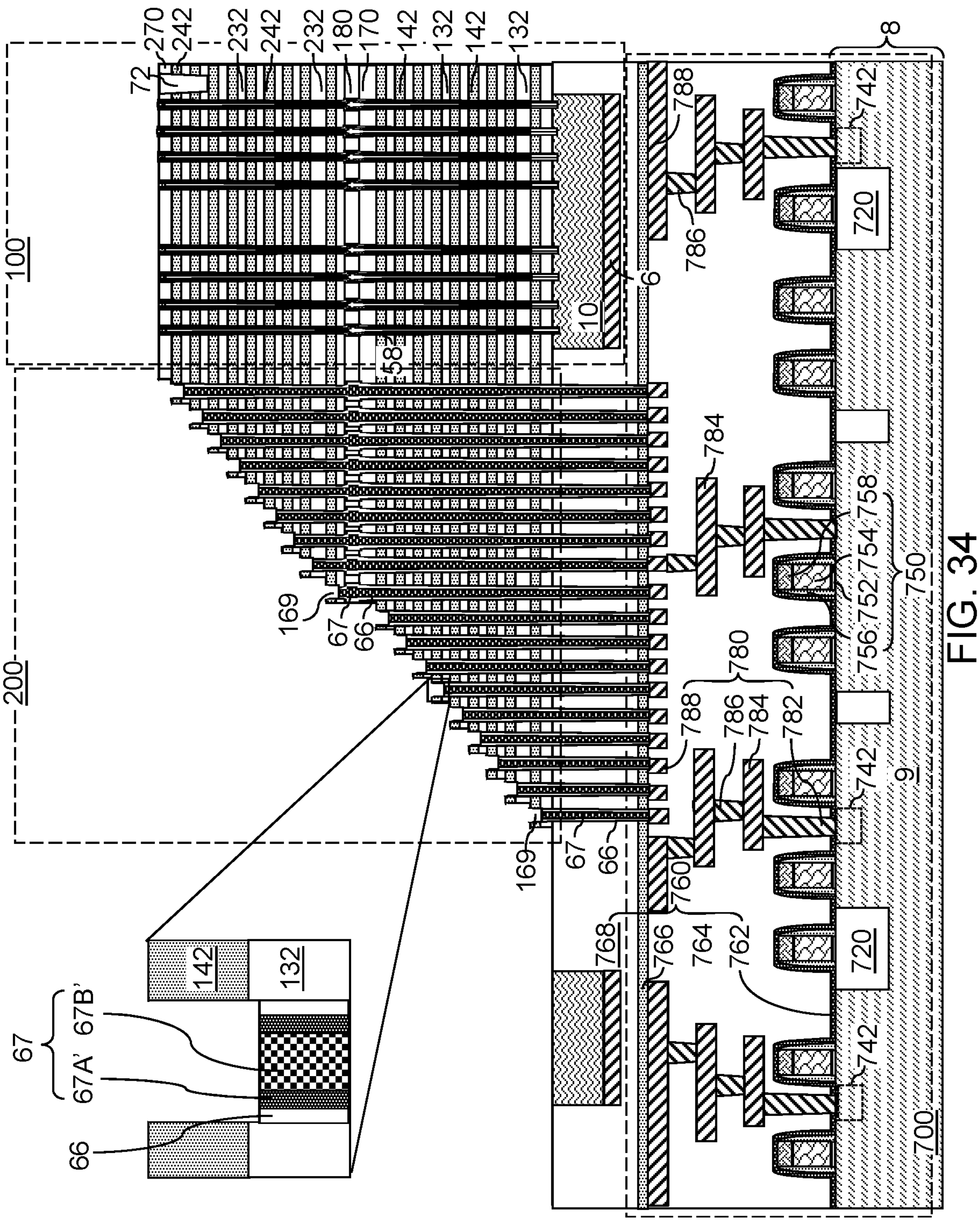
FIG. 34 is a vertical cross-sectional view of the second exemplary structure after recessing the continuous metallic nitride liner layer and a continuous metal fill layer to form metallic nitride liners and metal fill portions according to an embodiment of the present disclosure.

Referring to FIG. 34, the continuous metal fill layer 67B and the continuous metallic nitride liner layer 67A can be anisotropically etched outside the volumes of the contact via cavities 119. In one embodiment, top surfaces of remaining portions of the continuous metal fill layer 67B and the continuous metallic nitride liner layer 67A can be vertically recessed below the bottom surface of sacrificial material layers (142, 242) including physically exposed horizontal surfaces as components of the stepped surfaces. Each remaining portion of the continuous metallic nitride liner layer 67A constitutes a metallic nitride liner 67A'. Each remaining portion of the continuous metal fill layer 67B constitutes a metal fill portion 67B'. Metallic nitride liners 67A' are located within a respective one of the contact via cavities 119, and metal fill portions 67B' are located within a respective one of the metallic nitride liners 67A'. Each contiguous set of a metallic nitride liner 67A' and a metal fill portion 67B' constitutes a laterally-insulated via structure 67.

Physically exposed portions of the insulating tubular liners 66 that protrude above the top surfaces of the laterally-insulated via structure 67 can be removed by an etch process, which can be an isotropic etch process. Sidewalls of the sacrificial material layers (142, 242) including physically exposed top surfaces as horizontal surfaces of the stepped surfaces are physically exposed around each contact via cavity 119 (which is partly filled with an insulating tubular liner 66 and a respective laterally-insulated via structure 67). In one embodiment, the upper periphery of the outer sidewall of each insulating tubular liner 66 can be on a sidewall of an insulating layer (132, 232) that contact a bottom surface of a sacrificial material layer (142, 242) having a physically exposed top surface, or on a sidewall of the inter-tier dielectric layer 180 (or on a sidewall of the first insulating cap layer 170) that contact a bottom surface of a sacrificial material layer (142, 242) having a physically exposed top surface. A sidewall of a on respective sacrificial material layer (142, 242) is physically exposed within each of the contact via cavities 119 after formation of the laterally-insulated via structures 67, i.e., after formation of the metallic nitride liners 67A' and the metal fill portions 67B'.

Figure 35:
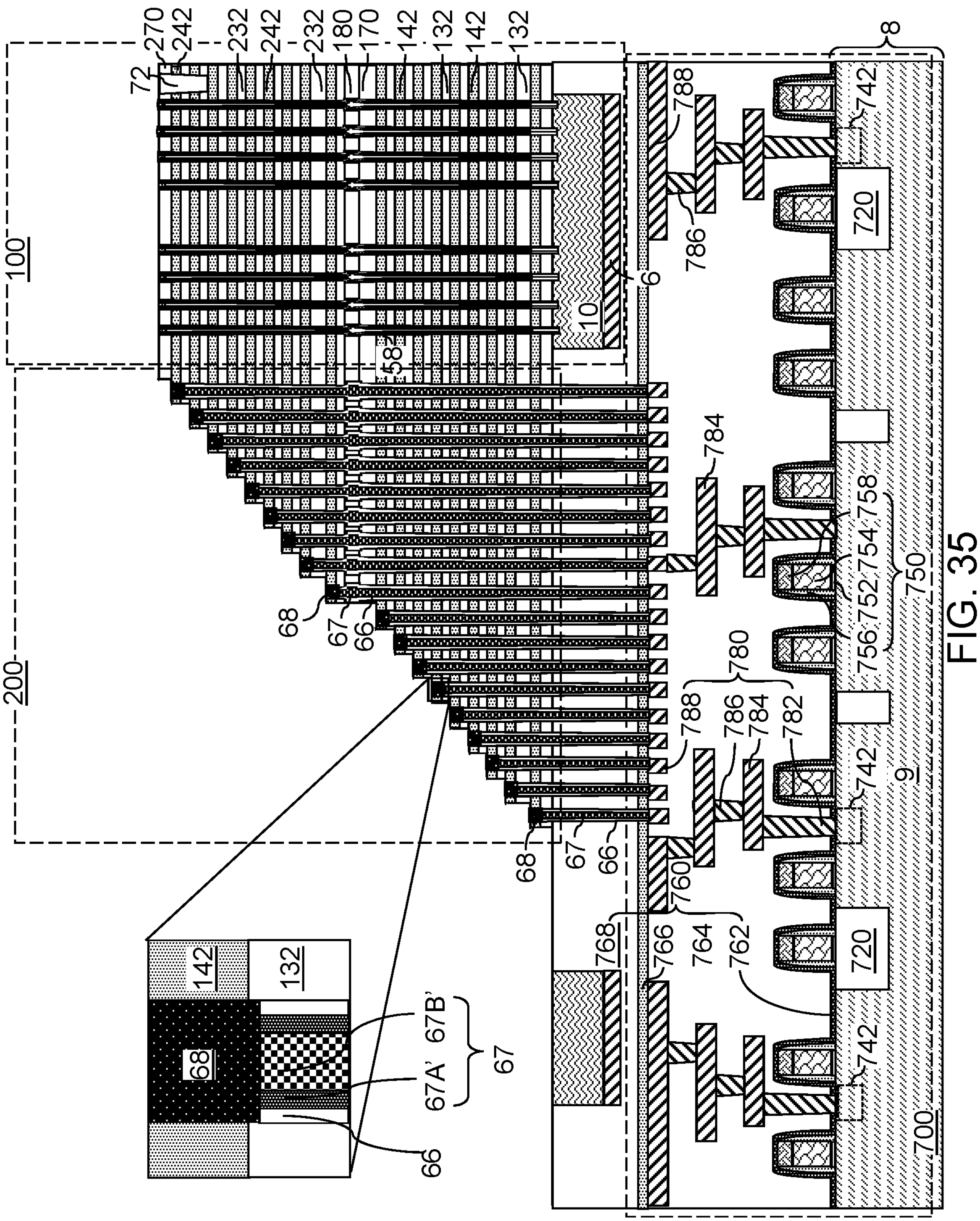
FIG. 35 is a vertical cross-sectional view of the second exemplary structure after formation of metallic pillar structures on each metal fill portion employing a selective metal deposition process according to an embodiment of the present disclosure.

Referring to FIG. 35, a metallic pillar structure 68 is formed on top of each adjoining pair of a metallic nitride liner 67A' and a metal fill portion 67B', i.e., on top of each laterally-insulated via structure 67. The metallic pillar structures 68 are formed in unfilled volumes of each of the contact via cavities 119 and directly on the sidewalls of the sacrificial material layers (142, 242) that are present around the contact via cavities 119. Specifically, each of the metallic pillar structures 68 is formed in a respective unfilled volume of each respective one of the contact via cavities 119 and directly on the sidewall of the respective one of the sacrificial material layers (142, 242) that is present around the respective contact via cavities 119. The metallic pillar structures 68 include a metal such as tungsten, copper, aluminum, ruthenium, cobalt, molybdenum, or a combination thereof. The material of the metallic pillar structures 68 may be the same as, or may be different from, the material of the metal fill portions 67B'.

In one embodiment, the metallic pillar structures 68 may be formed by a selective metal deposition process that grows a metallic material from surfaces of the metallic nitride liners 67A' and the metal fill portions 67B' and does not grow the metallic material from surfaces of the insulating layers (132, 232) and the sacrificial material layers (142, 242). The duration of the selective metal deposition process can be selected such that the metallic pillar structures 68 has a top surface that is substantially coplanar with the horizontal surfaces in the stepped surfaces, i.e., with the physically exposed top surfaces of the sacrificial material layers (142, 242) in the stepped surfaces. In one embodiment, top surfaces of the metallic pillar structures 68 protrude above the physically exposed surfaces of the sacrificial material layers (142, 242) within the stepped surfaces. In another embodiment, top surfaces of the metallic pillar structures 68 are recessed below the physically exposed surfaces of the sacrificial material layers (142, 242) within the stepped surfaces. In yet another embodiment, top surfaces of the metallic pillar structures 68 are coplanar with the physically exposed surfaces of the sacrificial material layers (142, 242) within the stepped surfaces.

Each contiguous set of a laterally-insulated via structure 67 and a metallic pillar structure 68 constitutes a word line contact via structure (67, 68), which is a contact via structure that provides electrical connection to one of word lines to be subsequently formed by replacement of the sacrificial material layers (142, 242) with electrically conductive layers.

Thus, remaining portions of the sacrificial contact opening pillars 120 provided at the processing steps of FIG. 31 are replaced with the word line contact via structures (67, 68). Each of the contact via structures (67, 68) can be formed on a sidewall of a respective one of the insulating tubular liners 66. Specifically, the laterally-insulated via structure 67 portion of each of the contact via structures (67, 68) can be formed on a sidewall of a respective one of the insulating tubular liners 66. The word line contact via structures (67, 68) are formed in the word line contact region 200. Each word line contact via structure (67, 68) laterally contacts a respective one of the sacrificial material layers (142, 242), vertically extends through a respective opening in at least a bottommost sacrificial material layer of the alternating stacks (132, 142, 232, 242), and contacts a respective one of the lower interconnect structures 780 that underlie the alternating stacks (132, 142, 232, 242). Specifically, the metallic pillar structure 68 portion of each word line contact via structure (67, 68) laterally contacts the respective one of the sacrificial material layers (142, 242).

Figure 36A:
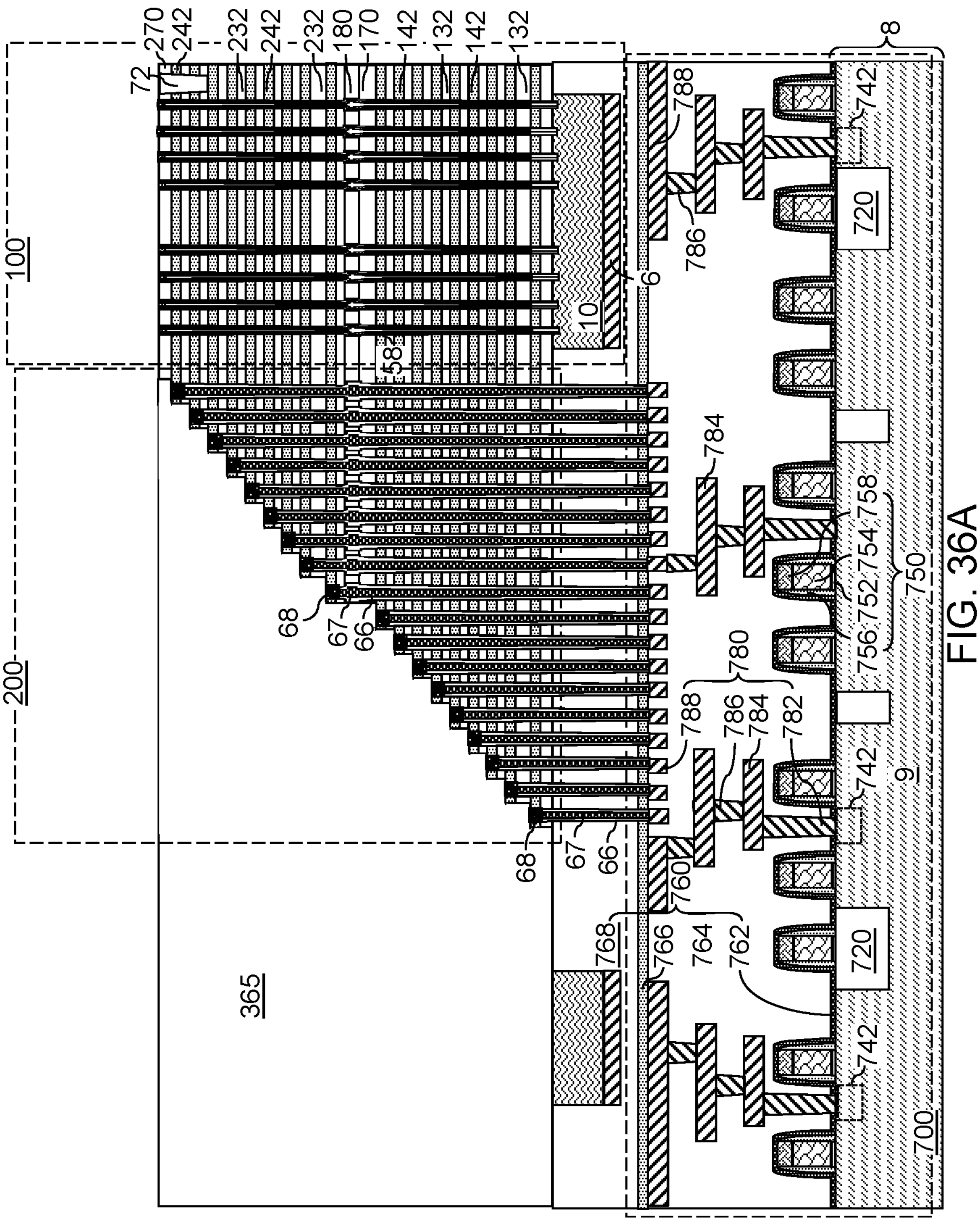
FIG. 36A is a vertical cross-sectional view of the second exemplary structure after formation of a retro-stepped dielectric material portion according to an embodiment of the present disclosure.
Figure 36B:
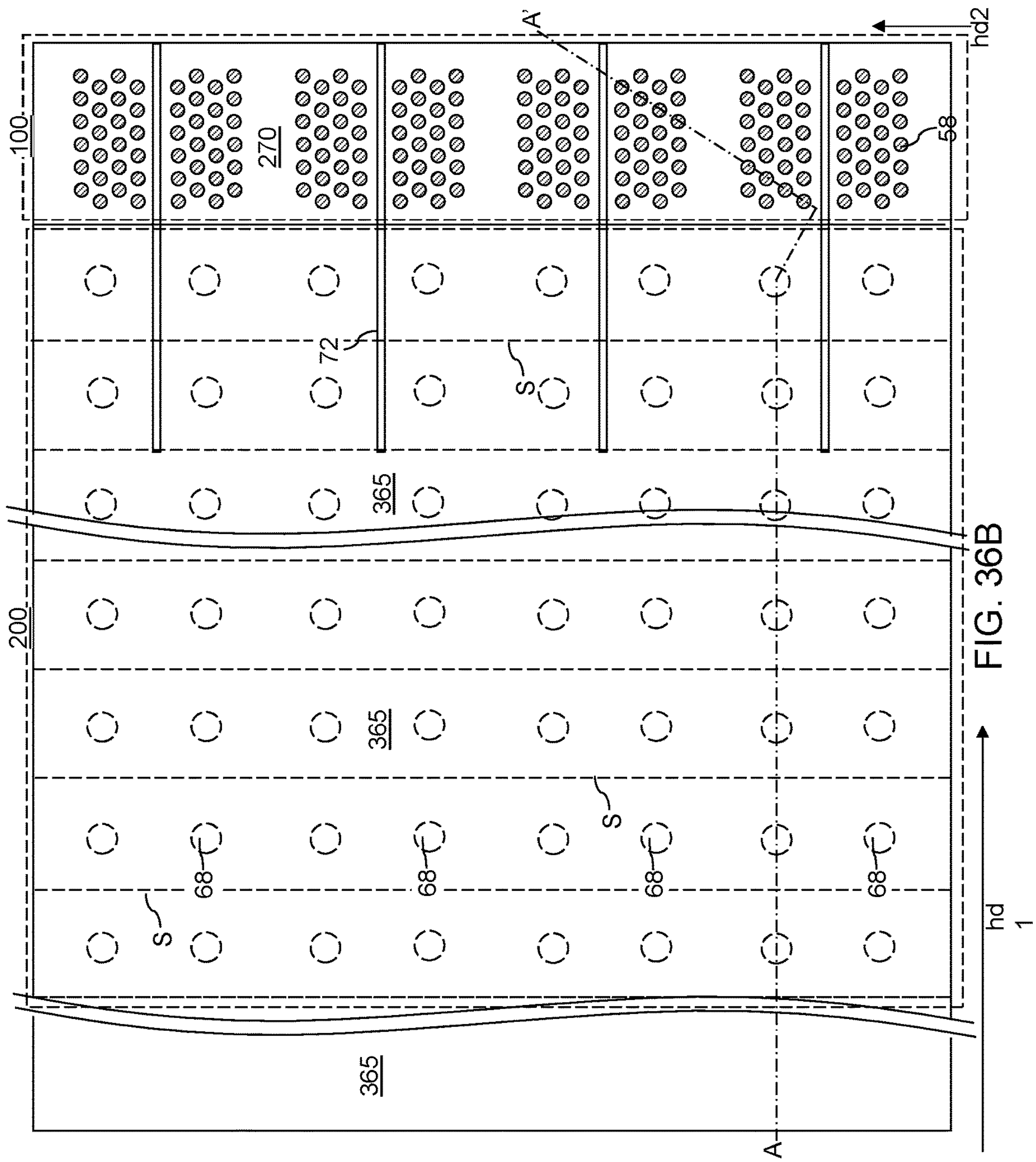
FIG. 36B is a top-down view of the second exemplary structure of FIG. 36A.

Referring to FIGS. 36A and 36B, a dielectric material can be deposited in the stepped cavity overlying the stepped surfaces. The dielectric material can be subsequently planarized employing the top surface of the second insulating cap layer 270 as a stopping surface. The remaining portion of the deposited dielectric material forms a retro-stepped dielectric material portion 365. The retro-stepped dielectric material portion 365 includes a dielectric material that is different from the material of the sacrificial material layers (142, 242). For example, the retro-stepped dielectric material portion 365 can include undoped silicate glass or doped silicate glass. The top surface of the retro-stepped dielectric material portion 365 can be coplanar with the top surface of the second insulating cap layer 270. The bottom surfaces of the retro-stepped dielectric material portion 365 contacts the stepped surfaces of the alternating stacks (132, 142, 232, 242) and top surfaces of the word line contact via structures (67, 68).

Figure 37:
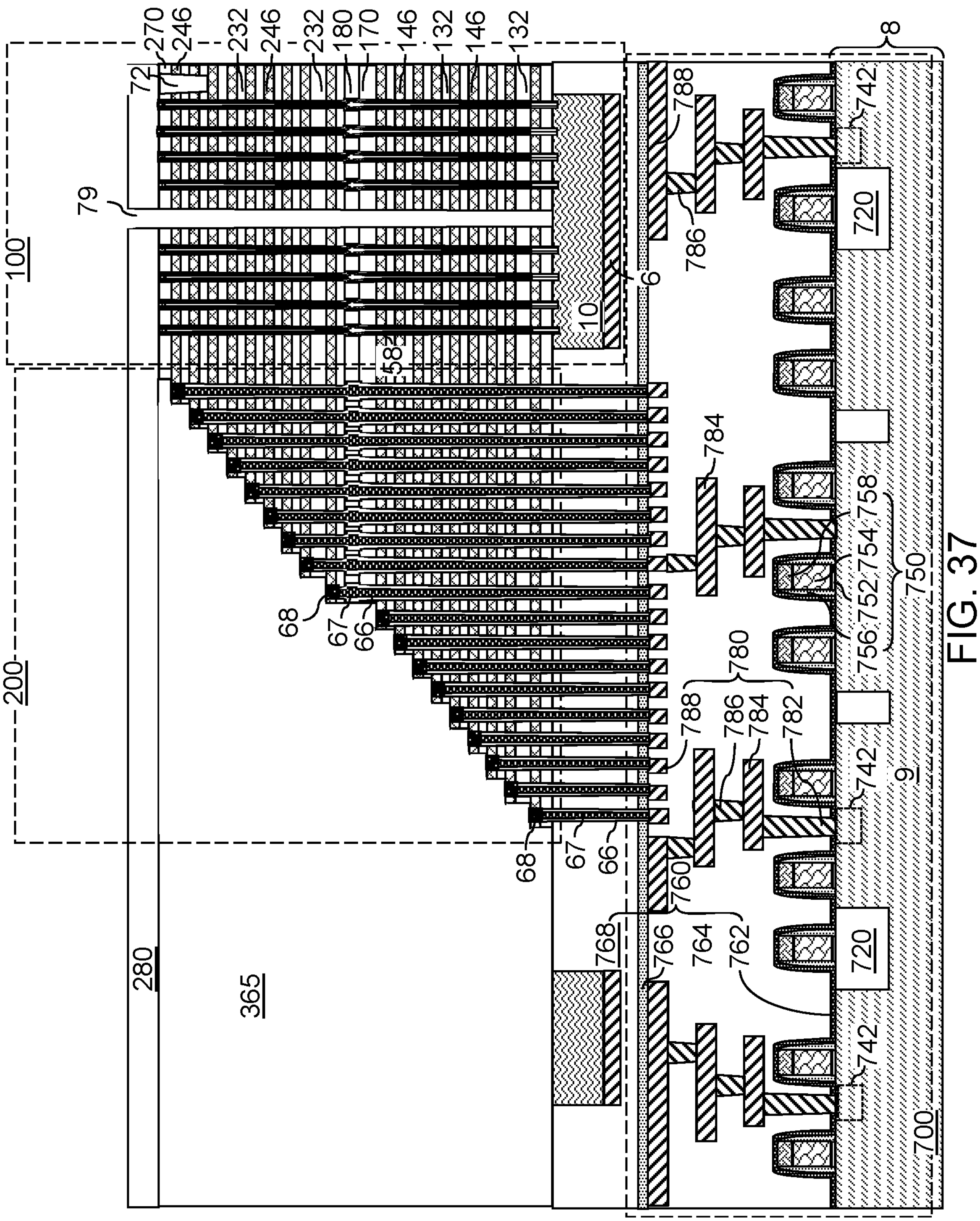
FIG. 37 is a vertical cross-sectional view of the second exemplary structure after formation of a first contact level dielectric layer and backside trenches and replacement of the sacrificial material layers with electrically conductive layers according to an embodiment of the present disclosure.

Referring to FIG. 37, the processing steps of FIGS. 10A and 10B can be performed to form a first contact level dielectric layer 280 and backside trenches 79. Subsequently, a first subset of the processing steps of FIGS. 11A and 11B can be performed to replace the sacrificial material layers (142, 242) with electrically conductive layers (246, 246). The word line contact via structures (67, 68) provide structural support in the word line contact region 200 and the memory opening fill structures 58 provide structural support in the memory array region 100 while backside recesses are present between vertically neighboring pairs of insulating layers (132, 232) during replacement of the sacrificial material layers (142, 242) with the electrically conductive layers (246, 246). Each electrically conductive layer (146, 246) contacts a respective one of the word line contact via structures (67, 68). In other words, each electrically conductive layer (146, 246) contacts the metallic pillar structure 68 portion of the respective one of the word line contact via structures (67, 68).

Figure 11A:
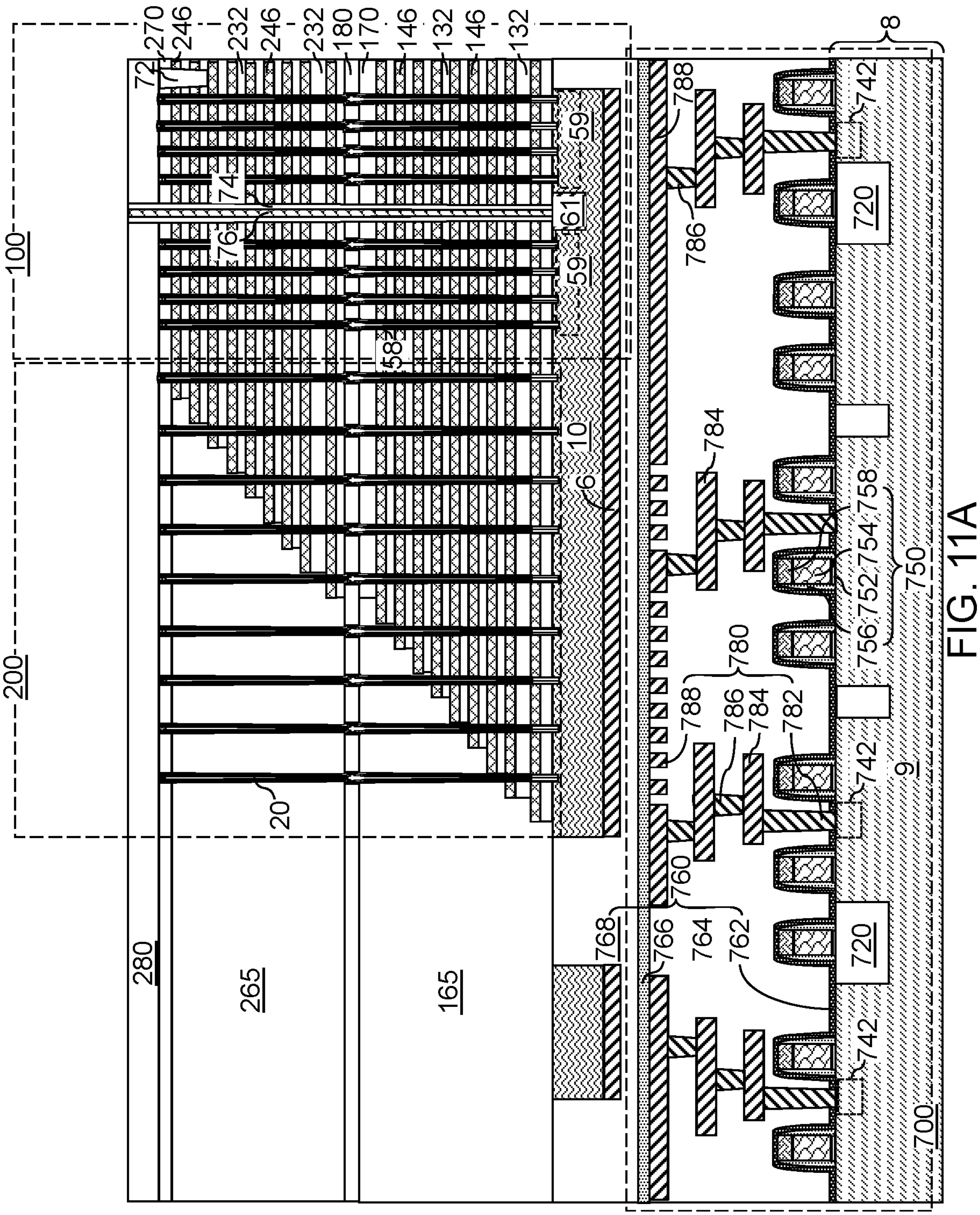
FIG. 11A is a vertical cross-sectional view of the first exemplary structure after formation of through-stack insulating material portion according to an embodiment of the present disclosure.
Figure 11B:
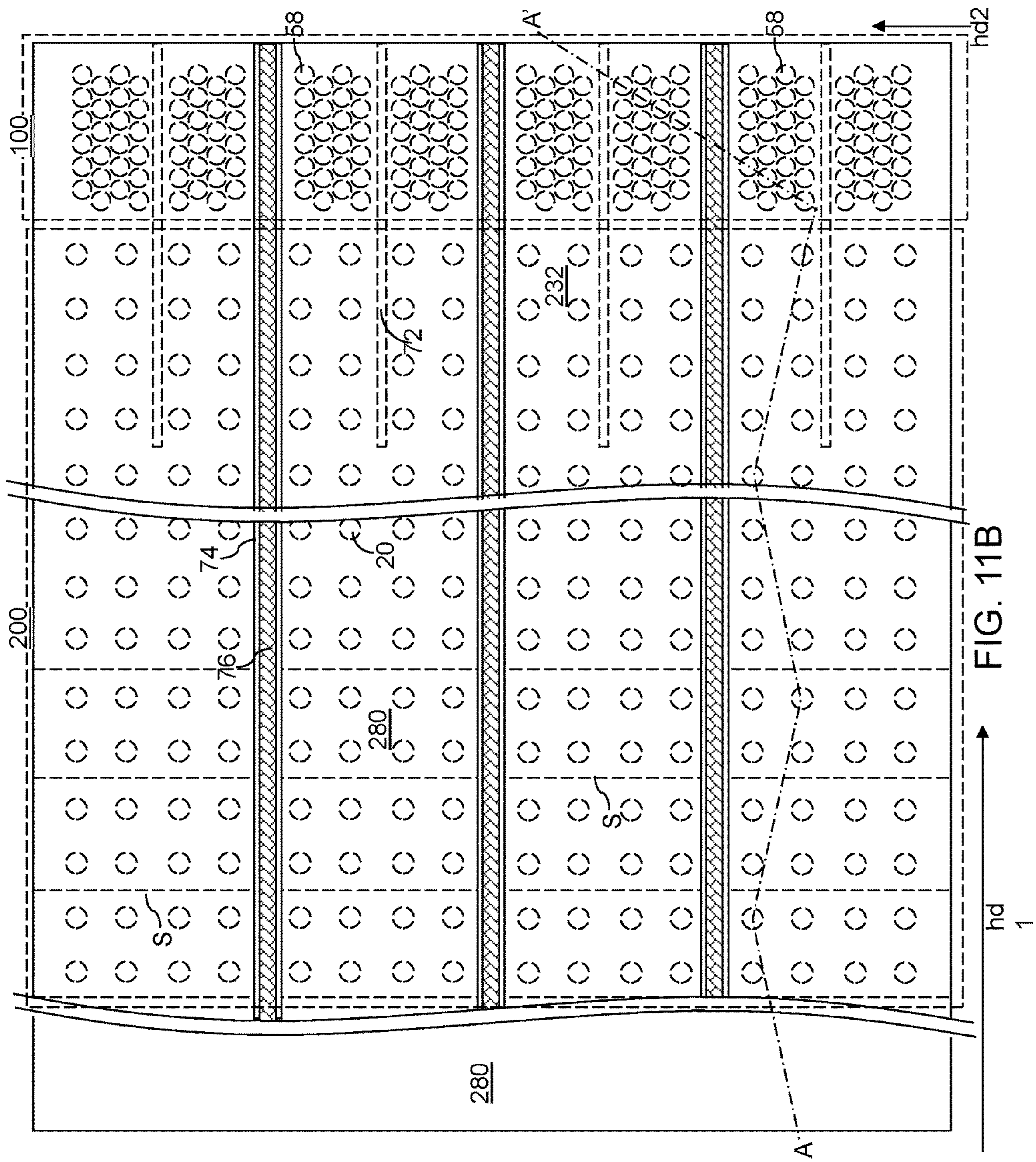
FIG. 11B is a horizontal cross-sectional view of the first exemplary structure. The zig-zag vertical plane A-A' corresponds to the plane of the vertical cross-sectional view of FIG. 11A.
Figure 38A:
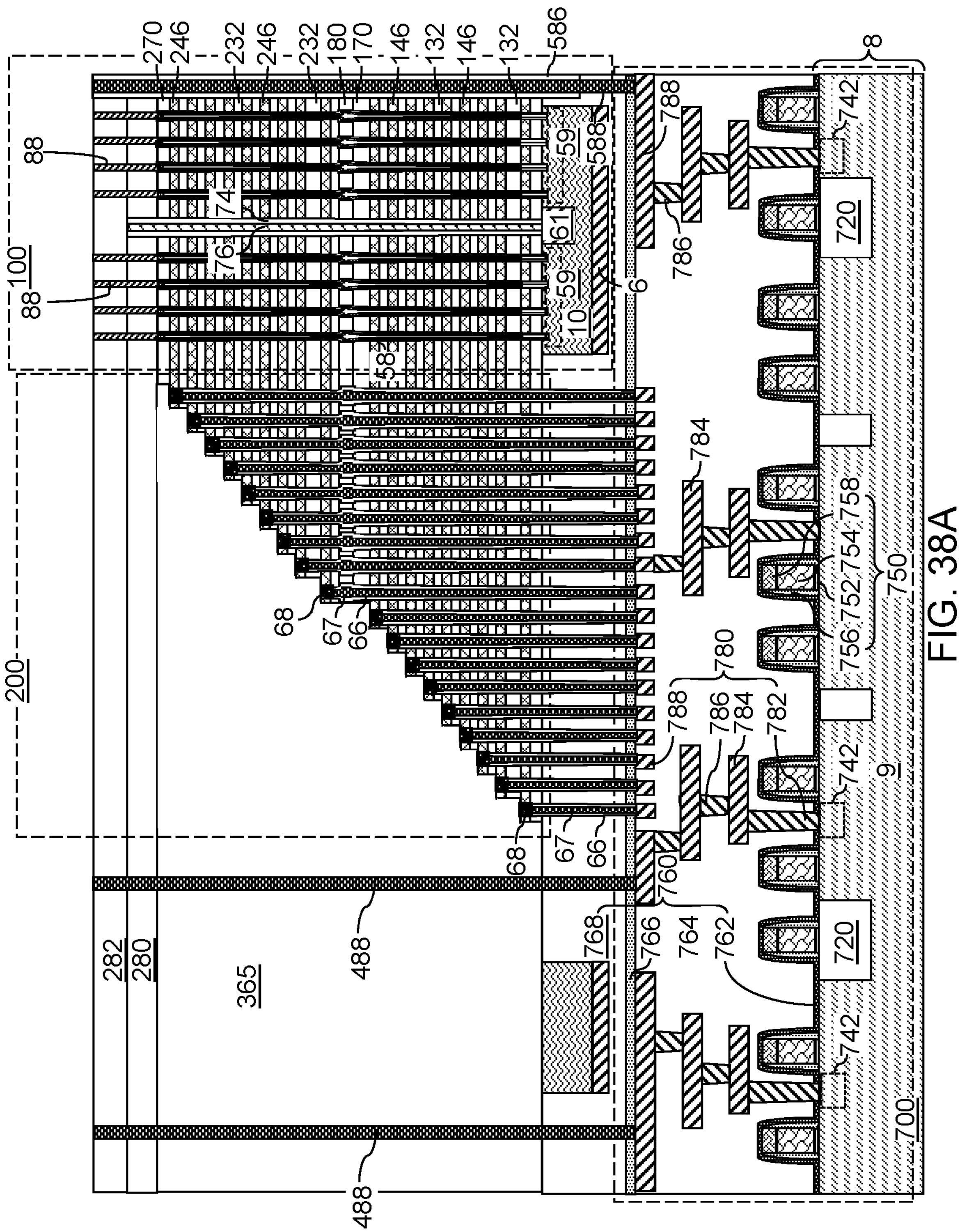
FIG. 38A is a vertical cross-sectional view of the second exemplary structure after formation of a second contact level dielectric layer, through-stack insulating spacers, and through-stack contact via structures according to an embodiment of the present disclosure.
Figure 38B:
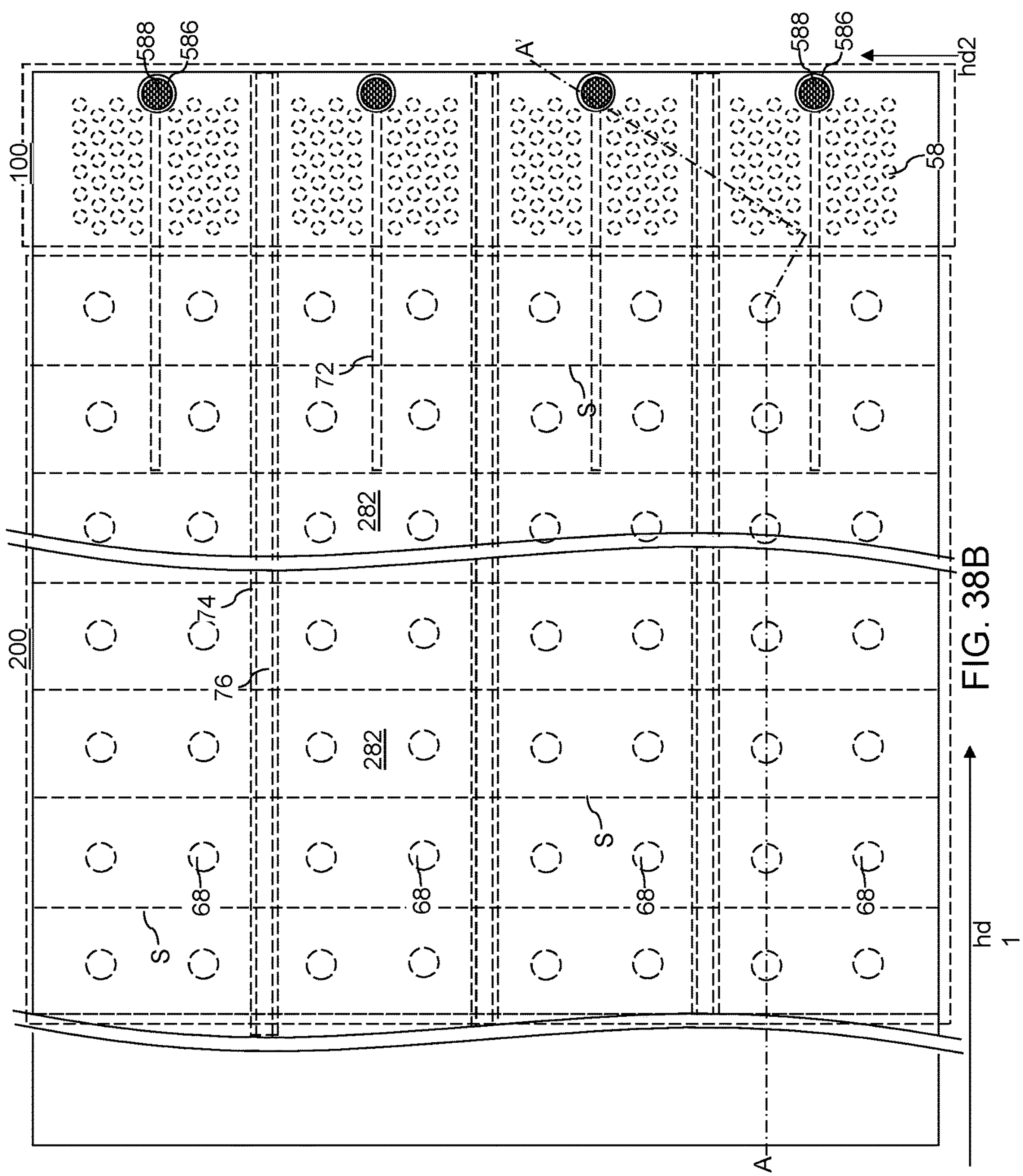
FIG. 38B is a top-down view of the second exemplary structure of FIG. 38A.

Referring to FIGS. 38A and 38B, a second subset of the processing steps of FIGS. 11A and 11B can be performed to form source regions 61, insulating spacers 74, and backside contact via structures 76 (which may be laterally-elongated contact via structures). Subsequently, a second contact level dielectric layer 282 can be formed over the second contact level dielectric layer 280.

The processing steps of FIGS. 12A and 12B can be performed, with modification, to form the drain contact via structures 88 without forming the word line contact via structures 86 of the first embodiment. Omission of formation of the word line contact via structures 86 can be effected by modifying the pattern in the etch mask for forming cavities for the drain contact via structures 88 such that the etch mask does not include any openings in the word line contact region 200. In the second exemplary structure, the word line contact via structures (67, 68) as formed at the processing steps of FIG. 35 provide vertical electrical connection to the peripheral devices on the substrate semiconductor layer 9, and therefore, formation of additional contact via structures on the electrically conductive layers (146, 246) is not necessary.

Subsequently, the processing steps of FIGS. 13A and 13B, FIG. 14, FIG. 15, and FIGS. 16A and 16B can optionally be performed to form through-stack insulating spacers 586, through-stack contact via structures 588, and through-dielectric contact via structures 488. The through-stack contact via structures 588 and through-dielectric contact via structures 488 can be employed to provide electrical connections to bit lines to be subsequently formed and to provide power and ground connections to the three-dimensional memory device formed on the semiconductor material layer 10. The word line contact via structures (67, 68) can be employed to provide electrical connections between the peripheral devices on the substrate semiconductor layer 9 and the electrically conductive layers (146, 246), which include the word lines for the three-dimensional memory device.

Figure 39:
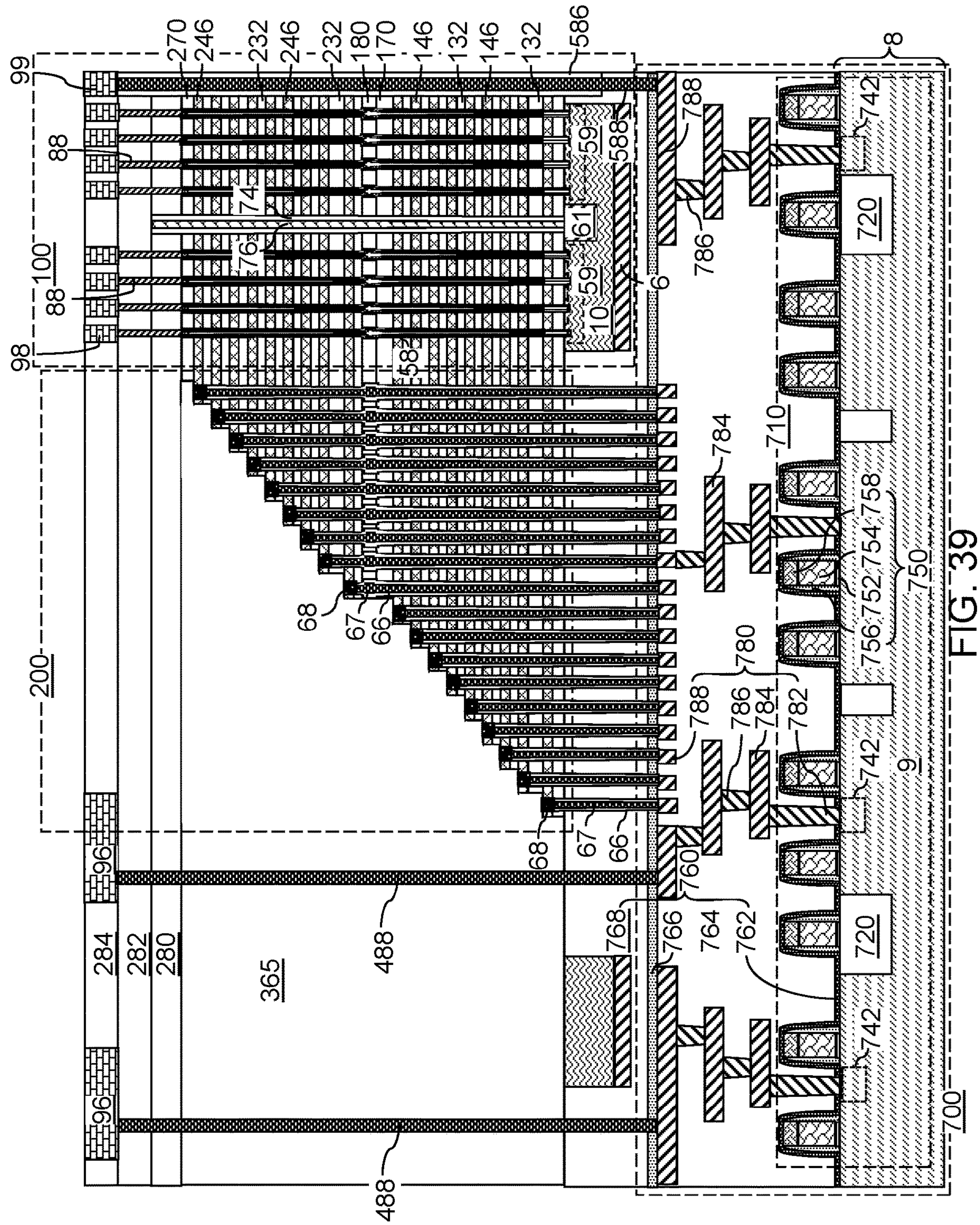
FIG. 39 is a vertical cross-sectional view of the second exemplary structure after formation of through-dielectric contact via structures, at least one upper interconnect level dielectric layer, and various upper interconnect level metal structures according to an embodiment of the present disclosure.

Referring to FIG. 39, the processing steps of FIG. 17 can be performed to form at least one upper interconnect level dielectric layer 284 over the contact level dielectric layers (280, 282). The at least one upper interconnect level dielectric layer 284 can include multiple upper interconnect level dielectric layers. Various upper interconnect structures, such as upper interconnect level metal structures, can be formed in the at least one upper interconnect level dielectric layer 284. For example, the various upper interconnect level metal structures can include line level metal interconnect structures (96, 98, 99). The line level metal interconnect structures (96, 98, 99) can include first upper metal line structures 99 that contact a top surfaces of a respective one of the through-stack contact via structures 588, second upper metal line structures 96 that contact a top surface of a respective one of the through-dielectric contact via structures 488, and bit lines 98 that contact a respective one of the drain contact via structures 88 and extend along the second horizontal direction (e.g., bit line direction) hd2 and perpendicular to the first horizontal direction (e.g., word line direction) hd1.

At least a subset of the upper metal interconnect structures (which include the line level metal interconnect structures (96, 98, 99)) is formed over the three-dimensional memory array. The upper metal interconnect structures comprise an upper metal line structure (such as a first upper metal line structure 99) that is formed directly on a through-stack contact via structure 588. A set of conductive structures including the through-stack contact via structure 588 and a lower metal line structure (such as a topmost lower metal line structure 788) provides an electrically conductive path between the at least one semiconductor device 710 on the substrate semiconductor layer and the upper metal line structure. A through-dielectric contact via structure 488 can be provided through the retro-stepped dielectric material portion 365, the at least one second dielectric material layer 768, and the silicon nitride layer 766 and directly on a top surface of another lower metal line structure (e.g., another topmost lower metal line structure 788) of the lower metal interconnect structures 780.

The through-dielectric contact via structures 488 can be formed on a respective one of the lower interconnect structures 780 within an area outside of the alternating stacks (132, 146, 232, 246). In one embodiment, the entire region of the retro-stepped dielectric material portion 365 within the area of the stepped surfaces, i.e., the entire volume of the portion of the retro-stepped dielectric material portion 365 that has an areal overlap with the area of the stepped surfaces in a see-through top-down view, can be free of any conductive via structure after formation of the upper interconnect structures. Optionally, the stepped word line contact region 200 can also be free of support pillar structures 20. In one embodiment, the upper interconnect structures comprise bit lines 98 that are electrically shorted via a respective drain region 63 to an upper end of a respective one of the vertical semiconductor channels 60 and to a respective one of the through-dielectric contact via structures 488, and the semiconductor devices on the substrate semiconductor layer 9 can include bit line drivers for driving the bit lines 98.

Figure 40A:
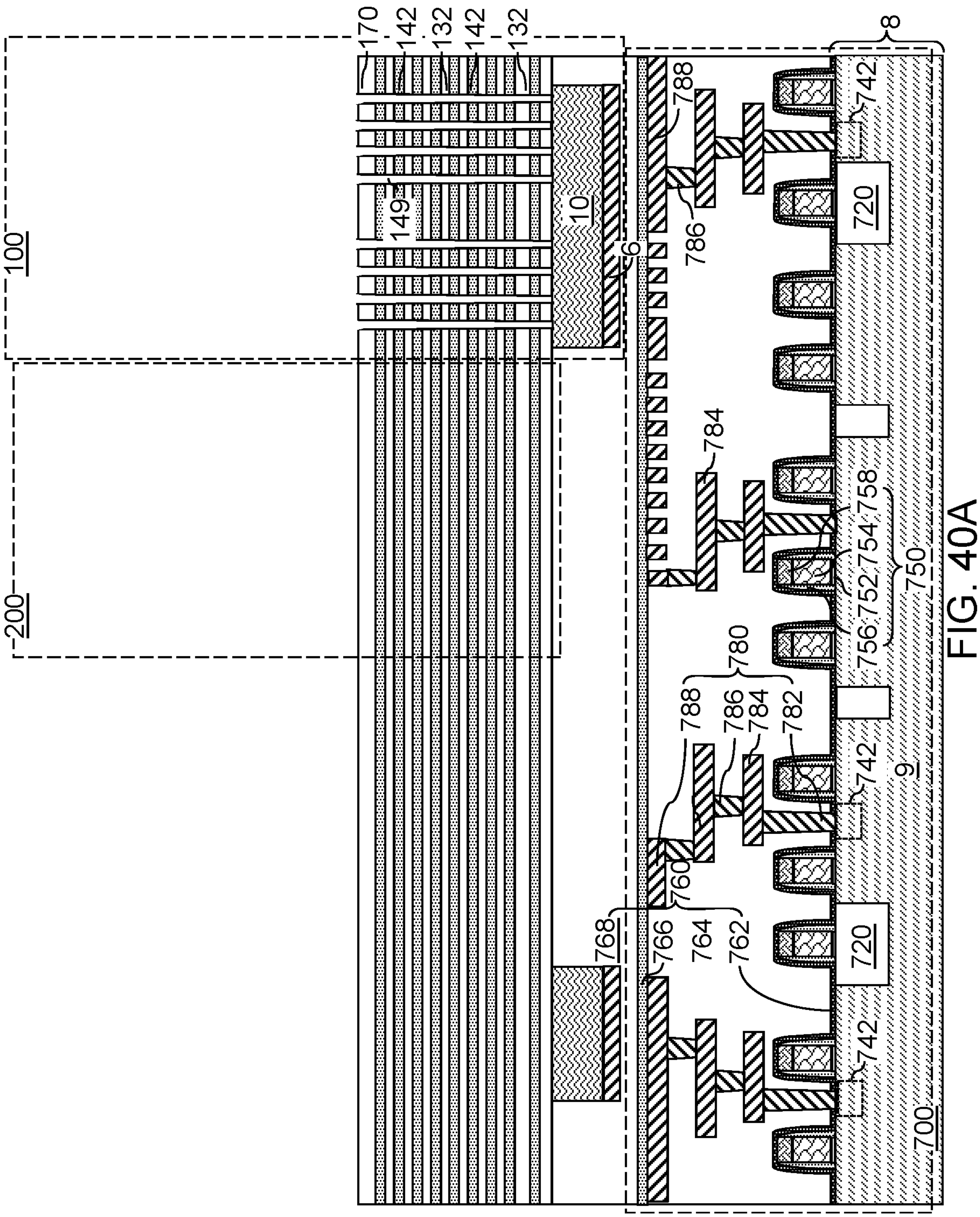
FIG. 40A is a vertical cross-sectional view of a third exemplary structure after formation of a first alternating stack of first insulating layers and first sacrificial material layers and first-tier memory openings according to an embodiment of the present disclosure.
Figure 40B:
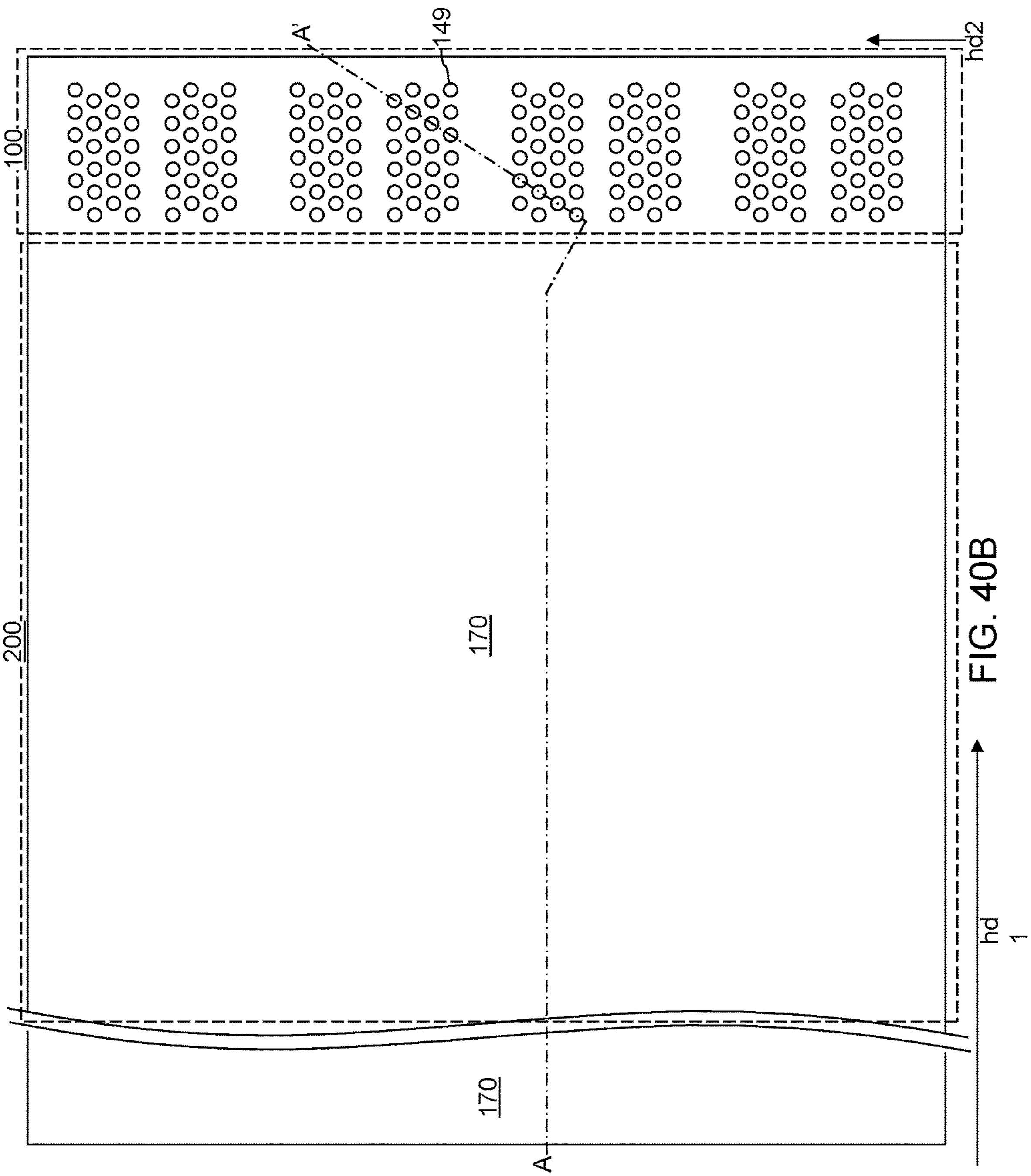
FIG. 40B is a top-down view of the third exemplary structure of FIG. 40A.

Referring to FIGS. 40A and 40B, a third exemplary structure according to a third embodiment of the present disclosure can be derived from the first exemplary structure after the processing steps of FIG. 2. Appropriate changes to the pattern of the optional planar conductive material layer 6 and the planar semiconductor material layer 10 may be made. In one embodiment, the optional planar conductive material layer 6 and the planar semiconductor material layer 10 can be removed from the word line contact region 200. Thus, the at least one second dielectric material layer 768 extends into the word line contact region 200. The pattern of the topmost lower metal liner structures 788 can be modified so that the topmost lower metal liner structures 788 extend into the word line contact region 200, and are located in areas in which word line contact via structures are to be subsequently formed.

First-tier memory openings 149 can be formed in the memory array region 100 at locations at which memory stack structures including vertical stacks of memory elements are to be subsequently formed. The first-tier memory openings 149 extend through the first-tier alternating stack (132, 142) at least to a top surface of the planar semiconductor material layer 10. For example, a lithographic material stack (not shown) including at least a photoresist layer can be formed over the first insulating cap layer 170, and can be lithographically patterned to form openings within the lithographic material stack. The openings in the lithographic material stack are located within the memory array region 100, and can be arranged as rows extending along the first horizontal direction hd1. The pattern in the lithographic material stack can be transferred through the first insulating cap layer 170, and through the entirety of the first-tier alternating stack (132, 142) by at least one anisotropic etch that employs the patterned lithographic material stack as an etch mask. Portions of the first insulating cap layer 170 and the first-tier alternating stack (132, 142) underlying the openings in the patterned lithographic material stack can be etched to form the first-tier memory openings 149. In other words, the transfer of the pattern in the patterned lithographic material stack through the first insulating cap layer 170 and the first-tier alternating stack (132, 142) forms the first-tier memory openings 149.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 can be substantially vertical, or can be tapered. The planar semiconductor material layer 10 can be employed as etch stop structures. Subsequently, the patterned lithographic material stack can be subsequently removed, for example, by ashing.

Figure 41:
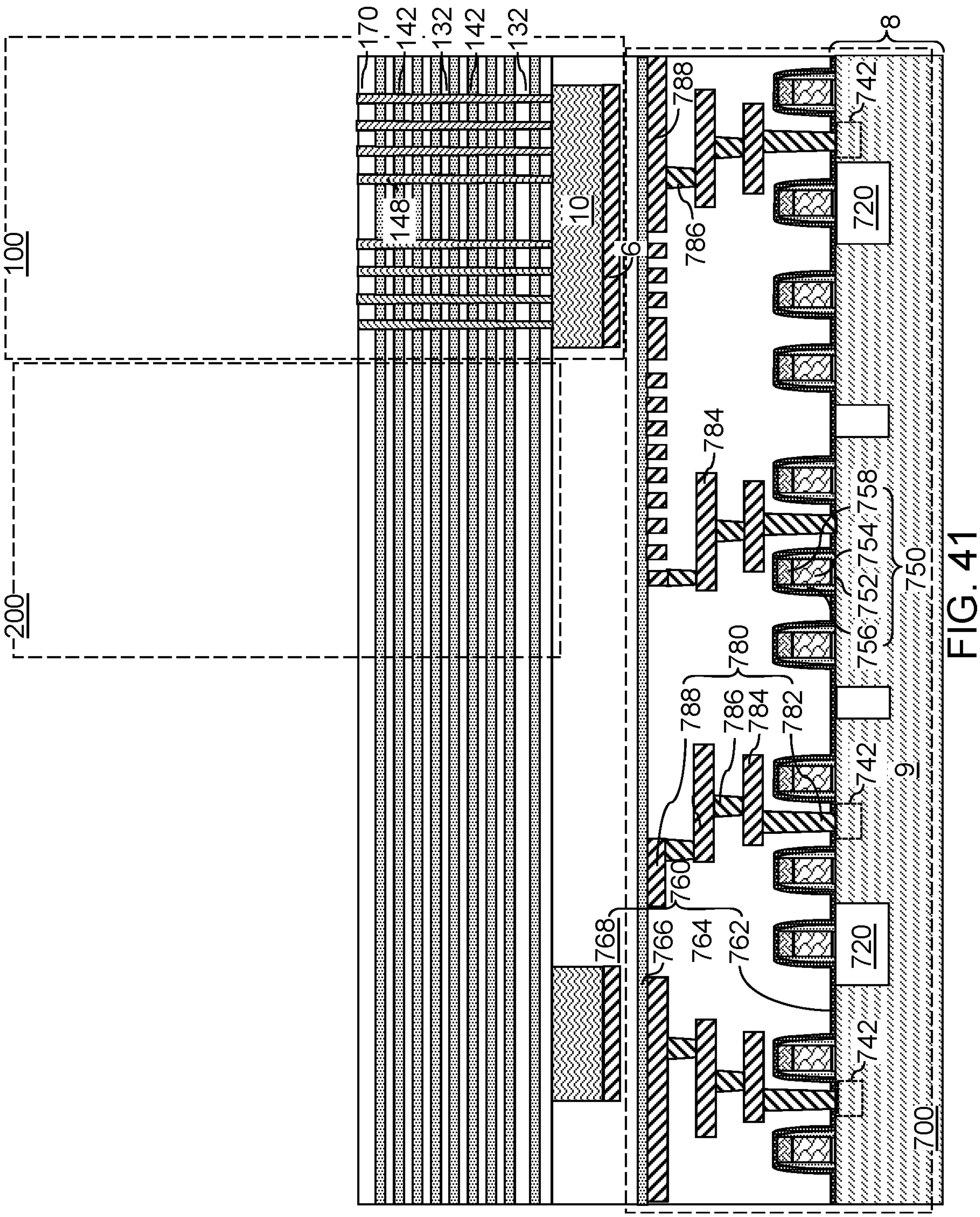
FIG. 41 is a vertical cross-sectional view of the third exemplary structure after formation of sacrificial memory opening fill portions in the first-tier memory openings according to an embodiment of the present disclosure.

Referring to FIG. 41, sacrificial memory opening fill portions 148 can be formed in the first-tier memory openings 149. For example, a sacrificial fill material layer is deposited in the first-tier memory openings 149. The sacrificial fill material layer includes a sacrificial material which can be subsequently removed selective to the materials of the first insulator layers 132 and the first sacrificial material layers 142. In one embodiment, the sacrificial fill material layer can include germanium, a silicon-germanium alloy, carbon, borosilicate glass (which provides higher etch rate relative to undoped silicate glass), porous or non-porous organosilicate glass, organic polymer, or inorganic polymer. Optionally, a thin etch stop layer (such as a silicon oxide layer having a thickness in a range from 1 nm to 3 nm) may be employed prior to depositing the sacrificial fill material layer. If an etch stop layer is employed, semiconductor materials such as amorphous silicon may be employed as the sacrificial fill material. The sacrificial fill material layer may be formed by a non-conformal deposition or a conformal deposition method.

Portions of the deposited sacrificial material can be removed from above the first insulating cap layer 170. For example, the sacrificial fill material layer can be recessed to a top surface of the first insulating cap layer 170 employing a planarization process. The planarization process can include a recess etch, chemical mechanical planarization (CMP), or a combination thereof. The top surface of the first insulating layer 170 can be employed as an etch stop layer or a planarization stop layer. Each remaining portion of the sacrificial material in a first-tier memory opening 149 constitutes a sacrificial memory opening fill portion 148. The top surfaces of the sacrificial memory opening fill portions 148 can be coplanar with the top surface of the first insulating cap layer 170. The sacrificial memory opening fill portion 148 may, or may not, include cavities therein.

Figure 42A:
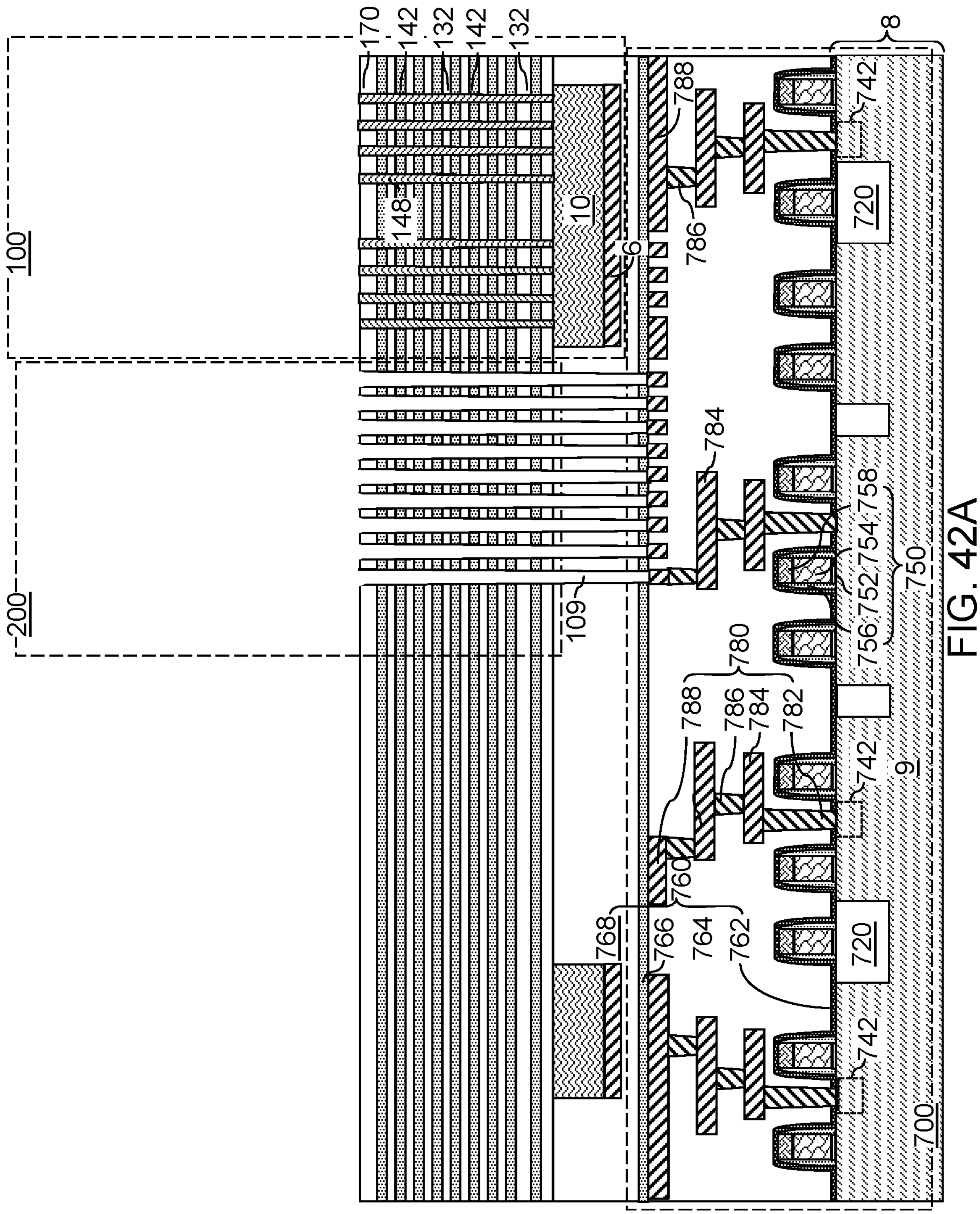
FIG. 42A is a vertical cross-sectional view of the third exemplary structure after formation of first-tier contact openings according to an embodiment of the present disclosure.
Figure 42B:
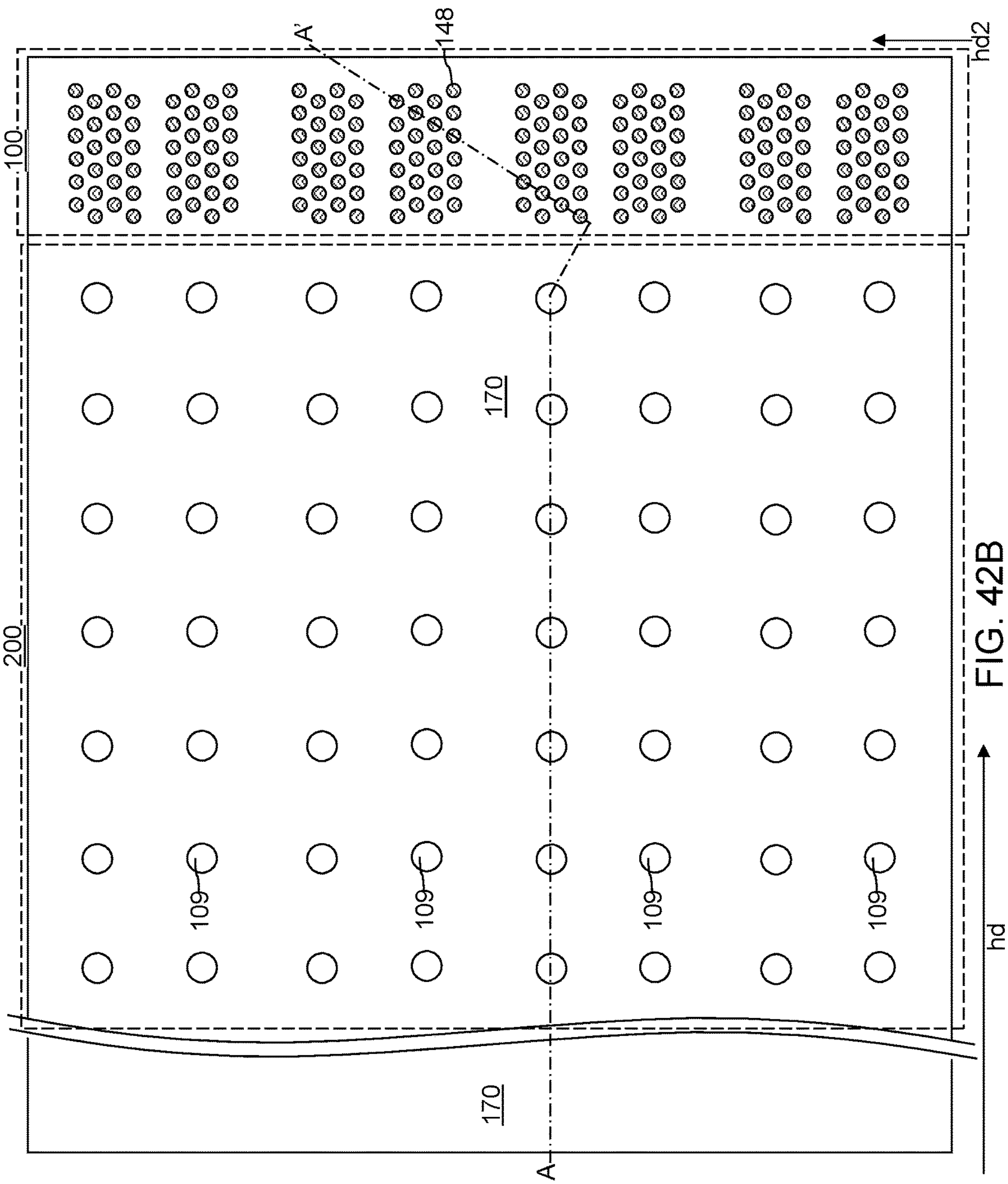
FIG. 42B is a top-down view of the third exemplary structure of FIG. 42A.

Referring to FIGS. 42A and 42B, first-tier contact openings 109 can be formed in the word line contact region 200. The first-tier contact openings 109 extend through the first-tier alternating stack (132, 142), and the at least one second dielectric material layer 768, and the silicon nitride layer 766, and to a top surface of a respective one of the topmost lower metal liner structures 788. For example, a lithographic material stack (not shown) including at least a photoresist layer can be formed over the first insulating cap layer 170, and can be lithographically patterned to form openings within the lithographic material stack. The openings in the lithographic material stack are located within the word line contact region 200, and can be arranged as rows extending along the first horizontal direction hd1. The pattern in the lithographic material stack can be transferred through the first insulating cap layer 170, and through the entirety of the first-tier alternating stack (132, 142) by at least one anisotropic etch that employs the patterned lithographic material stack as an etch mask. Portions of the first insulating cap layer 170, the first-tier alternating stack (132, 142), the at least one second dielectric material layer 768, and the silicon nitride layer 766 underlying the openings in the patterned lithographic material stack can be etched to form the first-tier contact openings 109. In other words, the transfer of the pattern in the patterned lithographic material stack through the first insulating cap layer 170 and the first-tier alternating stack (132, 142) forms the first-tier contact openings 109.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier contact openings 109 can be substantially vertical, or can be tapered. The topmost lower metal liner structures 788 can be employed as etch stop structures. Subsequently, the patterned lithographic material stack can be subsequently removed, for example, by ashing.

Figure 43:
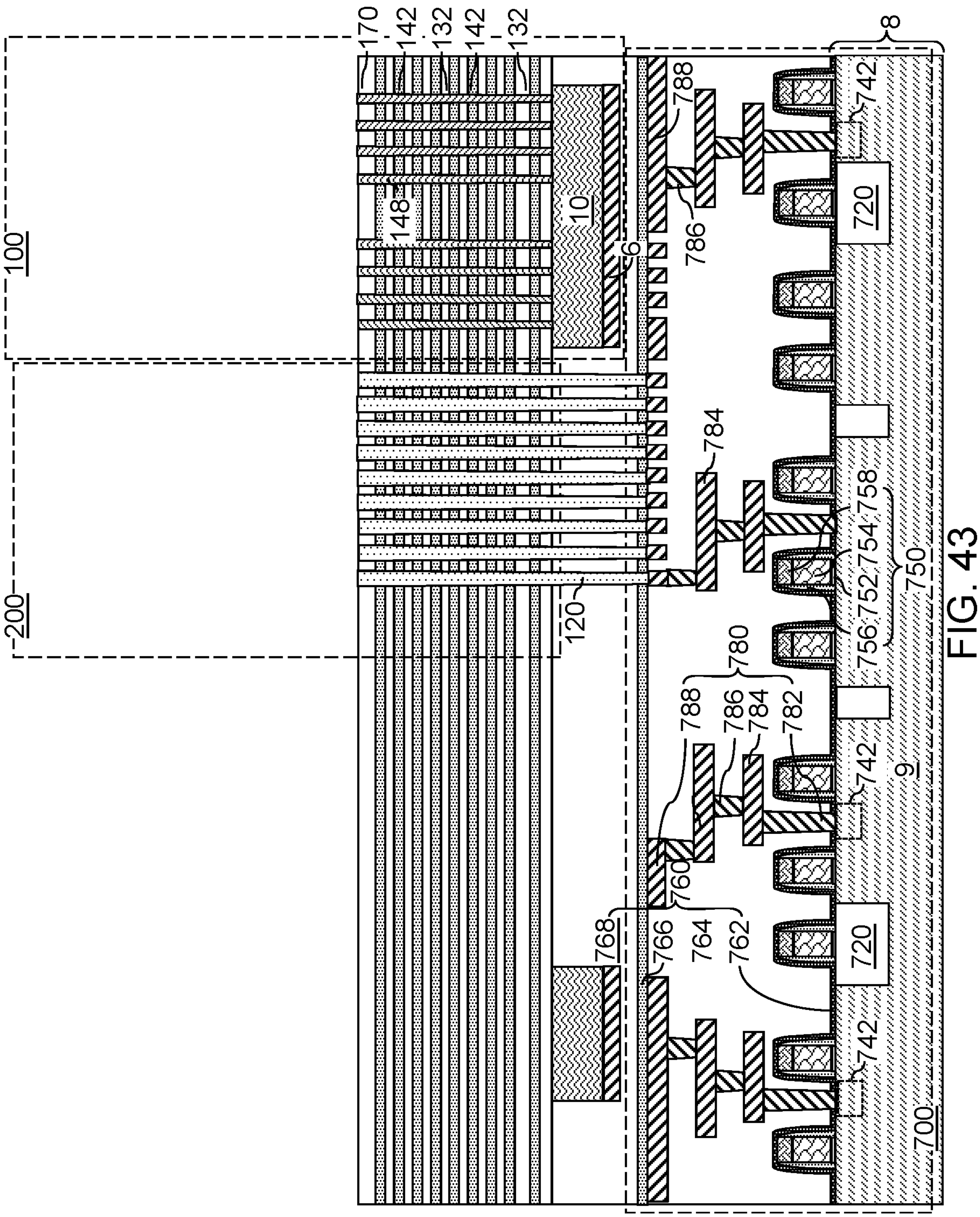
FIG. 43 is a vertical cross-sectional view of the third exemplary structure after formation of sacrificial contact opening pillars according to an embodiment of the present disclosure.

Referring to FIG. 43, sacrificial contact opening pillars 120 can be formed in the first-tier contact openings 109. For example, a sacrificial fill material layer is deposited in the first-tier contact openings 109. The sacrificial fill material layer includes a sacrificial material which can be subsequently removed selective to the materials of the first insulator layers 132 and the first sacrificial material layers 142. The sacrificial fill material of the sacrificial contact opening pillars 120 is different from the sacrificial material of the sacrificial memory opening fill portions 148. For example, the sacrificial fill material of the sacrificial contact opening pillars 120 can be selected from germanium, a silicon-germanium alloy, carbon, borosilicate glass (which provides higher etch rate relative to undoped silicate glass), porous or non-porous organosilicate glass, organic polymer, or inorganic polymer, provided that the sacrificial fill material of the sacrificial contact opening pillars 120 is different from the sacrificial material of the sacrificial memory opening fill portions 148. Optionally, a thin etch stop layer (such as a silicon oxide layer having a thickness in a range from 1 nm to 3 nm) may be employed prior to depositing the sacrificial fill material to form the sacrificial contact opening pillar 120. If an etch stop layer is employed, semiconductor materials such as amorphous silicon may be employed as the sacrificial fill material. The sacrificial fill material layer may be formed by a non-conformal deposition or a conformal deposition method.

In an illustrative example, the sacrificial memory opening fill portions 148 can include a combination of an etch stop layer such as a thin silicon oxide layer and a first sacrificial fill material such as germanium, a silicon-germanium alloy, or carbon. In this case, the sacrificial contact opening pillars 120 can include a second sacrificial fill material selected from borosilicate glass (which provides higher etch rate relative to undoped silicate glass), porous or non-porous organosilicate glass, organic polymer, and inorganic polymer. Portions of the second sacrificial material can be removed from above the first insulating cap layer 170 employing a planarization process. The planarization process can include a recess etch, chemical mechanical planarization (CMP), or a combination thereof. The top surface of the first insulating layer 170 can be employed as an etch stop layer or a planarization stop layer. Each remaining portion of the second sacrificial material in a first-tier contact opening 109 constitutes a sacrificial contact opening pillar 120. The top surfaces of the sacrificial memory opening fill portions 148 and the sacrificial contact opening pillars 120 can be coplanar with the top surface of the first insulating cap layer 170. The sacrificial contact opening pillars 120 may, or may not, include cavities therein.

Figure 44:
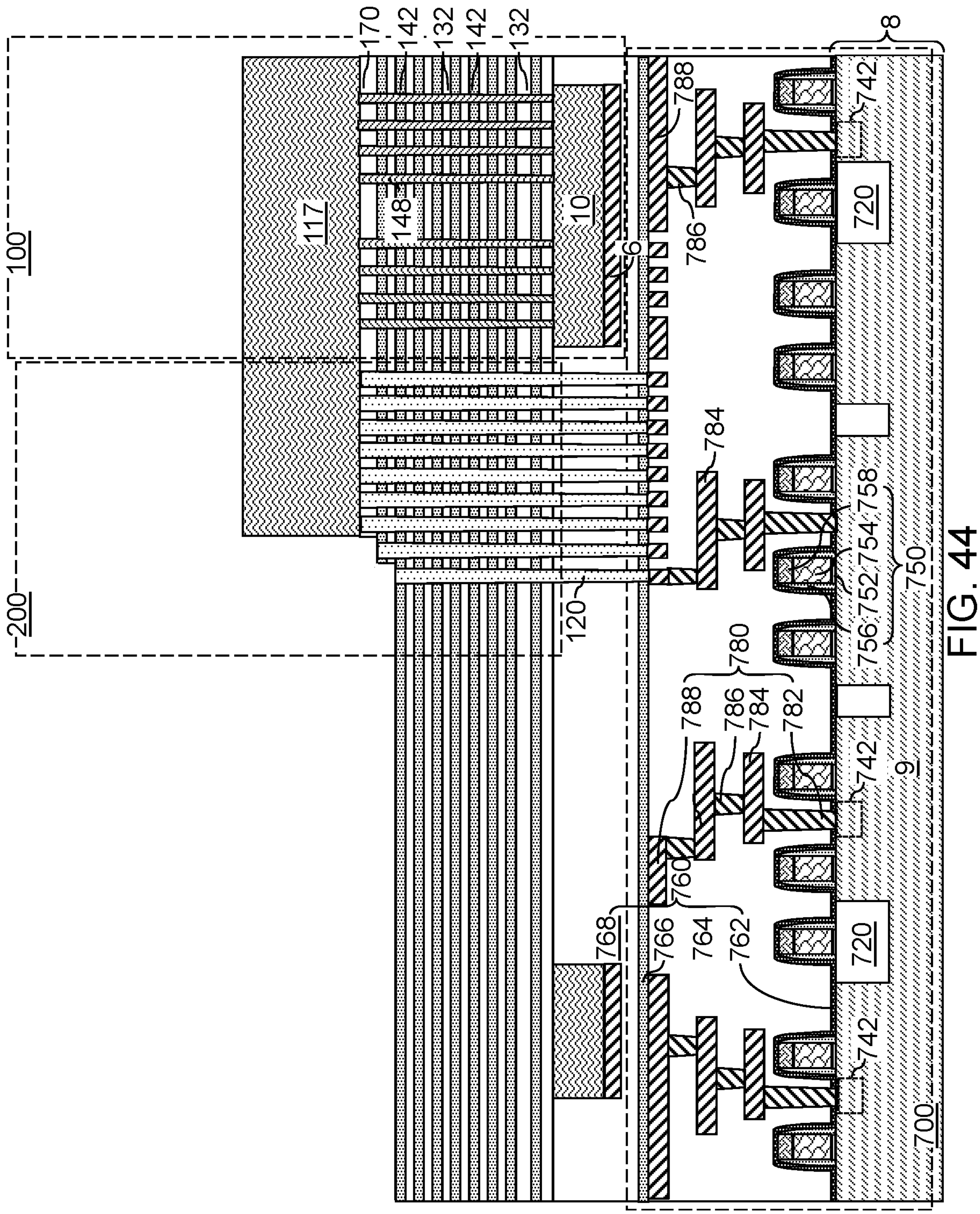
FIG. 44 is a vertical cross-sectional view of the third exemplary structure during formation of first stepped surfaces by repetition of an anisotropic etch process and trimming of the trimmable mask layer according to an embodiment of the present disclosure.

Referring to FIG. 44, stepped surfaces are formed in the word line contact region 200. The stepped surfaces can be formed, for example, by forming a trimmable mask layer 117 that covers the memory array region 100 and a predominant portion of the word line contact region 200 that excludes a distal peripheral region of the word line contact region 200, etching unmasked areas of the word line contact region 200 to vertically recess a layer or a pair of layers in the unmasked areas, and iteratively trimming the trimmable mask layer 117 and vertically recessing unmasked areas of the word line contact region 200 by a pair of layers that includes a first sacrificial material layer 142 and a first insulating layer 132.

Specifically, the trimmable mask layer 117 is applied and patterned to cover the memory array region 100 and the predominant portion of the word line contact region 200 that excludes the distal peripheral region of the word line contact region 200. An anisotropic etch process is performed to etch a physically exposed portion of the second insulating cap layer 170. A set of processing steps can be repeated multiple times to shift existing stepped surfaces downward and to form additional stepped surfaces. During the set of processing steps, upper portions of the sacrificial contact opening pillars 120 can be removed at approximately the same etch rate as the unmasked portions of the first alternating stack (132, 142) so that the sacrificial contact opening pillars 120 do not protrude above the stepped surfaces.

Each set of processing steps includes a first step of removing an uppermost pair of layers that includes one of the first insulating layers 132 and one of the first sacrificial material layers 142 within each area that is not covered by the trimmable mask layer 117, and removing each portion of the sacrificial contact opening pillars 120 from above a physically exposed horizontal surface within each area that is not covered by the trimmable material layer 117. In one embodiment, the first insulating layers 132 can include, and/or can consist essentially of, undoped silicate glass, the first sacrificial material layers 142 can include, and/or can consist essentially of, silicon nitride, and the sacrificial contact opening pillars 120 can include, and/or can consist essentially of, borosilicate glass or a porous organosilicate glass. The first step can be effected by an anisotropic etch process. The etch chemistry of the anisotropic etch process can be selected to remove the materials of the first insulating layers 132, the first sacrificial material layers 242, and the sacrificial contact opening pillars 120 at approximately the same removal rate.

Each set of processing steps include a second step of trimming the trimmable mask layer 117 to provide an additional area that is not covered by the trimmable mask layer 117. Each additional area can include the area of a sacrificial contact opening pillar 120 that is more proximal to the memory array region 100 than previously exposed sacrificial contact opening pillars 120. Thus, each second step can physically expose an additional sacrificial contact opening pillar 120 among each row of sacrificial contact opening pillars 120 that are arranged along the first horizontal direction hd1.

Figure 45:
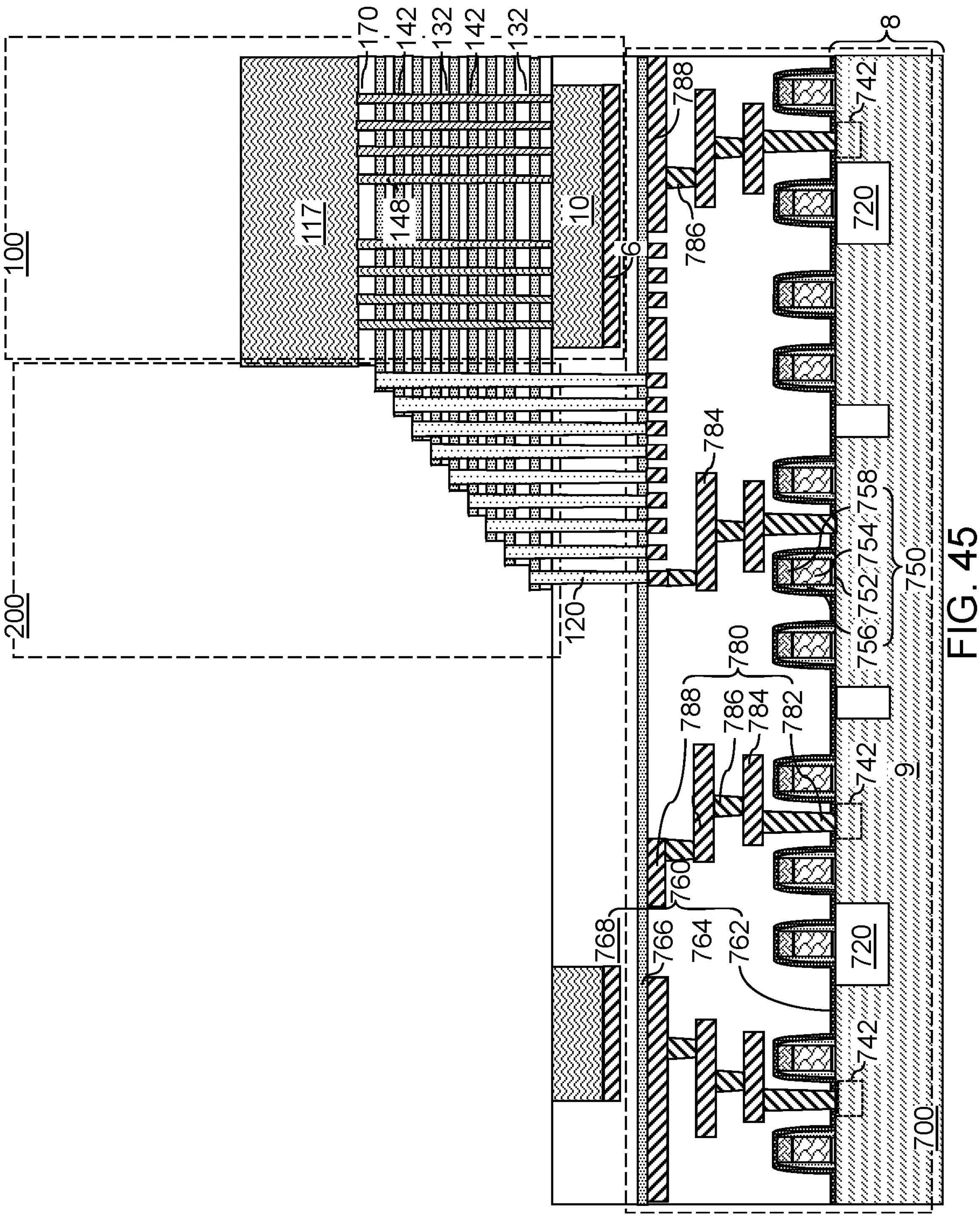
FIG. 45 is a vertical cross-sectional view of the third exemplary structure after formation of the first stepped surfaces according to an embodiment of the present disclosure.

Referring to FIG. 45, the set of processing steps is repeated until the at least one second dielectric material layer 768 is physically exposed and the stepped surfaces continuously extend from the bottommost layer of the first alternating stack (132, 142) to the topmost layer of the first alternating stack (132, 142). Generally, an anisotropic etch process and trimming of the trimmable mask layer 117 can be repeated to pattern the first alternating stack (132, 142), thereby forming the stepped surfaces in the word line contact region 200. The stepped surfaces can include stepped terraces that laterally extend along the second horizontal direction hd2. Upper portions of the sacrificial contact opening pillars 120 can be removed concurrently with formation of the stepped surfaces.

Mismatch between the etch rate of the material of the sacrificial contact opening pillars 120 and the materials of the first alternating stack (132, 142) may cause remaining portions of the sacrificial contact opening pillars 120 to protrude above the stepped surfaces of the first alternating stack (132, 142) or to be recessed below the stepped surfaces of the first alternating stack (132, 142). Such protrusions or recesses are acceptable because the sacrificial contact opening pillars 120 are subsequently removed selective to the first alternating stack (132, 142). The trimmable mask layer 117 can be subsequently removed, for example, by ashing or by dissolving in a solvent.

Figure 46:
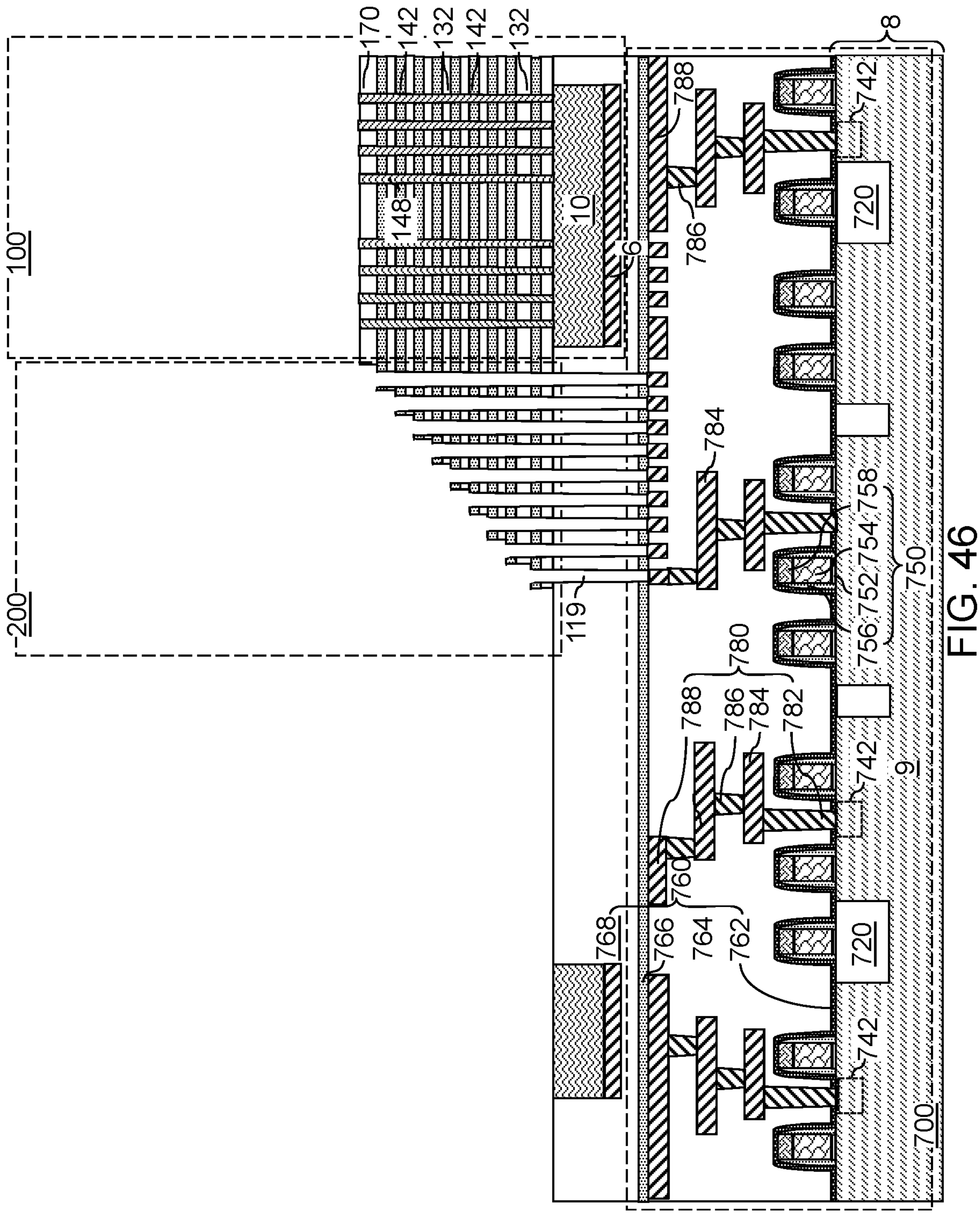
FIG. 46 is a vertical cross-sectional view of the third exemplary structure after selective removal of remaining portions of the sacrificial contact opening pillars to form contact via cavities according to an embodiment of the present disclosure.

Referring to FIG. 46, remaining portions of the sacrificial contact opening pillars 120 can be removed selective to the materials of the first alternating stack (132, 142), the at least one second dielectric material layer 768, the first and second insulating cap layers (170, 270), and the semiconductor material layer 10. For example, if the sacrificial contact opening pillars 120 include borosilicate glass, a wet etch employing hydrofluoric acid or a vapor phase clean using HF can be employed to remove the remaining portions of the sacrificial contact opening pillars 120. Contact via cavities 119 can be formed in each volume from which the sacrificial contact opening pillars 120 are removed. A top surface of a respective one of the topmost lower metal line structures 788 can be physically exposed at the bottom of each contact via cavity 119. The bottom surfaces of the contact via cavities 119 can be within a same horizontal plane such as the horizontal plane including the top surfaces of the topmost lower metal line structures 788. Each of the contact via cavities 119 has a top periphery that is adjoined to a respective horizontal surface of the stepped surfaces.

Figure 33:
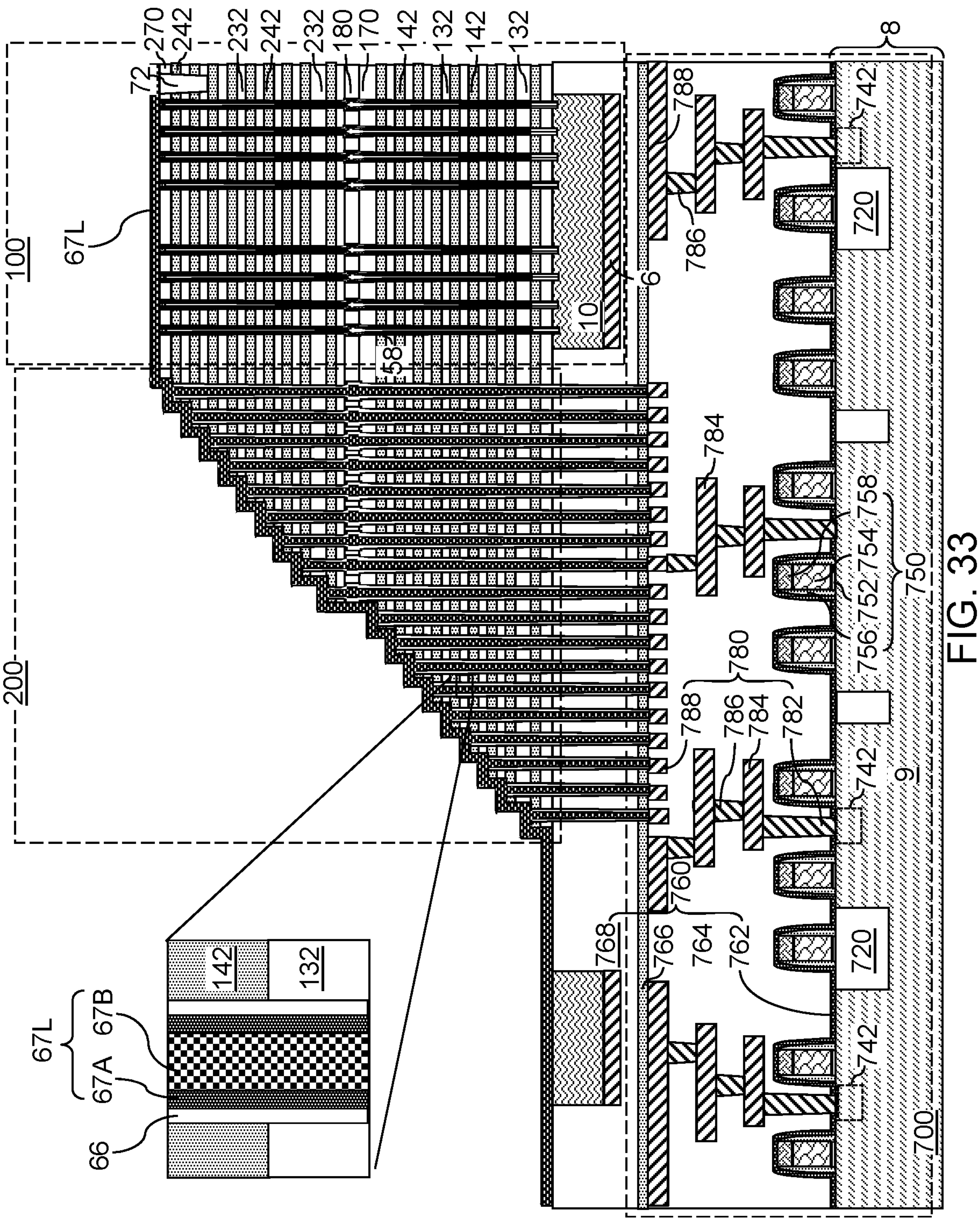
FIG. 33 is a vertical cross-sectional view of the second exemplary structure after formation of a continuous insulating liner layer, a continuous metallic nitride liner layer, and a continuous metal fill layer according to an embodiment of the present disclosure.
Figure 47:
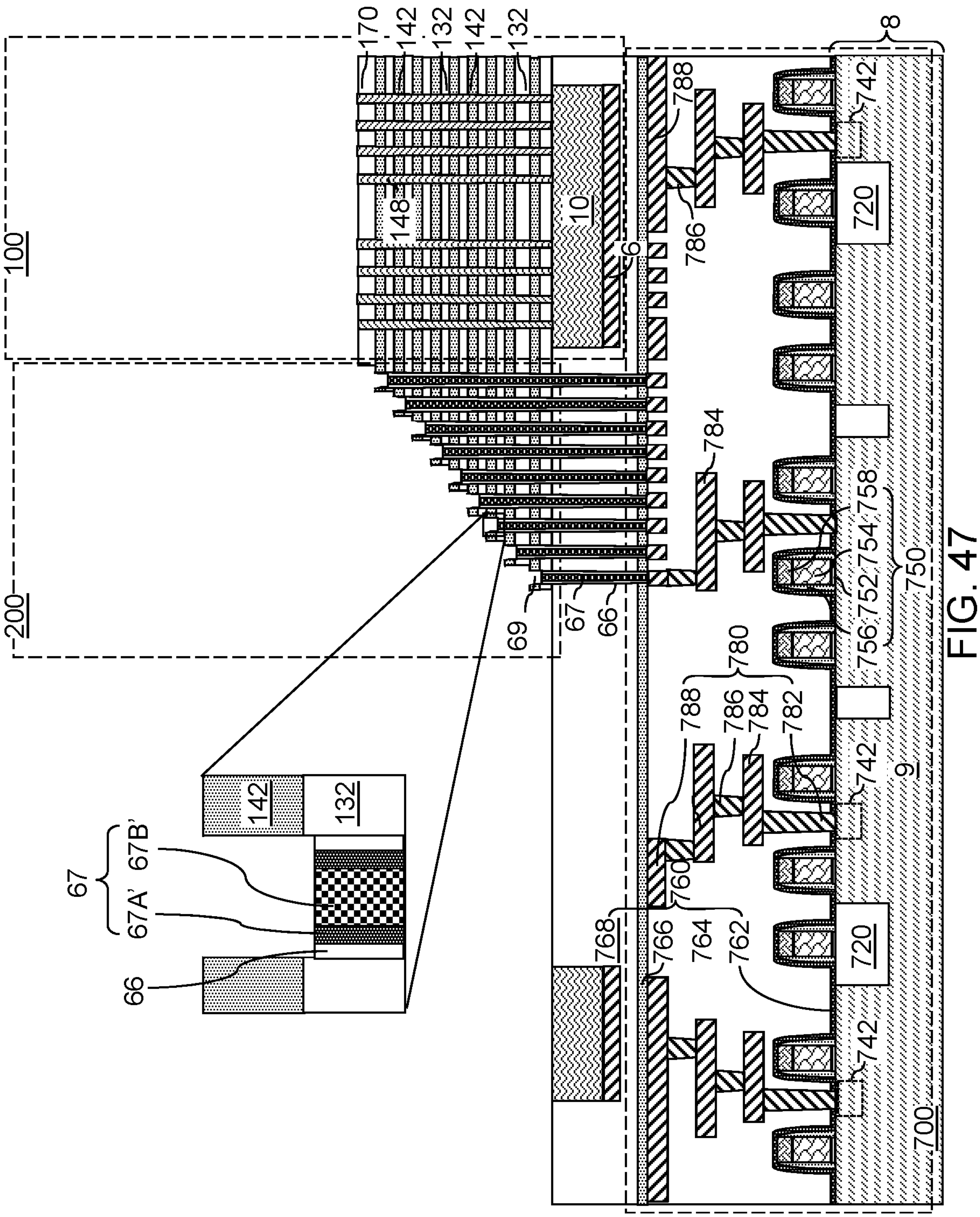
FIG. 47 is a vertical cross-sectional view of the third exemplary structure after formation of metallic nitride liners and metal fill portions according to an embodiment of the present disclosure.

Referring to FIG. 47, the processing steps of FIGS. 33 and 34 can be performed to form insulating tubular liners 66 and laterally-insulated via structures 67. Specifically, a continuous insulating liner layer is formed by a conformation deposition process. An anisotropic etch process is performed on the continuous insulating liner layer to remove horizontal portions of the continuous insulating liner layer. Each remaining vertical portion of the continuous insulating liner layer within the contact via cavities 119 constitutes an insulating tubular liner 66. Each insulating tubular liner 66 has a general configuration of a tube, and extends from a bottom surface of a respective contact via cavity 119 to a topmost region of the contact via cavity 119. A top surface of a respective one of the topmost lower metal line structures 788 is physically exposed within a bottom region of each insulating tubular liner 66. The insulating tubular liners 66 can have the same composition and the same thickness as in the second embodiment.

At least one continuous conductive material layer is deposited in unfilled volumes of the contact via cavities 119 and over the stepped surfaces of the first alternating stack (132, 142). The at least one continuous conductive material layer can include a stack of multiple conductive layers. For example, the at least one continuous conductive material layer can include a continuous metallic nitride liner layer and a continuous metal fill layer as in the second embodiment. The continuous metallic nitride liner layer can be deposited on physically exposed top surfaces of the lower interconnect structures 780 and on inner sidewalls of the insulating tubular liners 66. The continuous metallic nitride liner can include a conductive metallic nitride material such as TiN, TaN, and/or WN, and can have a thickness in a range from 2 nm to 40 nm, such as from 4 nm to 20 nm, although lesser and greater thicknesses can also be employed. The continuous metal fill layer can be deposited on the continuous metallic nitride liner layer. The continuous metal fill layer includes a metal such as tungsten, copper, aluminum, ruthenium, cobalt, molybdenum, or any other metal that can be employed for metal interconnect structures. The continuous metal fill layer can fill remaining volumes of the contact via cavities 119.

The continuous metal fill layer and the continuous metallic nitride liner layer can be anisotropically etched outside the volumes of the contact via cavities 119. In one embodiment, top surfaces of remaining portions of the continuous metal fill layer and the continuous metallic nitride liner layer can be vertically recessed below the bottom surface of first sacrificial material layers 142 including physically exposed horizontal surfaces as components of the stepped surfaces. Each remaining portion of the continuous metallic nitride liner layer constitutes a metallic nitride liner 67A'. Each remaining portion of the continuous metal fill layer constitutes a metal fill portion 67B'. Metallic nitride liners 67A' are located within a respective one of the contact via cavities 119, and metal fill portions 67B' are located within a respective one of the metallic nitride liners 67A'. Each contiguous set of a metallic nitride liner 67A' and a metal fill portion 67B' constitutes a laterally-insulated via structure 67.

Physically exposed portions of the insulating tubular liners 66 that protrude above the top surfaces of the laterally-insulated via structure 67 can be removed by an etch process, which can be an isotropic etch process. Sidewalls of the first sacrificial material layers 142 including physically exposed top surfaces as horizontal surfaces of the stepped surfaces are physically exposed around each contact via cavity 119 (which is partly filled with an insulating tubular liner 66 and a respective laterally-insulated via structure 67). In one embodiment, the upper periphery of the outer sidewall of each insulating tubular liner 66 can be on a sidewall of a first insulating layer 132 that contact a bottom surface of a first sacrificial material layer having a physically exposed top surface, or on a sidewall of the first insulating cap layer 170 that contact a bottom surface of a first sacrificial material layer 142 having a physically exposed top surface. A sidewall of a first sacrificial material layer 142 is physically exposed within each of the contact via cavities 119 after formation of the laterally-insulated via structures 67, i.e., after formation of the metallic nitride liners 67A' and the metal fill portions 67B'.

Figure 48:
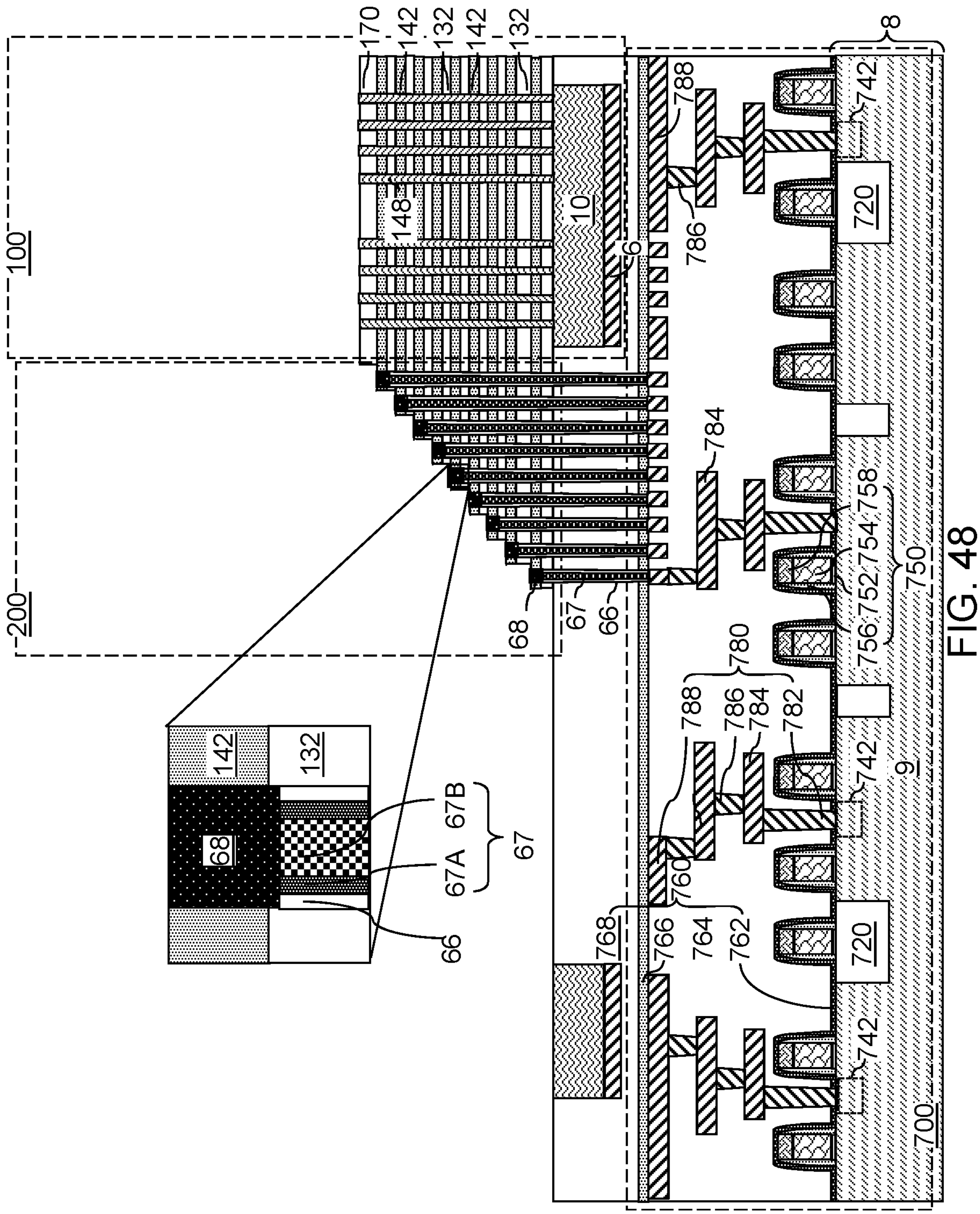
FIG. 48 is a vertical cross-sectional view of the third exemplary structure after formation of metallic pillar structures on each metal fill portion employing a selective metal deposition process according to an embodiment of the present disclosure.

Referring to FIG. 48, a metallic pillar structure 68 is formed on top of each adjoining pair of a metallic nitride liner 67A' and a metal fill portion 67B', i.e., on top of each laterally-insulated via structure 67. The metallic pillar structures 68 are formed in unfilled volumes of each of the contact via cavities 119 and directly on the sidewalls of the first sacrificial material layers 142 that are present around the contact via cavities 119. The metallic pillar structures 68 includes a metal such as tungsten, copper, aluminum, ruthenium, cobalt, molybdenum, or a combination thereof. The material of the metallic pillar structures 68 may be the same as, or may be different from, the material of the metal fill portions 67B'.

In one embodiment, the metallic pillar structures 68 may be formed by a selective metal deposition process that grows a metallic material from surfaces of the metallic nitride liners 67A' and the metal fill portions 67B' and does not grow the metallic material from surfaces of the first insulating layers 132 and the first sacrificial material layers 142. The duration of the selective metal deposition process can be selected such that the metallic pillar structures 68 has a top surface that is substantially coplanar with the horizontal surfaces in the stepped surfaces, i.e., with the physically exposed top surfaces of the first sacrificial material layers 142 in the stepped surfaces. In one embodiment, top surfaces of the metallic pillar structures 68 protrude above the physically exposed surfaces of the first sacrificial material layers 142 within the stepped surfaces. In another embodiment, top surfaces of the metallic pillar structures 68 are recessed below the physically exposed surfaces of the first sacrificial material layers 142 within the stepped surfaces. In yet another embodiment, top surfaces of the metallic pillar structures 68 are coplanar with the physically exposed surfaces of the first sacrificial material layers 142 within the stepped surfaces.

Each contiguous set of a laterally-insulated via structure 67 and a metallic pillar structure 68 constitutes a word line contact via structure (67, 68), which is a contact via structure that provides electrical connection to one of word lines to be subsequently formed by replacement of the first sacrificial material layers 142 with electrically conductive layers. Thus, remaining portions of the sacrificial contact opening pillars 120 provided at the processing steps of FIG. 45 are replaced with the word line contact via structures (67, 68). Each of the contact via structures (67, 68) can be formed on a sidewall of a respective one of the insulating tubular liners 66. The word line contact via structures (67, 68) are formed in the word line contact region 200. Each word line contact via structure (67, 68) laterally contacts a respective one of the first sacrificial material layers 142, vertically extends through a respective opening in at least a bottommost sacrificial material layer of the first alternating stack (132, 142), and contacts a respective one of the lower interconnect structures 780 that underlie the first alternating stack (132, 142).

Figure 49A:
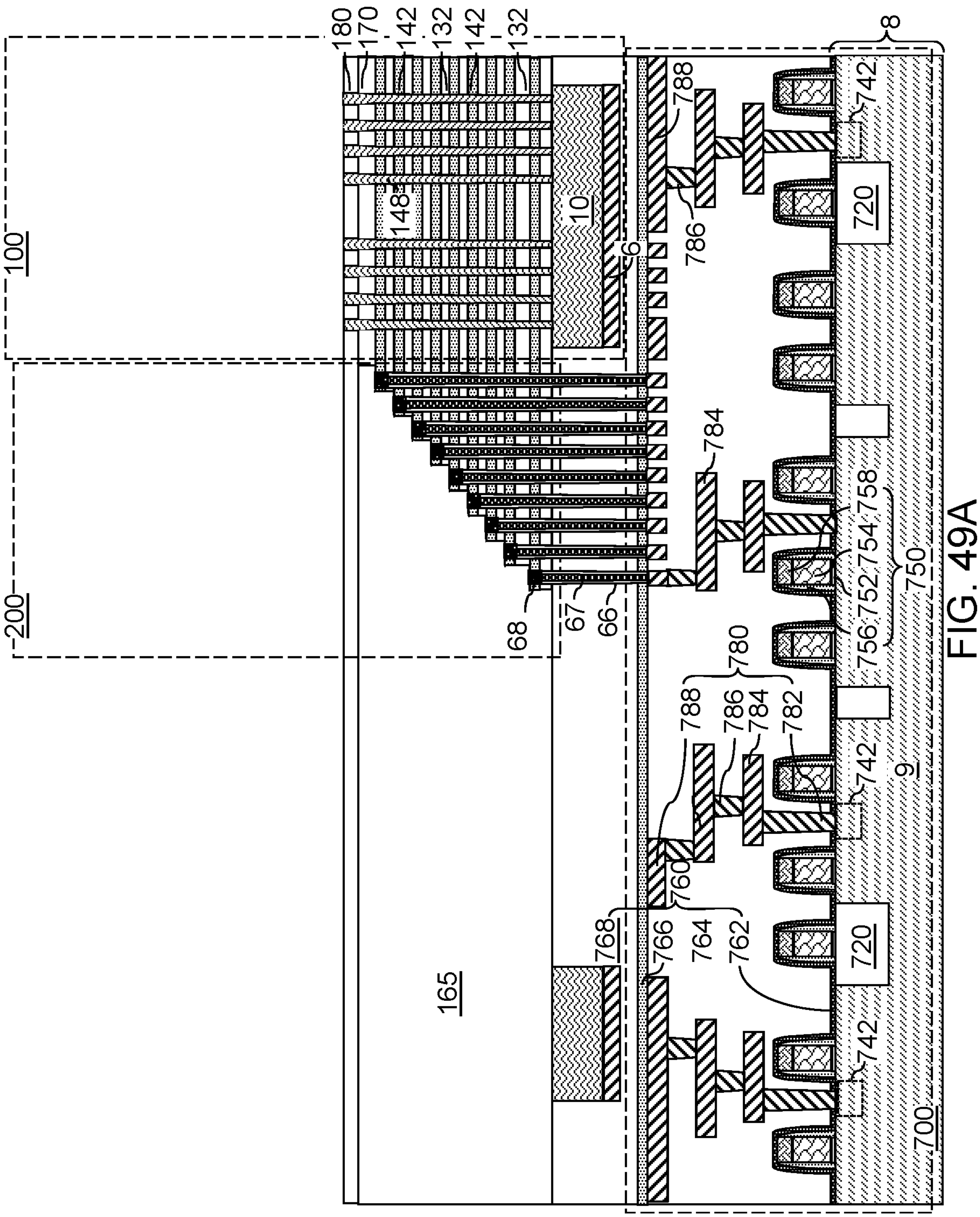
FIG. 49A is a vertical cross-sectional view of the third exemplary structure after formation of a first retro-stepped dielectric material portion and an inter-tier dielectric layer, and extension of the sacrificial memory opening fill portions into the inter-tier dielectric layer according to an embodiment of the present disclosure.
Figure 49B:
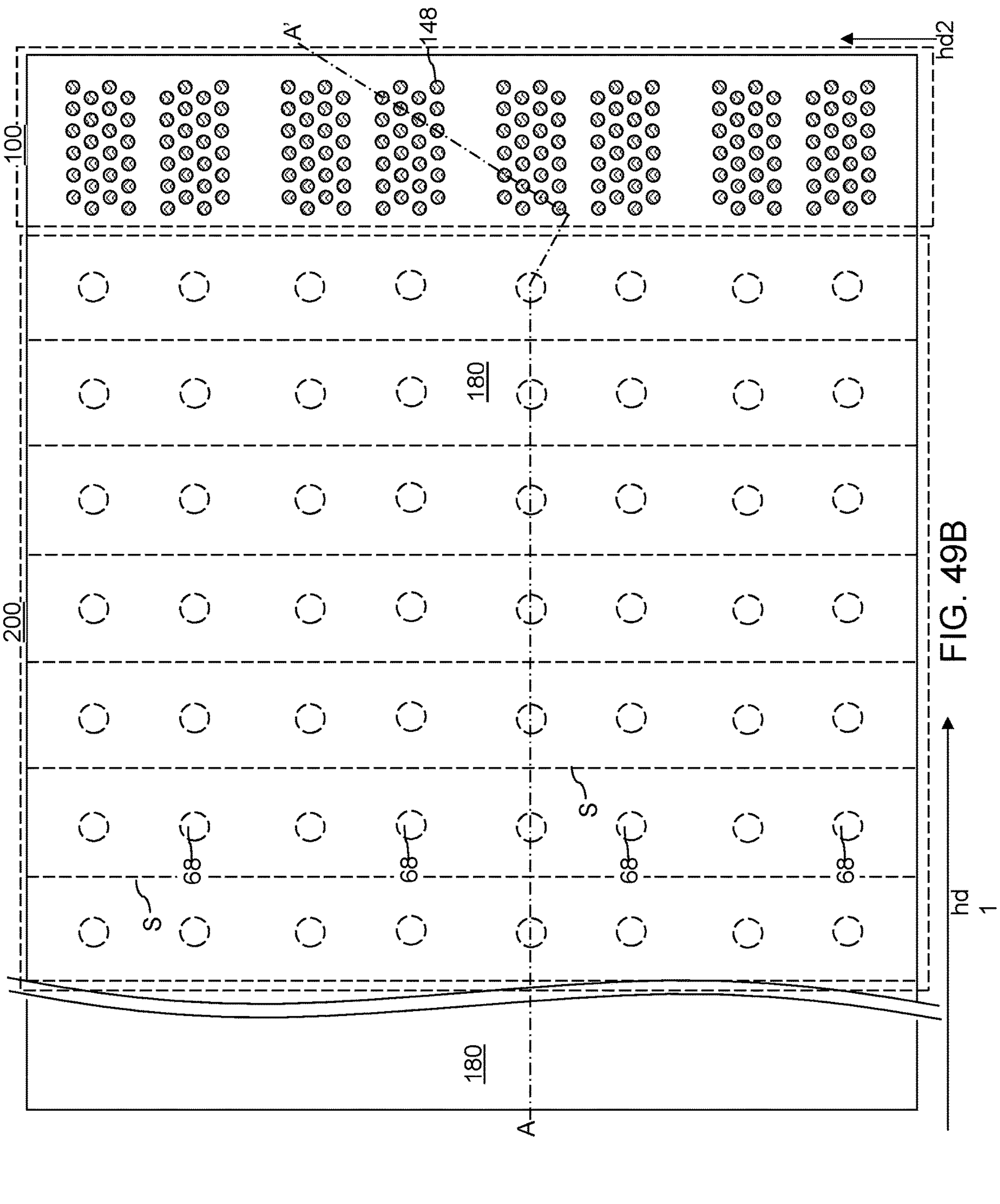
FIG. 49B is a top-down view of the third exemplary structure of FIG. 49A.

Referring to FIGS. 49A and 49B, a dielectric material can be deposited to fill the stepped cavity overlying the stepped surfaces of the first alternating stack (132, 142) to form a first-tier retro-stepped dielectric material portion 165. Specifically, the dielectric material can be deposited in the stepped cavity overlying the stepped surfaces of the first alternating stack (132, 142). The dielectric material can be subsequently planarized employing the top surface of the first insulating cap layer 170 as a stopping surface. The remaining portion of the deposited dielectric material forms a first retro-stepped dielectric material portion 165. The first retro-stepped dielectric material portion 165 includes a dielectric material that is different from the material of the first sacrificial material layers 142. For example, the first retro-stepped dielectric material portion 165 can include undoped silicate glass or doped silicate glass. The top surface of the first retro-stepped dielectric material portion 165 can be coplanar with the top surface of the first insulating cap layer 170. The bottom surfaces of the first retro-stepped dielectric material portion 165 contacts the stepped surfaces of the first alternating stack (132, 142) and top surfaces of the word line contact via structures (67, 68).

An inter-tier dielectric layer 180 may be optionally deposited over the first-tier structure (132, 142, 165, 170, 148, 67, 68). The inter-tier dielectric layer 180 includes a dielectric material such as silicon oxide. The thickness of the inter-tier dielectric layer 180 can be in a range from 30 nm to 300 nm, although lesser and greater thicknesses can also be employed. Locations of steps S in the first-tier alternating stack (132, 142) are illustrated as dotted lines.

In one embodiment, openings can be formed through the inter-tier dielectric layer 180 in areas that overlap with the sacrificial memory opening fill portions 148. An etch mask having the same pattern as the sacrificial memory opening fill portions 148 (which have the same pattern as the first-tier memory openings 149) can be employed, and an anisotropic etch can be performed to transfer the pattern in the etch mask through the inter-tier dielectric layer 180. The same sacrificial material layer as the sacrificial material layer of the sacrificial memory opening fill portions 148 can be deposited in the openings in the inter-level dielectric layer 180. Upon incorporation of the additional sacrificial material in the inter-level dielectric layer 180, the sacrificial memory opening fill portions 148 can extend through the first alternating stack (132, 142) and the inter-level dielectric layer 180. In one embodiment, each of the sacrificial memory opening fill portions 148 can have a greater lateral dimension at the level of the inter-tier dielectric layer 180 than at the levels of the first alternating stack (132, 142). In this case, the wider regions of the sacrificial memory opening fill portions 148 at the level of the inter-tier dielectric layer 180 can function as landing pads during subsequent formation of second-tier memory openings.

Figure 50A:
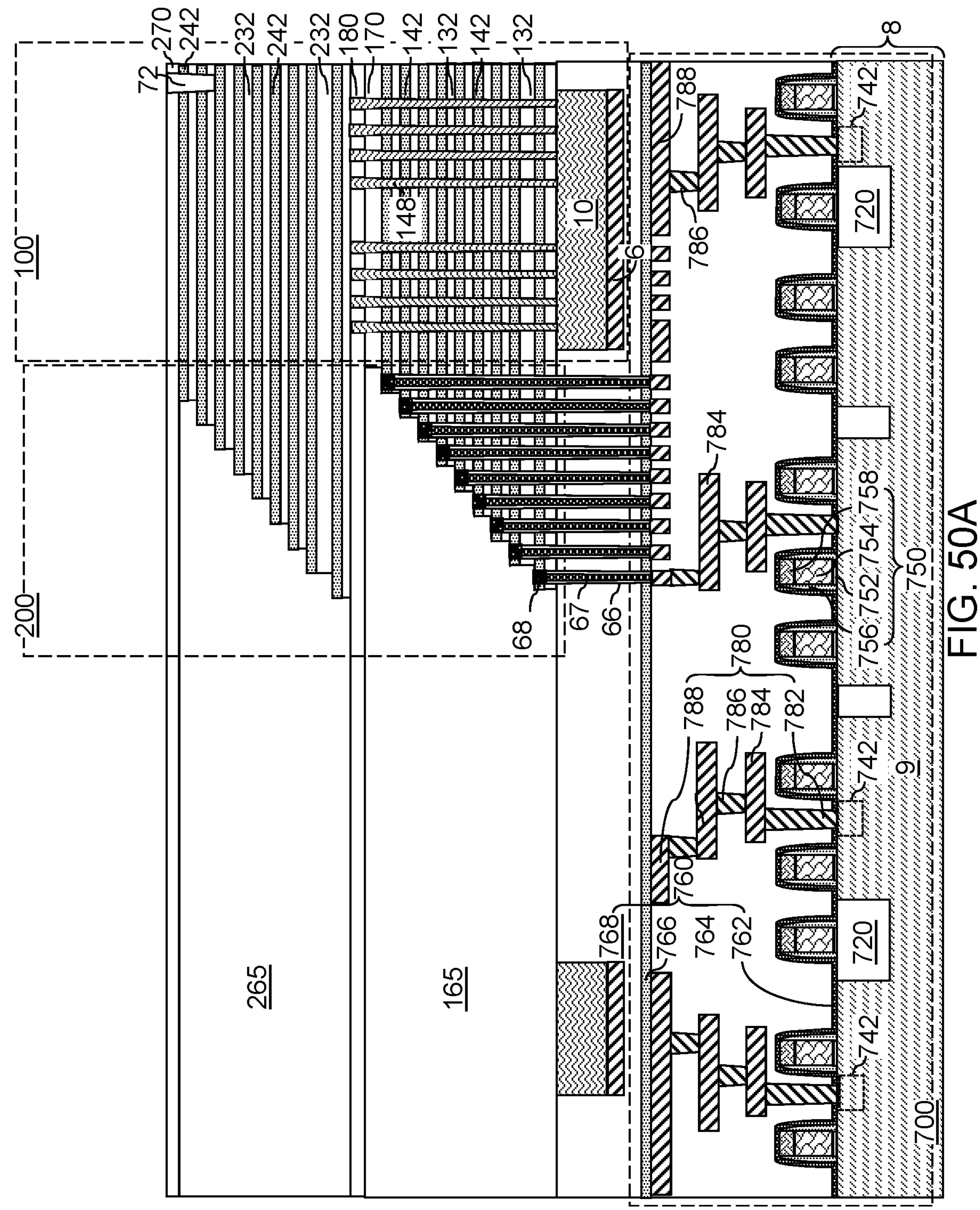
FIG. 50A is a vertical cross-sectional view of the third exemplary structure after formation of a second-tier alternating stack of second insulating layers and second spacer material layers, a second retro-stepped dielectric material portion, a second insulating cap layer, and drain-select-level shallow trench isolation structures according to an embodiment of the present disclosure.
Figure 50B:
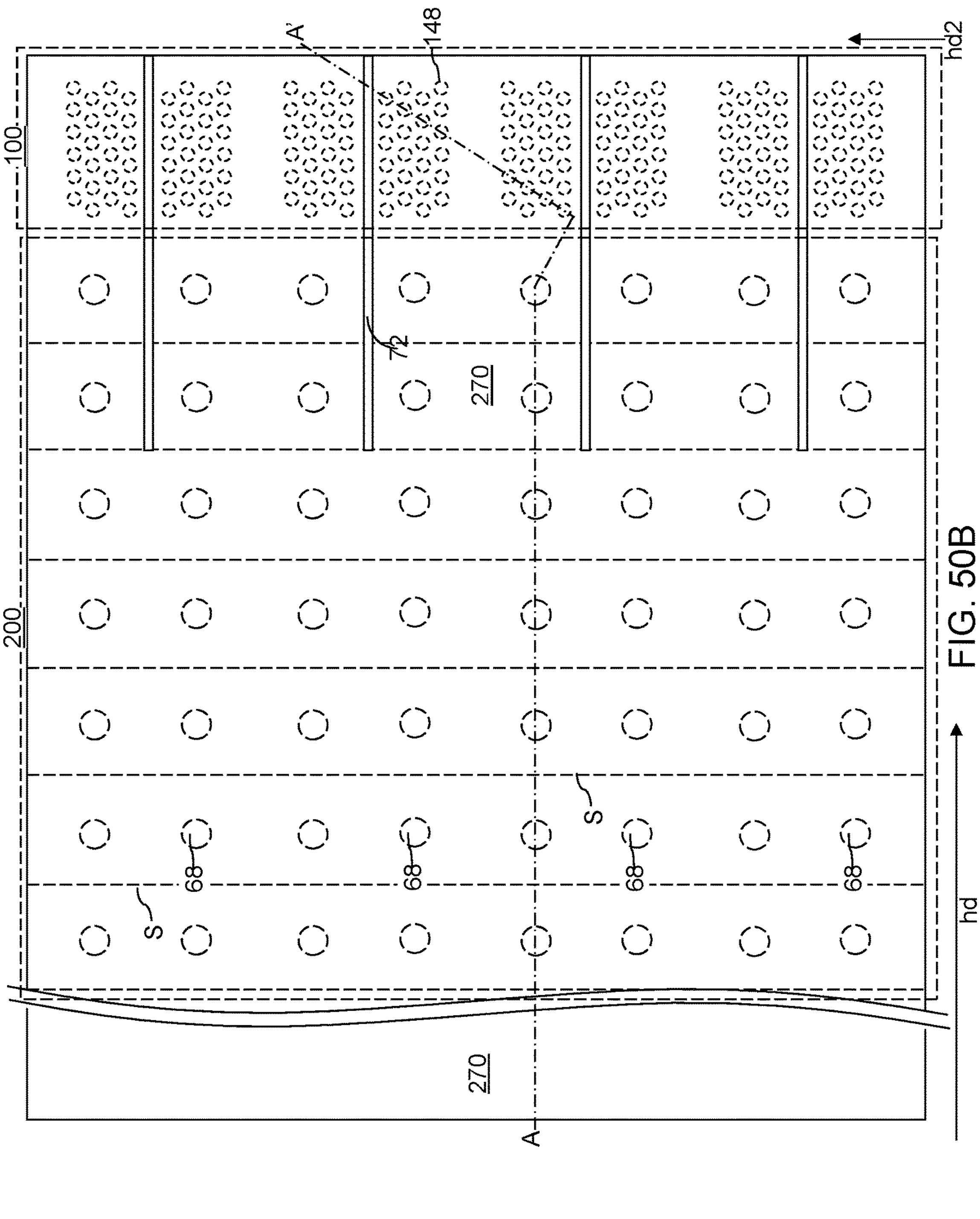
FIG. 50B is a top-down view of the third exemplary structure of FIG. 50A.

Referring to FIGS. 50A and 50B, the processing steps of FIG. 6 can be performed to form a second-tier structure over the first-tier structure (132, 142, 170, 165, 148, 67, 68). The second-tier structure can include an additional alternating stack of insulating layers and spacer material layers, which can be sacrificial material layers in the same manner as in the first and second embodiments. For example, a second alternating stack (232, 242) of second insulating layers 232 and second sacrificial material layers 242 can be formed.

Second stepped surfaces in the second stepped area can be formed in the word line contact region 200 in the same manner as in the first embodiment. A second-tier retro-stepped dielectric material portion 265 can be formed over the second stepped surfaces in the word line contact region 200. A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Optionally, drain-select-level shallow trench isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Figure 51A:
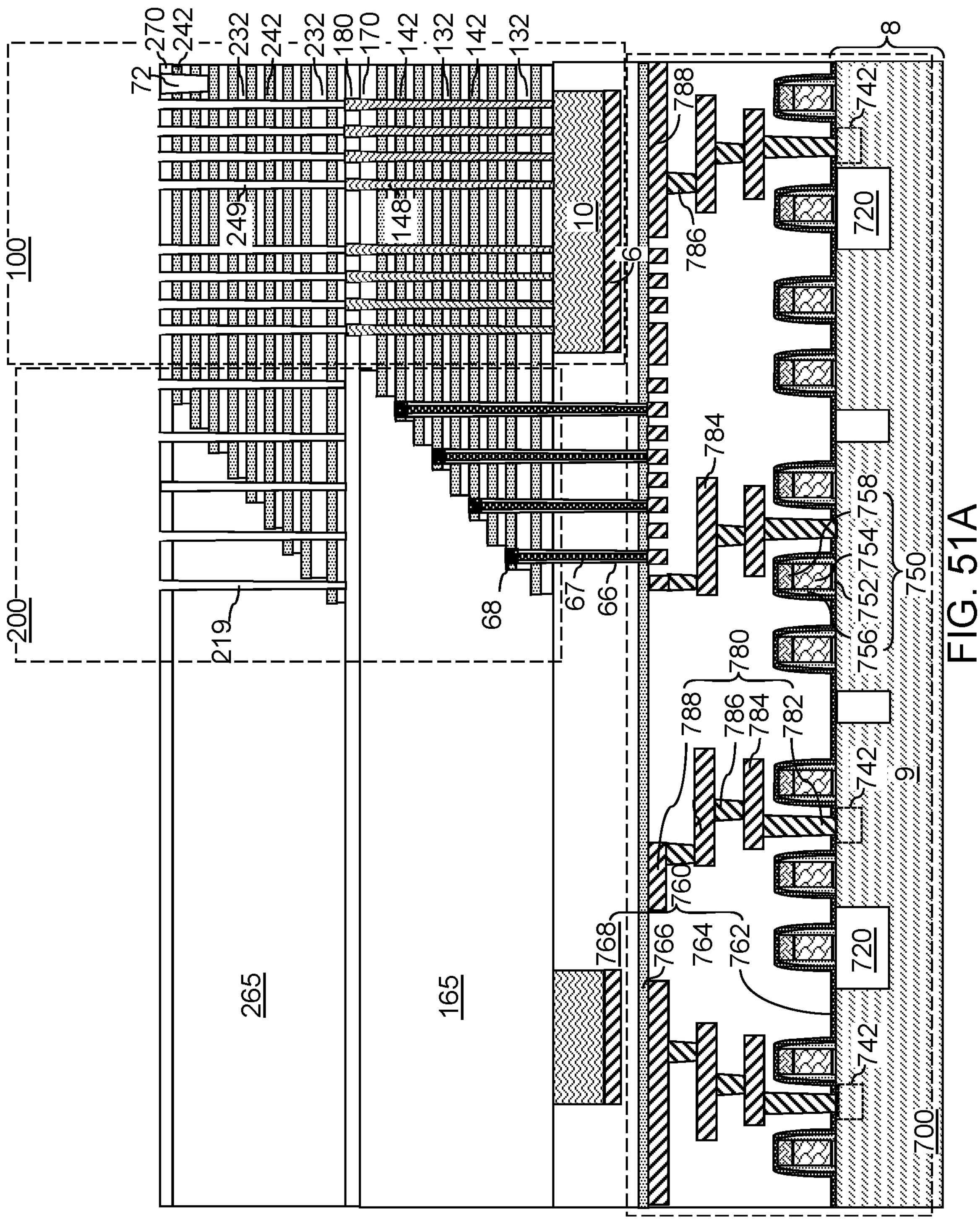
FIG. 51A is a vertical cross-sectional view of the third exemplary structure after formation of second-tier memory openings and support openings according to an embodiment of the present disclosure.
Figure 51B:
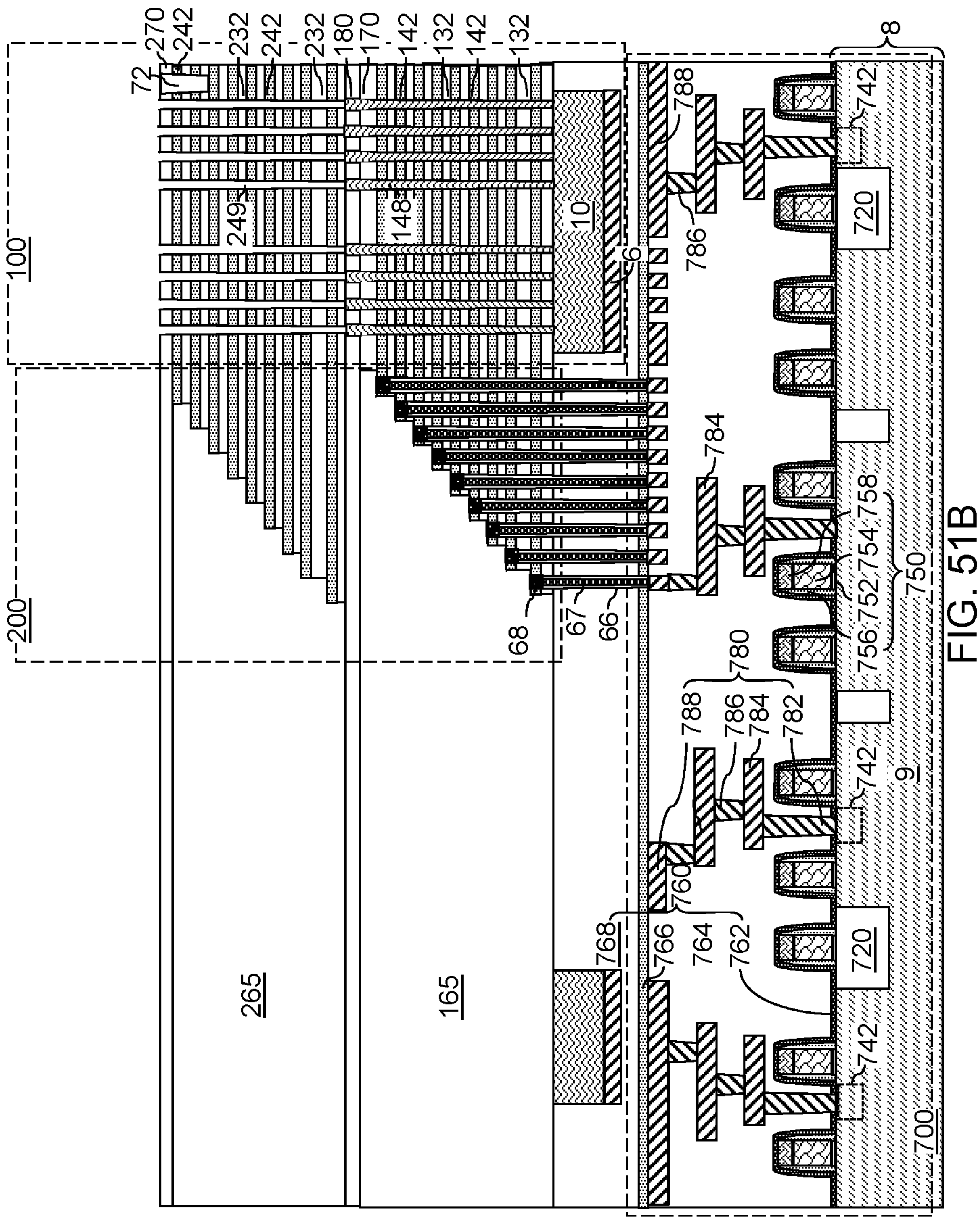
FIG. 51B is another vertical cross-sectional view of the third exemplary structure of FIG. 51A according to an embodiment of the present disclosure.
Figure 51C:
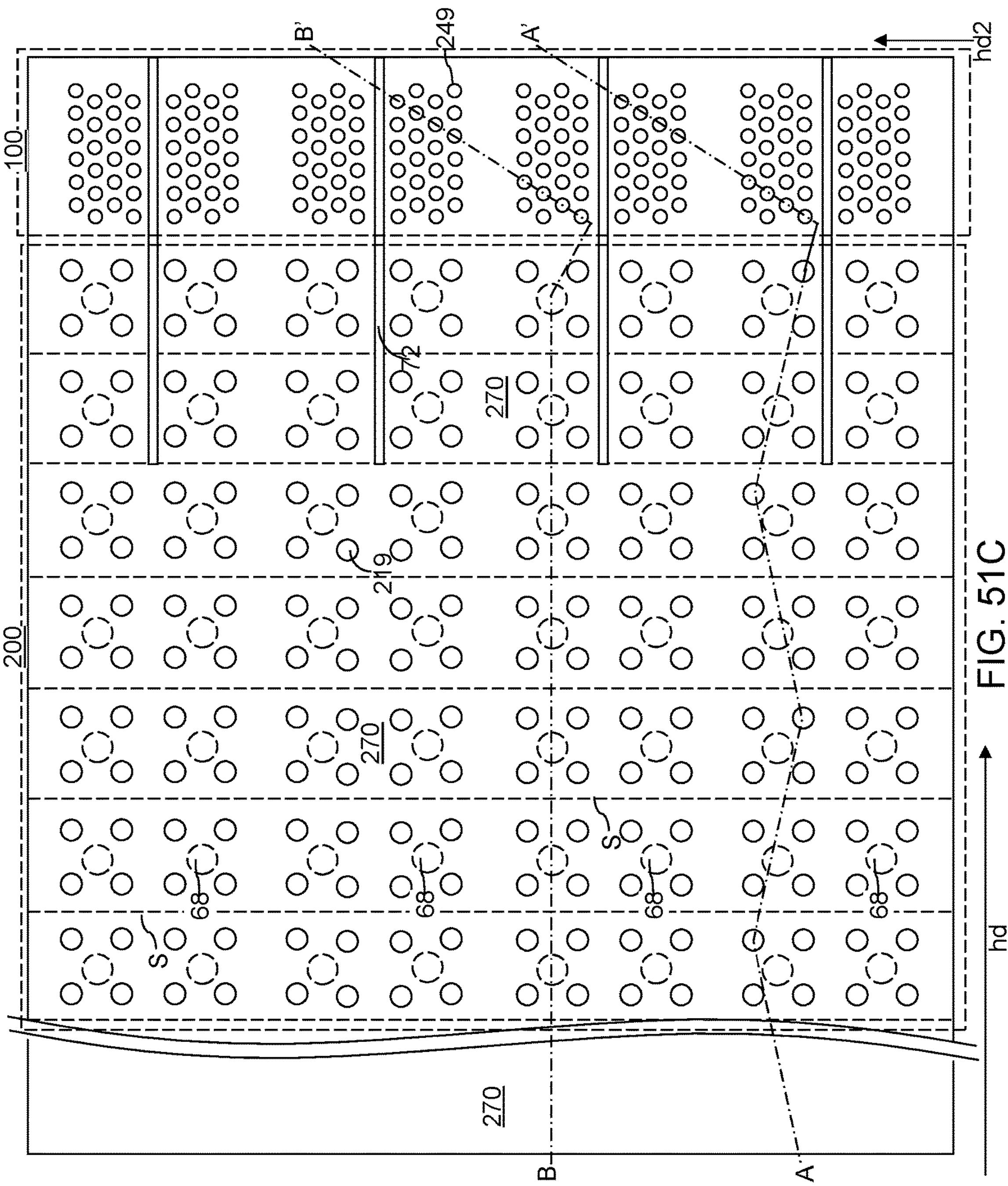
FIG. 51C is a top-down view of the third exemplary structure of FIGS. 51A and 51B. Plane A-A' is the plane of the vertical cross-sectional view of FIG. 51A, and plane B-B' is the plane of the vertical cross-sectional view of FIG. 51B.

Referring to FIGS. 51A-51C, second-tier memory openings 249 and second-tier support openings 219 are formed. The second-tier memory openings 249 extend through the second-tier structure (232, 242, 270, 265) in areas overlying the sacrificial memory opening fill portions 148. A photoresist layer can be applied over the second-tier structure (232, 242, 270, 265), and can be lithographically patterned to form a pattern that includes the pattern of the sacrificial memory opening fill portions 148 and a pattern for subsequently forming support structures in the word line contact region 200. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. Each second-tier support opening 219 can extend to the inter-tier dielectric layer 180 or the first retro-stepped dielectric material portion 165 (in case the inter-tier dielectric layer 180 is not employed).

Figure 52:
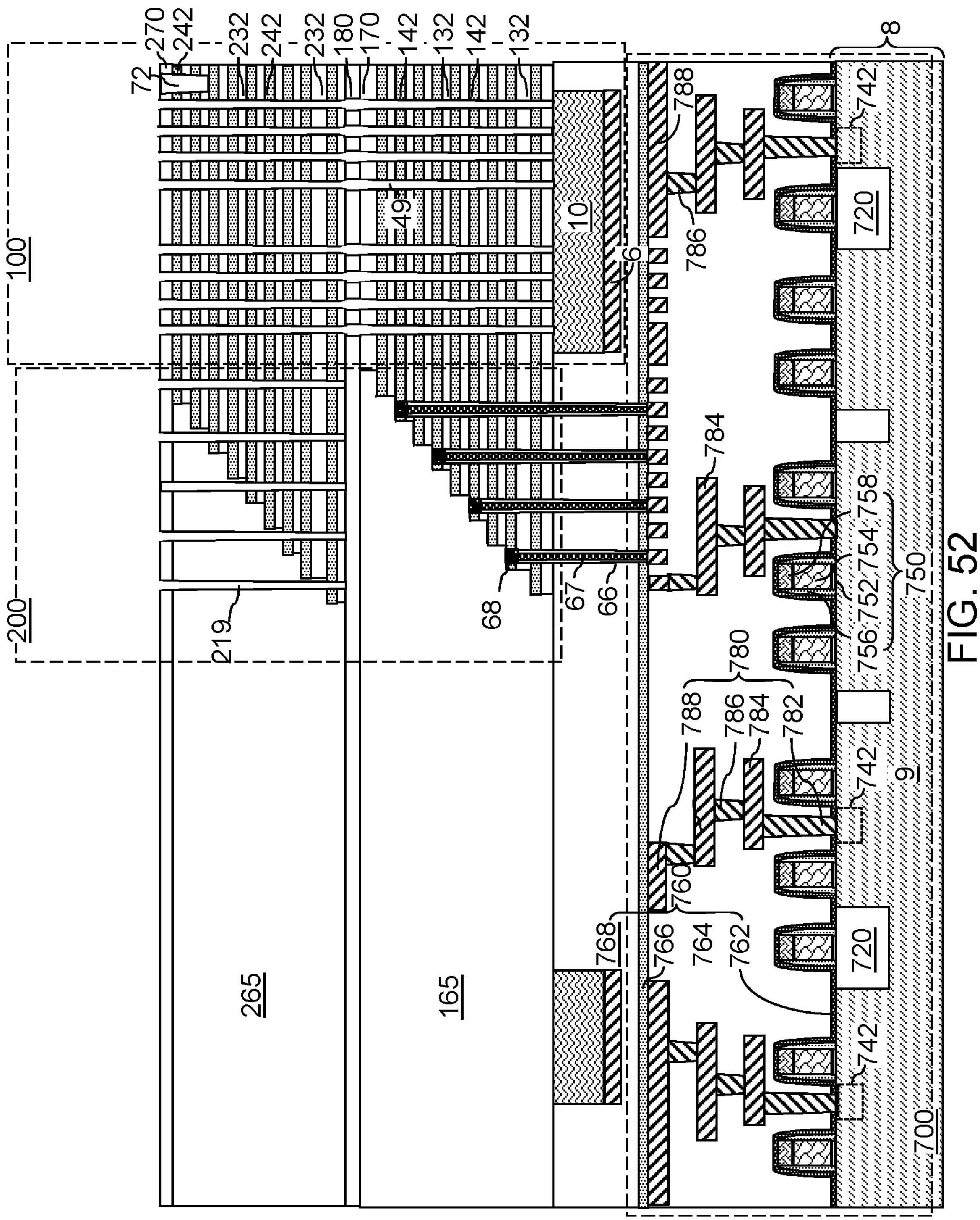
FIG. 52 is a vertical cross-sectional view of the third exemplary structure after formation of inter-tier memory opening by removal of the sacrificial memory opening fill portions according to an embodiment of the present disclosure.

Referring to FIG. 52, after the top surfaces of the sacrificial memory opening fill portions 148 are physically exposed, an etch process can be performed, which removes the sacrificial material of the sacrificial memory opening fill portions 148 selective to the materials of the second-tier alternating stack (232, 242) and the first-tier alternating stack (132, 142) (e.g., $C_4F_8$ /$O_2$ /Ar etch). Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). Each continuous cavity is herein referred to as an inter-tier memory opening 49. A top surface of the planar semiconductor material layer 10 can be physically exposed at the bottom of each inter-tier memory opening 49.

Figure 53A:
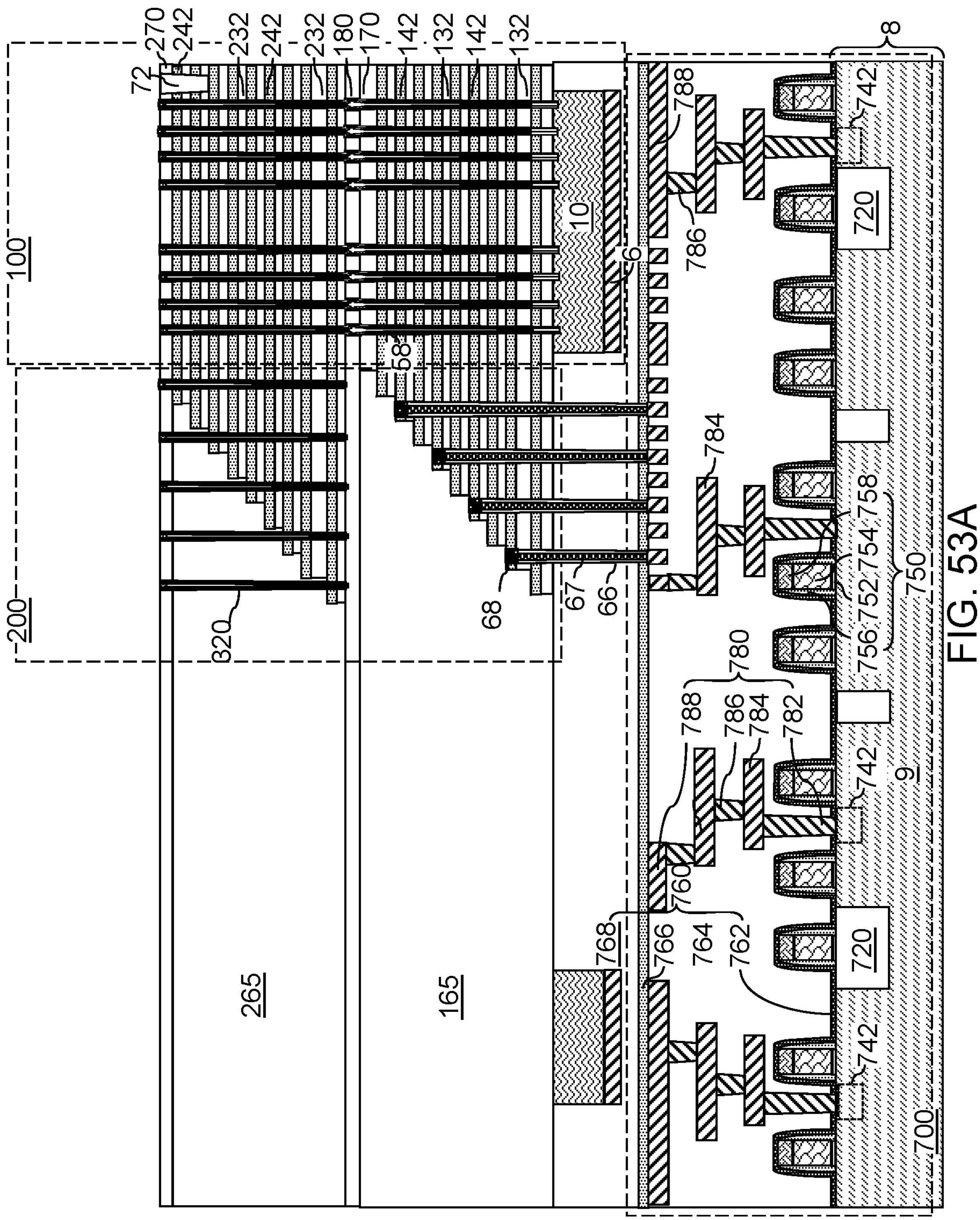
FIG. 53A is a vertical cross-sectional view of the third exemplary structure after formation of memory opening fill structures and support opening fill structures according to an embodiment of the present disclosure.
Figure 53B:
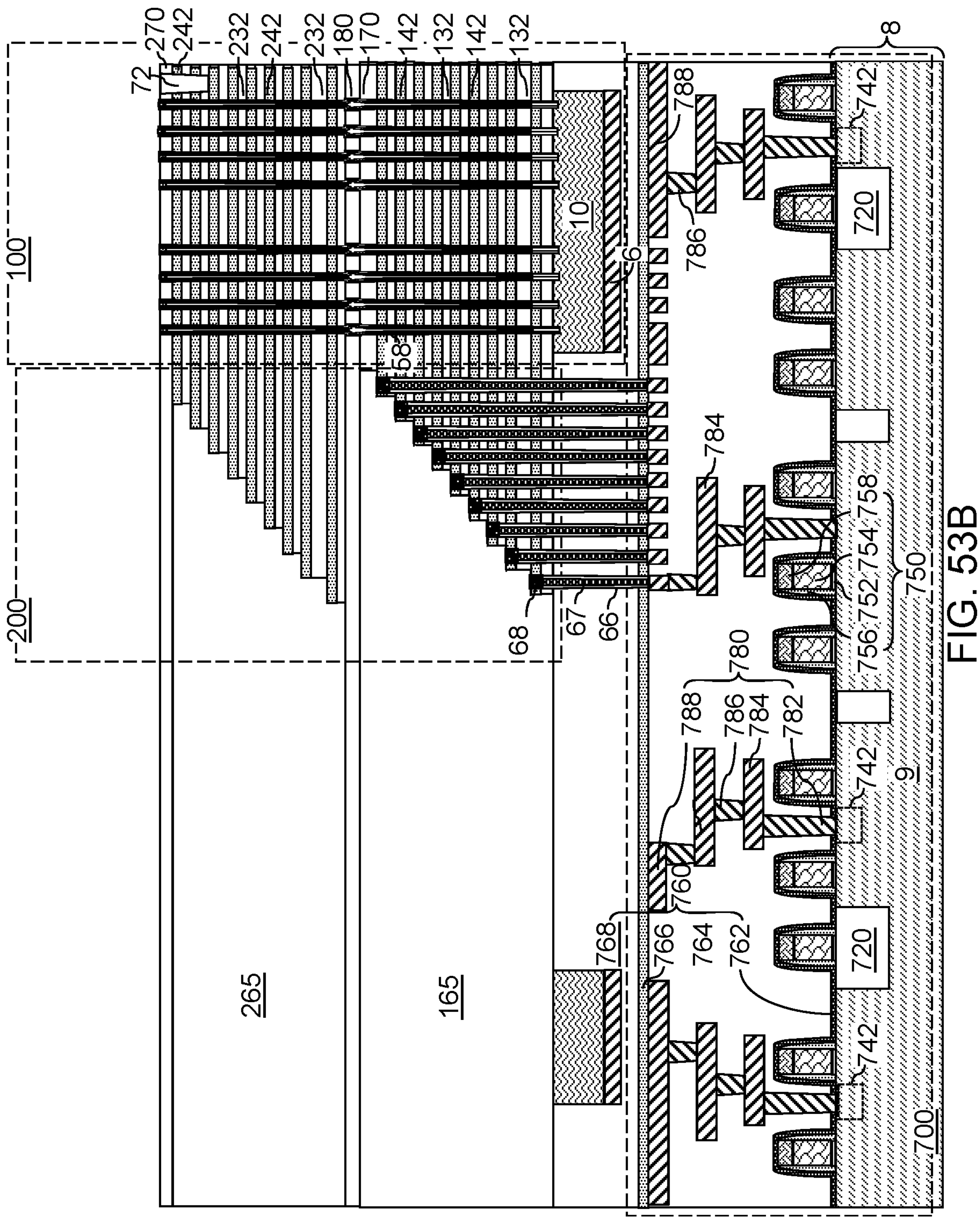
FIG. 53B is another vertical cross-sectional view of the third exemplary structure of FIG. 53A.
Figure 53C:
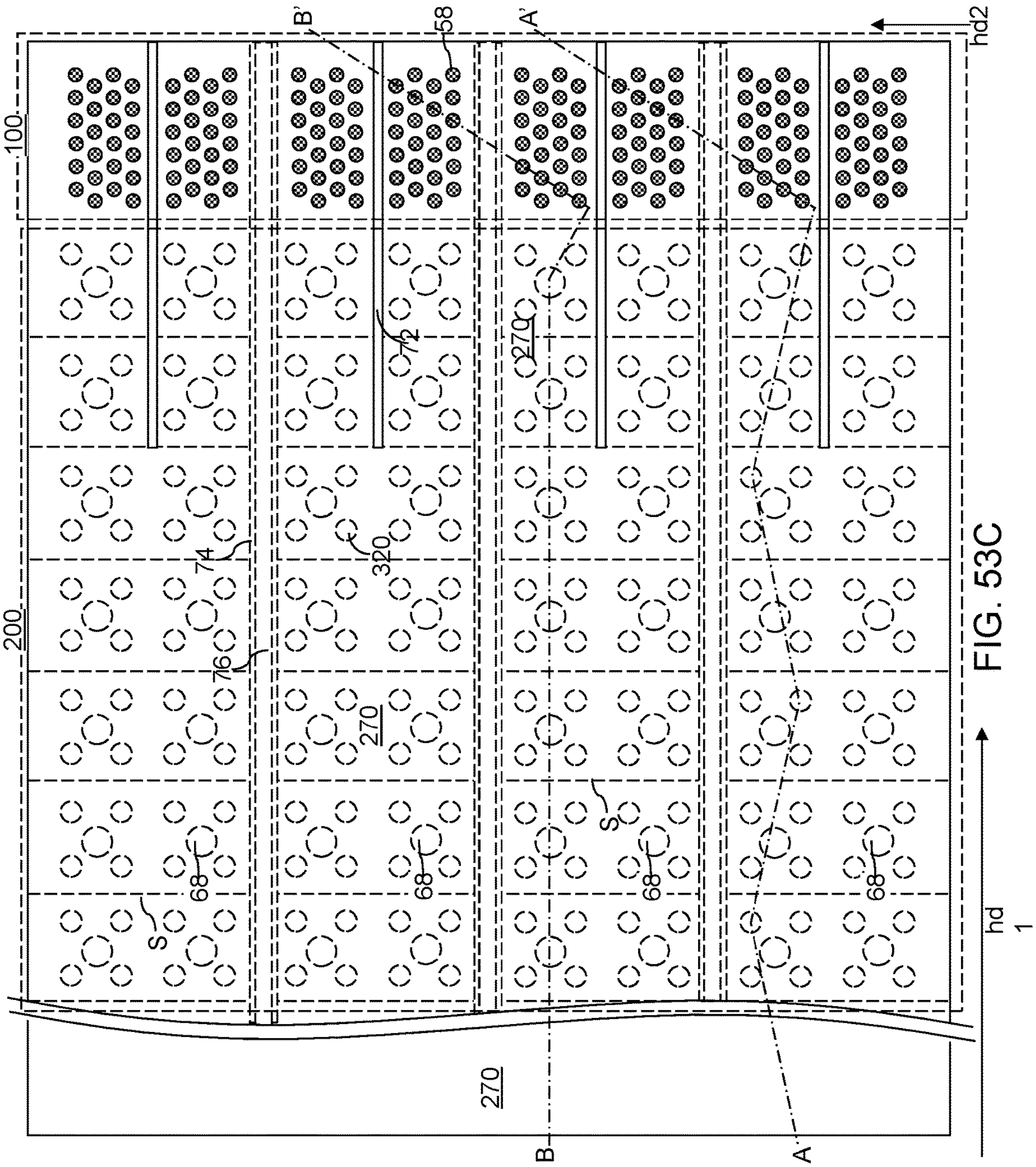
FIG. 53C is a top-down view of the third exemplary structure of FIGS. 53A and 53B. Plane A-A' is the plane of the vertical cross-sectional view of FIG. 53A, and plane B-B' is the plane of the vertical cross-sectional view of FIG. 53B.

Referring to FIGS. 53A-53C, memory opening fill structures 58 are formed in each of the inter-tier memory openings 49. For example, the processing steps of FIGS. 9A-9H can be performed to form the memory opening fill structures 58 in the inter-tier memory openings 49. Each memory opening fill structure 58 includes a respective memory stack structure 55. Each memory stack structure vertically extends through the first alternating stack (132, 142) and the second alternating stack (232, 242). Each memory stack structure 55 comprises a memory film 50 and a vertical semiconductor channel 60 laterally surrounded by the memory film 50.

Support pillar structures 320 are formed within each second-tier support opening 219 collaterally during the processing steps that form the memory opening fill structures 58 in the inter-tier memory openings 49. As such, each material portion of a support pillar structure 320 can have the same composition as a corresponding material portion in a memory opening fill structures 58. For example, each support pillar structure 320 can have a layer stack that has the same set of material layers as a memory film 50 within a memory opening fill structure 58, at least one semiconductor material layer having the same composition and thickness as a vertical semiconductor channel 60 within a memory opening fill structure 58, a dielectric core having the same composition as a dielectric core 62 within a memory opening fill structure 58, and a dummy drain region having a same composition as a drain region 63 within a memory opening fill structure 58. In this embodiment, the support pillar structures 320 are present in the second tier, but can be omitted in the first tier. The locations of insulating spacers 74 and backside contact via structures 76 to be formed in subsequent steps are shown in dashed lines in FIG. 53C.

Figure 54A:
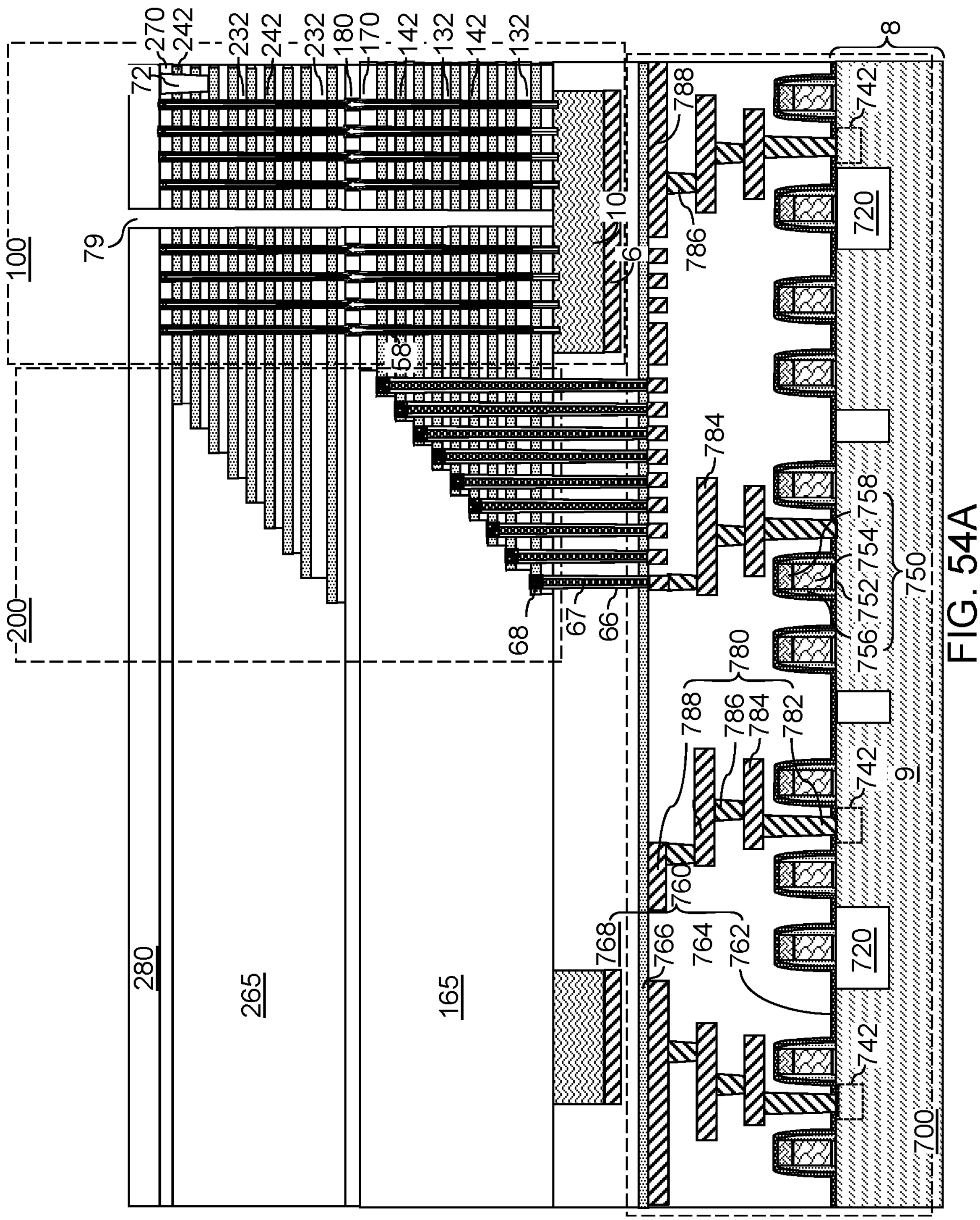
FIG. 54A is a vertical cross-sectional view of the third exemplary structure after formation of a first contact level dielectric layer and backside trenches according to an embodiment of the present disclosure.
Figure 54B:
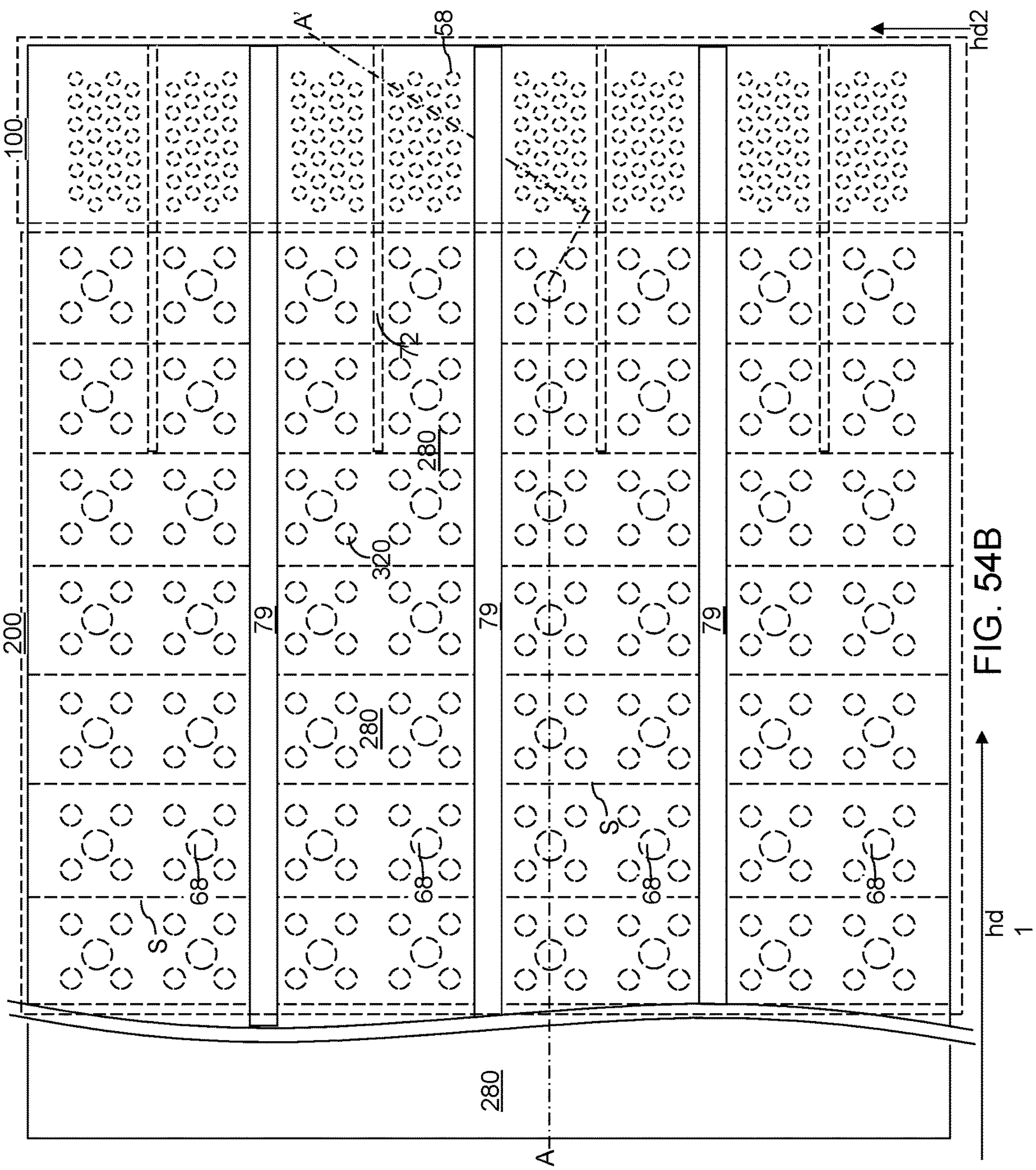
FIG. 54B is a top-down view of the third exemplary structure of FIG. 54A.

Referring to FIGS. 54A and 54B, the processing steps of FIGS. 10A and 10B can be performed to form a first contact level dielectric layer 280 and backside trenches 79.

Figure 55A:
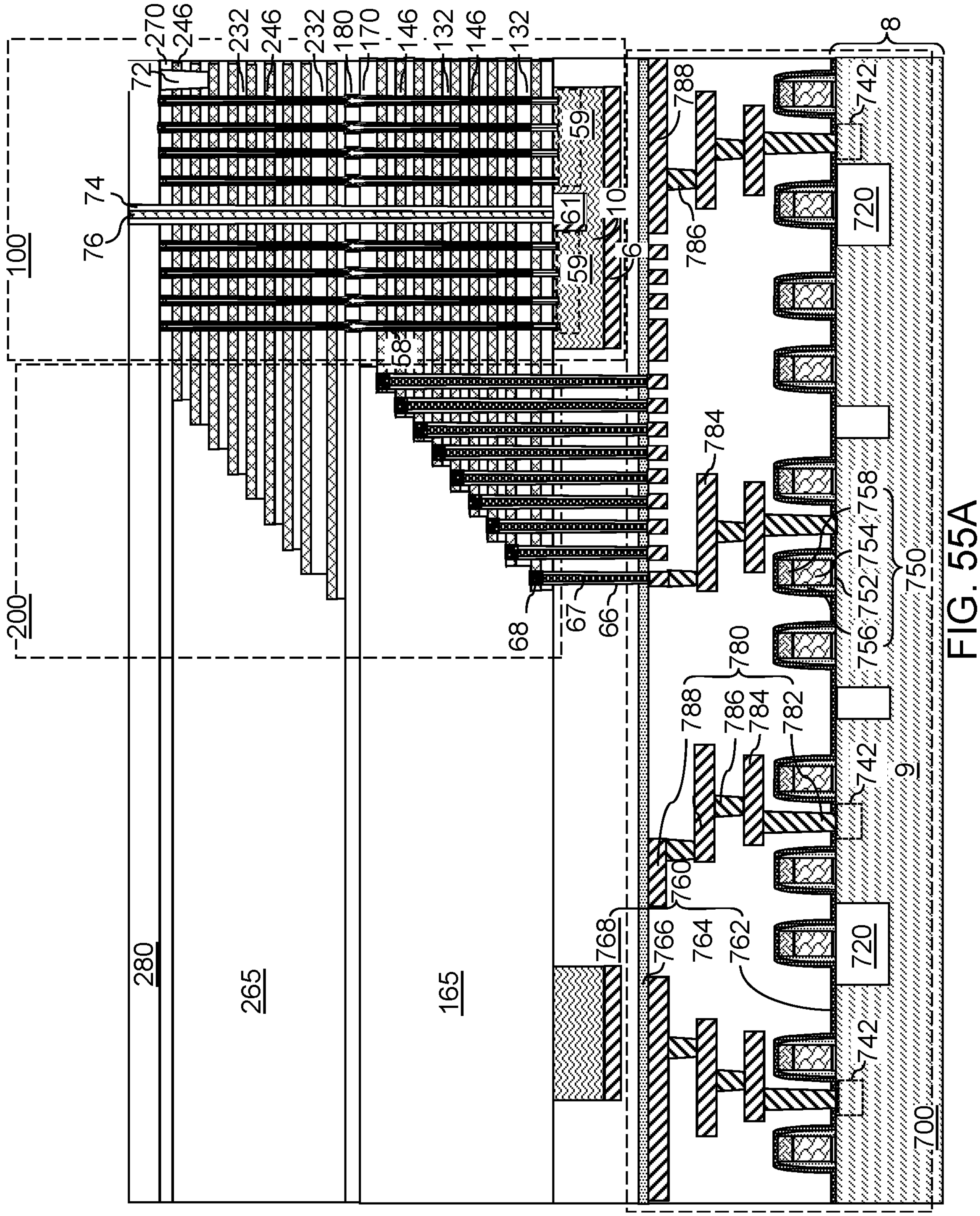
FIG. 55A is a vertical cross-sectional view of the third exemplary structure after replacement of the sacrificial material layers with electrically conductive layers according to an embodiment of the present disclosure.
Figure 55B:
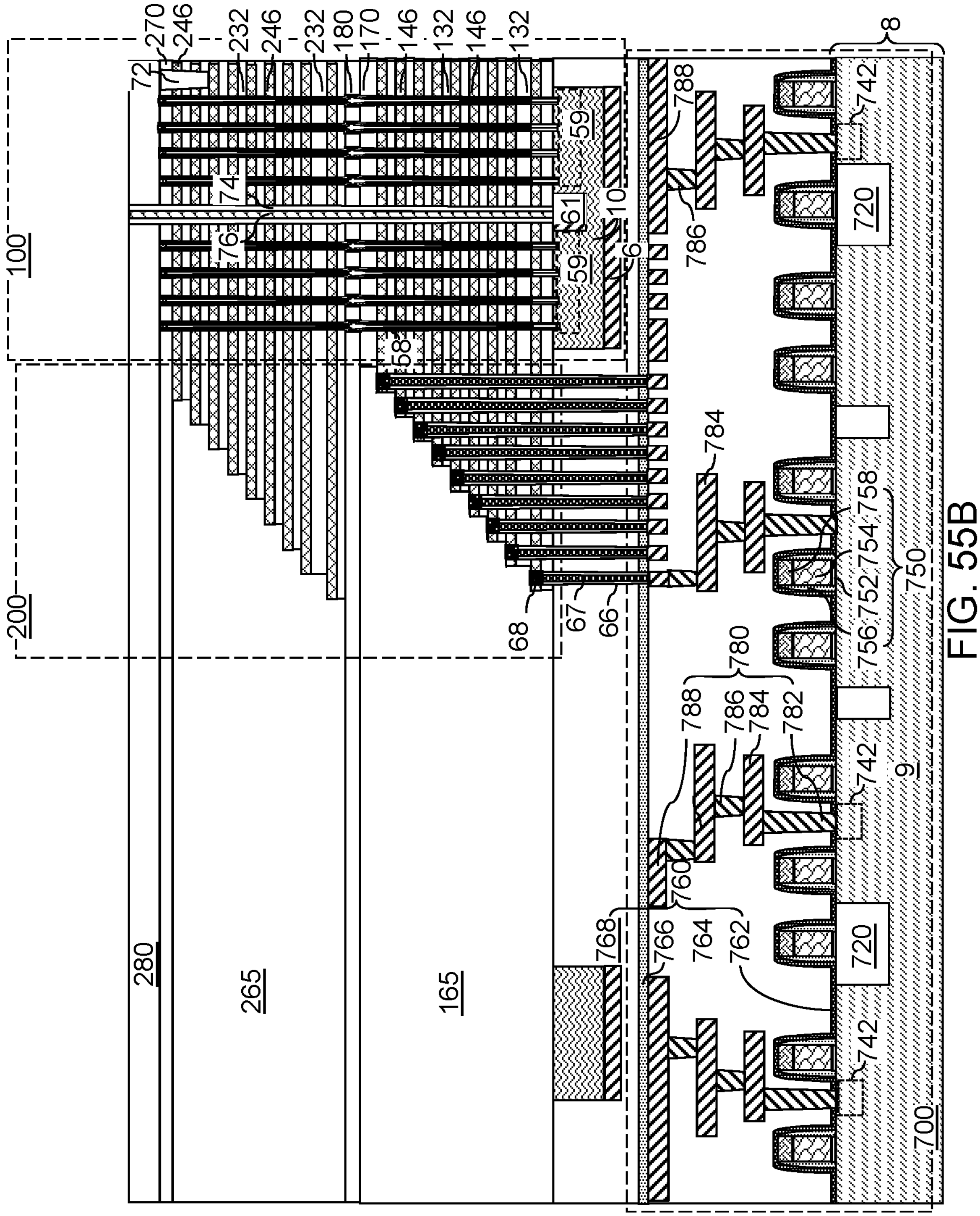
FIG. 55B is another vertical cross-sectional view of the third exemplary structure of FIG. 55A.
Figure 55C:
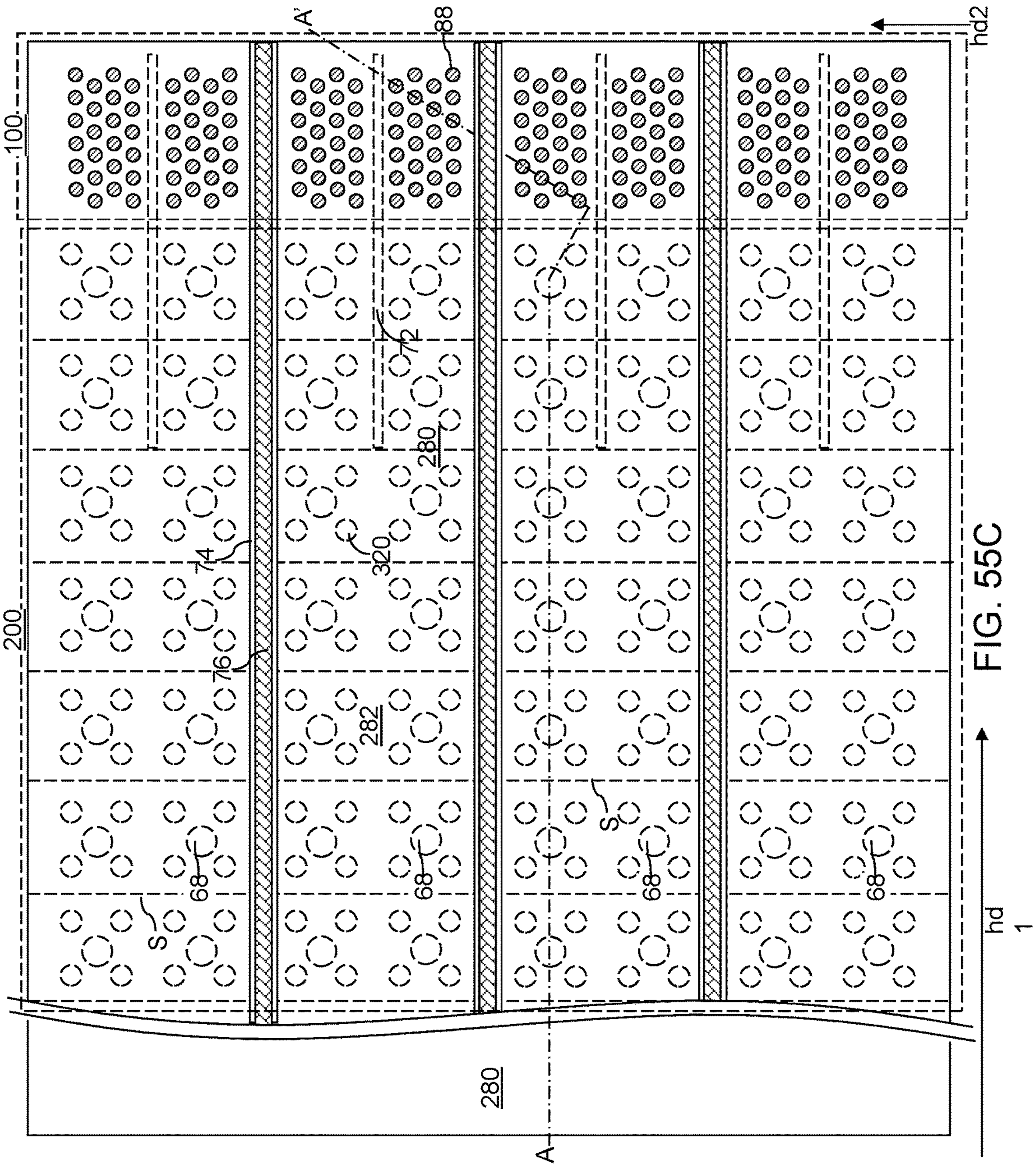
FIG. 55C is a top-down view of the third exemplary structure of FIGS. 55A and 55B. Plane A-A' is the plane of the vertical cross-sectional view of FIG. 55A, and plane B-B' is the plane of the vertical cross-sectional view of FIG. 55B.

Referring to FIGS. 55A-55C, a first subset of the processing steps of FIGS. 11A and 11B can be performed to replace the sacrificial material layers (142, 242) with electrically conductive layers (246, 246). The word line contact via structures (67, 68) provide structural support in the first tier of the word line contact region 200, the support pillar structures 320 provide structural support in the second tier of the word line contact region 200, and the memory opening fill structures 58 provide structural support in the memory array region 100 while backside recesses are present between vertically neighboring pairs of insulating layers (132, 232) during replacement of the sacrificial material layers (142, 242) with the electrically conductive layers (246, 246). Replacement of the second sacrificial material layers 242 with the second electrically conducive layers 246 occurs concurrently with replacement of the first sacrificial material layers 142 with the first electrically conductive layers 146. Each first electrically conductive layer 146 contacts a respective one of the word line contact via structures (67, 68).

Subsequently, source regions 61 can be formed in the same manner as in the first embodiment. Upper portions of the semiconductor material layer 10 located between the source regions 61 and the pedestal channel portions 11 constitute horizontal semiconductor channels 59.

A second subset of the processing steps of FIGS. 11A and 11B can be performed to form insulating spacers 74 and backside contact via structures 76 (which may be laterally-elongated contact via structures).

Figure 56A:
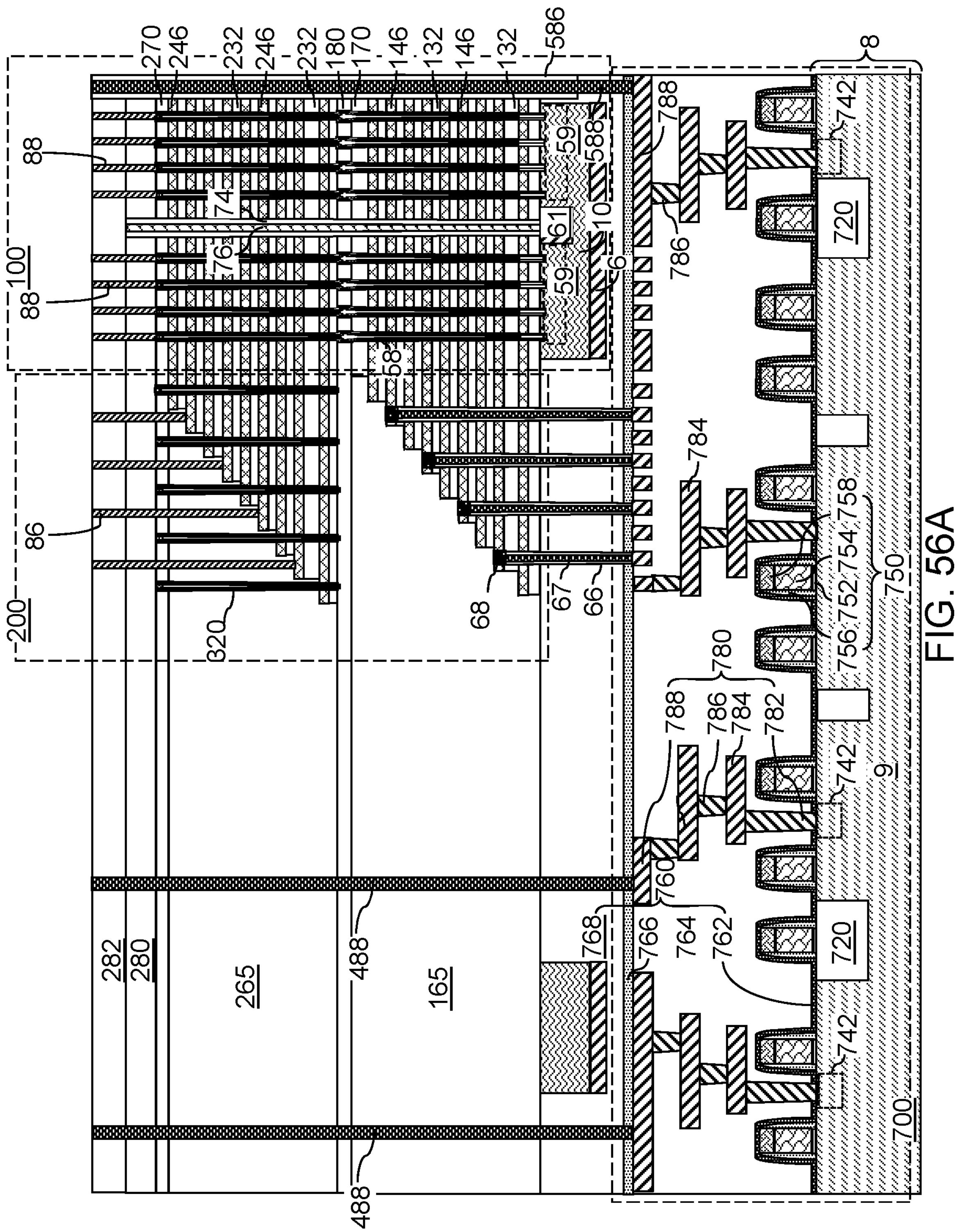
FIG. 56A is a vertical cross-sectional view of the third exemplary structure after formation of a second contact level dielectric layer, through-stack insulating spacers, and through-stack contact via structures according to an embodiment of the present disclosure.
Figure 56B:
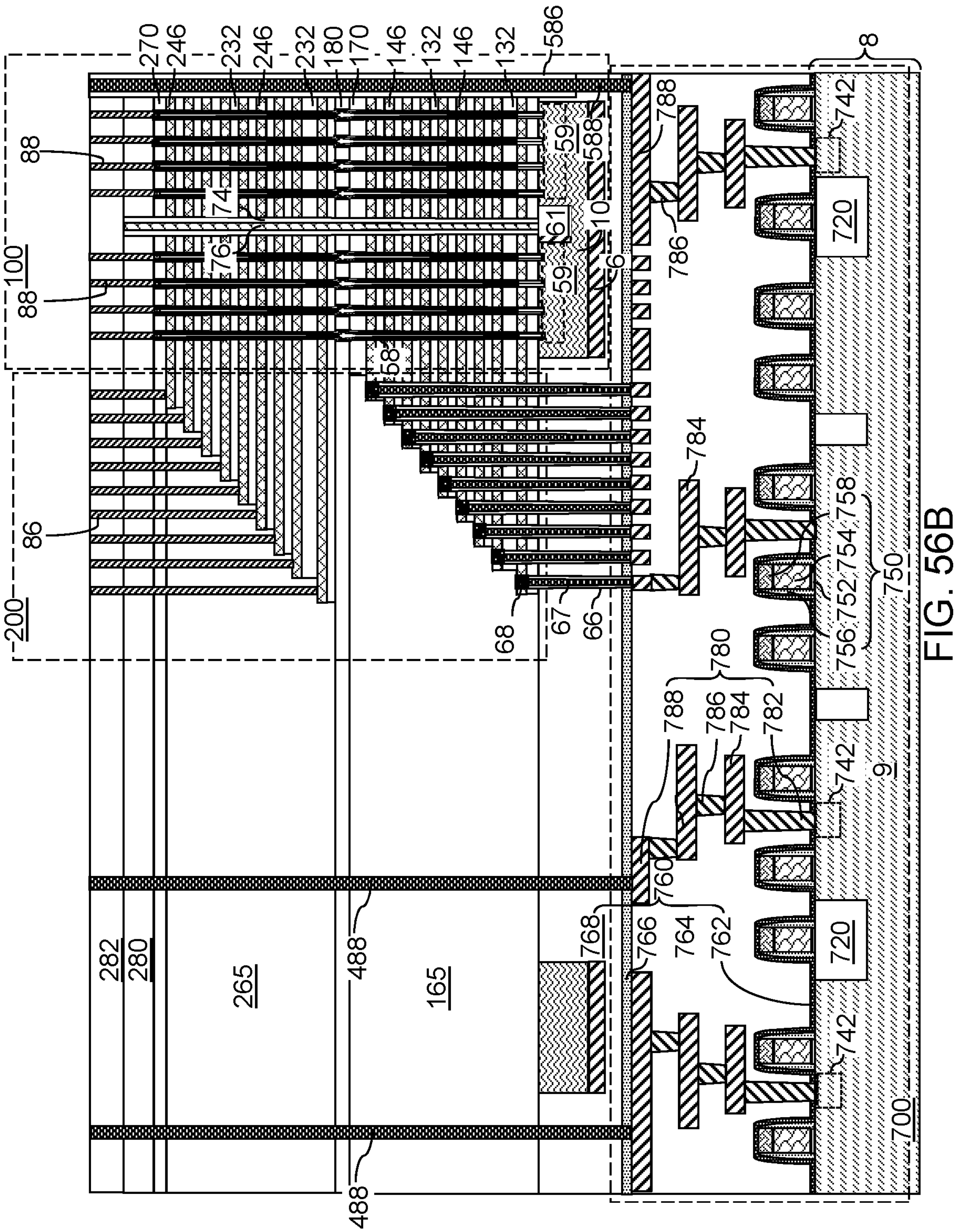
FIG. 56B is another vertical cross-sectional view of the third exemplary structure of FIG. 56A.
Figure 56C:
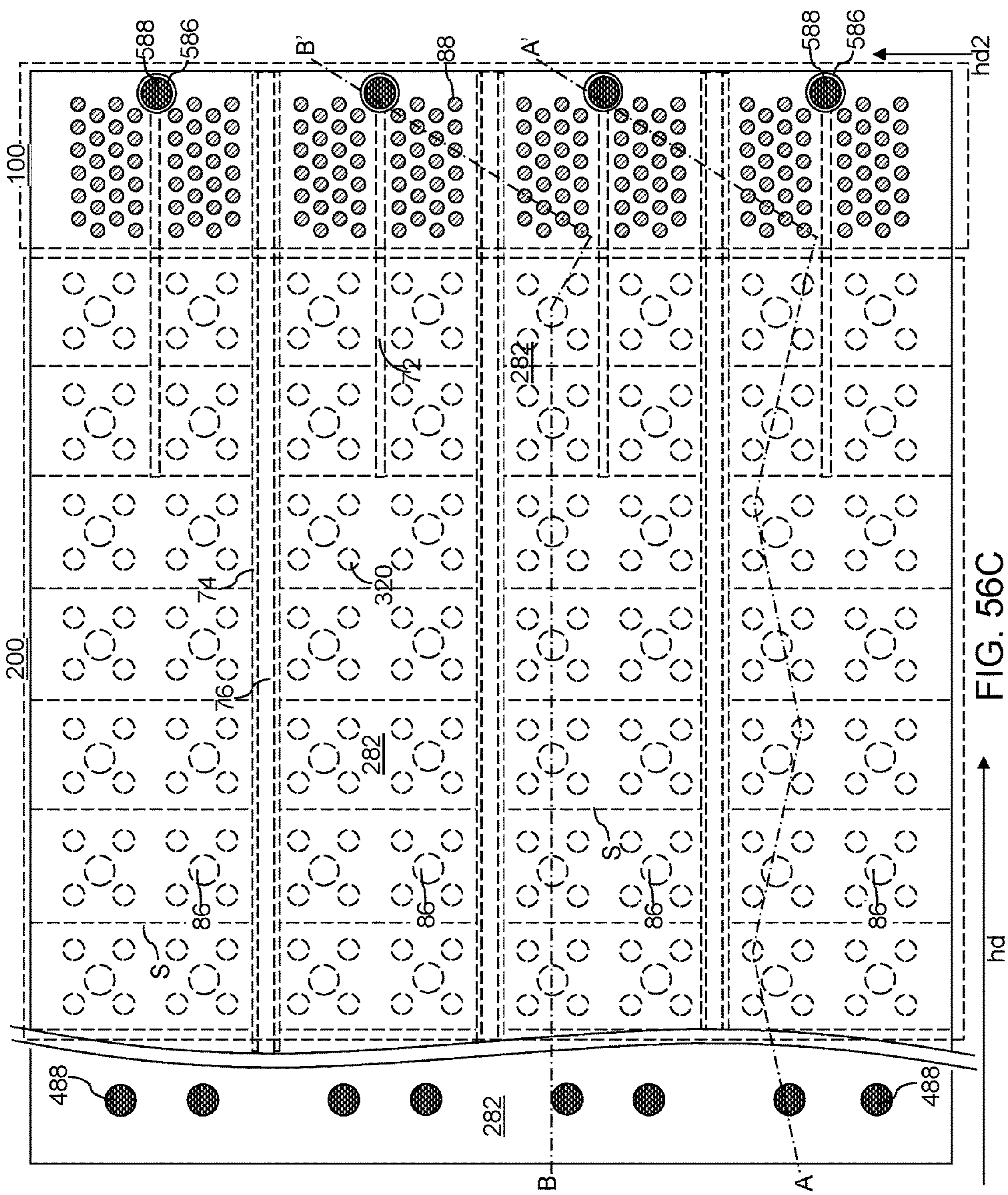
FIG. 56C is a top-down view of the third exemplary structure of FIGS. 56A and 56B. Plane A-A' is the plane of the vertical cross-sectional view of FIG. 56A, and plane B-B' is the plane of the vertical cross-sectional view of FIG. 56B.

Referring to FIGS. 56A-56C, a second contact level dielectric layer 282 over the second contact level dielectric layer 280. The processing steps of FIGS. 12A and 12B can be performed, with modification, to form the drain contact via structures 88 and the word line contact via structures 86. In this case, the word line contact via structures 86 extend only through the first and second contact level dielectric layers (280, 282), the second insulating cap layer 270, and the second retro-stepped dielectric material portion 265 and contacts a top surface of a respective one of the second electrically conductive layers 246. The word line contact via structures 86 do not extend into the fist-tier structure (132, 146, 170, 165, 67, 68), or extend below the horizontal plane including the bottommost layer within the second alternating stack (232, 246).

The word line contact via structures (67, 68) formed at the processing steps of FIG. 48 are herein referred to as first word line contact via structures (67, 68), and the word line contact via structures 86 formed at the processing steps of FIGS. 56A-56C are herein referred to as second word line contact via structures 86. In the third exemplary structure, the first word line contact via structures (67, 68) provide vertical electrical connection between the first electrically conductive layers 146 and the peripheral devices on the substrate semiconductor layer 9, and the second word line contact via structures 86 provide vertical electrical connection between the second electrically conductive layers 246 and the peripheral devices on the substrate semiconductor layer 9. The areas of the first word line contact via structures (67, 68) and the areas of the second word line contact via structures 86 can overlap, and thus, the total area for the word line contact region 200 can be reduced compared to the configuration of the first exemplary structure.

Subsequently, the processing steps of FIGS. 13A and 13B, FIG. 14, FIG. 15, and FIGS. 16A and 16B can optionally be performed to form through-stack insulating spacers 586, through-stack contact via structures 588, and through-dielectric contact via structures 488. The through-stack contact via structures 588 and through-dielectric contact via structures 488 can be employed to provide electrical connections to bit lines to be subsequently formed and to provide power and ground connections to the three-dimensional memory device formed on the semiconductor material layer 10.

Figure 57:
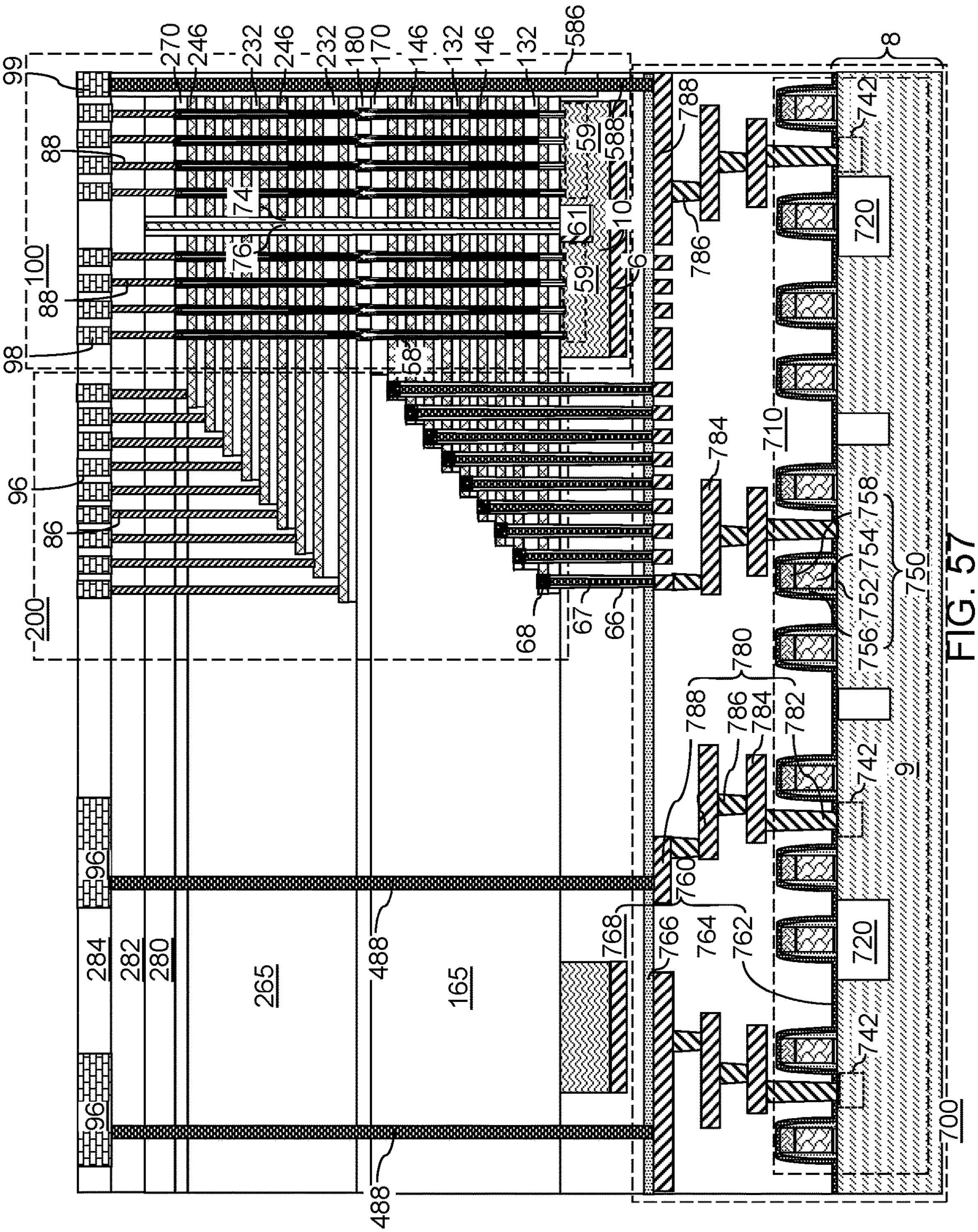
FIG. 57 is a vertical cross-sectional view of the third exemplary structure after formation of through-dielectric contact via structures, at least one upper interconnect level dielectric layer, and various upper interconnect level metal structures according to an embodiment of the present disclosure.

Referring to FIG. 57, the processing steps of FIG. 17 can be performed to form at least one upper interconnect level dielectric layer 284 over the contact level dielectric layers (280, 282). The at least one upper interconnect level dielectric layer 284 can include multiple upper interconnect level dielectric layers. Various upper interconnect structures, such as upper interconnect level metal structures, can be formed in the at least one upper interconnect level dielectric layer 284. For example, the various upper interconnect level metal structures can include line level metal interconnect structures (96, 98, 99). The line level metal interconnect structures (96, 98, 99) can include first upper metal line structures 99 that contact a top surfaces of a respective one of the through-stack contact via structures 588, second upper metal line structures 96 that contact a top surface of a respective one of the through-dielectric contact via structures 488, and bit lines 98 that contact a respective one of the drain contact via structures 88 and extend along the second horizontal direction (e.g., bit line direction) hd2 and perpendicular to the first horizontal direction (e.g., word line direction) hd1. In one embodiment, a subset of the first upper metal line structures 99 may be employed to provide electrical connections through the source connection via structures 91 described above to the laterally-elongated contact via structures 76 and to the source regions 61. In one embodiment, a subset of the second upper metal line structures 96 may contact, or are electrically coupled to, a respective pair of a word line contact via structure 86 and a through-dielectric contact via structure 488.

At least a subset of the upper metal interconnect structures (which include the line level metal interconnect structures (96, 98, 99)) is formed over the three-dimensional memory array. The upper metal interconnect structures comprise an upper metal line structure (such as a first upper metal line structure 99) that is formed directly on a through-stack contact via structure 588. A set of conductive structures including the through-stack contact via structure 588 and a lower metal line structure (such as a topmost lower metal line structure 788) provides an electrically conductive path between the at least one semiconductor device 710 on the substrate semiconductor layer and the upper metal line structure. A through-dielectric contact via structure 488 can be provided through the retro-stepped dielectric material portions (165, 265), the at least one second dielectric material layer 768, and the silicon nitride layer 766 and directly on a top surface of another lower metal line structure (e.g., another topmost lower metal line structure 788) of the lower metal interconnect structures 780. The through-dielectric contact via structures 488 can be formed on a respective one of the lower interconnect structures 780 within an area outside of the alternating stacks (132, 146, 232, 246).

While a multi-tier structure containing at least two tiers of alternating stacks (132, 146) and (232, 246) is described above, the present disclosure is not limited to a multi-tier structure. In an alternative embodiment, a single tier structure containing only one alternating stack (132, 146) can be formed. In this alternative embodiment, the upper alternating stack (232, 246) can be omitted.

Furthermore, the first-tier memory openings 149 and first-tier contact openings 115 can be formed during the same etching step in a single tier structure, as shown in FIGS. 23A and 23B. In another alternative embodiment, the first-tier memory openings 149 and contact openings 115 can be formed in separate etching steps in a single tier structure. In this alternative embodiment, the first-tier memory openings 149 are formed in the alternating stack (132, 142) first, and are then filled with memory opening fill structures 58 which contain memory stack structures 55. After formation of the memory opening fill structures 58, the contact openings 115 are formed in the alternating stack (132, 142) and are then filled with the sacrificial contact opening fill portions 127, as shown in FIGS. 24A and 24B. The terrace region is then formed in the alternating stack (132, 142) using the method illustrated in FIGS. 29-31. The sacrificial contact opening fill portions 127 are then removed from the contact openings 115 to form support openings 119, as shown in FIG. 32. The method then proceeds according to the steps illustrated in FIGS. 33-39, as described above.

Referring to all drawings of the present disclosure and according to various embodiments of the present disclosure, a three-dimensional memory device is provided. The three-dimensional memory device includes: semiconductor devices 710 located on a semiconductor substrate 9; lower interconnect level dielectric layers 760 located over the semiconductor devices 710 and embedding lower interconnect structures 780 that are electrically connected to the respective semiconductor devices 710; an alternating stack {(132, 146) and/or (232, 246)} of insulating layers (132, 232) and electrically conductive layers (146, 246) located over the lower interconnect level dielectric layers 760, wherein stepped surfaces of layers of the alternating stack {(132, 146) and/or (232, 246)} are provided in a terrace region; memory stack structures 55 vertically extending through the alternating stack {(132, 146) and/or (232, 246)}, wherein each of the memory stack structures 55 comprises a memory film 50 and a vertical semiconductor channel 60 laterally surrounded by the memory film 50; and contact via structures (67, 68) located in the terrace region, wherein each of the contact via structures (67, 68) laterally contacts a respective one of the electrically conductive layers (146, 246), vertically extends through a respective opening in at least a bottommost electrically conductive layer 146 of the alternating stack {(132, 146) and/or (232, 246)}, and contacts a respective one of the lower interconnect structures 780 that underlie the alternating stack {(132, 146) and/or (232, 246)}.

In one embodiment, a top surface of each of the contact via structures (67, 68) is substantially coplanar with (i.e., within 2 nm of a top surface of) a horizontal stepped surface of the respective one of the electrically conductive layers (146, 246). In one embodiment, each of the contact via structures (67, 68) vertically extends through openings in each layer of the alternating stack {(132, 146) and/or (232, 246)} that underlies the respective one of the electrically conductive layers (146, 246). In one embodiment, each of the contact via structures (67, 68) is electrically isolated from each layer of the alternating stack {(132, 146) and/or (232, 246)} that underlies the respective one of the electrically conductive layers (146, 246) by an insulating tubular liner 66.

In one embodiment, each of the contact via structures (67, 68) comprises: a metallic nitride liner 67A' contacting the respective one of the lower interconnect structures 780; a metal fill portion 67B' located within the metallic nitride liner 67A' and contacting the respective one of the lower interconnect structures 780; and a metallic pillar structure 68 contacting a generally cylindrical sidewall of the respective one of the electrically conductive layers (146, 246). As used herein, a "generally cylindrical sidewall" refers to a sidewall having a general configuration of a cylindrical surface, which may have a circular cylindrical surface, an elliptical cylindrical surface, or any other generally concave and vertical surface.

In one embodiment, the metallic pillar structure 68 contacts a top surface of the metal fill portion 67B' and an annular top surface of the metallic liner layer 67A'. In one embodiment, the metallic pillar structure 68 has a greater lateral extent than the metal fill portion 67B', and an outer periphery of an interface between a bottom surface of the metallic pillar structure 68 and the metallic nitride liner 67A' is located entirely on a sidewall of a respective one of the insulating layers (132, 232) that contacts a bottom surface of the respective one of the electrically conductive layers (146, 246).

In one embodiment, the stepped surfaces continuously extend from a bottommost layer within the alternating stack {(132, 146) and (232, 246)} to a topmost layer within the alternating stack {(132, 146) and (232, 246)}, and each electrically conductive layer (146, 246) within the alternating stack {(132, 146) and/or (232, 246)} contacts a respective one of the contact via structures (67, 68).

In one embodiment, a retro-stepped dielectric material portion 365 is located over the stepped surfaces in the terrace region, and an entire region of the retro-stepped dielectric material portion 365 within an area of the stepped surfaces is free of any conductive via structure, i.e., does not include any conductive via structure.

In one embodiment, the stepped surfaces are surfaces of a first subset (132, 146) of layers in the alternating stack {(132, 146) and (232, 246)} that includes a bottommost layer within the alternating stack {(132, 146) and (232, 246)}. A second subset (232, 246) of layers of the alternating stack {(132, 146) and (232, 246)} that overlies the first subset of layers include additional stepped surfaces that overhangs the stepped surfaces. Each electrically conductive layer 146 within the first subset (132, 146) of layers contacts a respective one of the contact via structures (67, 68), i.e., a respective one of the first word line contact via structures (67, 68), and each electrically conductive layer 246 within the second subset (232, 246) of layers includes a respective top surface that contacts a bottom surface of a respective one of additional contact via structures 86, i.e., a respective one of second word line contact via structures 86. The first word line contact via structures (67, 68) have bottom surfaces located within a first horizontal plane, and the second word line contact via structures 68 includes top surfaces located with a second horizontal plane. A retro-stepped dielectric material portion 265 is located over the additional stepped surfaces, and each of the additional contact via structures 86 vertically extends through the retro-stepped dielectric material portion 265.

In one embodiment, the three-dimensional memory device further comprises upper interconnect level dielectric layers 284 located over the alternating stack {(132, 146) and/or (232, 246)} and embedding upper interconnect structures (96, 98) that are electrically connected via a respective drain region 63 to an upper end of a respective one of the vertical semiconductor channels 60, and through-dielectric contact via structures 488 vertically extending between a respective one of the upper interconnect structures (96., 98) and a respective one of the lower interconnect structures 780 within an area outside of the alternating stack {(132, 146), (232, 246)}. The upper interconnect structures (96, 98) comprises bit lines 98 that are electrically connected via a respective drain region 63 to an upper end of a respective one of the vertical semiconductor channels 60. The semiconductor devices 710 comprise word line and/or bit line drivers.

In one embodiment, the three-dimensional memory device comprises a monolithic three-dimensional NAND memory device, the electrically conductive layers (146, 246) comprise, or are electrically connected to, a respective word line of the monolithic three-dimensional NAND memory device, bottom ends of the memory stack structures 58 contact a planar semiconductor material layer 10, and the monolithic three-dimensional NAND memory device comprises an array of monolithic three-dimensional NAND strings over the planar semiconductor material layer 10.

At least one memory cell in a first device level of the array of monolithic three-dimensional NAND strings is located over another memory cell in a second device level of the array of monolithic three-dimensional NAND strings. The at least one semiconductor device 710 comprises an integrated circuit comprising a driver circuit for monolithic three-dimensional NAND memory device located thereon. The electrically conductive layers (146, 246) comprise a plurality of control gate electrodes having a strip shape extending substantially parallel to the top surface of the substrate 9.

The plurality of control gate electrodes comprises at least a first control gate electrode located in the first device level and a second control gate electrode located in the second device level. The array of monolithic three-dimensional NAND strings comprises a plurality of semiconductor channels (59, 11, 60), wherein at least one end portion 60 of each of the plurality of semiconductor channels (59, 11, 60) extends substantially perpendicular to a top surface of the semiconductor substrate, and a plurality of charge storage elements (as embodied as portions of the charge storage layers 54 located at levels of the electrically conductive layers (146, 246)), each charge storage element located adjacent to a respective one of the plurality of semiconductor channels (59, 11, 60).

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

semiconductor devices located on a top surface of a semiconductor substrate;

lower interconnect level dielectric layers located over the semiconductor devices and embedding lower interconnect structures that are electrically connected to a respective one of the semiconductor devices;

an alternating stack of insulating layers and electrically conductive layers located over the lower interconnect level dielectric layers, wherein stepped surfaces of layers of the alternating stack are provided in a terrace region;

memory stack structures vertically extending through the alternating stack, wherein each of the memory stack structures comprises a memory film and a vertical semiconductor channel laterally surrounded by the memory film; and contact via structures located in the terrace region, wherein each of the contact via structures laterally contacts a respective one of the electrically conductive layers, vertically extends through a respective opening in at least a bottommost electrically conductive layer of the alternating stack, and contacts a respective one of the lower interconnect structures that underlie the alternating stack, wherein a top surface of each of the contact via structures is substantially coplanar with a horizontal stepped surface of the respective one of the electrically conductive layers.

2. The three-dimensional memory device of claim 1, wherein:

each of the contact via structures vertically extends through openings in each layer of the alternating stack that underlies the respective one of the electrically conductive layers; and each of the contact via structures is electrically isolated from each layer of the alternating stack that underlies the respective one of the electrically conductive layers by an insulating tubular liner.

3. The three-dimensional memory device of claim 1, wherein each of the contact via structures comprises:

a metallic nitride liner contacting the respective one of the lower interconnect structures;

a metal fill portion located within the metallic nitride liner; and a metallic pillar structure contacting a generally cylindrical sidewall of the respective one of the electrically conductive layers.

4. The three-dimensional memory device of claim 3, wherein the metallic pillar structure contacts a top surface of the metal fill portion and an annular top surface of the metallic liner layer.

5. The three-dimensional memory device of claim 3, wherein:

the metallic pillar structure has a greater lateral extent than the metal fill portion; and an outer periphery of an interface between a bottom surface of the metallic pillar structure and the metallic nitride liner is located entirely on a sidewall of a respective one of the insulating layers that contacts a bottom surface of the respective one of the electrically conductive layers.

6. The three-dimensional memory device of claim 1, wherein:

the stepped surfaces continuously extend from a bottommost layer within the alternating stack to a topmost layer within the alternating stack;

each electrically conductive layer within the alternating stack contacts a respective one of the contact via structures;

a retro-stepped dielectric material portion is located over the stepped surfaces in the terrace region; and an entire region of the retro-stepped dielectric material portion within an area of the stepped surfaces is free of any conductive via structure.

7. The three-dimensional memory device of claim 1, wherein:

the stepped surfaces are surfaces of a first subset of layers in the alternating stack that includes a bottommost layer within the alternating stack;

a second subset of layers of the alternating stack that overlies the first subset of layers include additional stepped surfaces that overhangs the stepped surfaces;

each electrically conductive layer within the first subset of layers contacts a respective one of the contact via structures; and each electrically conductive layer within the second subset of layers includes a respective top surface that contacts a bottom surface of a respective one of additional contact via structures.

8. The three-dimensional memory device of claim 1, wherein:

a retro-stepped dielectric material portion is located over the additional stepped surfaces; and each of the additional contact via structures vertically extends through the retro-stepped dielectric material portion.

9. The three-dimensional memory device of claim 1, further comprising:

upper interconnect level dielectric layers located over the alternating stack and embedding upper interconnect structures that are electrically connected via a respective drain region to an upper end of a respective one of the vertical semiconductor channels; and through-dielectric contact via structures vertically extending between a respective one of the upper interconnect structures and a respective one of the lower interconnect structures within an area outside of the alternating stack, wherein the upper interconnect structures comprise bit lines that are electrically connected via a respective drain region to an upper end of a respective one of the vertical semiconductor channels; and wherein the semiconductor devices comprise at least one of word line drivers or bit line drivers.

10. The three-dimensional memory device of claim 1, wherein:

the three-dimensional memory device comprises a monolithic three-dimensional NAND memory device;

the electrically conductive layers comprise, or are electrically connected to, a respective word line of the monolithic three-dimensional NAND memory device;

bottom ends of the memory stack structures contact a planar semiconductor material layer;

the monolithic three-dimensional NAND memory device comprises an array of monolithic three-dimensional NAND strings over the planar semiconductor material layer;

at least one memory cell in a first device level of the array of monolithic three-dimensional NAND strings is located over another memory cell in a second device level of the array of monolithic three-dimensional NAND strings;

the at least one semiconductor device comprises an integrated circuit comprising a driver circuit for monolithic three-dimensional NAND memory device located thereon;

the electrically conductive layers comprise a plurality of control gate electrodes having a strip shape extending substantially parallel to the top surface of the semiconductor substrate;

the plurality of control gate electrodes comprises at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the semiconductor substrate, and a plurality of charge storage elements, each charge storage element located adjacent to a respective one of the plurality of semiconductor channels.

* * * * *